US008795942B2

(12) United States Patent
Kobayashi et al.

(10) Patent No.: US 8,795,942 B2
(45) Date of Patent: Aug. 5, 2014

(54) POSITIVE RESIST COMPOSITION AND PATTERNING PROCESS

(75) Inventors: Tomohiro Kobayashi, Niigata (JP); Youichi Ohsawa, Niigata (JP); Ryosuke Taniguchi, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 434 days.

(21) Appl. No.: 12/000,284

(22) Filed: Dec. 11, 2007

(65) Prior Publication Data

US 2008/0153030 A1 Jun. 26, 2008

(30) Foreign Application Priority Data

Dec. 25, 2006 (JP) ................................. 2006-348203

(51) Int. Cl.

| | |
|---|---|
| ***G03F 7/039*** | (2006.01) |
| ***G03F 7/20*** | (2006.01) |
| ***G03F 7/30*** | (2006.01) |
| ***G03F 7/38*** | (2006.01) |

(52) U.S. Cl.
USPC ........ 430/270.1; 430/311; 430/326; 430/330; 430/907; 430/910; 430/921; 430/925

(58) Field of Classification Search
None
See application file for complete search history.

(56) References Cited

U.S. PATENT DOCUMENTS

| | | | | |
|---|---|---|---|---|
| 6,200,728 | B1 * | 3/2001 | Cameron et al. | 430/270.1 |
| 6,210,859 | B1 * | 4/2001 | Jeon et al. | 430/270.1 |
| 6,261,738 | B1 | 7/2001 | Asakura et al. | |
| 6,280,898 | B1 * | 8/2001 | Hasegawa et al. | 430/270.1 |
| 6,300,035 | B1 * | 10/2001 | Thackeray et al. | 430/270.1 |
| 7,611,821 | B2 * | 11/2009 | Nishi et al. | 430/270.1 |
| 2002/0051933 | A1 | 5/2002 | Kodama et al. | |
| 2003/0044717 | A1 * | 3/2003 | Kodama | 430/270.1 |
| 2006/0177765 | A1 * | 8/2006 | Harada et al. | 430/270.1 |
| 2007/0122750 | A1 * | 5/2007 | Yamaguchi et al. | 430/311 |

FOREIGN PATENT DOCUMENTS

| | | |
|---|---|---|
| EP | 1 710 230 A1 * | 10/2006 |
| JP | A-04-230645 | 8/1992 |
| JP | A-05-249662 | 9/1993 |
| JP | A-06-242605 | 9/1994 |
| JP | B-2906999 | 11/1995 |
| JP | A-09-073173 | 3/1997 |
| JP | A-09-090637 | 4/1997 |
| JP | A-09-095479 | 4/1997 |
| JP | A-09-208554 | 8/1997 |
| JP | A-09-230588 | 9/1997 |
| JP | A-09-301948 | 11/1997 |
| JP | A-2000-314956 | 11/2000 |

(Continued)

OTHER PUBLICATIONS

Machine-assisted English translation of JP2005-99156 as provided by JPO (2005).*

(Continued)

*Primary Examiner* — Sin J. Lee
(74) *Attorney, Agent, or Firm* — Oliff PLC

(57) ABSTRACT

There is disclosed a resist composition that remarkably improves the resolution of photolithography using a high energy beam such as ArF excimer laser light as a light source, and exhibits excellent resistance to surface roughness and side lobe under use of a halftone phase shift mask; and a patterning process using the resist composition. The positive resist composition at least comprises (A) a resin component comprising a repeating unit represented by the following general formula (1); (B) a photoacid generator generating sulfonic acid represented by the following general formula (2) upon exposure to a high energy beam; and (C) an onium salt where a cation is sulfonium represented by the following general formula (3), or ammonium represented by the following general formula (4); and an anion is represented by any one of the following general formulae (5) to (7).

(1)

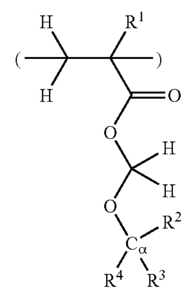

(2)

$$R^{200}—CF_2SO_3^-H^+$$

(3)

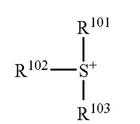

(4)

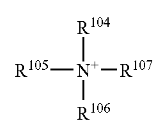

(5)

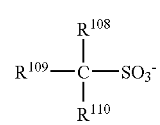

(6)

$$R^{111}—SO_3^-$$

(7)

$$R^{112}—COO^-$$

20 Claims, No Drawings

(56) References Cited

FOREIGN PATENT DOCUMENTS

| | | | |
|---|---|---|---|
| JP | A-2000-336121 | | 12/2000 |
| JP | A-2001-233842 | | 8/2001 |
| JP | A-2002-122994 | | 4/2002 |
| JP | A-2003-005376 | | 1/2003 |
| JP | A-2003-252855 | | 9/2003 |
| JP | A-2004-002252 | | 1/2004 |
| JP | A-2004-531749 | | 10/2004 |
| JP | A-2005-084365 | | 3/2005 |
| JP | 2005-99156 | * | 4/2005 |
| JP | A-2005-234449 | | 9/2005 |
| JP | A-2005-352466 | | 12/2005 |
| JP | A-2006-257078 | | 9/2006 |
| WO | WO 2004/074242 A2 | | 9/2004 |

OTHER PUBLICATIONS

R.B. Wagner et al.; *Synthetic Organic Chemistry*; pp. 813-814; John Wiley & Sons Inc.; 1965.

Chen-Ping Qian et al.; Perfluoro-Enolate Chemistry: Facile Generation and Unique Reactivities of Metal F-1-Propen-2-Olates; *Tetrahedron Letters*; vol. 29; No. 33; pp. 4119-4122; 1988.

Arimitsu et al.; Sensitivity Enhancement of Chemical-Amplification-Type Photoimaging Materials by Acetoacetic Acid Derivatives; *Journal of Photopolymer Science and Technology*; vol. 8; No. 1; 1995; pp. 43-44.

Arimitsu et al.; Effect of Phenolic Hydroxyl Residues on the Improvement of Acid-Proliferation-Type Photoimaging Materials; *Journal of Photopolymer Science and Technology*; vol. 9; No. 1; 1996; pp. 29-30.

* cited by examiner

POSITIVE RESIST COMPOSITION AND PATTERNING PROCESS

BACKGROUND OF THE INVENTION

1. Field of the Invention

The present invention relates to (1) a resist composition suitable for microprocessing techniques that exhibits excellent resolution and excellent resistance to surface roughness and side lobeunder use of a halftone mask; and (2) a patterning process using the resist composition.

2. Description of the Related Art

In recent years, a finer pattern rule is demanded as high integration and high-speed of LSIs have been achieved. Under these circumstances, there have been vigorously developed microprocessing techniques using deep-ultraviolet lithography or vacuum ultraviolet lithography. Photolithography using KrF excimer laser light at a wavelength of 248 nm as a light source has already used as a major technique for actually fabricating semiconductor devices. In order to achieve further pattern size reduction, use of ArF excimer laser light at a wavelength of 193 nm has been under review, and ArF excimer laser has already been used in some trial productions. The ArF excimer laser lithography is technically, however, still in its infancy, and has various outstanding problems for actually fabricating semiconductor devices.

The properties required for resist compositions applicable to ArF excimer laser lithography are transparency at a wavelength of 193 nm and dry etching resistance. As resist compositions exhibiting both of the properties, there were proposed resist compositions having as a base resin a poly(meth) acrylic acid derivative having a bulky acid cleavable protective group represented by 2-ethyl-2-adamantyl group or 2-methyl-2-adamantyl group (See Japanese Patent Application Laid-open (kokai) Nos. 09-73173 and 09-90637). After that, various compositions have been proposed, but most compositions share use of a resin having a highly transparent backbone and a carboxylic acid moiety protected with a bulky tertiary alkyl group.

Most of the tertiary alkyl groups generally used as protective groups for carboxylic acids, however, have low reactivity and absolutely lacks necessary properties for applications requiring high resolution such as forming micro grooves or micro holes.

The reactivity of the alkyl groups can be enhanced to some extent by increasing the temperature of a heat treatment conducted after exposure. But, this also promotes acid diffusion, and which deteriorates pitch dependency and mask fidelity. Thus the temperature increase does not result in the enhancement of resolution ultimately. If resolution is not enhanced, semiconductor devices with reduced size cannot be fabricated.

In order to enhance the resolution, improvement of exposure systems and resist compositions have been attempted.

A halftone phase shift mask is designed so that light-shading parts allow a small amount of light to pass through and the phase of the transmitted light is reversed relative to light-transmitting parts. The intensity of light at the edge of a pattern is decreased by the interference of lights having opposite phases. This results in enhancement of optical contrast and considerable enhancement of resolution. Thus the halftone phase shift mask is an indispensable tool in advanced lithography.

Resolution is also enhanced by using a composition comprising an acid-labile group that is apt to be deprotected by acid generated from an photoacid generator, specifically, a composition using an acetal protection group as a protection group for carboxylic acid.

When this composition is combined with the halftone phase shift mask, a small amount of light that passed through the light-shading parts effects the reaction of resist in non-pattern areas, and which causes surface roughness or a recess (side lobe) between adjacent patterns. The tendency of causing surface roughness or side lobe depends on mask transmittance, lighting conditions, and the design of a pattern. The tendency also depends strongly on a resist composition. In particular, when a highly reactive acetal protection group is used, irradiation of relatively weak light advances reaction. This results in insufficient resistance to surface roughness and side lobe.

Under these circumstances, there is a desire for a composition that comprises a highly reactive acid labile group and has excellent resistance to surface roughness and side lobe.

It is known that acid diffusion is controlled by adding a basic compound (see Japanese Patent Application Laid-open (kokai) No. 05-249662). For the same purpose, basic ammonium salts are also added (see Japanese Patent Application Laid-open (kokai) No. 06-242605). In resist solvents, the basic ammonium salts probably react with propylene glycol monomethyl ether acetate or ethyl lactate to form acetate or lactate. In contrast, tetramethyl ammonium hydroxide is an aqueous solution or a methanol solution, and addition of it as such solutions results in the presence of unwanted water or alcohol in resist solvents. This is not preferable and removal of the water or alcohol requires a complicated process of removing the low boiling point substances by concentration.

Japanese Patent Application Laid-open (kokai) No. 2003-5376 discloses a resist composition that has reduced pitch dependency, particularly reduced line-and-space pitch dependency, by combining a compound generating alkanesulfonic acid in which hydrogen atoms at the α position are substituted with fluorine atoms and an onium salt of nonfluorinated alkanesulfonic acid. The detailed mechanism of providing the advantageous effect is not described in the document, but it supposedly depends on that fluorine-containing sulfonic acid generated upon exposure reacts with the onium salt of nonfluorinated alkanesulfonic acid, generating nonfluorinated alkanesulfonic acid and an onium salt of fluorine-containing sulfonic acid, thereby replacing strong acid (fluorine-containing sulfonic acid) with weak acid (nonfluorinated alkanesulfonic acid).

But, depending on the type of the acid labile group of a polymer to be used, replaced weak acid can advance acidolysis or conversely the capability of restricting deprotection can function excessively, resulting in insufficient resolution.

Under the circumstances, there is a desire for developing a resist composition that exhibit both high reactivity and the capability of inhibiting reaction caused by faint light, and also exhibit high resolution and excellent resistance to surface roughness and side lobe under use of a halftone phase shift mask.

SUMMARY OF THE INVENTION

The present invention has been accomplished to solve the above-mentioned problems, and an object of the present invention is to provide a resist composition that remarkably improves the resolution of photolithography using a high energy beam such as ArF excimer laser light as a light source, and exhibits excellent resistance to surface roughness and side lobe under use of a halftone mask; and a patterning process using the resist composition.

The present invention has been accomplished to solve the above-mentioned problems, and provides A positive resist composition at least comprising:

(A) a resin component comprising a repeating unit represented by the following general formula (1);

(B) a photoacid generator generating sulfonic acid represented by the following general formula (2) upon exposure to a high energy beam; and (C) an onium salt where a cation is sulfonium represented by the following general formula (3), or ammonium represented by the following general formula (4); and an anion is represented by any one of the following general formulae (5) to (7), (1)

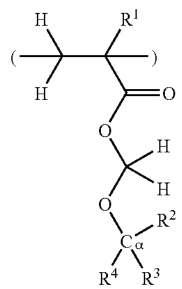

wherein $R^1$ represents a hydrogen atom, a methyl group, or a trifluoromethyl group;

$R^2$, $R^3$, and $R^4$ independently represent a hydrogen atom, or a $C_{1-20}$ linear, branched, or cyclic monovalent hydrocarbon group that may optionally contain a hetero atom; two or more among $R^2$, $R^3$, and $R^4$ may be linked to form a ring, where the ring represents a $C_{1-20}$ divalent or trivalent hydrocarbon group that may optionally contain a hetero atom; and Cα represents a carbon atom at an α position, $$R^{200}—CF_2SO_3^-H^+ \quad (2)$$

wherein $R^{200}$ represents a halogen atom, or a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group, (3)

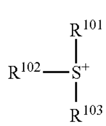

(4)

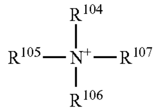

wherein $R^{101}$, $R^{102}$, and $R^{103}$ independently represent a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{101}$, $R^{102}$, and $R^{103}$ may be linked together to form a ring with the S in the formula (3); and $R^{104}$, $R^{105}$, $R^{106}$, and $R^{107}$ independently represent a hydrogen atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{104}$, $R^{105}$, $R^{106}$, and $R^{107}$ may be linked together to form a ring with the N in the formula (4), (5)

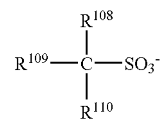

wherein $R^{108}$, $R^{109}$, and $R^{110}$ independently represent a hydrogen atom, a halogen atom except a fluorine atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{108}$, $R^{109}$, and $R^{110}$ may be linked together to form a ring, $$R^{111}—SO_3^{31} \quad (6)$$

wherein $R^{111}$ represents a $C_{1-20}$ aryl group where a hydrogen atom or hydrogen atoms of the aryl group may be substituted with a halogen atom, a hydroxy group, a carboxy group, an amino group, or a cyano group; and hydrogen atom or hydrogen atoms of the aryl group may be substituted with a $C_{1-20}$ linear, branched, or cyclic alkyl group, $$R^{112}—COO^{31} \quad (7)$$

wherein $R^{112}$ represents a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group.

In such a resist composition according to the present invention, combination of (A) a resin component, (B) a photoacid generator, and (C) an onium salt each having the specific structure inhibits excessive deprotection reaction peculiar to the acetal protection group of the (A) resin component. That is, the resist composition according to the present invention exhibits the capability of moderately restricting deprotection, and reduces dissolution at slightly exposed areas while retaining resolution. As a result, the resist composition exhibits improved resistance to surface roughness and side lobe under use of a halftone phase shift mask. Thus use of the resist composition enables micropatterning with extremely high precision.

In the above case, the sulfonic acid generated from the (B) photoacid generator is preferably represented by the following general formula (8), $$R^{201}—CF_2SO_3^-H^+ \quad (8)$$

wherein $R^{201}$ represents a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group, however, $R^{201}$ does not represent a perfluoroalkyl group.

In this case, the (B) photoacid generator generates sulfonic acid that is not perfluoroalkanesulfonic acid. This is preferable because of reduced load on the environment.

The sulfonic acid generated from the (B) photoacid generator is preferably represented by the following general formula (9) or (10), $$CF_3\text{—}CH(OCOR^{202})\text{—}CF_2SO_3^-H^+ \quad (9)$$

wherein $R^{202}$ represents a $C_{1-20}$ linear, branched, or cyclic alkyl group where a hydrogen atom or hydrogen atoms of the alkyl group are substituted with a halogen atom, a hydroxy group, a carboxy group, an amino group, or a cyano group; or no hydrogen atoms of the alkyl group are substituted; or a $C_{6-14}$ aryl group where a hydrogen atom or hydrogen atoms of the aryl group are substituted with a halogen atom, a hydroxy group, a carboxy group, an amino group, or a cyano group; or no hydrogen atoms of the aryl group are substituted, $$R^{203}\text{—}OOC\text{—}CF_2SO_3^-H^+ \quad (10)$$

wherein $R^{203}$ represents a $C_{1-20}$ linear, branched, or cyclic alkyl group wherein a hydrogen atom or hydrogen atoms of the alkyl group are substituted with a halogen atom, a hydroxy group, a carboxy group, an amino group, or a cyano group; or no hydrogen atoms of the alkyl group are substituted; or a $C_{6-14}$ aryl group where a hydrogen atom or hydrogen atoms of the aryl group are substituted with a halogen atom, a hydroxy group, a carboxy group, an amino group, or a cyano group; or no hydrogen atoms of the aryl group are not substituted.

In this case, the (B) photoacid generator generates sulfonic acid comprising an ester group. This inhibits leaching of the generated acid to water on ArF immersion lithography, and also inhibits generation of defects because water remaining on wafers does not have large adverse impact. In treating the waste solution of resist after device fabrication, the ester moiety is base hydrolyzed to convert the generator and the acid into low accumulative compounds having lower molecular weights. Also in disposing of the waste solution by combustion, the generator and the acid have high flammability because of low fluorinated ratio.

The cation of the (C) onium salt is preferably quaternary ammonium represented by the following general formula (11), (11)

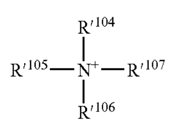

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

In this case, where the cation of the (C) onium salt is quaternary ammonium represented by the general formula (11), the resist composition has excellent storage stability over an extended time period because there are no hydrogen atoms on the nitrogen atom, and proton transfer does not occur in the presence of other strongly basic nitrogen-containing organic compounds.

The general formula (1) representing the repeating unit of the (A) resin component is preferably of any one of the following structures:

(I) a structure where there exist no carbon atom at a β position bound to the Cα, which is the carbon atom at the α position;

(II) a structure where there exists a carbon atom at a β position bound to the Cα, which is the carbon atom at the α position; and there exist no hydrogen atoms on the β carbon atom;

(III) a structure where there exists a condensed ring that comprises the Cα, which is the carbon atom at the α position, as a bridgehead of the ring; and (IV) a structure where there exists a condensed ring that comprises the Cα, which is the carbon atom at the α position; one to three carbon atoms at β positions bound to the Cα are bridgeheads of the condensed ring; and there exist no hydrogen atoms on the β carbon atom that is not the bridgehead.

When the general formula (1) representing the repeating unit of the (A) resin component is of any one of the structures (I) to (IV), there hardly occurs deprotection of carboxylic acid moiety by β-elimination reaction, and there is less possibility of excessive deprotection. Use of a positive resist composition comprising such (A) a resin component enables higher resolution, excellent pitch dependency, and mask fidelity.

The present invention also provides a patterning process comprising: at least, a step of applying any one of the positive resist compositions to a substrate; a step of conducting a heat-treatment and then exposing the substrate to a high energy beam; and a step of developing the substrate with a developer.

As a matter of course, the exposure may be followed by heat treatment and then development, and the patterning process may comprise various steps such as etching, stripping of resist, or cleaning.

As described above, a resist composition according to the present invention comprises (A) a resin component, (B) a photoacid generator, and (C) an onium salt each having a specific structure, thereby exhibiting extremely high resolution in micropatterning, particularly in ArF lithography, and exhibiting excellent resistance to surface roughness and side lobe under use of a halftone phase shift mask. Thus use of the resist composition enables micropatterning with extremely high precision.

DESCRIPTION OF THE INVENTION AND A PREFERRED EMBODIMENT

Hereinafter, the present invention is described further in detail.

As mentioned above, conventional resist compositions have problems such as insufficient reactivity or generation of surface roughness or side lobe.

In order to overcome the problems, the present inventors have thoroughly studied. As a result, the inventors have found that a positive resist composition comprising a polymer comprising a carboxylic acid moiety protected by a specific acetal protection group, a photoacid generator having a specific structure, and an onium salt having a specific structure exhibits extremely high resolution and excellent resistance to surface roughness and side lobe under use of a halftone phase shift mask; the resist composition is therefore extremely useful for precise micropatterning, in particular, for forming trench and hole patterns.

That is, a positive resist composition according to the present invention at least comprises:

(A) a resin component comprising a repeating unit represented by the following general formula (1);

(B) a photoacid generator generating sulfonic acid represented by the following general formula (2) upon exposure to a high energy beam; and (C) an onium salt where a cation is sulfonium represented by the following general formula (3), or ammonium represented by the following general formula (4); and an anion is represented by any one of the following general formulae (5) to (7), (1)

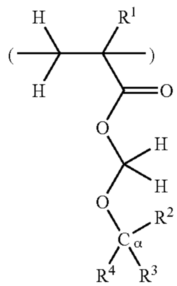

wherein $R^1$ represents a hydrogen atom, a methyl group, or a trifluoromethyl group;

$R^2$, $R^3$, and $R^4$ independently represent a hydrogen atom, or a $C_{1-20}$ linear, branched, or cyclic monovalent hydrocarbon group that may optionally contain a hetero atom; two or more among $R^2$, $R^3$, and $R^4$ may be linked to form a ring, where the ring represents a $C_{1-20}$ divalent or trivalent hydrocarbon group that may optionally contain a hetero atom; and Cα represents a carbon atom at an α position, $$R^{200}—CF_2SO_3^-H^+ \quad (2)$$

wherein $R^{200}$ represents a halogen atom, or a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group, (3)

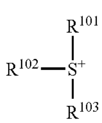

(4)

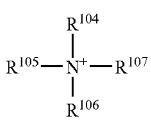

wherein $R^{101}$, $R^{102}$, and $R^{103}$ independently represent a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{101}$, $R^{102}$, and $R^{103}$ may be linked together to form a ring with the S in the formula (3); and $R^{104}$, $R^{105}$, $R^{106}$, and $R^{107}$ independently represent a hydrogen atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{104}$, $R^{105}$, $R^{106}$, and $R^{107}$ may be linked together to form a ring with the N in the formula (4), (5)

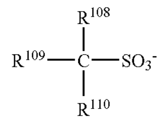

wherein $R^{108}$, $R^{109}$, and $R^{110}$ independently represent a hydrogen atom, a halogen atom except a fluorine atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{108}$, $R^{109}$, and $R^{110}$ may be linked together to form a ring, $$R^{111}—SO_3^- \quad (6)$$

wherein $R^{111}$ represents a $C_{1-20}$ aryl group where a hydrogen atom or hydrogen atoms of the aryl group may be substituted with a halogen atom, a hydroxy group, a carboxy group, an amino group, or a cyano group; and hydrogen atom or hydrogen atoms of the aryl group may be substituted with a $C_{1-20}$ linear, branched, or cyclic alkyl group, $$R^{112}—COO^- \quad (7)$$

wherein $R^{112}$ represents a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group.

Hereinafter, there is described further in detail the resist composition according to the present invention.

It should be noted that, in the following description, some structures represented by chemical formulae have asymmetric carbon atoms, and thus have enantiomers or diastereoisomers. In these cases, a single formula also represents its isomers. The isomers may be used alone or in combination.

The resist composition according to the present invention comprises (A) a resin component comprising a repeating unit represented by the following general formula (1). The repeating unit comprises a carboxylic acid moiety protected by an acetal protection group that breaks down under the influence of acid.

(1)

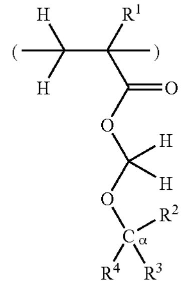

In the general formula (1), $R^1$ represents a hydrogen atom, a methyl group, or a trifluoromethyl group; and $R^2$, $R^3$, and $R^4$ independently represent a hydrogen atom, or a $C_{1-20}$ linear, branched, or cyclic monovalent hydrocarbon group that may optionally contain a hetero atom. Examples of $R^2$, $R^3$, and $R^4$ may include: a methyl group, ethyl group, propyl group, isopropyl group, n-butyl group, sec-butyl group, tert-butyl group, tert-amyl group, n-pentyl group, n-hexyl group, cyclopentyl group, cyclohexyl group, ethylcyclopentyl group, butylcyclopentyl group, ethylcyclohexyl group, butylcyclohexyl group, adamantyl group, ethyladamantyl group, butyladamantyl group; hetero atom containing group between any carbon-carbon bond of the foregoing where the hetero atom include —O—, —S—, —SO—, —$SO_2$—, —NH—, —C(=O)—, —C(=O)O—, and —C(=O)NH—; and substituted group of the foregoing where any hydrogen atom is substituted with a functional group such as —OH, —$NH_2$, —CHO, and $CO_2H$. $R^2$, $R^3$, and $R^4$ may be the same or different. Two or three among $R^2$, $R^3$, and $R^4$ may be linked to form a ring, where the ring represents a $C_{1-20}$ divalent or trivalent hydrocarbon group that may optionally contain a hetero atom: for example, the divalent or trivalent group may be obtained by removing one or two hydrogen atoms from the foregoing.

Cα represents a carbon atom at an α position.

The general formula (1) representing the repeating unit of the (A) resin component preferably takes any one of the following structures (I) to (IV):

(I) a structure where there exist no carbon atom at a β position bound to the Cα, which is the carbon atom at the α position;

(II) a structure where there exists a carbon atom at a β position bound to the Cα, which is the carbon atom at the α position; and there exist no hydrogen atoms on the β carbon atom;

(III) a structure where there exists a condensed ring that comprises the Cα, which is the carbon atom at the α position, as a bridgehead of the ring; and (IV) a structure where there exists a condensed ring that comprises the Cα, which is the carbon atom at the α position; one to three carbon atoms at β positions bound to the Cα are bridgeheads of the condensed ring; and there exist no hydrogen atoms on the β carbon atom that is not the bridgehead.

When the general formula (1) representing the repeating unit of the (A) resin component takes any one of the structures (I) to (IV), there hardly occurs deprotection of the carboxylic acid moiety of the general formula (1) by β-elimination reaction, and there is less possibility of excessive deprotection. Use of a positive resist composition comprising such (A) a resin component enables higher resolution, excellent pitch dependency, and mask fidelity.

The term "a carbon atom at a β position" (hereinafter referred to as Cβ) refers to one to three carbon atoms directly bound to the carbon atom at the α position (herein after referred to as Cα). The relation of Cα and Cβ where three Cβs exist is shown in the following formula (101). The formula (101) shows the carboxylic acid moiety and a moiety bound thereto in the general formula (1) where three Cβs exist.

(101)

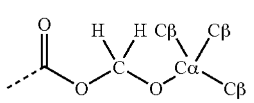

wherein the broken line indicates the point where the formula (101) links to the backbone chain of the general formula (1).

Hereinafter, hydrogen atoms bound to the Cα are referred to as Hα, and hydrogen atoms bound to the Cβ are referred to as Hβ.

When a hydrogen atom (Hβ) exists on the Cβ, there occurs deprotection of the carboxylic acid moiety of the general formula (1) by β-elimination reaction through the mechanism shown in the following formula (X1), generating an olefin compound corresponding to the carboxylic acid. The β-elimination reaction theoretically occurs only by the presence of an acid catalyst, and the reaction keeps on occurring as long as protected carboxylic acid as substrate exists.

In contrast, when the general formula (1) has the structure (I) comprising no Cβ or the structure (II) comprising no hydrogen atoms (Hβ) on Cβs, the deprotection does not occur by β-elimination reaction unless the structure turns into a structure comprising Hβ by rearrangement of the carbon skeleton of carbocation regarded as an intermediate.

It is understood that the presence of a nucleophile in a resist system causes decomposition reaction. For example, water or alcohol as a nucleophile causes the decomposition by the mechanism shown in the following formula (X2). The reaction of (X2) occurs by the presence of a nucleophile such as water or alcohol, and the reaction does not occur beyond the amount of the nucleophile even when the system contains an acid catalyst in abundance. Thus limited amount of a nucleophile moderately inhibits expansion of the reaction, thereby preventing excessive chemical amplification. That is, it is understood that such a resist composition exhibits excellent properties that are required such as pitch dependency and mask fidelity.

(X1)

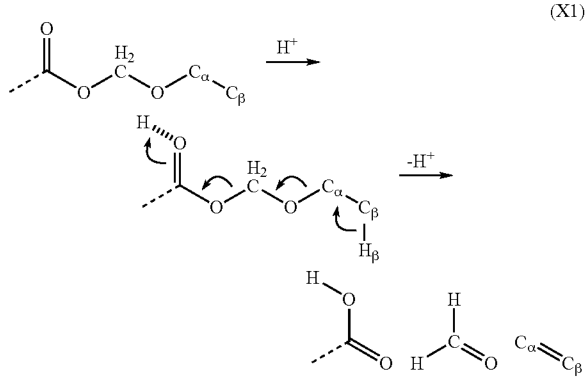

(X2)

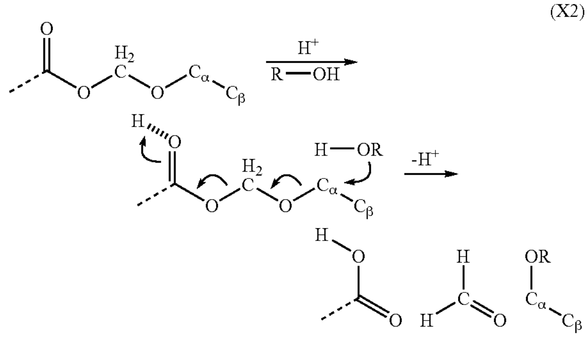

wherein the broken line indicates the point where the formulae link to the backbone chain of the repeating unit; and R represents a hydrogen atom or a monovalent substituent.

The repeating unit having the structure (I) or (II) according to the present invention can be represented by the following general formula (1-1).

(1-1)

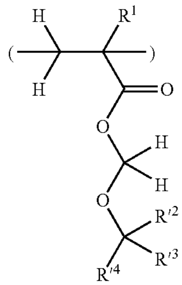

In the general formula (1-1), $R^1$ represents a hydrogen atom, a methyl group, or a trifluoromethyl group; and $R'^2$, $R'^3$, and $R'^4$ independently represent a hydrogen atom, or $CR^5R^6R^7$. $R^5$, $R^6$, and $R^7$ independently represent a $C_{1-20}$ linear, branched, or cyclic monovalent hydrocarbon group that may optionally contain a hetero atom. Examples of $R^5$, $R^6$, and $R^7$ may include: a methyl group, ethyl group, propyl group, isopropyl group, n-butyl group, sec-butyl group, tert-butyl group, tert-amyl group, n-pentyl group, n-hexyl group, cyclopentyl group, cyclohexyl group, ethylcyclopentyl group, butylcyclopentyl group, ethylcyclohexyl group, butylcyclohexyl group, adamantyl group, ethyladamantyl group, butyladamantyl group; hetero atom containing group between any carbon-carbon bond of the foregoing where the hetero atom includes —O—, —S—, —SO—, —$SO_2$—, —NH—, —C(═O)—, —C(═O)O—, and —C(═O)NH—; and substituted group of the foregoing where any hydrogen atom is substituted with a functional group such as —OH, —$NH_2$, —CHO, or $CO_2H$. $R^5$, $R^6$, and $R^7$ may be the same or different. Two or three among $R^5$, $R^6$, and $R^7$ may be linked to form a ring, where the linked Rs represent a $C_{1-20}$ divalent or trivalent hydrocarbon group that may optionally contain a hetero atom: for example, a divalent or trivalent group obtained by removing one or two hydrogen atoms from the foregoing.

More preferably, the repeating unit having the structure (I) or (II) according to the present invention is represented by the following general formula (1-2).

(1-2)

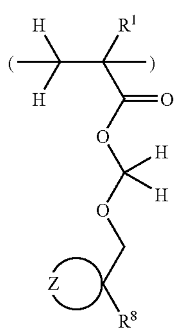

In the general formula (1-2), $R^1$ represents a hydrogen atom, a methyl group, or a trifluoromethyl group; and $R^8$ represents a $C_{1-20}$ linear, branched, or cyclic monovalent hydrocarbon group that may optionally contain a hetero atom. Examples of $R^8$ may include: a methyl group, ethyl group, propyl group, isopropyl group, n-butyl group, sec-butyl group, tert-butyl group, tert-amyl group, n-pentyl group, n-hexyl group, cyclopentyl group, cyclohexyl group, ethylcyclopentyl group, butylcyclopentyl group, ethylcyclohexyl group, butylcyclohexyl group, adamantyl group, ethyladamantyl group, butyladamantyl group; hetero atom containing group between any carbon-carbon bond of the foregoing where the hetero atom include —O—, —S—, —SO—, —$SO_2$—, —NH—, —C(═O)—, —C(═O)O—, and —C(═O)NH—; and substituted group of the foregoing where any hydrogen atom is substituted with a functional group such as —OH, —$NH_2$, —CHO, or $CO_2H$. Z represents a divalent hydrocarbon group forming a $C_{3-20}$ alicyclic structure with the carbon atom to which Z is linked. Examples of the ring that Z forms may include cyclopentane, cyclohexane, norbornane, bicyclo[2.2.2]octane, adamantane, tricyclo[$5.2.1.0^{2,6}$]decane, tetracyclo[$4.4.0.1^{2,5}$, $1.^{7,10}$]dodecane, and foregoing rings where any hydrogen atom on the rings is substituted with an alkyl group or the like.

Non-limiting examples of the repeating unit represented by the general formula (1-1) and (1-2) are shown below.

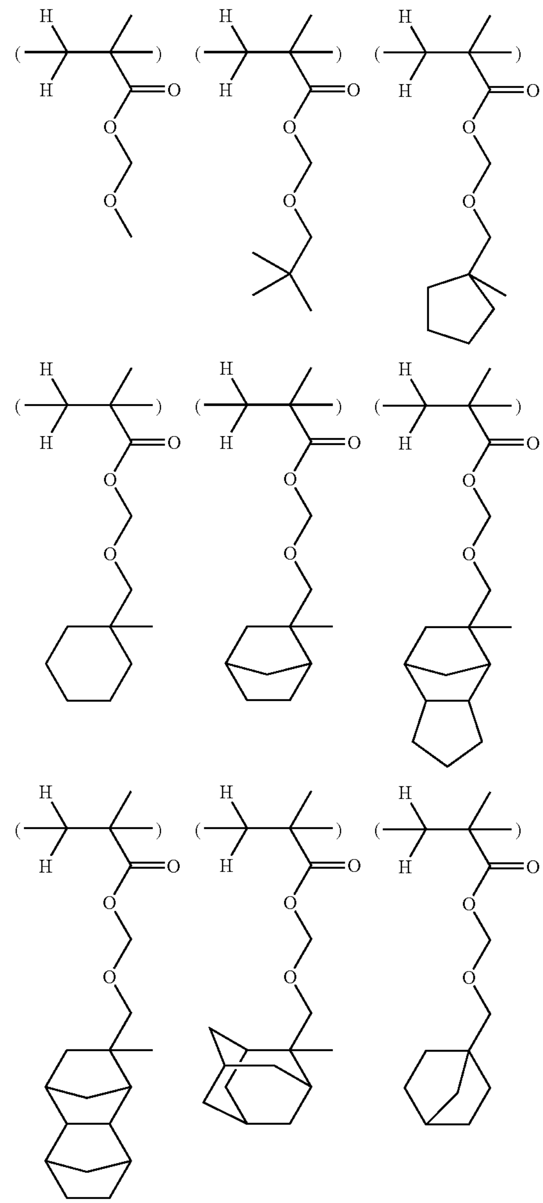

-continued

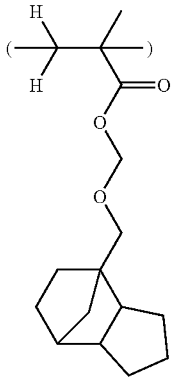

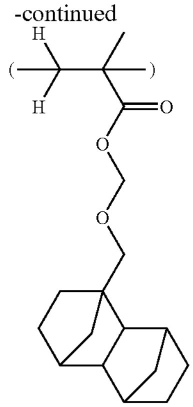

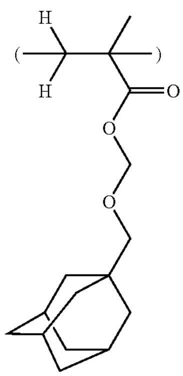

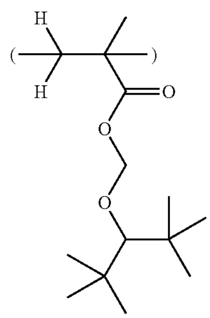

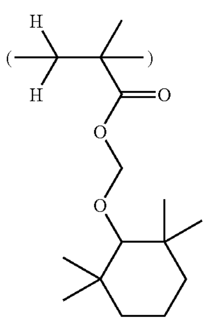

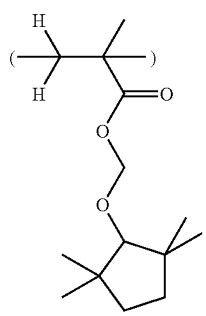

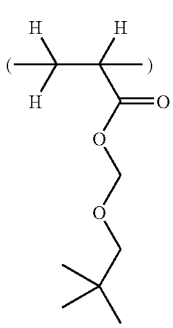

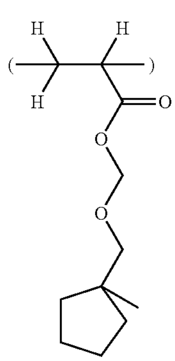

-continued

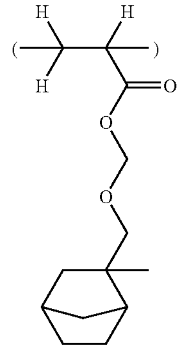

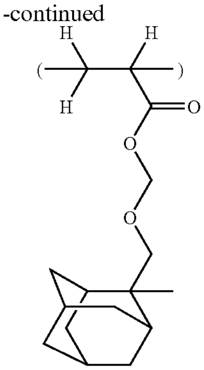

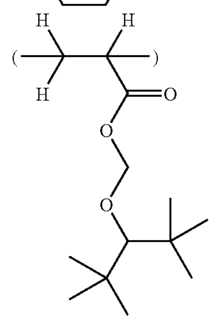

As mentioned above, there are another structures (III) and (IV) that the general formula (1) also preferably has, which the formula (1) represents the repeating unit of the (A) resin component.

(III) a structure where there exists a condensed ring that comprises the Cα, which is the carbon atom at the α position, as a bridgehead of the ring (IV) a structure where there exists a condensed ring that comprises the Cα, which is the carbon atom at the α position; one to three carbon atoms at β positions bound to the Cα are bridgeheads of the condensed ring; and there exist no hydrogen atoms on the β carbon atom that is not the bridgehead In the structure (III), as shown in the following formula (X3), although it appears on the planar formula that the hydrogen atom on the Cβ can be eliminated, deprotection by β-elimination reaction actually does not occur because a double bond cannot be formed at the bridgehead position by steric configuration unless the carbon skeleton changes by rearrangement or the like.

Likewise, in the structure (IV), as shown in the following formula (X4), the hydrogen atom on the Cα is not eliminated and deprotection by β-elimination reaction does not occur.

Note that, in both of the structures (III) and (IV), deprotection occurs in the presence of a nucleophile, and deprotection reaction itself proceeds rapidly because of high reactivity, but the reaction does not expand unlimitedly. Therefore, a resist composition comprising a resin component comprising the structure (III) or (IV) enables high resolution, excellent pitch dependency and mask fidelity.

In the following formulae, norbornane (bicyclo[2.2.1]heptane) is shown as an example of the condensed rings of the structures (III) and (IV). Another preferred examples of the condensed rings may include bicyclo[2.2.2]octane, adamantane, tricyclo[5.2.1.$0^{2,6}$]decane, and tetracyclo[4.4.0.$1^{2,5}$.$1^{7,10}$]dodecane.

(X3)

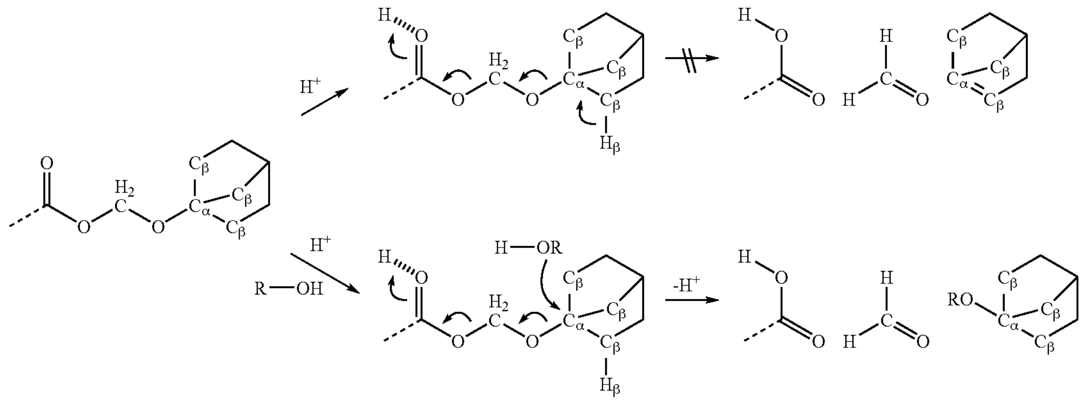

(X4)

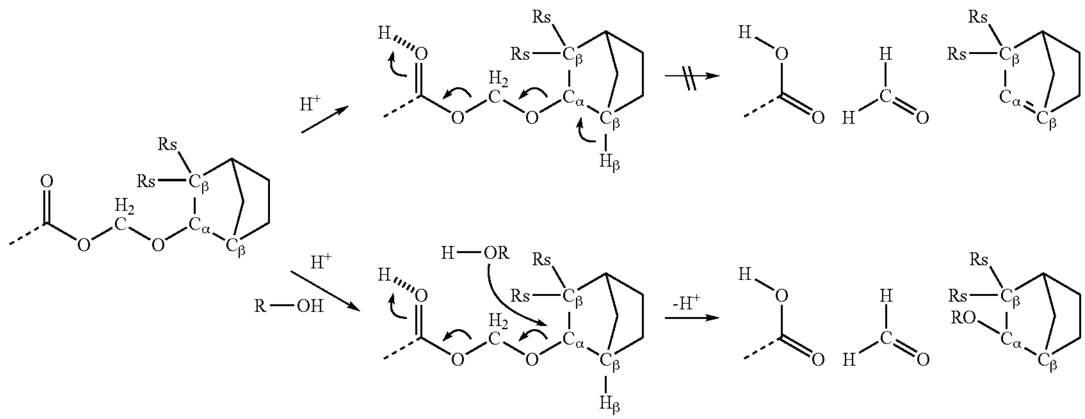

wherein the broken line indicates the point where the formulae link to the backbone chain of the repeating unit; R represents a hydrogen atom or a monovalent substituent; and Rs represents a monovalent substituent.

The repeating unit having the structure (IV) according to the present invention is preferably represented by the following general formula (1-3).

(1-3)

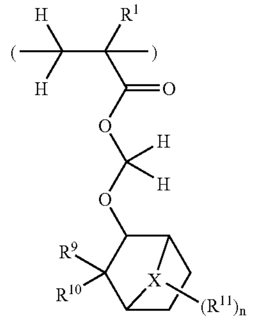

In the general formula (1-3), $R^1$ represents a hydrogen atom, a methyl group, or a trifluoromethyl group; and $R^9$, $R^{10}$, and $R^{11}$ independently represent a $C_{1-20}$ linear, branched, or cyclic monovalent hydrocarbon group that may optionally contain a hetero atom. Examples of $R^9$, $R^{10}$, and $R^{11}$ may include: a methyl group, ethyl group, propyl group, isopropyl group, n-butyl group, sec-butyl group, tert-butyl group, tert-amyl group, n-pentyl group, n-hexyl group, cyclopentyl group, cyclohexyl group, ethylcyclopentyl group, butylcyclopentyl group, ethylcyclohexyl group, butylcyclohexyl group, adamantyl group, ethyladamantyl group, butyladamantyl group; hetero atom containing group between any carbon-carbon bond of the foregoing where the hetero atom include —O—, —S—, —SO—, —$SO_2$—, —NH—, —C(═O)—, —C(═O)O—, and —C(═O)NH—; and substituted group of the foregoing where any hydrogen atom is substituted with a functional group such as —OH, —$NH_2$, —CHO, or $CO_2H$. Each of n units of $R^{11}$ may be linked to any bonding site on the ring. Two among $R^9$, $R^{10}$, and $R^{11}$ may be linked to form a ring or any two of $R^{11}$s may be linked to form a ring, where the linked two Rs together represents a $C_{1-20}$ divalent hydrocarbon group that may optionally contain a hetero atom: for example, the divalent groups mentioned as examples of divalent $R^5$, $R^6$, and $R^7$. X represents —$CH_2$—, —$CH_2CH_2$—, —O—, or —S—. n represents an integer of 0 to 4.

Non-limiting examples of the repeating unit of the present invention having the structure (III) or (IV) including a repeating unit represented by the general formula (1-3) are shown below.

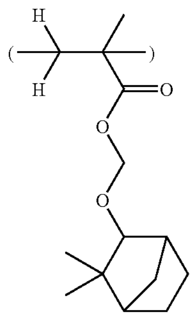
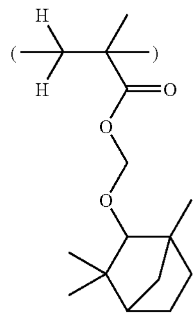
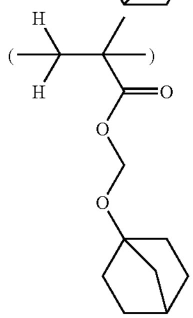
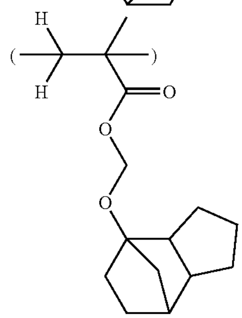
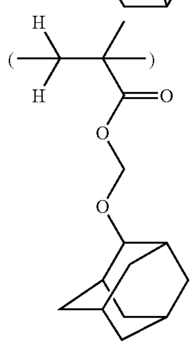
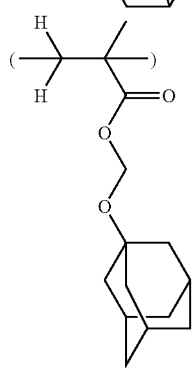
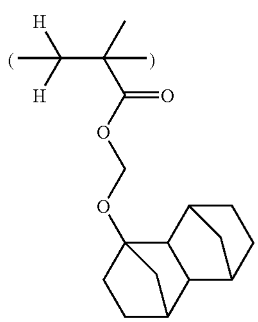
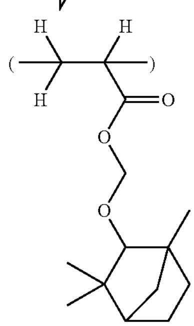
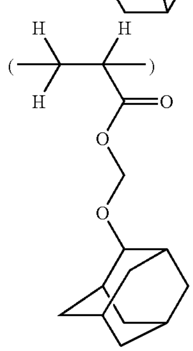
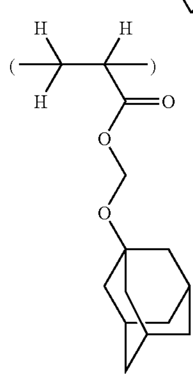

The (A) resin component according to the present invention may comprise one or more repeating units selected from the following general formulae (12), (13), (14), and (15) other than the repeating unit represented by the general formula (1).

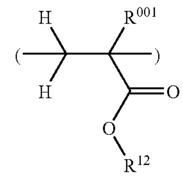
(12)

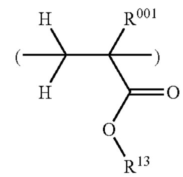
(13)

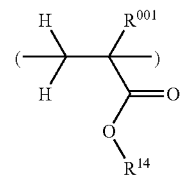
(14)

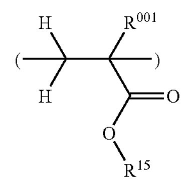
(15)

In the formula, $R^{001}$ independently represents a hydrogen atom, a methyl group, or a trifluoromethyl group.

$R^{12}$ represents a hydrogen atom or a monovalent hydrocarbon group comprising at least one group selected from a $C_{1-15}$ fluorine-containing substituent, carboxy group, and hydroxy group. Examples of $R^{12}$ may include: a hydrogen atom, carboxyethyl, carboxy butyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, [2,2,2-trifluoro-1-hydroxy-1-(trifluoromethyl)ethyl]cyclohexyl, and bis[2,2,2-trifluoro-1-hydroxy-1-(trifluoromethyl)ethyl]cyclohexyl.

$R^{13}$ represents a $C_{3-15}$ monovalent hydrocarbon group comprising —$CO_2$— moiety. Specific examples of $R^{13}$ may include 2-oxooxolan-3-yl, 4,4-dimethyl-2-oxooxolan-3-yl, 4-methyl-2-oxooxane-4-yl, 2-oxo-1,3-dioxolan-4-ylmethyl, and 5-methyl-2-oxooxolan-5-yl.

$R^{14}$ represents a $C_{7-15}$ polycyclichydrocarbon group or an alkyl group comprising a $C_{7-15}$ polycyclichydrocarbon group. Specific examples of $R^{14}$ may include norbornyl, bicyclo[3.3.1]nonyl, tricyclo[5.2.1.$0^{2,6}$]decyl, adamantyl, ethyladamantyl, butyladamantyl, norbornylmethyl, and adamantylmethyl.

$R^{15}$ represents an acid labile group. Various acid labile groups may be used as $R^{15}$, and any known acid labile group may be used that is deprotected by acid generated from a photoacid generator described later, and conventionally used for resist compositions, particularly chemically amplified resist compositions. Specific examples of $R^{15}$ may include groups represented by any one of the following general formulae (L1) to (L4); tertiary alkyl groups having 4-20, preferably 4-15 carbon atoms; trialkylsilyl groups wherein each alkyl group has 1-6 carbon atoms; and an oxoalkyl group having 4-20 carbon atoms.

(L1)

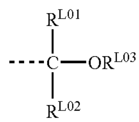

(L2)

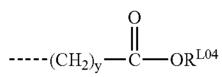

(L3)

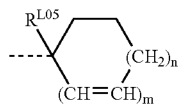

(L4)

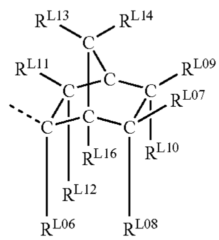

In the formulae, the broken lines denote bonds. $R^{L01}$ and $R^{L02}$ represent a hydrogen atom or a linear, branched or cyclic alkyl group having 1-18, preferably 1-10 carbon atoms. Examples thereof may include: a methyl group, ethyl group, propyl group, isopropyl group, n-butyl group, sec-butyl group, tert-butyl group, cyclopentyl group, cyclohexyl group, 2-ethylhexyl group, n-octyl group, and adamantyl group. $R^{L03}$ represents a monovalent hydrocarbon group having 1-18, preferably 1-10 carbon atoms which may contain a hetero atom such as an oxygen atom. Examples thereof may include: a linear, branched or cyclic alkyl group, and these alkyl groups in which a part of hydrogen atoms is substituted with a hydroxyl group, an alkoxy group, an oxo group, an amino group, an alkyl amino group, and the like. Examples of the linear, branched or cyclic alkyl group may include the same as the $R^{L01}$ and $R^{L02}$. Examples of the substituted alkyl groups may include the following groups.

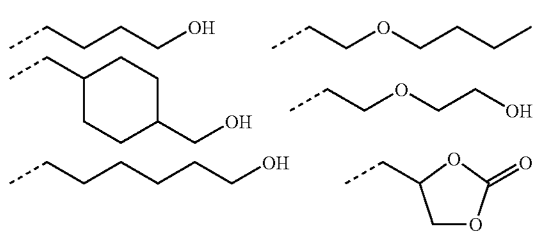

$R^{L01}$ and $R^{L02}$, $R^{L01}$ and $R^{L03}$, and $R^{L02}$ and $R^{L03}$ may bond to each other and form a ring with the carbon atom and/or the oxygen atom, which links to $R^{L01}$ and $R^{L02}$, or $R^{L03}$. Each of $R^{L01}$, $R^{L02}$ and $R^{L03}$ forming the ring represents a linear or branched alkylene group having 1-18, preferably 1-10 carbon atoms.

$R^{L04}$ represents tertiary alkyl group having 4-20, preferably 4-15 carbon atoms, a trialkyl silyl group wherein each of the alkyl groups has 1-6 carbon atoms, an oxoalkyl group having 4-20 carbon atoms, or the group represented by the general formula (L1). Examples of the tertiary alkyl group may include: tert-butyl group, tert-amyl group, 1,1-diethylpropyl group, 2-cyclopentylpropane-2-yl group, 2-cyclohexylpropane-2-yl group, 2-(bicyclo[2.2.1]heptane-2-yl) propane-2-yl group, 2-(adamantane-1-yl)propane-2-yl group, 2-(tricyclo[5.2.1.$0^{2,6}$]decane-8-yl)propane-2-yl group, 2-(tetracyclo[4.4.0.$1^{2,5}$, $1.^{7,10}$]dodecane-3-yl)propane-2-yl group, 1-ethylcyclopentyl group, 1-butylcyclopentyl group, 1-ethylcyclohexyl group, 1-butylcyclohexyl group, 1-ethyl-2-cyclopentenyl group, 1-ethyl-2-cyclohexenyl group, 2-methyl-2-adamantyl group, 2-ethyl-2-adamantyl group, 8-methyl-8-tricyclo[5.2.1.$0^{2,6}$]decyl, 8-ethyl-8-tricyclo[5.2.1.$0^{2,6}$]decyl, 3-methyl-3-tetracyclo[4.4.0.$1^{2,5}$, $1.^{7,10}$] dodecyl, and 3-ethyl-3-tetracyclo[4.4.0.$1^{2,5}$, $1.^{7,10}$]dodecyl. Examples of the trialkyl silyl group may include: a trimethylsilyl group, a triethylsilyl group, a dimethyl-tert-butylsilyl group, and the like. Examples of the oxo-alkyl group may include: 3-oxo-cyclohexyl group, 4-methyl-2-oxooxane-4-yl group, 5-methyl 2-oxooxolane-5-yl group, and the like. y is an integer of 0-6.

$R^{L05}$ represents a $C_{1-10}$ linear, branched or cyclic alkyl group that may optionally be substituted, or a $C_{6-20}$ aryl group that may optionally be substituted. Examples of the alkyl group that may optionally be substituted may include: a linear, branched or cyclic alkyl group such as a methyl group, an ethyl group, a propyl group, an isopropyl group, n-butyl group, sec-butyl group, tert-butyl group, tert-amyl group, n-pentyl group, n-hexyl group, a cyclopentyl group, a cyclohexyl group, bicyclo[2.2.1]heptyl group; and these groups in which a part of hydrogen atoms are substituted with a hydroxy group, an alkoxy group, a carboxy group, an alkoxy carbonyl group, an oxo group, an amino group, an alkyl amino group, a cyano group, a mercapto group, an alkylthio group, a sulfo group, or the like, or these groups where a part of methylene groups is substituted with an oxygen atom or a sulfur atom. Examples of the aryl group which may be substituted may include: a phenyl group, a methylphenyl group, a naphthyl group, an anthryl group, a phenanthryl group, a pyrenyl group, and the like. In the formula (L3), m is 0 or 1, and n is 0, 1, 2, or 3, and m and n satisfy the formula: 2m+n=2 or 3.

$R^{L06}$ represents a $C_{1-10}$ linear, branched or cyclic alkyl group that may optionally be substituted, or a $C_{6-20}$ aryl group that may optionally be substituted. Examples thereof may include the same groups as $R^{L05}$ and the like.

$R^{L07}$ to $R^{L16}$ independently represent a hydrogen atom or a monovalent hydrocarbon group having 1-15 carbon atoms. Examples thereof may include: a hydrogen atom; a linear, branched or cyclic alkyl group such as a methyl group, an ethyl group, a propyl group, an isopropyl group, n-butyl group, sec-butyl group, tert-butyl group, tert-amyl group, n-pentyl group, n-hexyl group, n-octyl group, n-nonyl group, n-decyl group, a cyclopentyl group, a cyclohexyl group, a cyclopentylmethyl group, a cyclopentylethyl group, cyclopentylbutyl group, a cyclohexylmethyl group, a cyclohexylethyl group, a cyclohexylbutyl group and the like; and these groups in which a part of hydrogen atoms are substituted with a hydroxy group, an alkoxy group, a carboxy group, an alkoxy carbonyl group, an oxo group, an amino group, an alkyl amino group, a cyano group, a mercapto group, an alkylthio group, a sulfo group, and the like. $R^{L07}$ to $R^{L16}$ may bond to each other, and form a ring (for example, $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or the like). In the case of forming the ring, Rs represent a divalent hydrocarbon group having 1-15 carbon atoms and examples thereof may include those groups in which a hydrogen atom is removed from the examples of a monovalent hydrocarbon group described above. Any two Rs among $R^{L07}$ to $R^{L16}$ bound to adjacent carbon atoms may bond to each other without any groups therebetween, and form a double bond (for example, $R^{L07}$ and $R^{L09}$, $R^{L09}$ and $R^{L15}$, $R^{L13}$ and $R^{L15}$, or the like).

Examples of the linear or branched group among the acid labile groups represented by the above-mentioned formula (L1) may include the following groups.

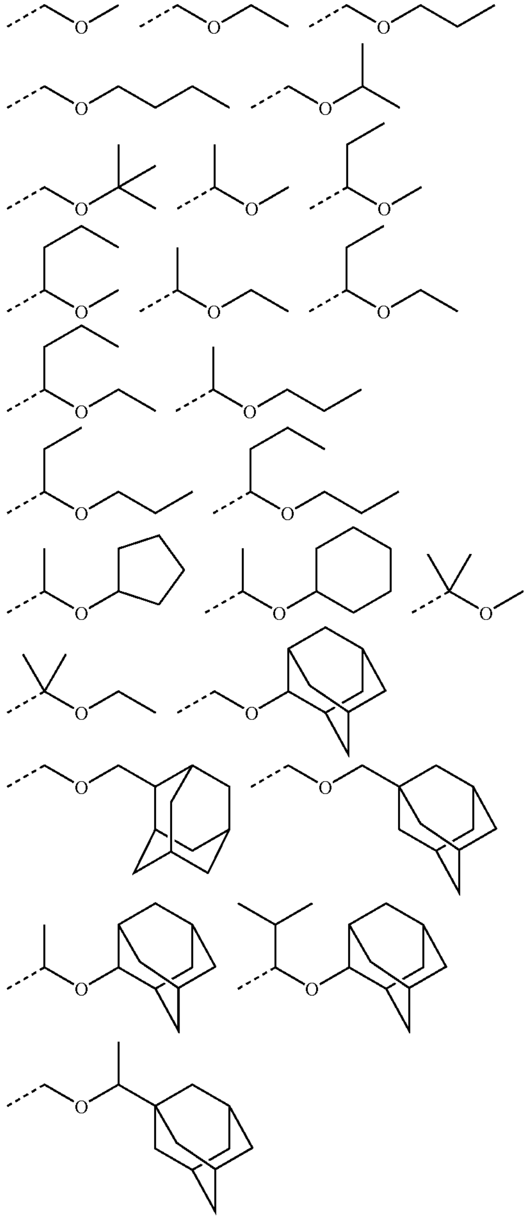

Examples of the cyclic group among the acid labile groups represented by the above-mentioned formula (L1) may include: a tetrahydrofuran-2-yl group, 2-methyltetrahydrofuran-2-yl group, tetrahydropyran-2-yl group, and 2-methyltetrahydropyran-2-yl group.

Examples of the acid labile group represented by the above-mentioned formula (L2) may include: tert-butoxy carbonyl group, tert-butoxy carbonyl methyl group, tert-amyloxy carbonyl group, tert-amyloxy carbonyl methyl group, 1,1-diethyl propyl oxy-carbonyl group, 1,1-diethyl propyloxy carbonyl methyl group, 1-ethylcyclopentyl oxy-carbonyl group, 1-ethylcyclopentyloxy-carbonyl methyl group, 1-ethyl-2-cyclopentenyloxy-carbonyl group, 1-ethyl-2-cyclopentenyloxy-carbonyl methyl group, 1-ethoxy ethoxy carbonyl methyl group, 2-tetrahydro pyranyl oxy-carbonyl methyl group, and 2-tetrahydrofuranyl oxy-carbonyl methyl group.

Examples of the acid labile group represented by the above-mentioned formula (L3) may include: 1-methyl cyclopentyl, 1-ethyl cyclopentyl, 1-n-propyl cyclopentyl, 1-isopropyl cyclopentyl, 1-n-butylcyclopentyl, 1-sec-butylcyclopentyl, 1-cyclohexyl cyclopentyl, 1-(4-methoxybutyl) cyclopentyl, 1-(bicyclo[2.2.1]heptane-2-yl)cyclopentyl, 1-(7-oxabicyclo[2.2.1]heptane-2-yl)cyclopentyl, 1-methyl cyclohexyl, 1-ethyl cyclohexyl, 1-methyl-2-cyclopentenyl, 1-ethyl-2-cyclopentenyl, 1-methyl-2-cyclohexenyl, and 1-ethyl-2-cyclohexenyl.

Most preferred examples of the acid labile group of the above-mentioned formula (L4) are groups represented by the following formulae (L4-1) to (L4-4).

(L4-1)

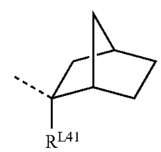

(L4-2)

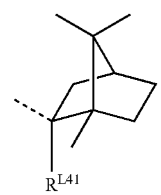

(L4-3)

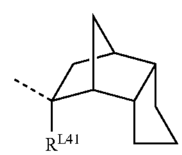

(L4-4)

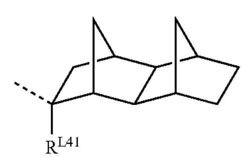

In the general formulae (L4-1) to (L4-4), the broken lines denote bonding positions and bonding directions. $R^{L41}$s independently represent a monovalent hydrocarbon group such as a linear, branched or cyclic alkyl group having 1-10 carbon atoms. Examples thereof may include a methyl group, ethyl group, propyl group, isopropyl group, n-butyl group, sec-butyl group, tert-butyl group, tert-amyl group, n-pentyl group, n-hexyl group, cyclopentyl group, and cyclohexyl group.

The general formulae (L4-1) to (L4-4) can have enantiomers or diastereomers, but the general formulae (L4-1) to (L4-4) are intended to represent all the stereoisomers thereof. Such stereoisomers may be used alone or in combination.

For example, the general formula (L4-3) is intended to represent one or a mixture of two selected from the following formulae (L4-3-1) and (L4-3-2).

(L4-3-1)

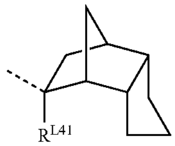

(L4-3-2)

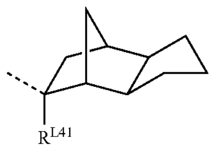

In the formulae, $R^{L41}$s represent the same as above.

The general formula (L4-4) is intended to represent one or a mixture of two or more selected from groups represented by the following formulae (L4-4-1) to (L4-4-4).

(L4-4-1)

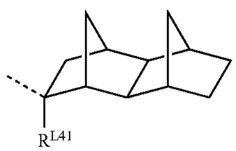

(L4-4-2)

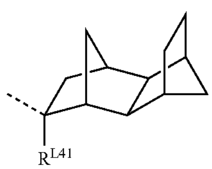

(L4-4-3)

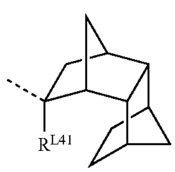

(L4-4-4)

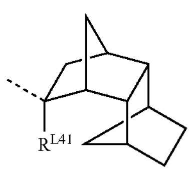

In the formulae, $R^{L41}$s represent the same as above.

The general formulae (L4-1) to (L4-4), (L4-3-1), (L4-3-2), and (L4-4-1) to (L4-4-4) are intended to also represent their enantiomers and mixtures of the enantiomers.

Note that the bonding directions in the formulae (L4-1) to (L4-4), (L4-3-1), (L4-3-2), and (L4-4-1) to (L4-4-4) are on the exo side relative to bicyclo[2,2,1]heptane ring, and which the configuration enables high reactivity in the elimination reaction with an acid catalyst (See Japanese Patent Application Laid-open (kokai) No. 2000-336121). In manufacturing monomers having the bicyclo[2.2.1]heptane structure and having a tertiary exo-alkyl group as a substituent, obtained monomers can contain monomers substituted with endo-alkyl groups represented by the following general formulae (L4-1-endo) to (L4-4-endo). In order to achieve good reactivity, exo ratio is preferably 50% or more, and more preferably 80% or more.

(L4-1-endo)

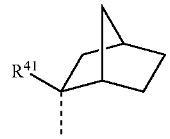

(L4-2-endo)

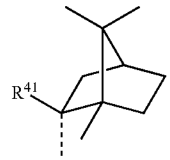

(L4-3-endo)

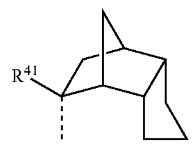

(L4-4-endo)

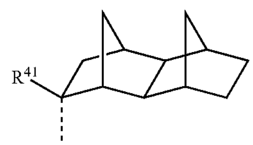

In the formulae, $R^{41}$ s represent the same as the $R^{L41}$s.

Examples of the acid labile groups of the formula (L4) may include the following groups.

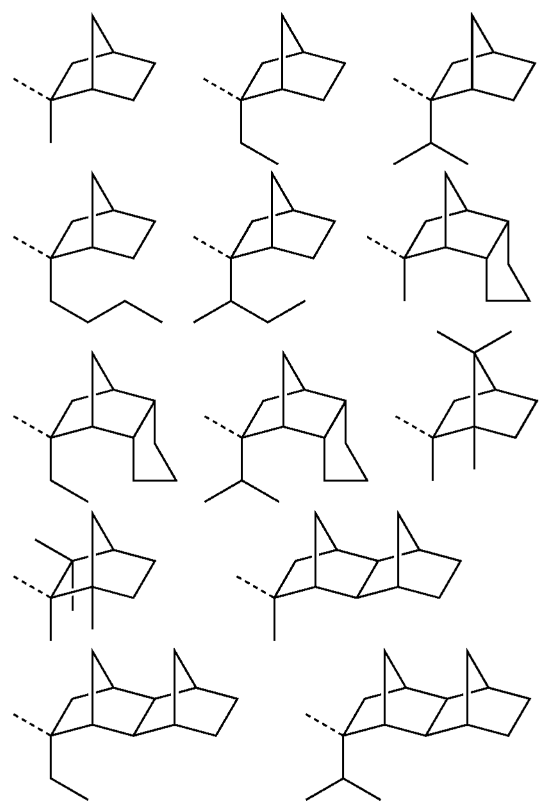

Examples of the tertiary alkyl groups having 4-20 carbon atoms; the trialkylsilyl groups wherein each alkyl group has 1-6 carbon atoms; and the oxoalkyl group having 4-20 carbon atoms may include the same examples described for $R^{L04}$.

Two or more repeating units may be selected from each of the general formulae (12), (13), (14), and (15). By using two or more repeating units from each of the general formulae (12), (13), (14), and (15), the properties of a resist composition to be prepared can be adjusted.
Non-limiting examples of repeating units represented by the general formula (12) may include the following units.
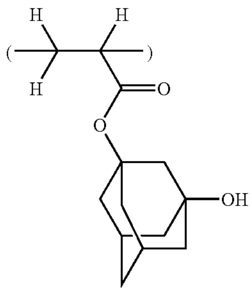
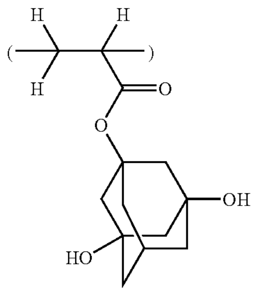
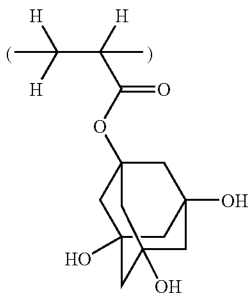
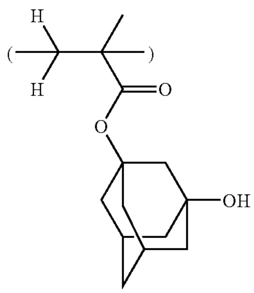
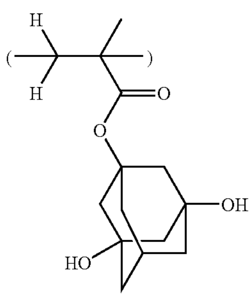
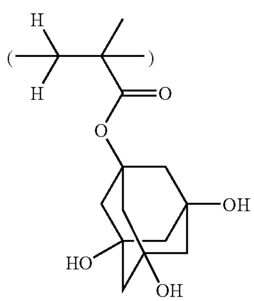
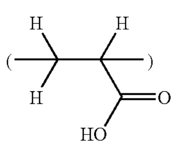
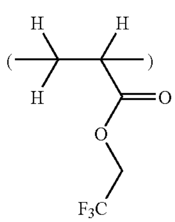
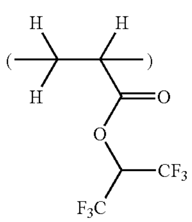
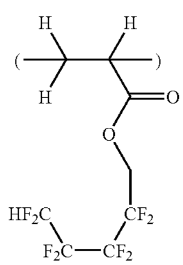
-continued
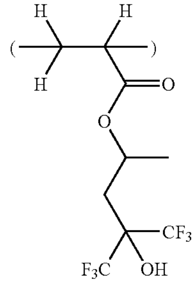
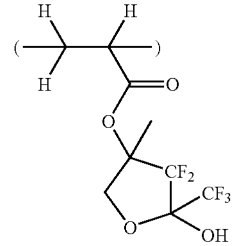
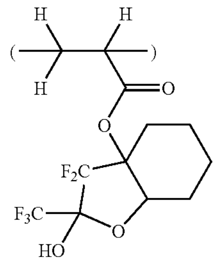
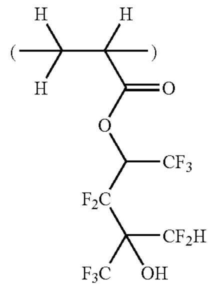
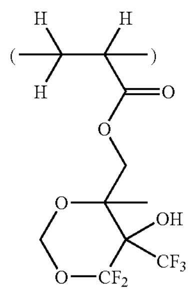
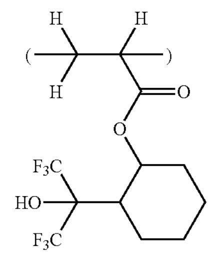
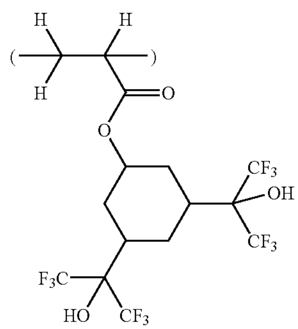
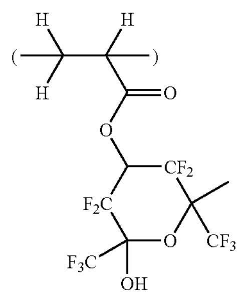
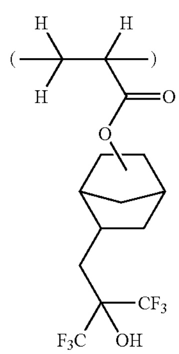
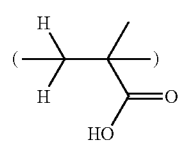

-continued
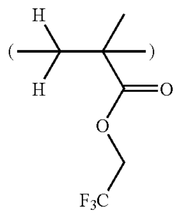
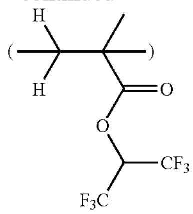
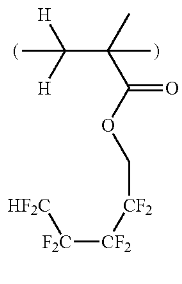
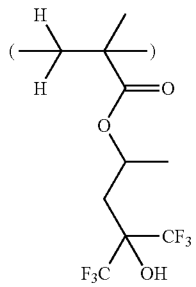
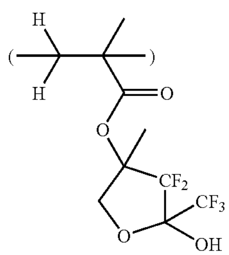
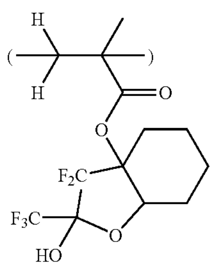
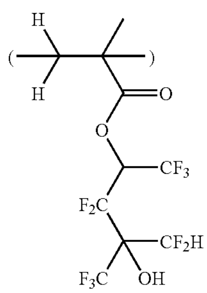
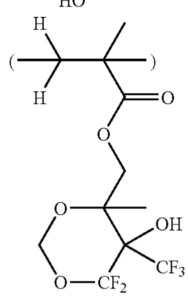
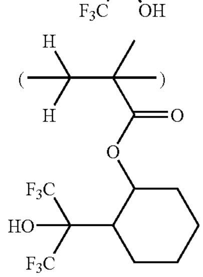
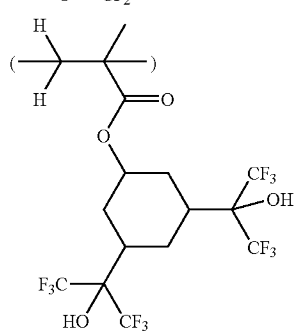
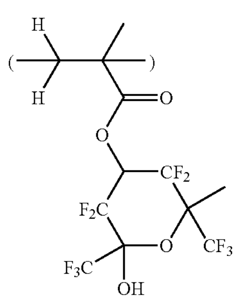
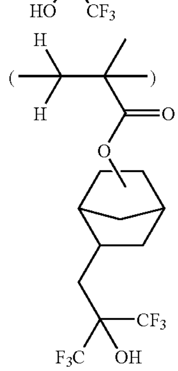
-continued
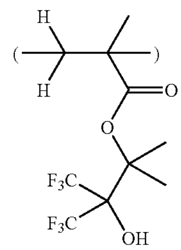
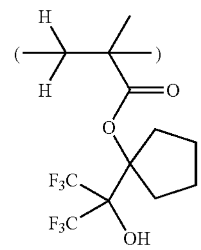
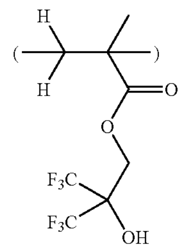
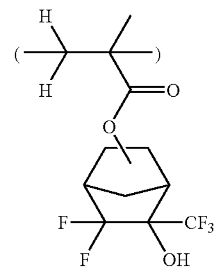
Non-limiting examples of repeating units represented by the general formula (13) may include the following units.
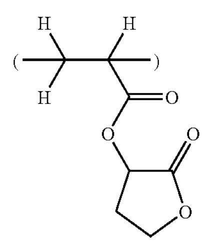
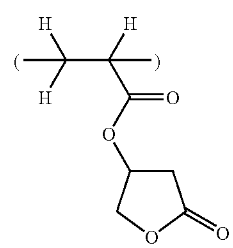
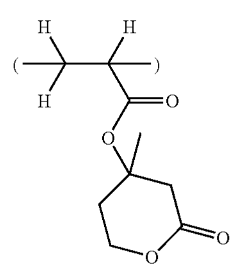
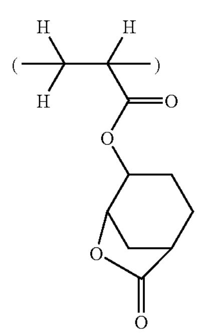
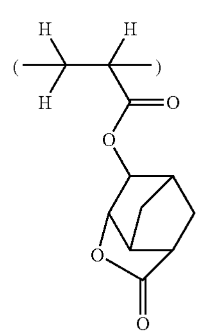
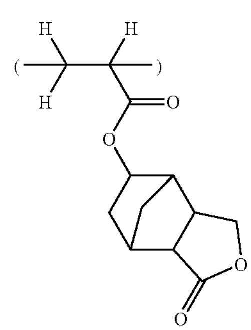

-continued
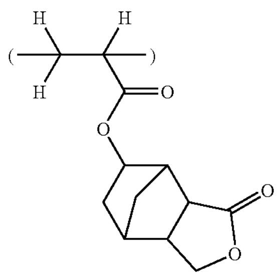
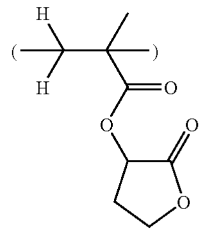
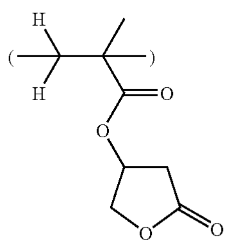
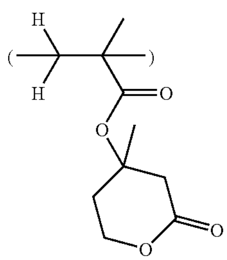
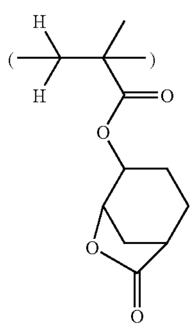
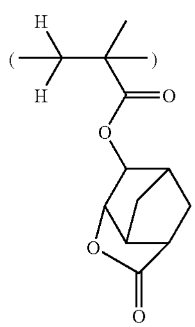
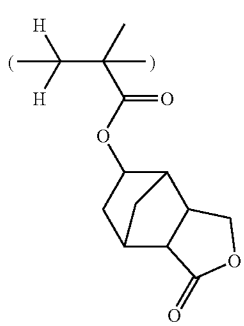
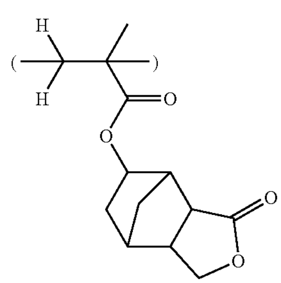
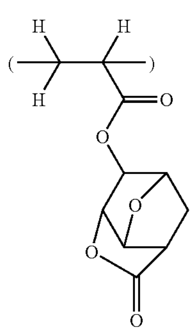
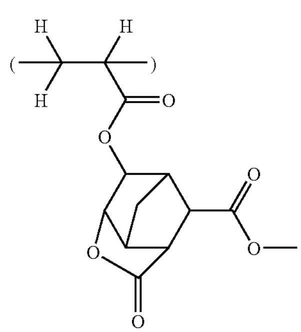
-continued
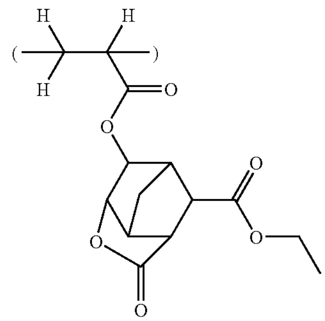
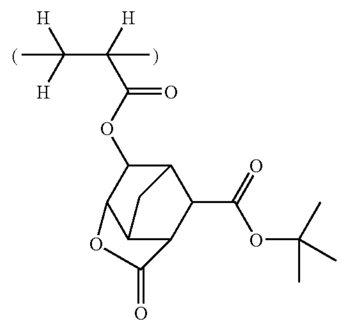
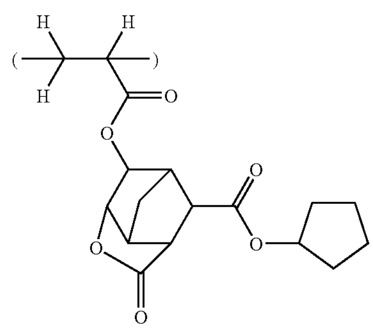
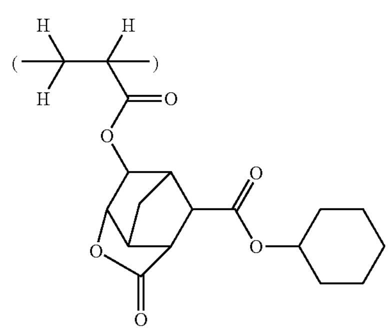
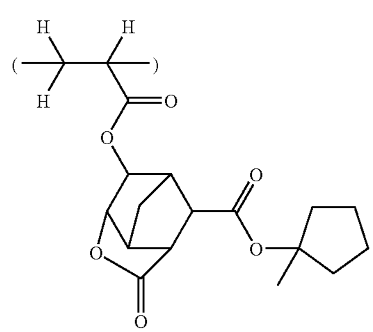

-continued
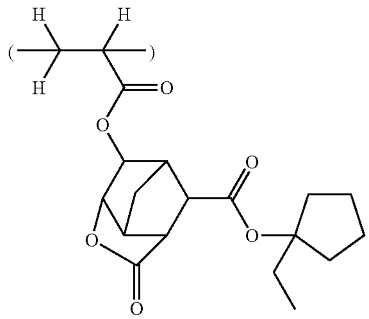
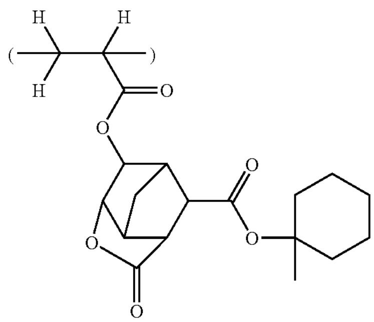
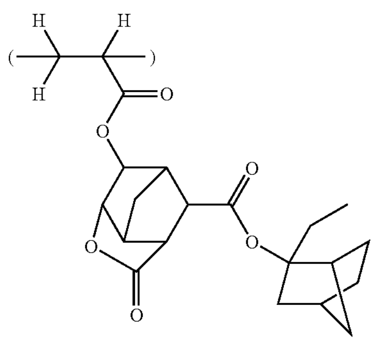
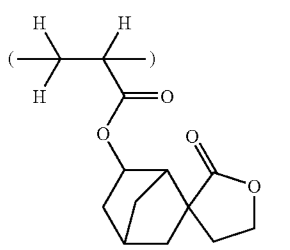
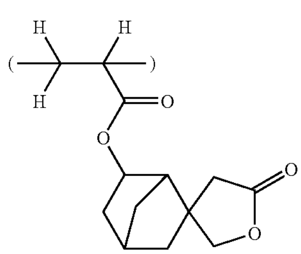
-continued
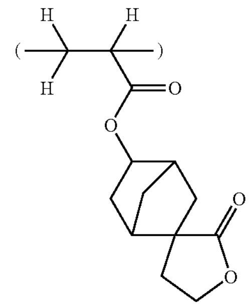
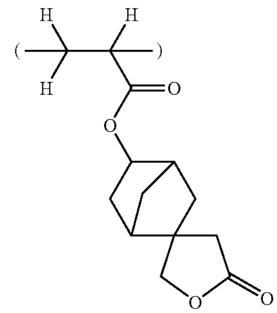
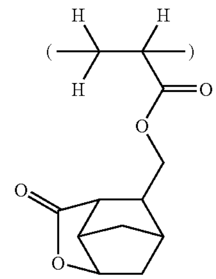
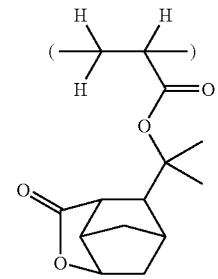
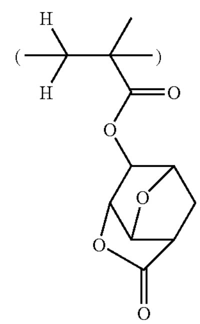
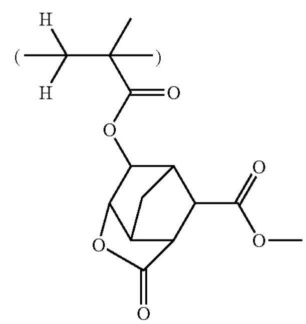
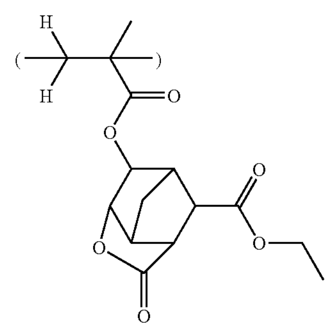
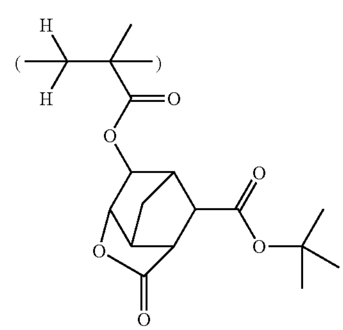

-continued
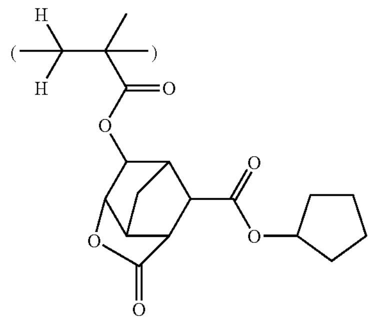
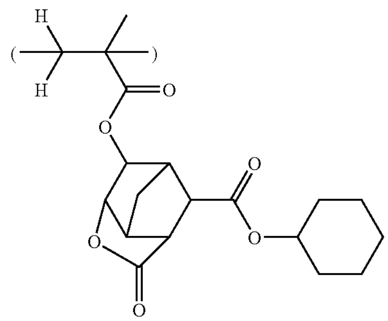
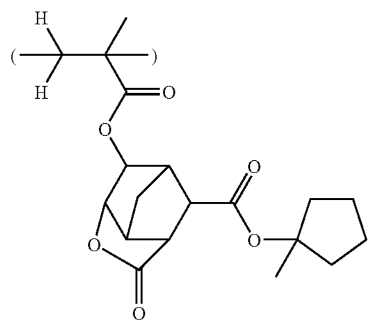
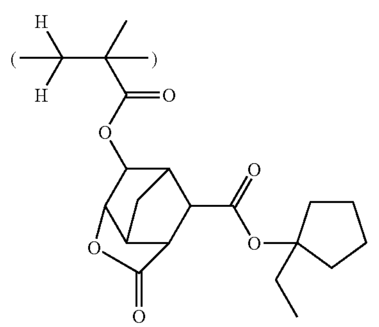
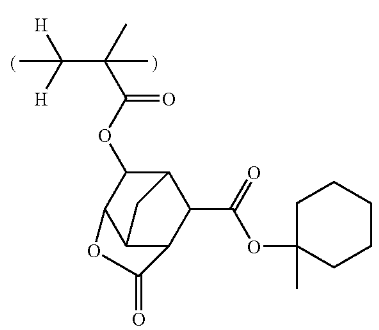
-continued
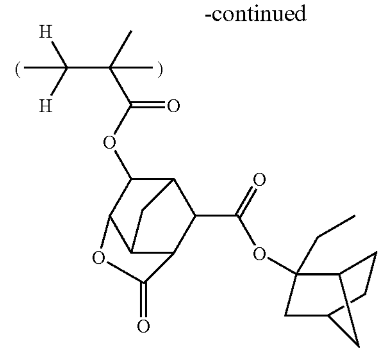
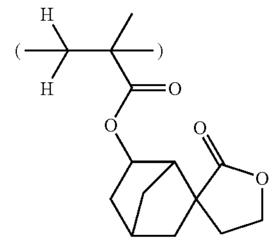
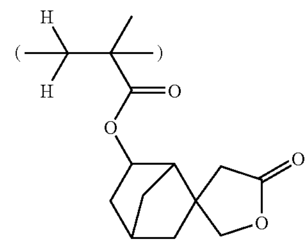
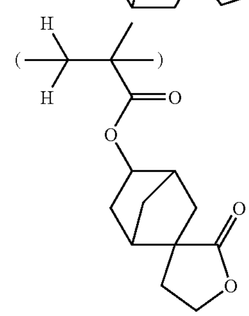
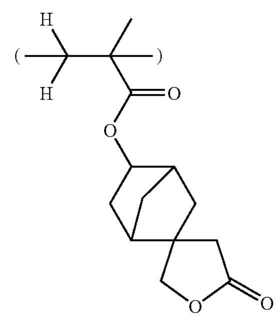
Non-limiting examples of repeating units represented by the general formula (15) may include the following units.
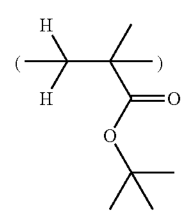
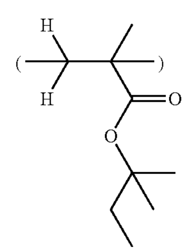
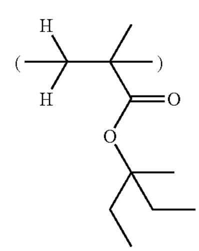
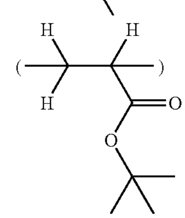

-continued
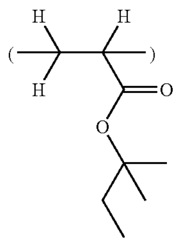
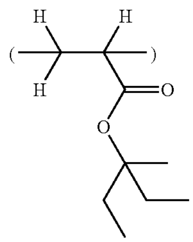
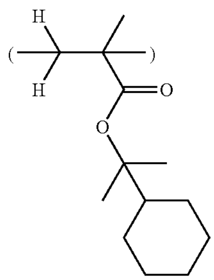
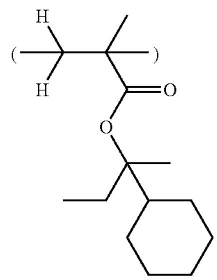
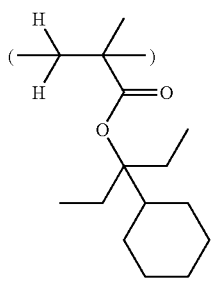
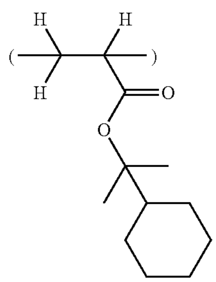
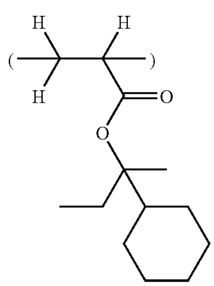
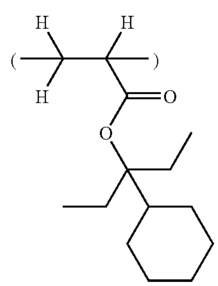
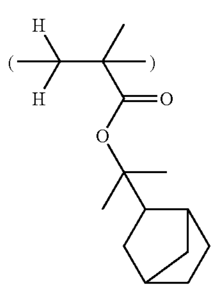
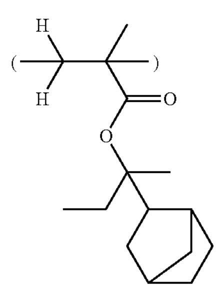
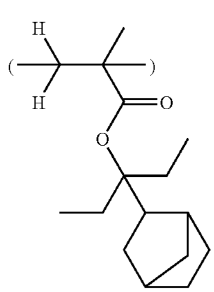
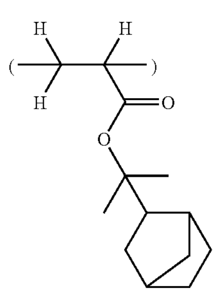
-continued
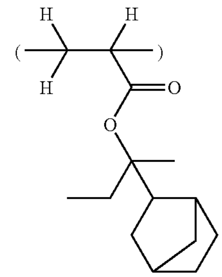
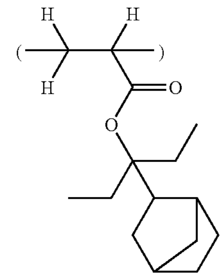
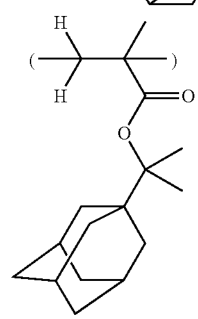
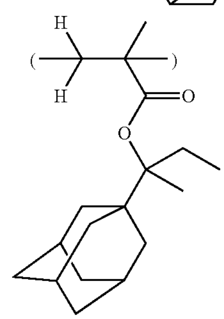
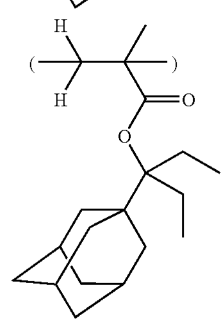
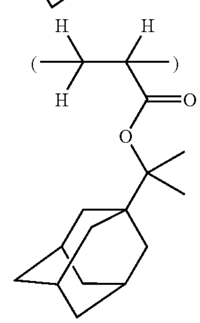
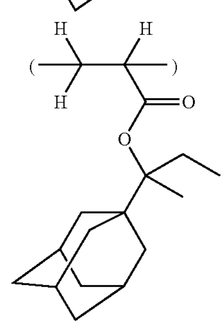
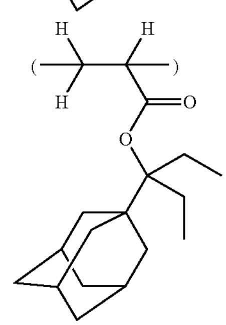
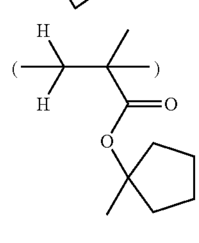
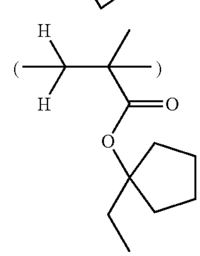
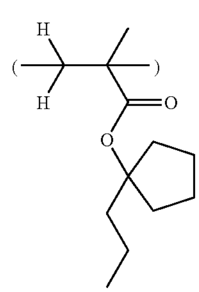
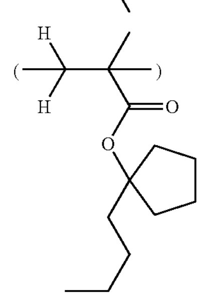

-continued
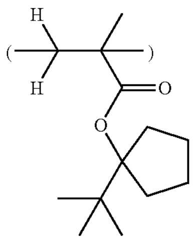
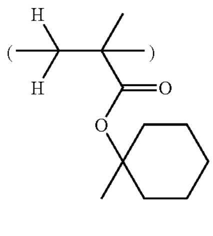
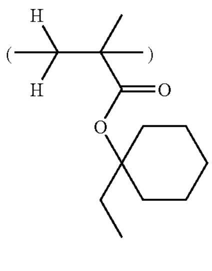
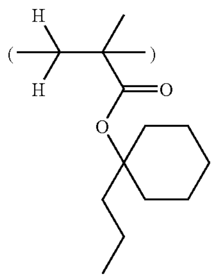
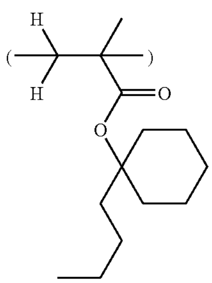
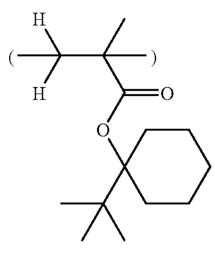
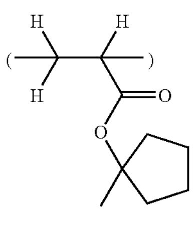
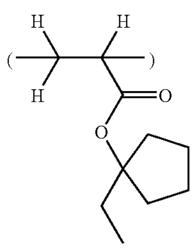
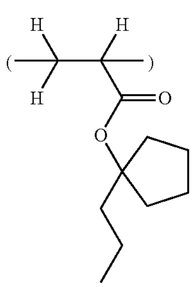
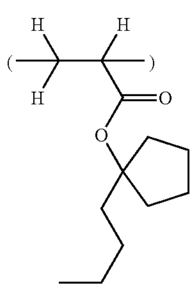
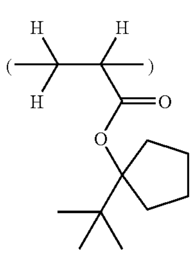
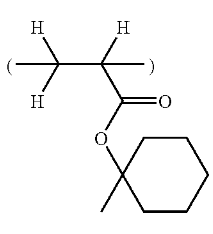
-continued
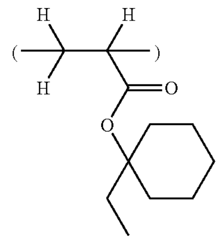
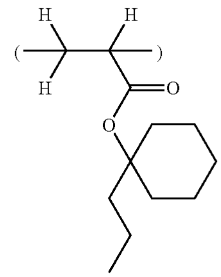
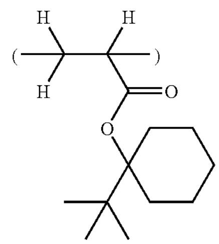
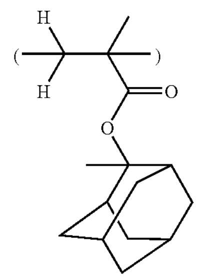
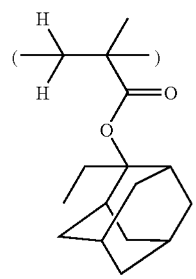
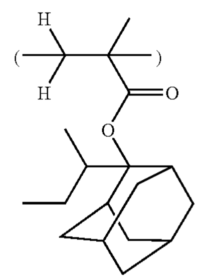
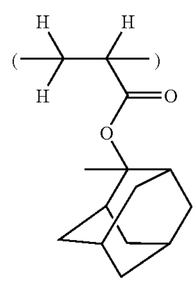
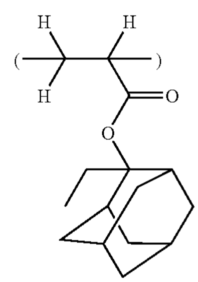
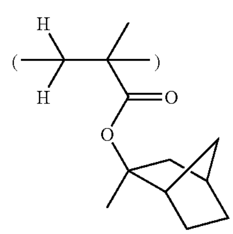
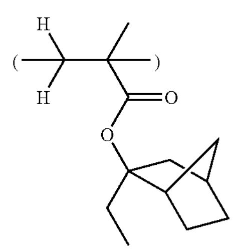
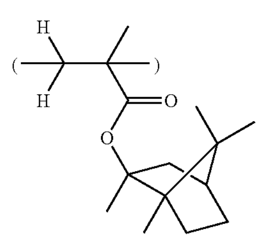
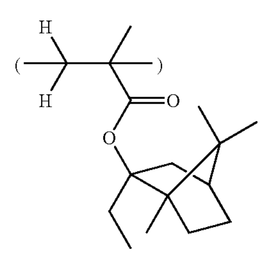

-continued
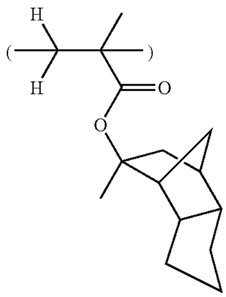
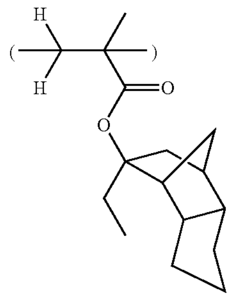
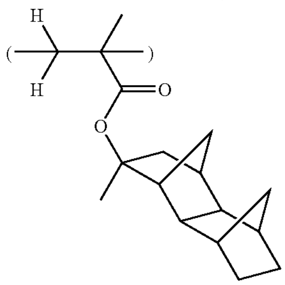
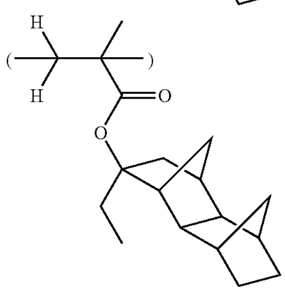
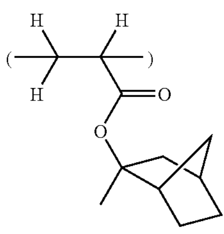
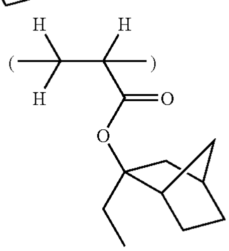
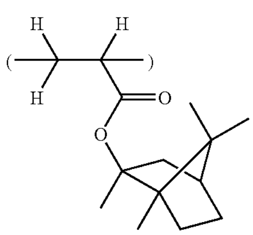
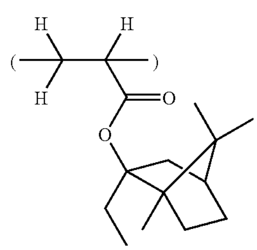
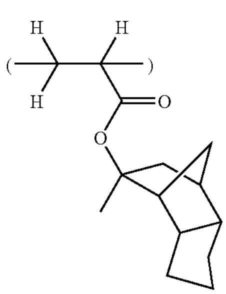
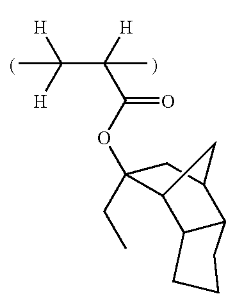
-continued
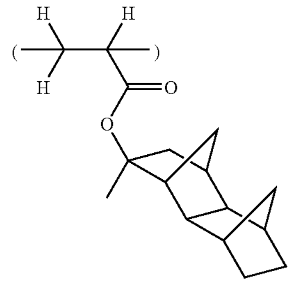
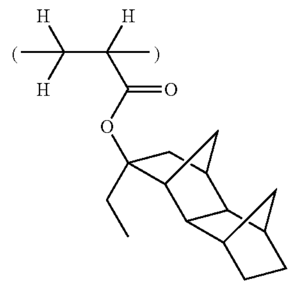
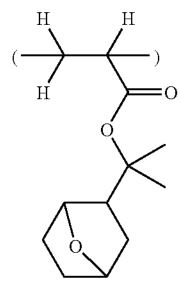
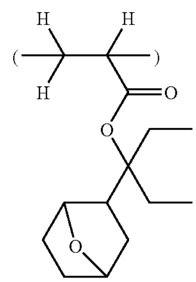
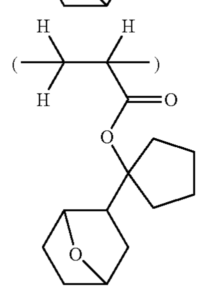
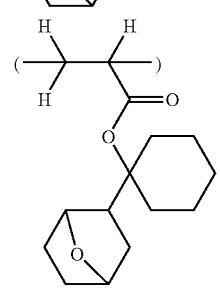
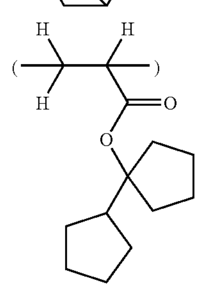
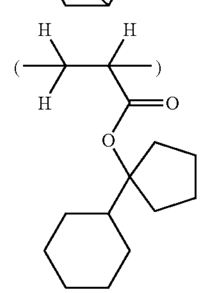
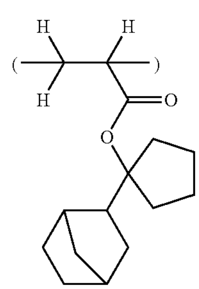
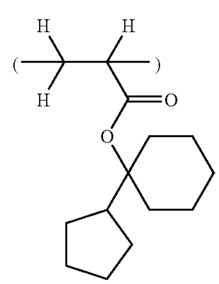

-continued
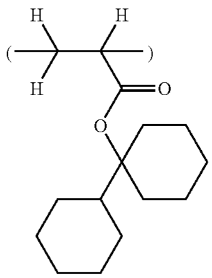
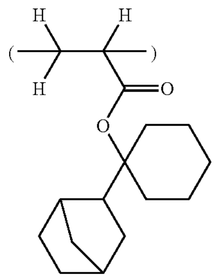
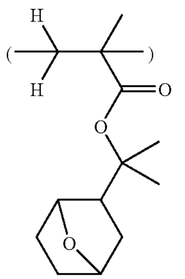
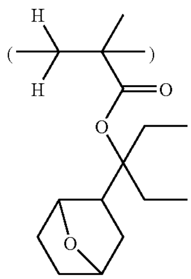
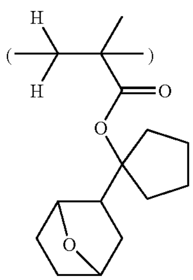
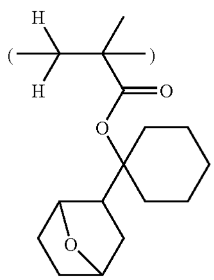
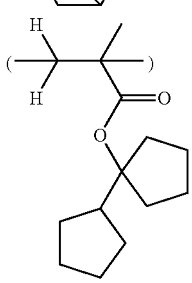
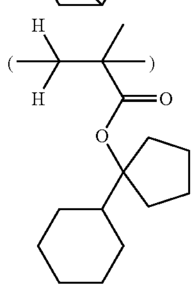
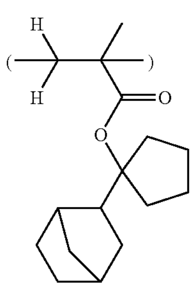
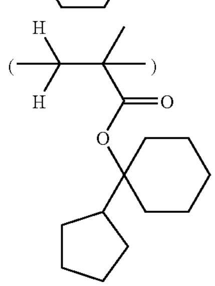
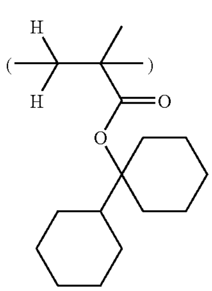
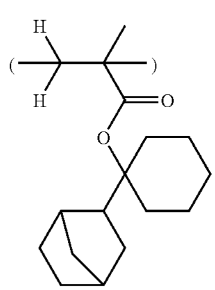
-continued
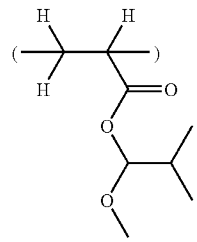
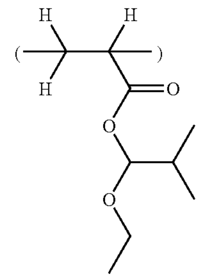
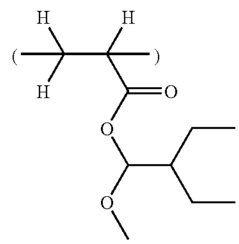
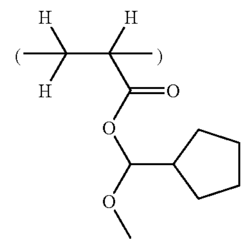
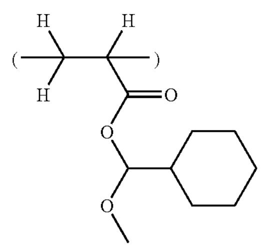
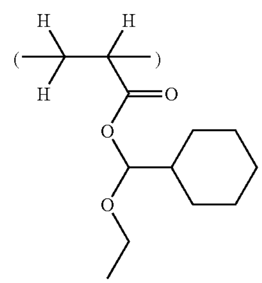
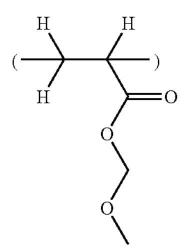
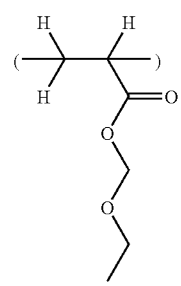
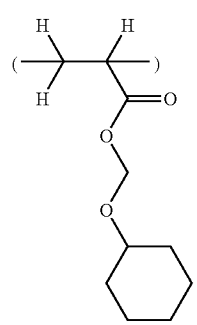
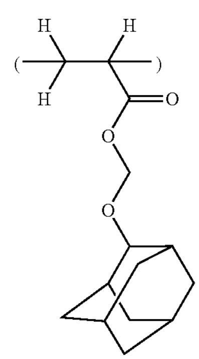

-continued

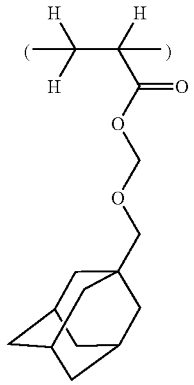
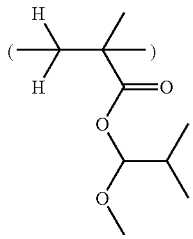
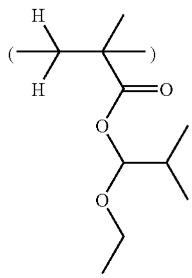
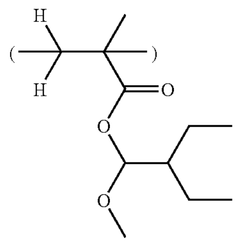
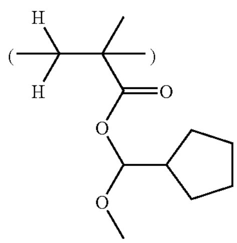
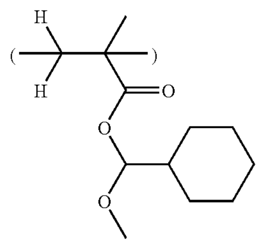
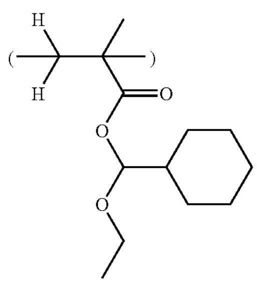
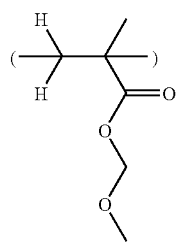
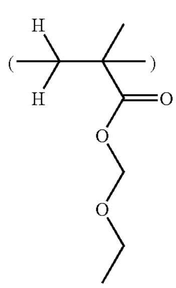
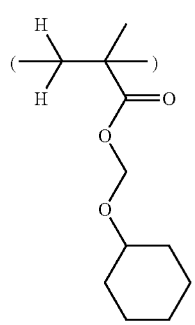

-continued

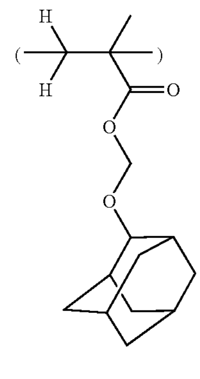
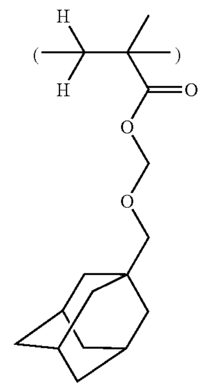

In the case of defining the ratio of the repeating unit represented by the formula (1) as a; the ratio of the repeating unit represented by the formula (12) as b; the ratio of the repeating unit represented by the formula (13) as c; the ratio of the repeating unit represented by the formula (14) as d; the ratio of the repeating unit represented by the formula (15) as e; and a+b+c+d+e=1, the ratios a, b, c, d, and e preferably satisfy the following ranges:

$0<a\leq 0.8$, more preferably $0.05\leq a\leq 0.7$, and still more preferably $0.1\leq a\leq 0.6$;

$0\leq b\leq 0.6$, more preferably $0\leq b\leq 0.5$, and still more preferably $0\leq b\leq 0.4$;

$0\leq c\leq 0.8$, more preferably $0.05\leq c\leq 0.7$, and still more preferably $0.1\leq c\leq 0.6$;

$0\leq d\leq 0.6$, more preferably $0\leq d\leq 0.5$, and still more preferably $0\leq d\leq 0.4$; and $0\leq e\leq 0.6$, more preferably $0\leq e\leq 0.5$, and still more preferably $0\leq e\leq 0.4$.

The mass average molecular weight, measured by gel permeation chromatography (GPC), of the (A) resin component according to the present invention is preferably 1,000 to 50,000, in particular, 2,000 to 30,000 relative to polystyrene.

A resist composition according to the present invention may further comprise another resin component other than (A) a resin component comprising a repeating unit represented by the general formula (1).

Non-limiting examples of the resin component other than (A) a resin component may include polymers that are represented by the following formulae (R1) and/or (R2) and have a mass average molecular weight of 1,000 to 100,000, and preferably 3,000 to 30,000. The mass average molecular weight is relative to polystyrene and measured by gel permeation chromatography (GPC).

(R1)

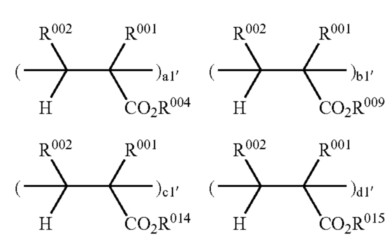

-continued

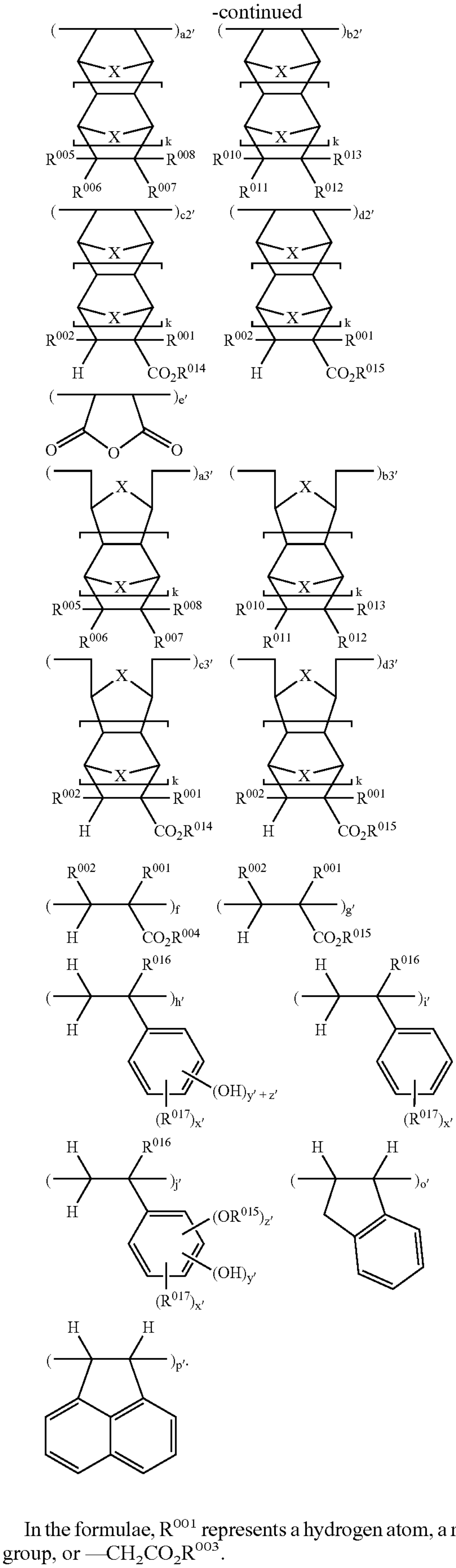

(R2)

In the formulae, $R^{001}$ represents a hydrogen atom, a methyl group, or —$CH_2CO_2R^{003}$.

$R^{002}$ represents a hydrogen atom, a methyl group, or —$CO_2R^{003}$.

$R^{003}$ represents a linear, branched, or cyclic alkyl group having 1-15 carbon atoms. Examples thereof may include: a methyl group, ethyl group, propyl group, isopropyl group, n-butyl group, sec-butyl group, tert-butyl group, tert-amyl group, n-pentyl group, n-hexyl group, cyclopentyl group, cyclohexyl group, ethylcyclopentyl group, butylcyclopentyl group, ethylcyclohexyl group, butylcyclohexyl group, adamantyl group, ethyladamantyl group, and butyladamantyl group.

$R^{004}$ represents a hydrogen atom or a $C_{1-15}$ monovalent hydrocarbon group comprising at least one selected from a fluorine-containing substituent, a carboxy group and a hydroxy group. Examples thereof may include: a hydrogen atom, carboxy ethyl, carboxy butyl, carboxy cyclopentyl, carboxy cyclohexyl, carboxy norbornyl, carboxy adamantyl, hydroxy ethyl, hydroxy butyl, hydroxy cyclopentyl, hydroxy cyclohexyl, hydroxy norbornyl, hydroxy adamantyl, [2,2,2-trifluoro-1-hydroxy-1-(trifluoromethyl)ethyl]cyclohexyl, and bis[2,2,2-trifluoro-1-hydroxy-1-(trifluoromethyl)ethyl]cyclohexyl.

At least one of $R^{005}$ to $R^{008}$ represents a carboxy group or a $C_{1-15}$ monovalent hydrocarbon group comprising at least one selected from a fluorine-containing substituent, a carboxy group, and a hydroxy group; and the remainder of the Rs independently represents a hydrogen atom or a linear, branched, or cyclic alkyl group having 1-15 carbon atoms. Examples of the $C_{1-15}$ monovalent hydrocarbon group comprising at least one selected from a fluorine-containing substituent, a carboxy group, and a hydroxy group may include: carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, [2,2,2-trifluoro-1-hydroxy-1-(trifluoromethyl)ethyl]cyclohexyloxycarbonyl, and bis[2,2,2-trifluoro-1-hydroxy-1-(trifluoromethyl)ethyl]cyclohexyloxycarbonyl.

Examples of the linear, branched, or cyclic alkyl group having 1-15 carbon atoms may include the above-mentioned examples for $R^{003}$.

$R^{005}$ to $R^{008}$ may bond to each other and form a ring. In the case of forming the ring, at least one of $R^{005}$ to $R^{008}$ represents a $C_{1-5}$ divalent hydrocarbon group at least containing one selected from a fluorine-containing substituent, a carboxy group and a hydroxy group; and the remainder of the Rs independently represents a single bond, a hydrogen atom, or a $C_{1-15}$ linear, branched, or cyclic alkyl group. Examples of the $C_{1-15}$ divalent hydrocarbon group at least containing one selected from a fluorine-containing substituent, a carboxy group and a hydroxy group may include groups in which a hydrogen atom is removed from the examples of the monovalent hydrocarbon groups at least containing one selected from a fluorine-containing substituent, a carboxy group and a hydroxy group. Examples of the $C_{1-15}$ linear, branched, or cyclic alkyl group may include the above-mentioned examples for $R^{003}$.

$R^{009}$ represents a $C_{3-15}$ monovalent hydrocarbon group containing —$CO_2$— moiety. Examples thereof may include: 2-oxooxolane-3-yl, 4,4-dimethyl-2-oxooxolane-3-yl, 4-methyl-2-oxooxane-4-yl, 2-oxo-1,3-dioxolane-4-yl methyl, and 5-methyl-2-oxooxolane-5-yl.

At least one of $R^{010}$ to $R^{013}$ represents a $C_{2-15}$ monovalent hydrocarbon group containing —$CO_2$— moiety, and the remainder or the Rs independently represents a hydrogen atom or a $C_{1-15}$ linear, branched, or cyclic alkyl group. Examples of the $C_{2-15}$ monovalent hydrocarbon group containing —$CO_2$— moiety may include: 2-oxo-oxolane-3-yloxy carbonyl, 4,4-dimethyl-2-oxo-oxolane-3-yloxy carbonyl, 4-methyl-2-oxo-oxane-4-yloxy carbonyl, 2-oxo-1,3-dioxolane-4-yl methyloxy carbonyl, and 5-methyl-2-oxo-oxolane-5-yloxy carbonyl. Examples of the $C_{1-15}$ linear, branched, or cyclic alkyl group may include the above-mentioned examples for $R^{003}$.

$R^{010}$ to $R^{013}$ may bond to each other and form a ring. In the case of forming the ring, at least one of $R^{010}$ to $R^{013}$ represents a $C_{1-5}$ divalent hydrocarbon group containing —$CO_2$— moiety, and the remainder of the Rs independently represents a single bond, a hydrogen atom, or a $C_{1-15}$ linear, branched, or cyclic alkyl group. Examples of the $C_{1-5}$ divalent hydrocarbon group containing —$CO_2$— moiety may include: 1-oxo-2-oxapropane-1,3-diyl, 1,3-dioxo-2-oxapropane-1,3-diyl, 1-oxo-2-oxabutane-1,4-diyl, 1,3-dioxo-2-oxabutane-1,4-diyl, and groups in which a hydrogen atom is removed from the examples of the monovalent hydrocarbon groups containing —$CO_2$— moiety. Examples of the $C_{1-15}$ linear, branched, or cyclic alkyl group may include the above-mentioned examples for $R^{003}$.

$R^{014}$ represents a $C_{7-15}$ polycyclic-hydrocarbon group or an alkyl group containing a $C_{7-15}$ polycyclic-hydrocarbon group. Examples thereof may include: norbornyl, bicyclo [3.3.1]nonyl, tricyclo[5.2.1.0$^{2,6}$]decyl, adamantyl, ethyladamantyl, butyladamantyl, norbornylmethyl, and adamantylmethyl.

$R^{015}$ represents an acid labile group, and examples thereof are described later.

$R^{016}$ represents a hydrogen atom or a methyl group.

$R^{017}$ represents a $C_{1-8}$ linear, branched, or cyclic alkyl group. Examples thereof may include: a methyl group, ethyl group, propyl group, isopropyl group, n-butyl group, sec-butyl group, tert-butyl group, tert-amyl group, n-pentyl group, n-hexyl group, cyclopentyl group, and cyclohexyl group.

X represents —$CH_2$ or an oxygen atom.

k represents 0 or 1.

Various acid labile groups may be used as $R^{015}$, and any acid labile group may be used as mentioned above. Examples of $R^{015}$ may include groups represented by the following general formulae (L1) to (L4); tertiary alkyl groups having 4-20 carbon atoms, preferably 4-15 carbon atoms; trialkylsilyl groups each alkyl group of which has 1-6 carbon atoms; and oxoalkyl groups having 4-20 carbon atoms.

(L1)

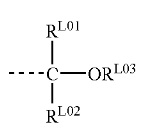

(L2)

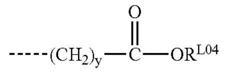

(L3)

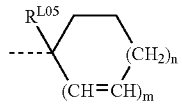

-continued (L4)

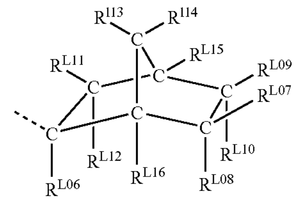

In the formulae, the broken lines denote bonds. $R^{L01}$ and $R^{L02}$ represent a hydrogen atom or a linear, branched or cyclic alkyl group having 1-18, preferably 1-10 carbon atoms. Examples thereof may include: a hydrogen atom, a methyl group, ethyl group, propyl group, isopropyl group, n-butyl group, sec-butyl group, tert-butyl group, cyclopentyl group, cyclohexyl group, 2-ethylhexyl group, n-octyl group, and adamantyl group. $R^{L03}$ represents a monovalent hydrocarbon group having 1-18, preferably 1-10 carbon atoms which may contain a hetero atom such as an oxygen atom. Examples thereof may include: a linear, branched or cyclic alkyl group, and these alkyl groups in which a part of hydrogen atoms is substituted with a hydroxyl group, an alkoxy group, an oxo group, an amino group, an alkyl amino group, and the like. Examples of the linear, branched or cyclic alkyl group may include the same as the $R^{L01}$ and $R^{L02}$. Examples of the substituted alkyl groups may include the following groups.

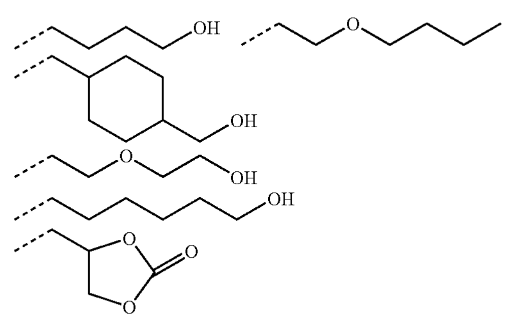

$R^{L01}$ and $R^{L02}$, $R^{L01}$ and $R^{L03}$, and $R^{L02}$ and $R^{L03}$ may bond to each other and form a ring with the carbon atom and/or the oxygen atom, which links to $R^{L01}$ and $R^{L02}$, or $R^{L03}$. Rs forming the ring represents a linear or branched alkylene group having 1-18, preferably 1-10 carbon atoms.

$R^{L04}$ represents a tertiary alkyl group having 4-20, preferably 4-15 carbon atoms, a trialkyl silyl group each alkyl groups of which has 1-6 carbon atoms, an oxoalkyl group having 4-20 carbon atoms, or the group represented by the general formula (L1). Examples of the tertiary alkyl group may include: tert-butyl group, tert-amyl group, 1,1-diethylpropyl group, 2-cyclopentylpropane-2-yl group, 2-cyclohexylpropane-2-yl group, 2-(bicyclo[2.2.1]heptane-2-yl) propane-2-yl group, 2-(adamantane-1-yl)propane-2-yl group, 2-(tricyclo[5.2.1.0$^{2,6}$]decane-8-yl)propane-2-yl group, 2-(tetracyclo[4.4.0.1$^{2,5}$.1$^{7,10}$]dodecane-3-yl)propane-2-yl group, 1-ethylcyclopentyl group, 1-butylcyclopentyl group, 1-ethylcyclohexyl group, 1-butylcyclohexyl group, 1-ethyl-2-cyclopentenyl group, 1-ethyl-2-cyclohexenyl group, 2-methyl-2-adamantyl group, 2-ethyl-2-adamantyl group, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$] dodecyl, and 3-ethyl-3-tetracyclo[4.4.0.1$^{2,5}$.1$^{7,10}$]dodecyl. Examples of the trialkyl silyl group may include: a trimethylsilyl group, triethylsilyl group, and dimethyl-tert-butylsilyl group. Examples of the oxo-alkyl group may include: 3-oxo-cyclohexyl group, 4-methyl-2-oxooxane-4-yl group, and 5-methyl-2-oxooxolane-5-yl group. y is an integer of 0-6.

$R^{L05}$ represents a $C_{1-10}$ linear, branched or cyclic alkyl group that may optionally be substituted, or a $C_{6-20}$ aryl group that may optionally be substituted. Examples of the alkyl group that may optionally be substituted may include: a linear, branched or cyclic alkyl group such as a methyl group, ethyl group, propyl group, isopropyl group, n-butyl group, sec-butyl group, tert-butyl group, tert-amyl group, n-pentyl group, n-hexyl group, cyclopentyl group, cyclohexyl group, or bicyclo[2.2.1]heptyl group; and these groups in which part of hydrogen atoms is substituted with a hydroxy group, alkoxy group, carboxy group, alkoxy carbonyl group, oxo group, amino group, alkyl amino group, cyano group, mercapto group, alkylthio group, or sulfo group, or these groups in which part of methylene groups is substituted with an oxygen atom or a sulfur atom. Examples of the aryl group which may be substituted may include: a phenyl group, methylphenyl group, naphthyl group, anthryl group, phenanthryl group, and pyrenyl group. In the formula (L3), m is 0 or 1, and n is 0, 1, 2, or 3, and m and n satisfy the formula: 2m+n=2 or 3.

$R^{L06}$ represents a $C_{1-10}$ linear, branched or cyclic alkyl group that may optionally be substituted, or a $C_{6-20}$ aryl group that may optionally be substituted. Examples thereof may include the same groups as those for $R^{L05}$.

$R^{L07}$ to $R^{L16}$ independently represent a hydrogen atom or a monovalent $C_{1-15}$ hydrocarbon group. Examples thereof may include: a hydrogen atom; a linear, branched or cyclic alkyl group such as a methyl group, ethyl group, propyl group, isopropyl group, n-butyl group, sec-butyl group, tert-butyl group, tert-amyl group, n-pentyl group, n-hexyl group, n-octyl group, n-nonyl group, n-decyl group, cyclopentyl group, cyclohexyl group, cyclopentyl methyl group, cyclopentyl ethyl group, cyclopentyl butyl group, cyclohexyl methyl group, cyclohexyl ethyl group, or cyclohexyl butyl group; and these groups in which part of hydrogen atoms are substituted with a hydroxy group, alkoxy group, carboxy group, alkoxy carbonyl group, oxo group, amino group, alkyl amino group, cyano group, mercapto group, alkylthio group, or a sulfo group. $R^{L07}$ to $R^{L16}$ may bond to each other, and form a ring (for example, $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, or $R^{L13}$ and $R^{L14}$). In the case of forming the ring, ring-forming Rs represent a $C_{1-15}$ divalent hydrocarbon group and examples thereof may include groups obtained by removing a hydrogen atom from the examples of a monovalent hydrocarbon group. Rs among $R^{L07}$ to $R^{L16}$ bound to adjacent carbon atoms may bond to each other without any groups therebetween, forming a double bond (for example, $R^{L07}$ and $R^{L09}$, $R^{L09}$ and $R^{L15}$, or $R^{L13}$ and $R^{L15}$).

Examples of the linear or branched group among the acid labile groups represented by the above-mentioned formula (L1) may include the following groups.

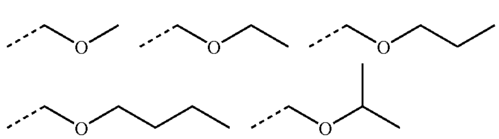

-continued

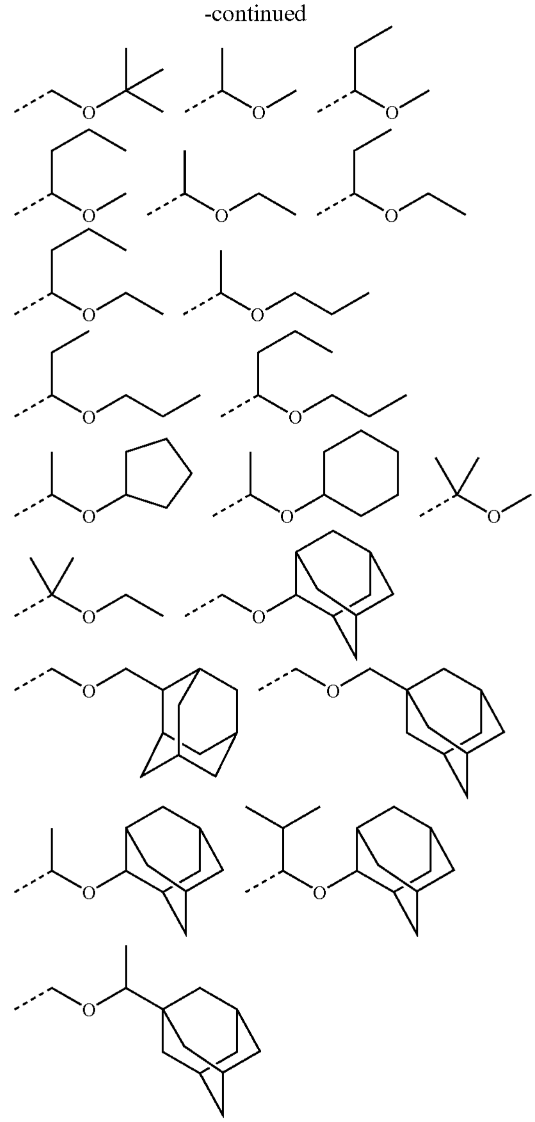

Examples of cyclic acid labile groups represented by the formula (L1) may include: a tetrahydrofuran-2-yl group, 2-methyltetrahydrofuran-2-yl group, tetrahydropyran-2-yl group, and 2-methyltetrahydropyran-2-yl group.

Examples of the acid labile group represented by the formula (L2) may include: tert-butoxy carbonyl group, tert-butoxy carbonyl methyl group, tert-amyloxy carbonyl group, tert-amyloxy carbonyl methyl group, 1,1-diethyl propyl oxy-carbonyl group, 1,1-diethyl propyloxy carbonyl methyl group, 1-ethylcyclopentyl oxy-carbonyl group, 1-ethylcyclopentyloxy-carbonyl methyl group, 1-ethyl-2-cyclopentenyloxy-carbonyl group, 1-ethyl-2-cyclopentenyloxy-carbonyl methyl group, 1-ethoxy ethoxy carbonyl methyl group, 2-tetrahydro pyranyl oxy-carbonyl methyl group, and 2-tetrahydrofuranyl oxy-carbonyl methyl group.

Examples of the acid labile group represented by the formula (L3) may include: 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptane-2-yl)cyclopentyl, 1-(7-oxabicyclo[2.2.1]heptane-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl.

Most preferred examples of the acid labile group of the formula (L4) are groups represented by the following formulae (L4-1) to (L4-4).

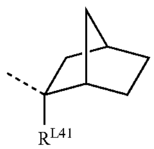

(L4-1)

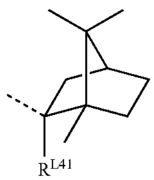

(L4-2)

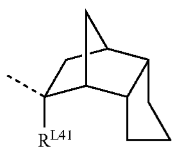

(L4-3)

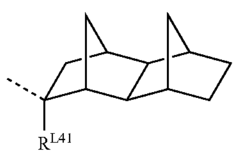

(L4-4)

In the general formulae (L4-1) to (L4-4), the broken lines denote bonding positions and bonding directions. $R^{L41}$s independently represent a monovalent hydrocarbon group such as a linear, branched or cyclic alkyl group having 1-10 carbon atoms. Examples thereof may include a methyl group, ethyl group, propyl group, isopropyl group, n-butyl group, sec-butyl group, tert-butyl group, tert-amyl group, n-pentyl group, n-hexyl group, cyclopentyl group, and cyclohexyl group.

The general formulae (L4-1) to (L4-4) can have enantiomers or diastereomers, but the general formulae (L4-1) to (L4-4) are intended to represent all the stereoisomers thereof. Such stereoisomers may be used alone or in combination.

For example, the general formula (L4-3) is intended to represent one or a mixture of two selected from the groups represented by the following formulae (L4-3-1) and (L4-3-2).

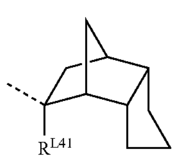

(L4-3-1)

-continued

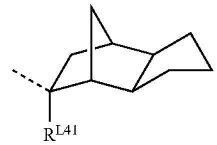

(L4-3-2)

In the formulae, $R^{L41}$s represent the same as above.

The general formula (L4-4) is intended to represent one or a mixture of two or more selected from the groups represented by the following formulae (L4-4-1) to (L4-4-4).

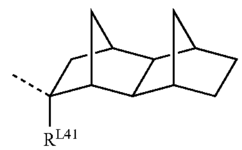

(L4-4-1)

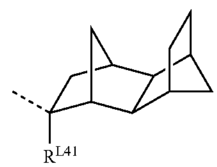

(L4-4-2)

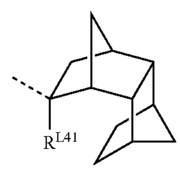

(L4-4-3)

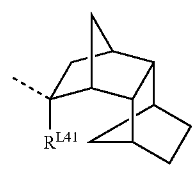

(L4-4-4)

In the formulae, $R^{L41}$s represent the same as above.

The general formulae (L4-1) to (L4-4), (L4-3-1), (L4-3-2), and (L4-4-1) to (L4-4-4) are intended to also represent their enantiomers and mixtures of the enantiomers.

Note that the bonding directions in the general formulae (L4-1) to (L4-4), (L4-3-1), (L4-3-2), and (L4-4-1) to (L4-4-4) are on the exo side relative to bicyclo[2,2,1]heptane ring, and which the configuration enables high reactivity in the elimination reaction with an acid catalyst (See Japanese Patent Application Laid-open (kokai) No. 2000-336121). In manufacturing monomers having the bicyclo[2.2.1]heptane structure and having a tertiary exo-alkyl group as a substituent, obtained monomers can contain monomers substituted with endo-alkyl groups represented by the following general formulae (L4-1-endo) to (L4-4-endo). In order to achieve good reactivity, exo ratio is preferably 50% or more, and more preferably 80% or more.

(L4-1-endo)

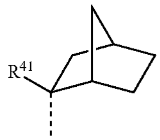

(L4-2-endo

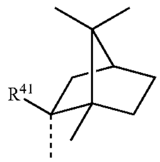

(L4-3-endo

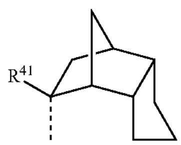

(L4-4-endo)

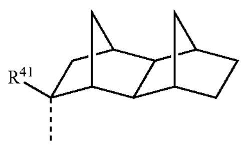

In the formulae, $R^{L41}$s represent the same as the $R^{L41}$s.

Examples of the acid labile groups of the formula (L4) may include the following groups.

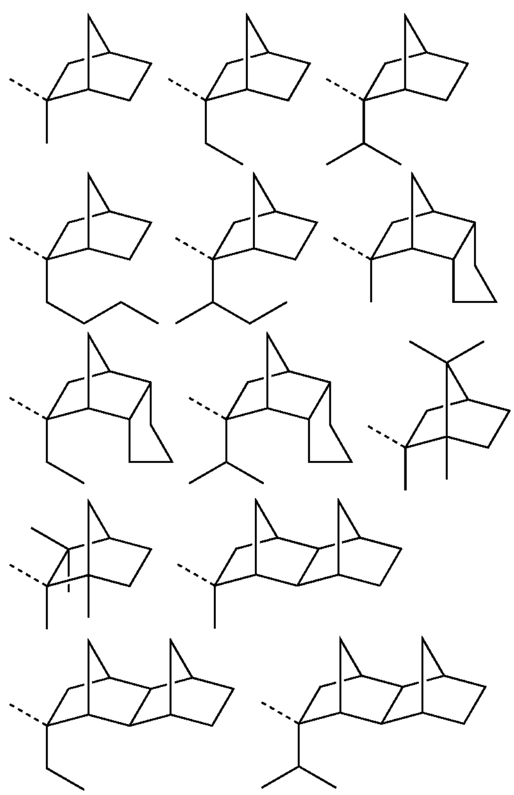

Examples of the tertiary alkyl groups having 4-20 carbon atoms; the trialkylsilyl groups wherein each alkyl group has 1-6 carbon atoms; and the oxoalkyl group having 4-20 carbon atoms may include the examples described for $R^{L04}$.

$R^{016}$ represents a hydrogen atom or a methyl group. $R^{017}$ represents a $C_{1-8}$ linear, branched, or cyclic alkyl group.

In formulae (R1), a1', a2', a3', b1', b2', b3', c1', c2', c3', d1', d2', d3', and e' are numbers in the range of 0 to less than 1, and satisfy the relationship a1'+a2'+a3'+b1'+b2'+b3'+c1'+c2'+c3'+d1'+d2'+d3'+e'=1.

In formulae (R2), f', g', h', i', j', o', and p' are numbers in the range of 0 to less than 1, and satisfy the relationship f'+g'+h'+i'+j'+o'+p'1. x', y', and z' are integers of 0 to 3, and satisfy the relationship 1≤x'+y'+z'≤5, and 1≤y'+z'≤3.

Two or more repeating units in terms of each of formulae (R1) and (R2) may be incorporated into (A) a resin component. By using two or more repeating units from each of the formulae (R1) and (R2), the properties of a resist composition to be prepared can be adjusted.

The condition that the sum of the repeating units is 1 means that the sum of the units is 100 mole % to the sum of the whole repeating units in a polymer comprising the units.

Non-limiting examples of repeating units in (R1) incorporated into the (A) resin component with the composition ratio a1' and repeating units in (R2) incorporated into the (A) resin component with the composition ratio f' may include the following units.

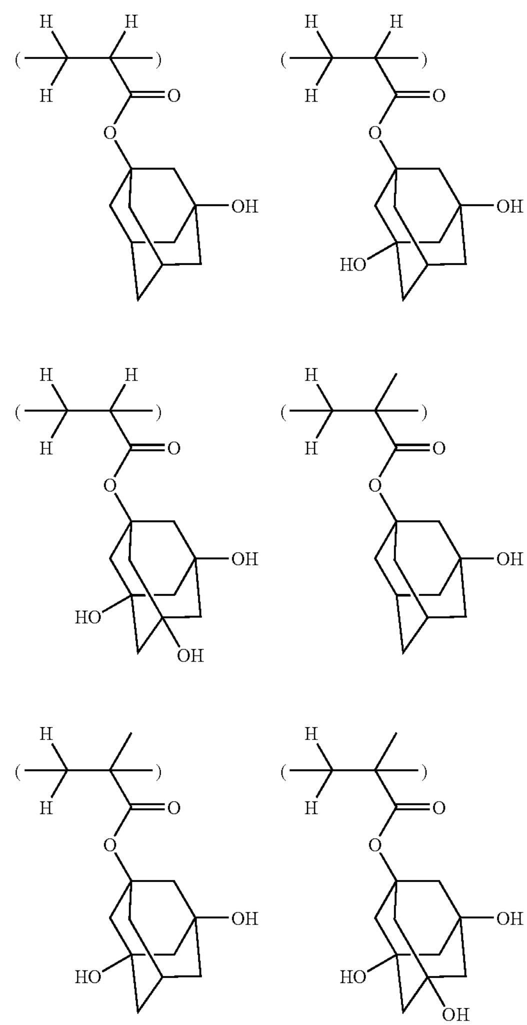

-continued
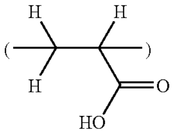
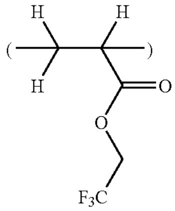
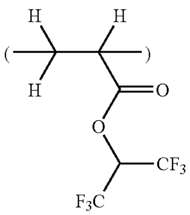
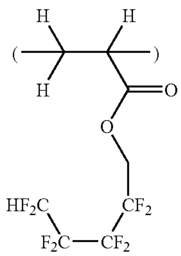
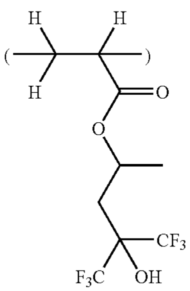
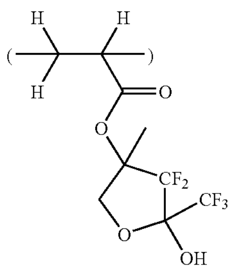
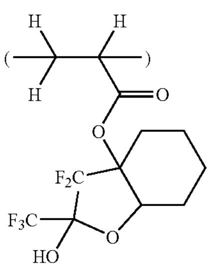
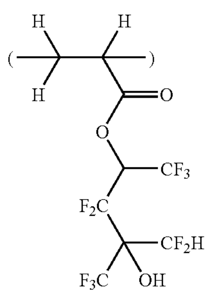
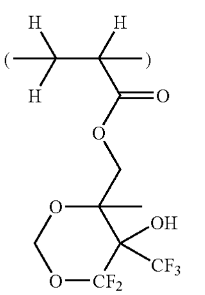
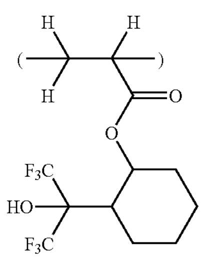
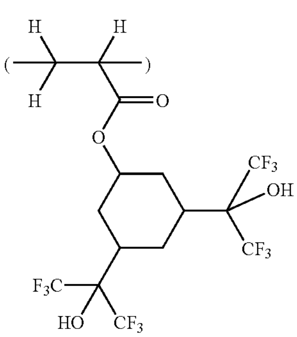
-continued
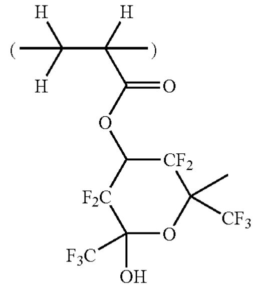
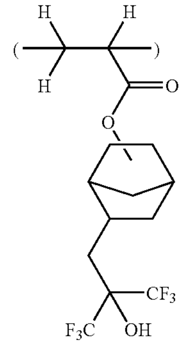
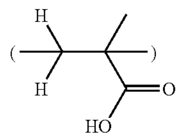
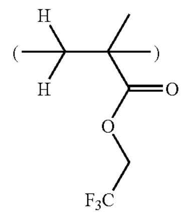
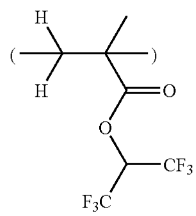
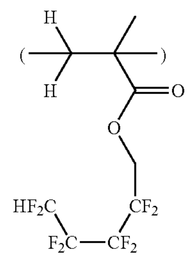
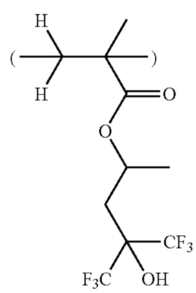
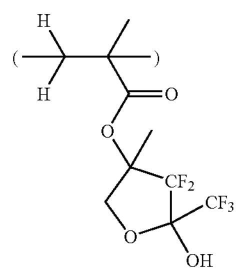
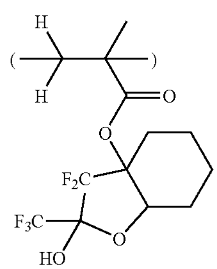
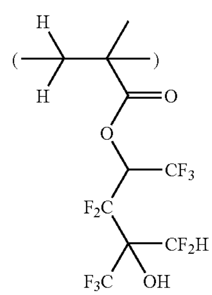
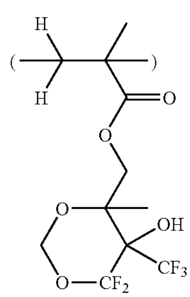
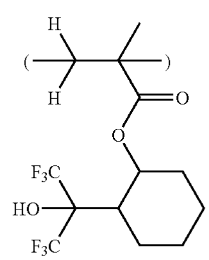

-continued
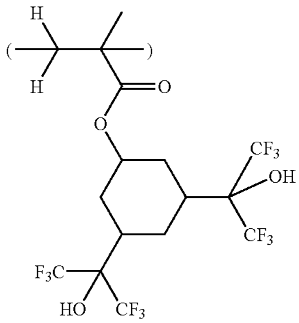
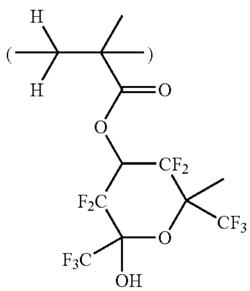
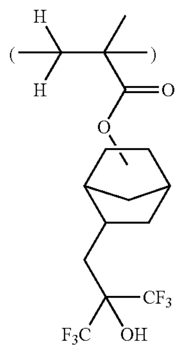
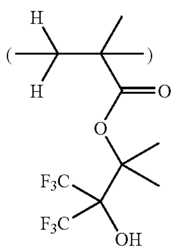
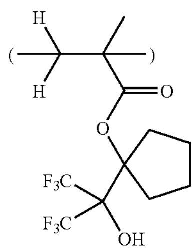
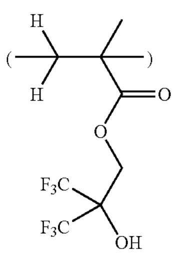
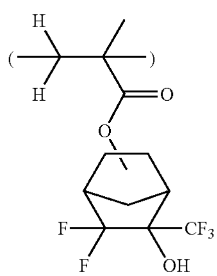
Non-limiting examples of repeating units in (R1) incorporated into the (A) resin component with the composition ratio b1' may include the following units.
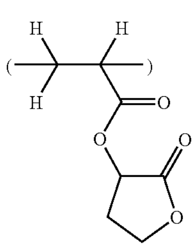
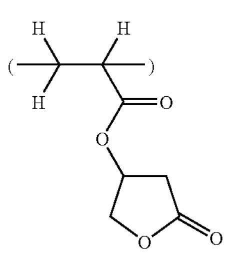
-continued
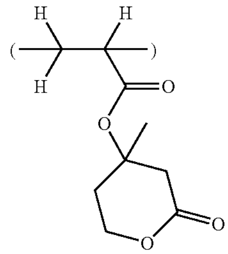
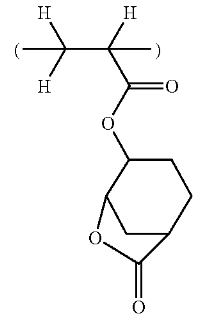
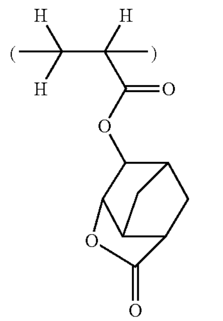
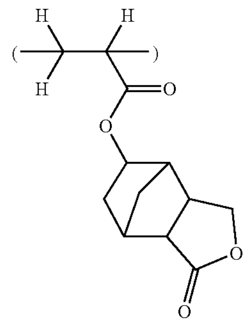
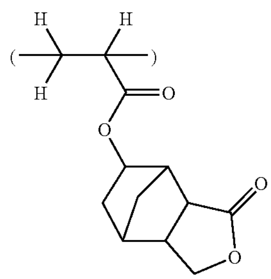
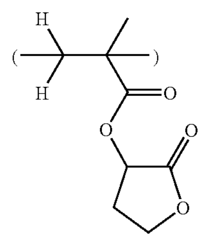
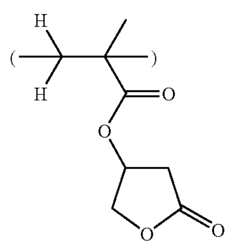
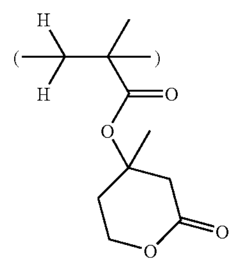
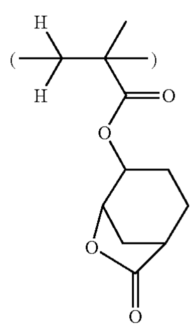
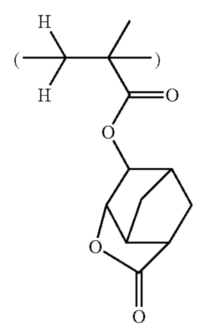

-continued
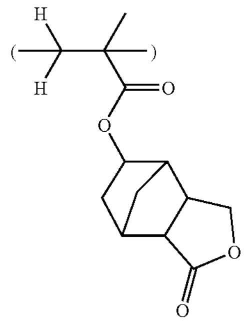
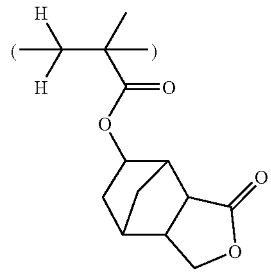
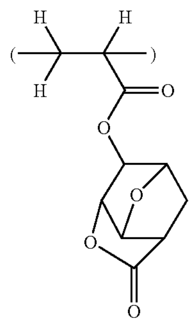
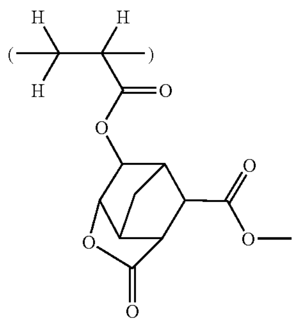
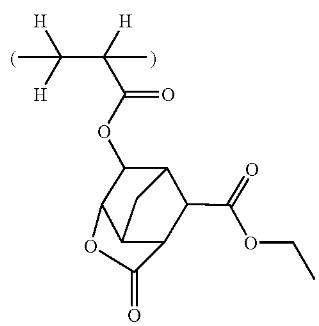
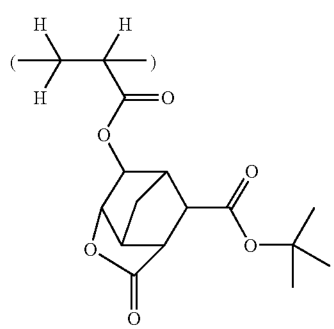
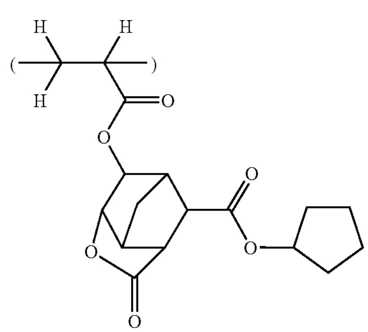
-continued
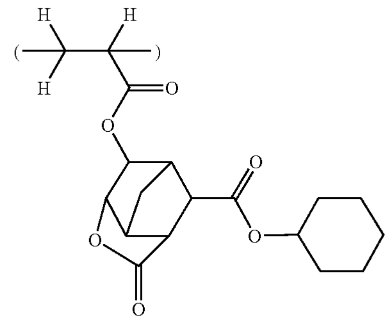
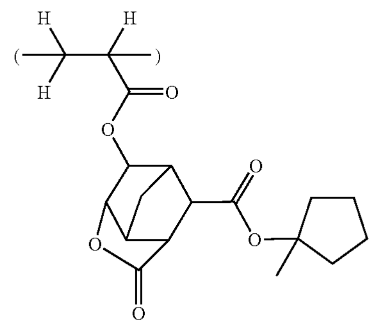
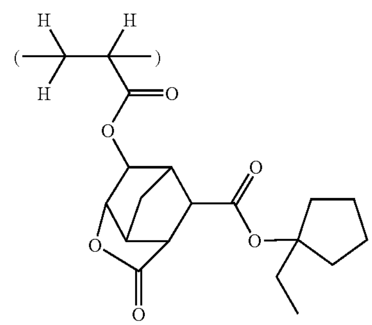
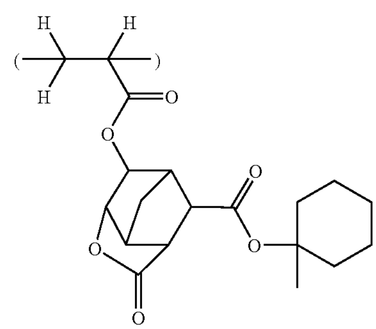
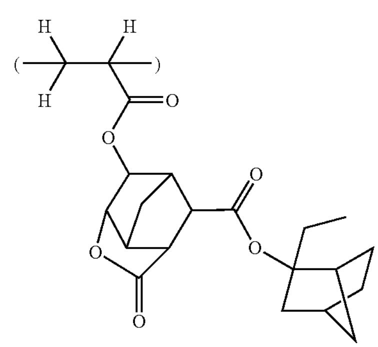

-continued
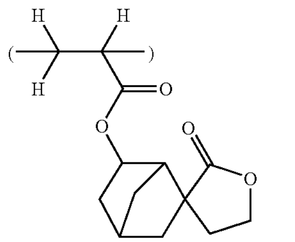
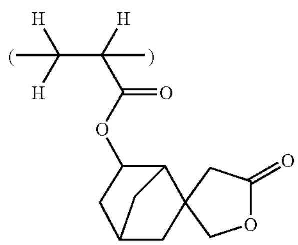
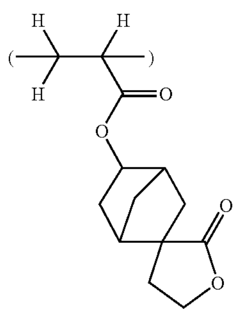
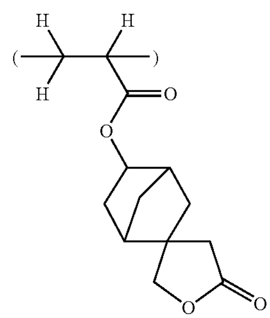
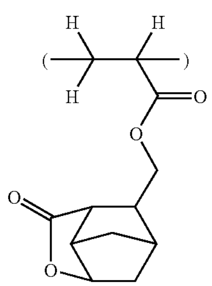
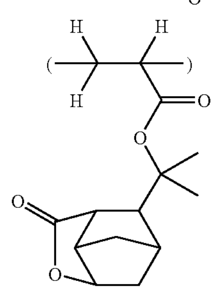
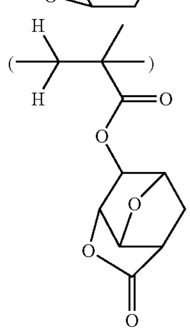
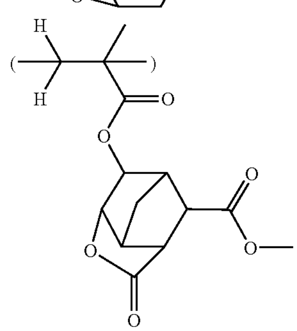
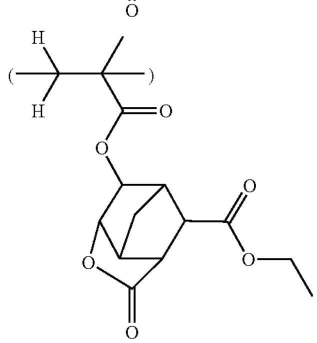
-continued
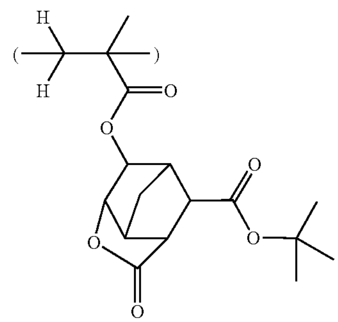
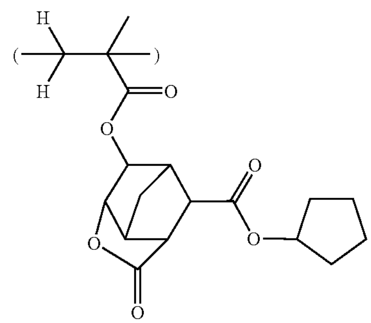
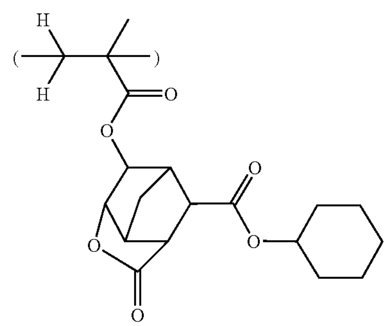
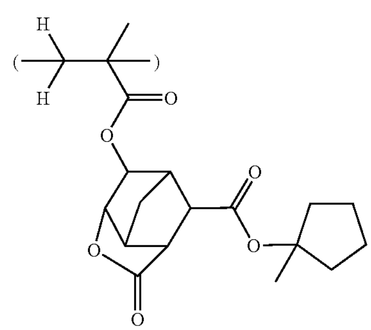
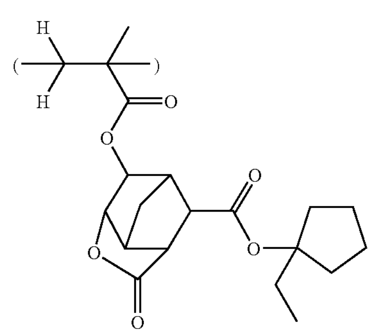

-continued
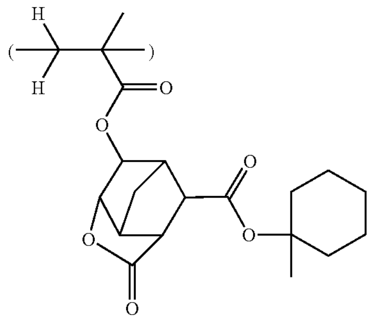
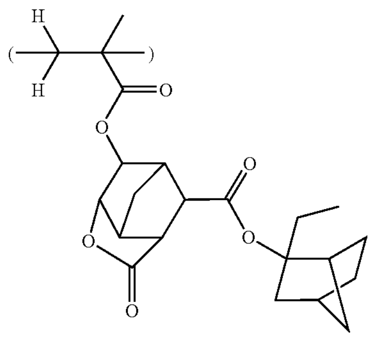
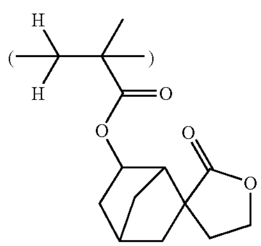
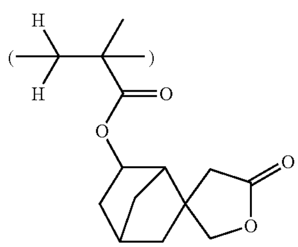
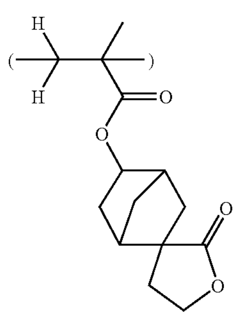
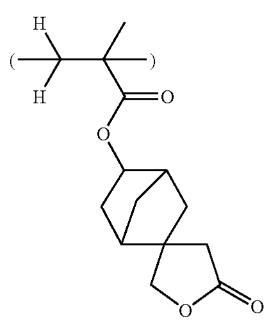
Non-limiting examples of repeating units in (R1) incorporated into the (A) resin component with the composition ratio d1' and repeating units in (R2) incorporated into the (A) resin component with the composition ratio g' may include the following units.
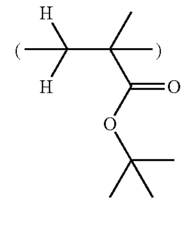
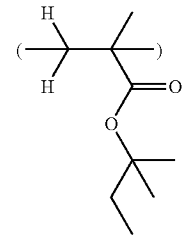
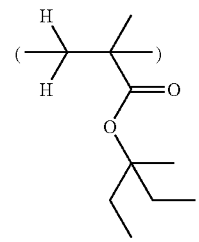
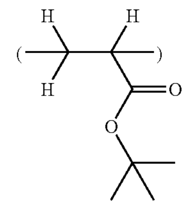
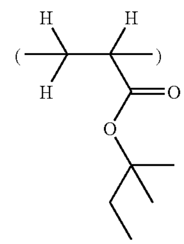
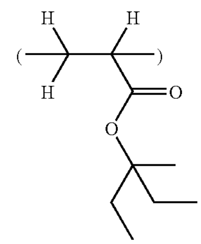
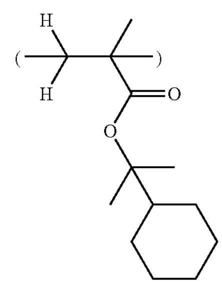
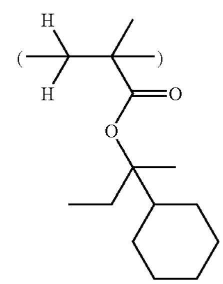
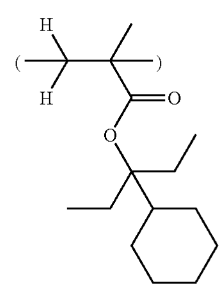
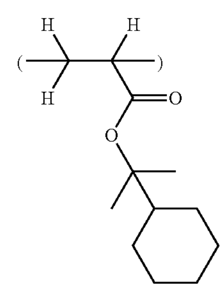
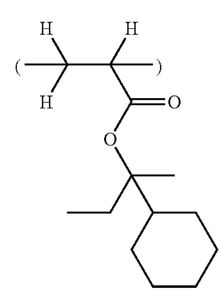
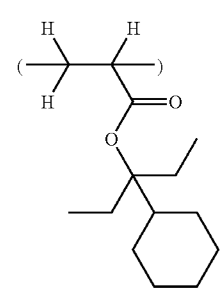

-continued
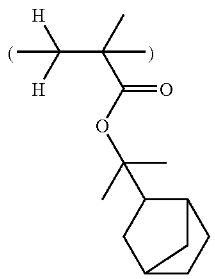
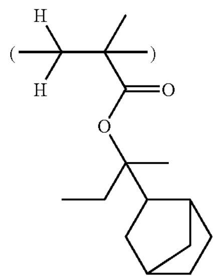
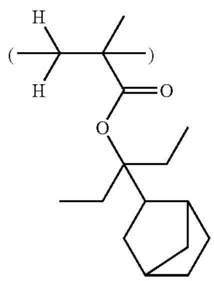
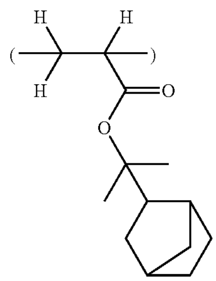
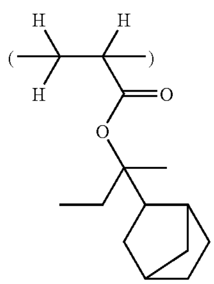
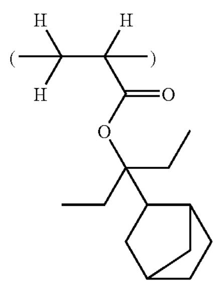
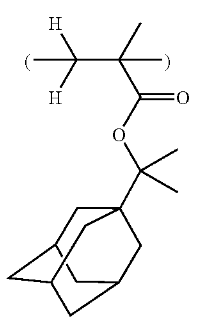
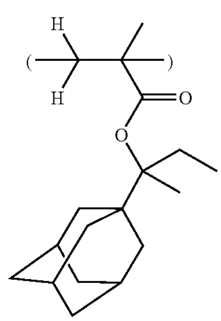
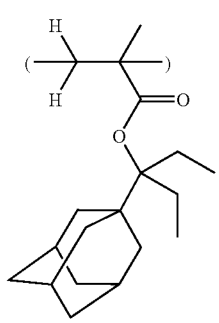
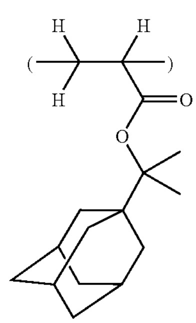
-continued
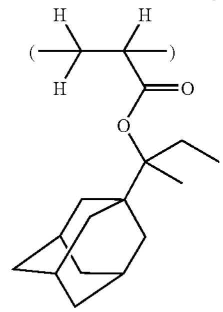
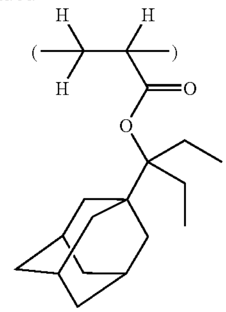
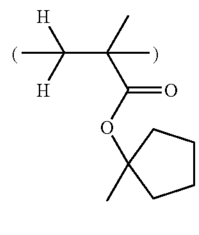
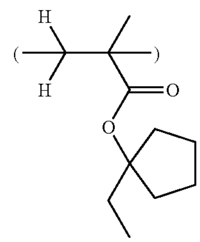
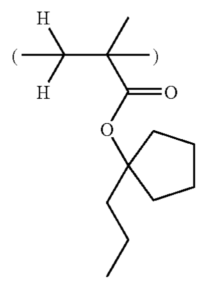
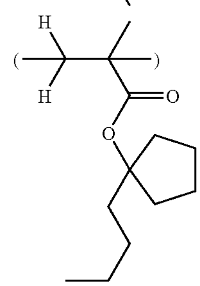
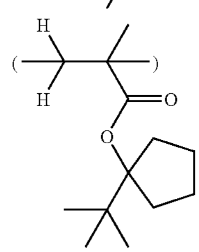
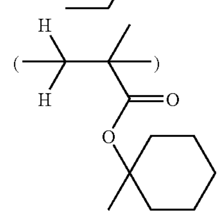
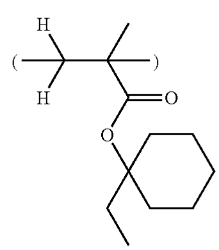
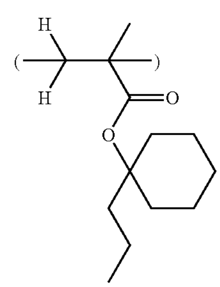
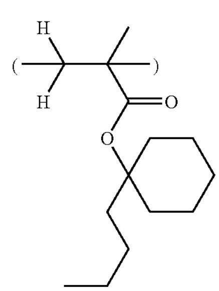
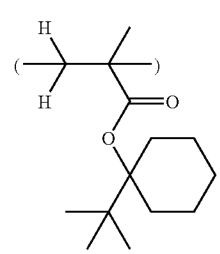

-continued
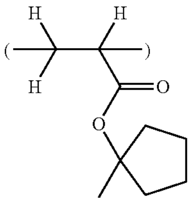
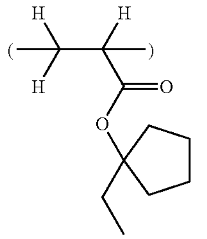
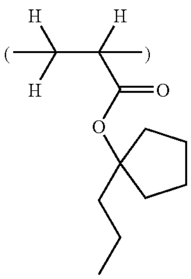
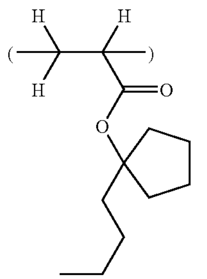
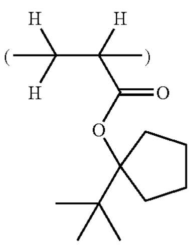
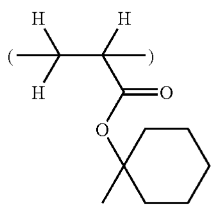
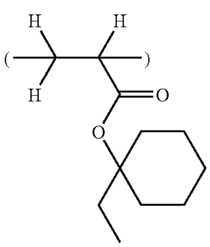
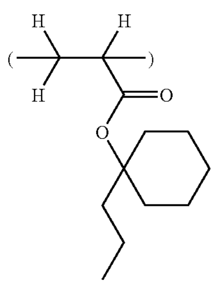
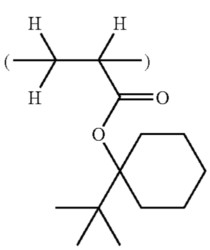
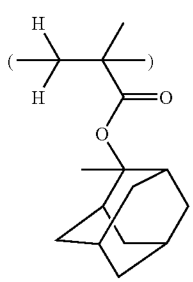
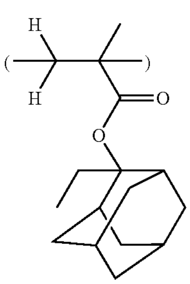
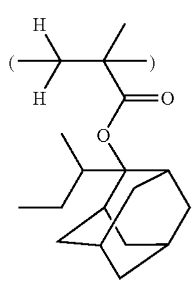
-continued
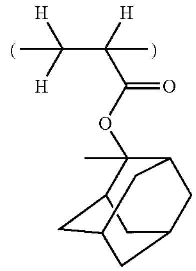
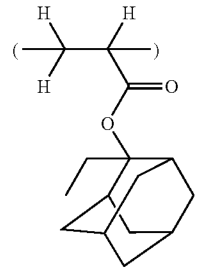
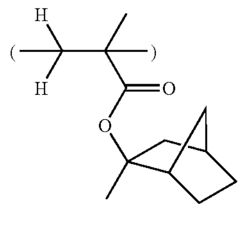
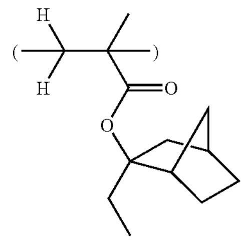
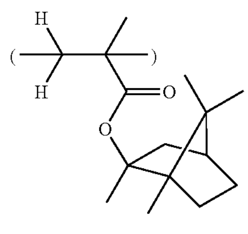
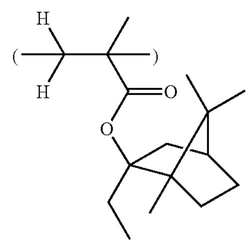
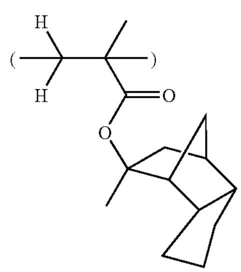
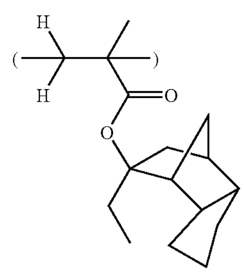
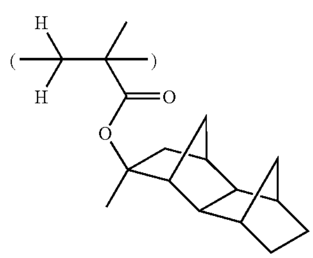
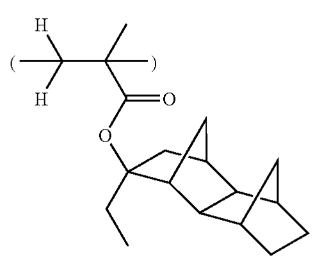

-continued
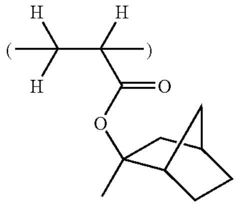
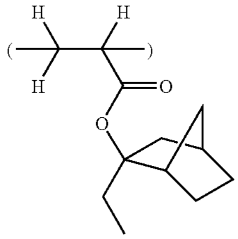
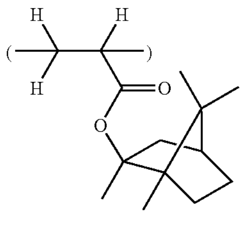
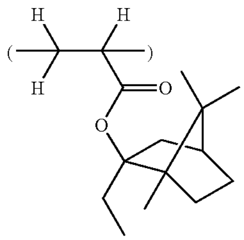
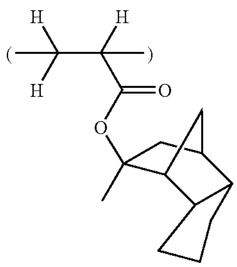
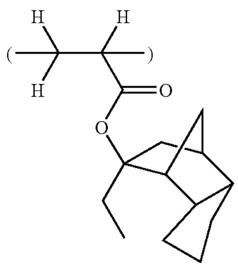
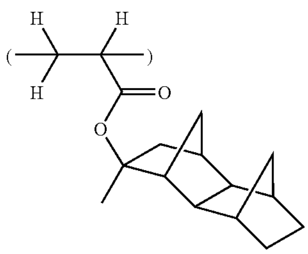
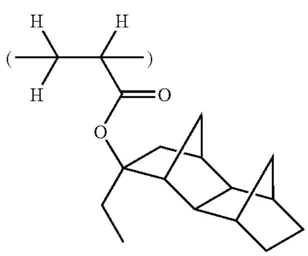
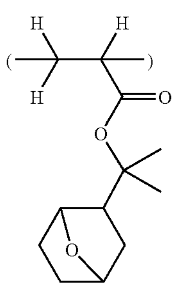
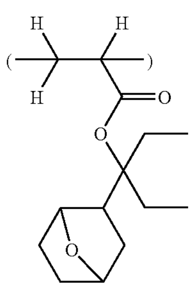
-continued
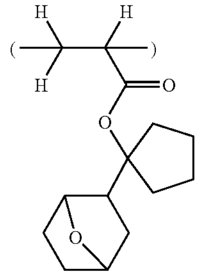
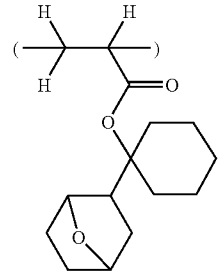
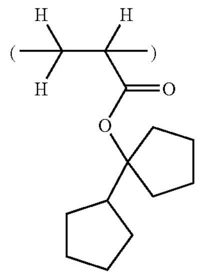
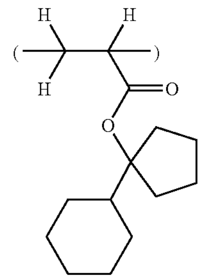
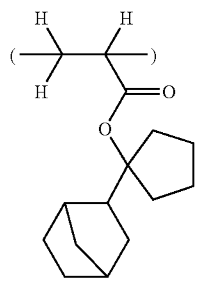
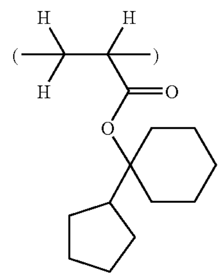
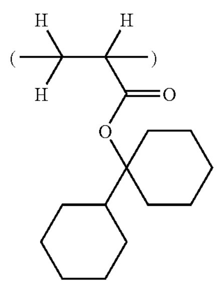
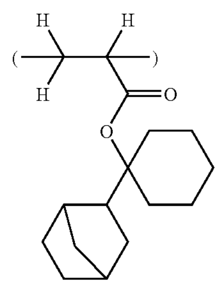
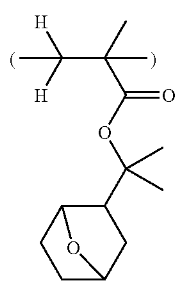
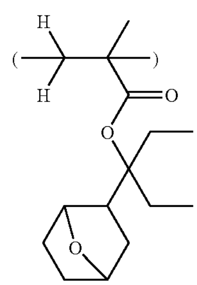
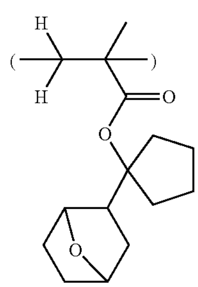
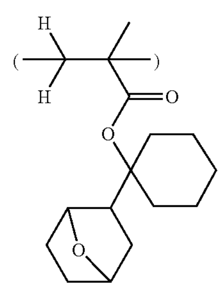

-continued
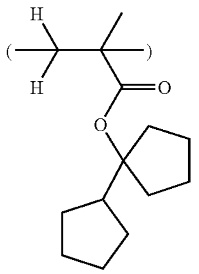
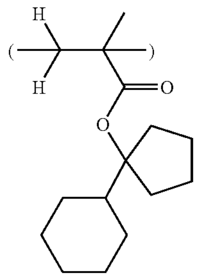
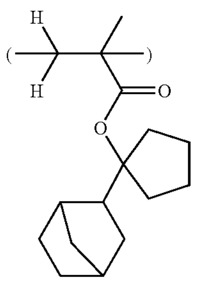
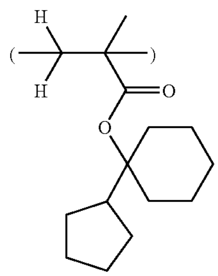
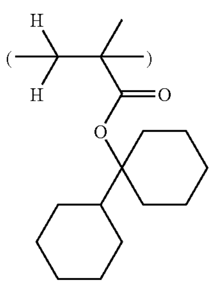
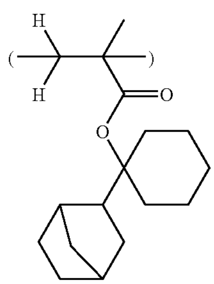
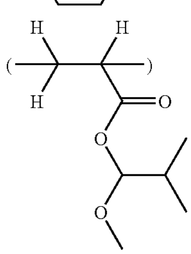
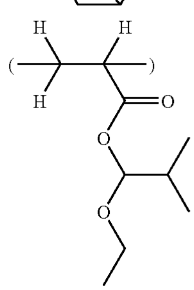
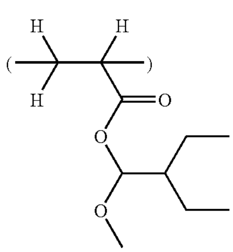
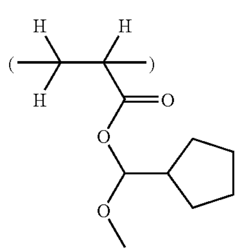
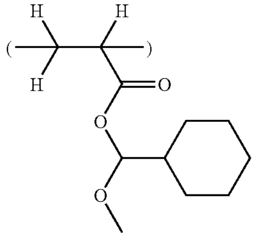
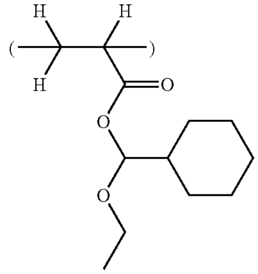
-continued
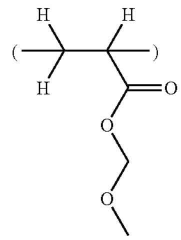
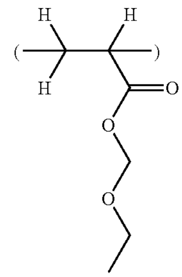
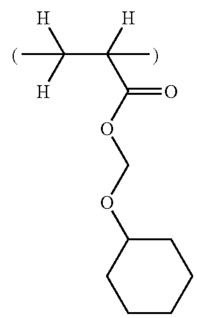
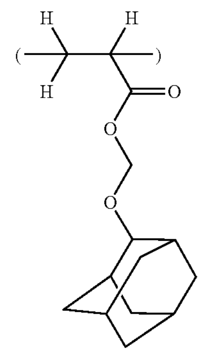
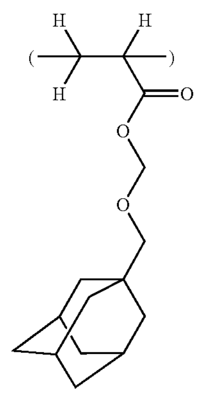
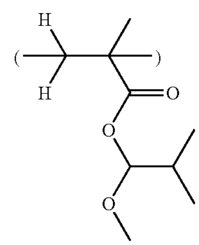
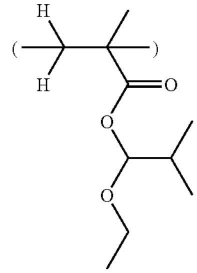
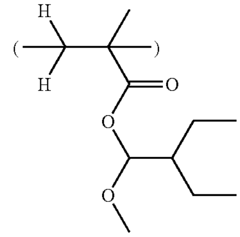
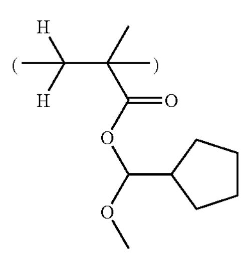
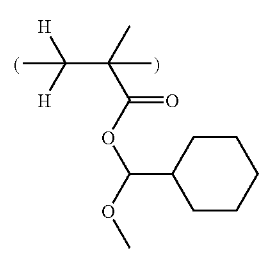

-continued
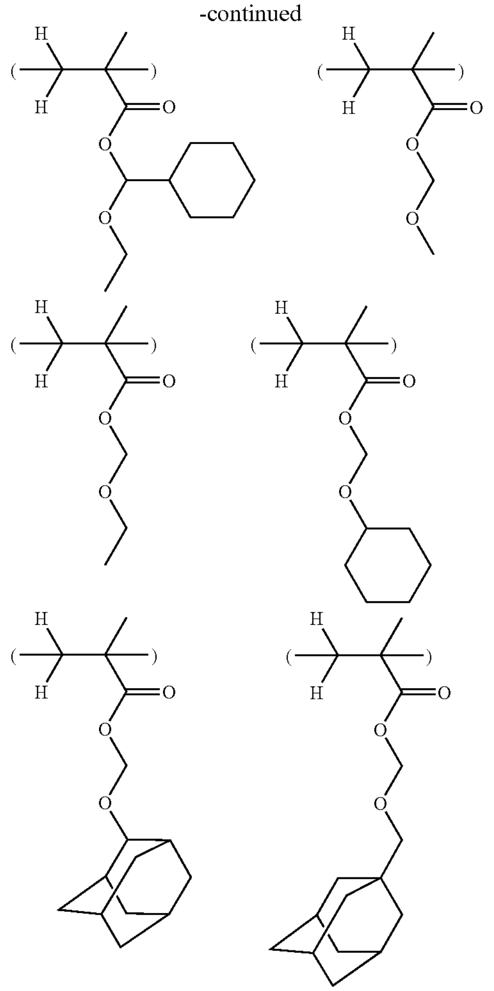
Non-limiting examples of polymers comprising the repeating units with the composition ratios of a1', b1', c1' and d1' in formulae (R1) may include the following polymers.
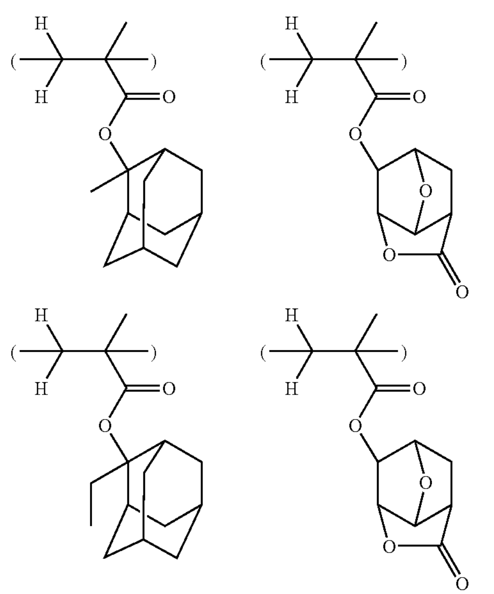
-continued
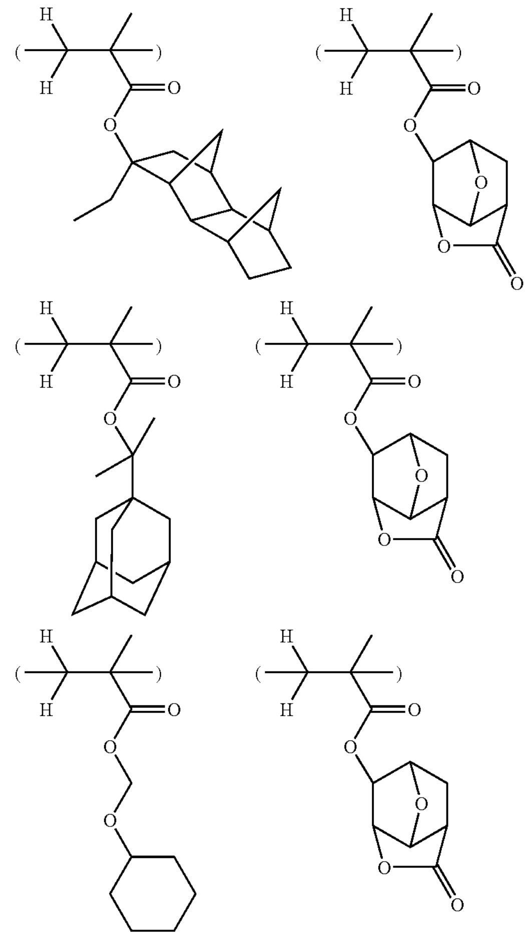
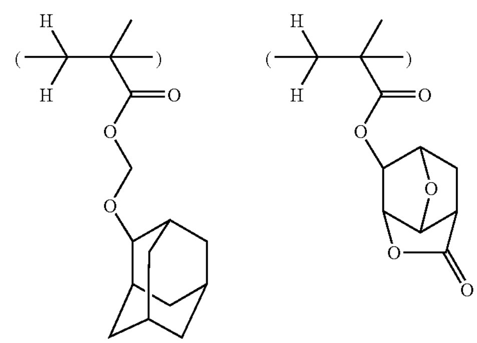
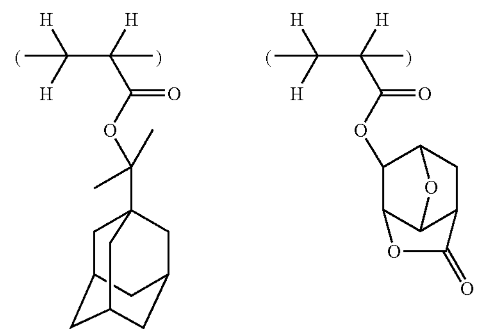

-continued
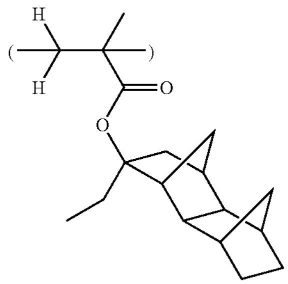
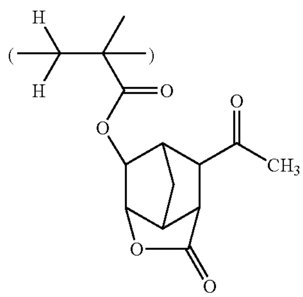
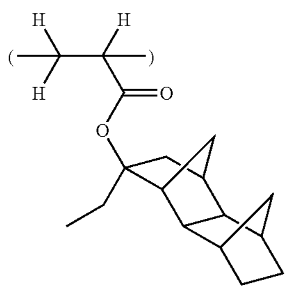
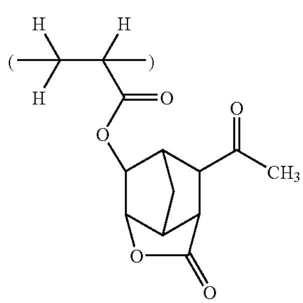
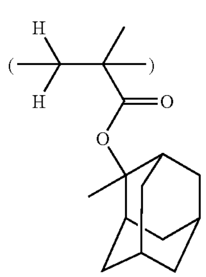
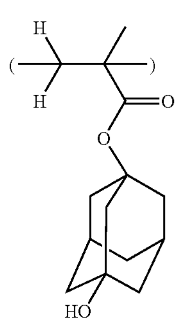
-continued
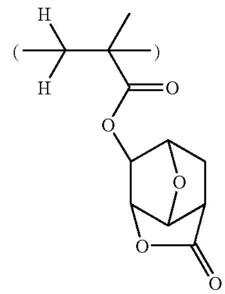
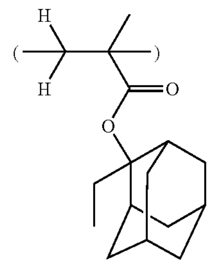
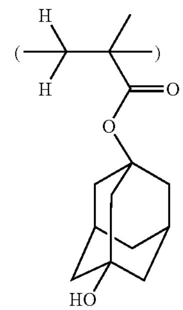
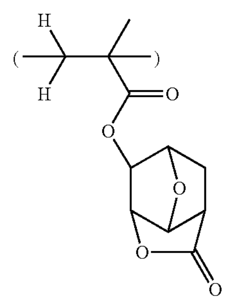
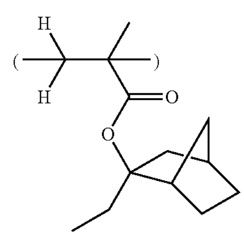
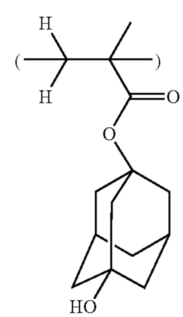
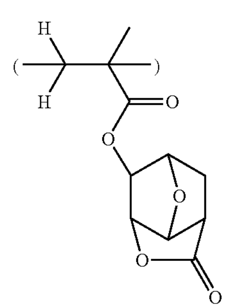

-continued
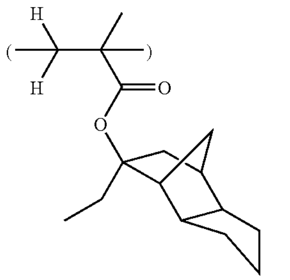
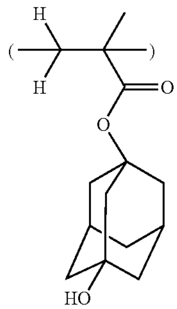
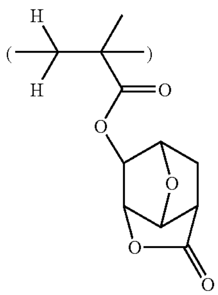
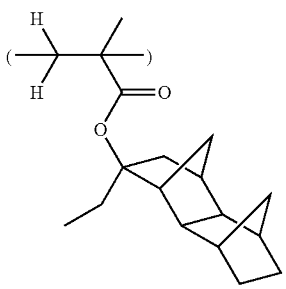
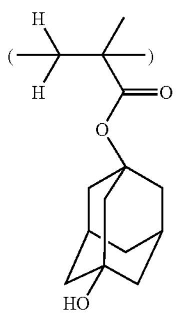
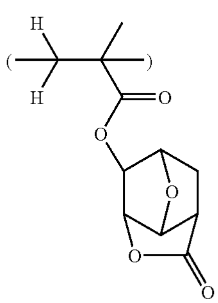
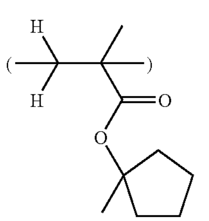
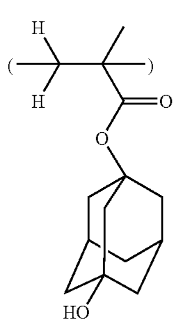
-continued
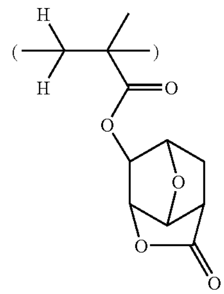
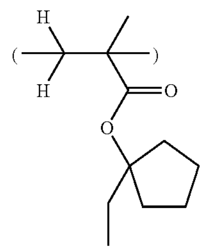
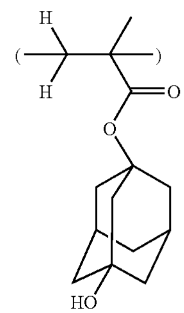
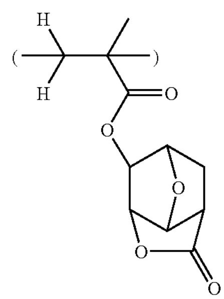
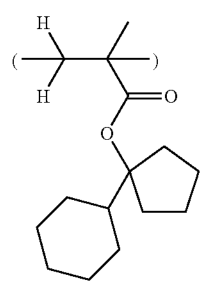
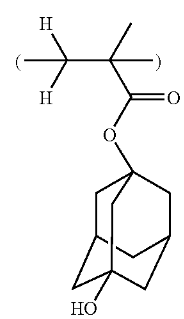
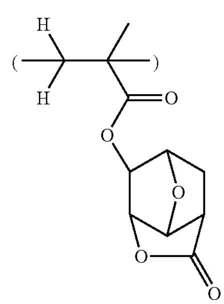

-continued
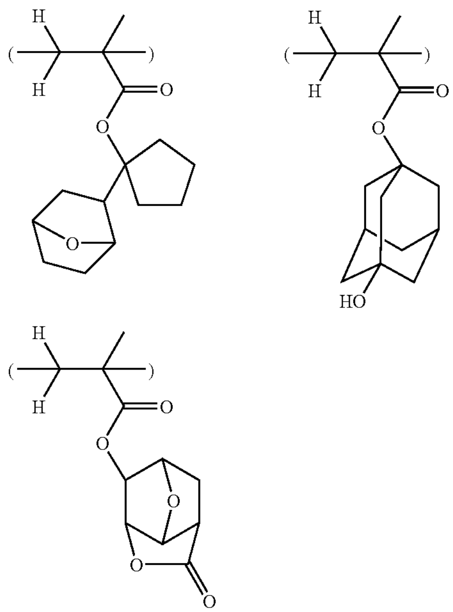
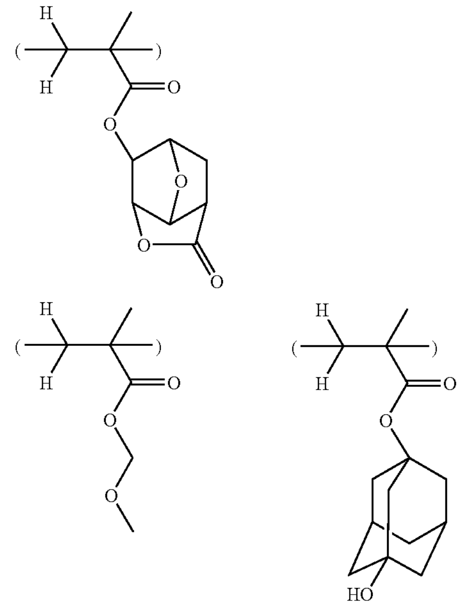
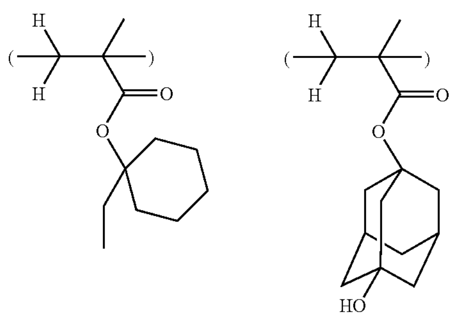
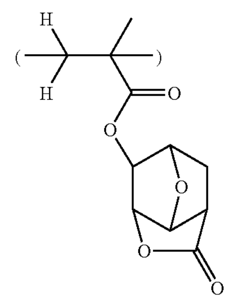
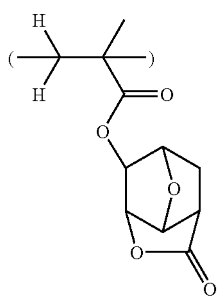
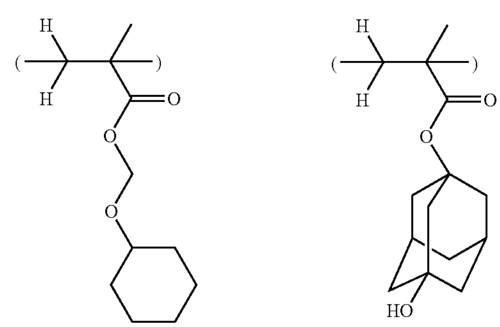
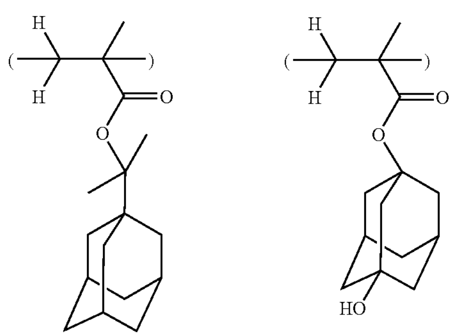
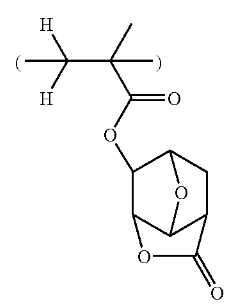
-continued -continued
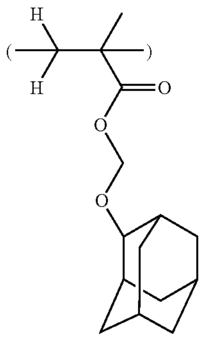
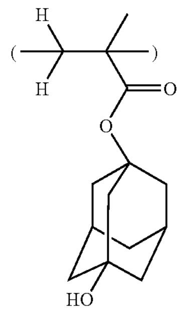
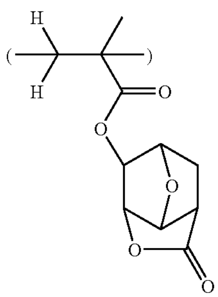
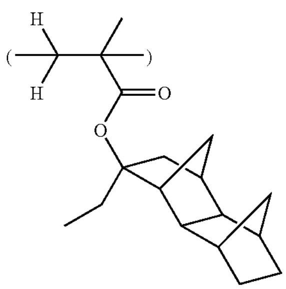
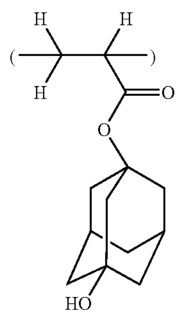
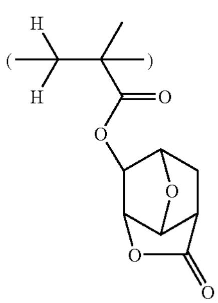
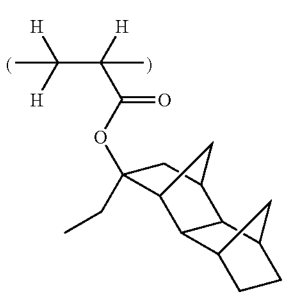
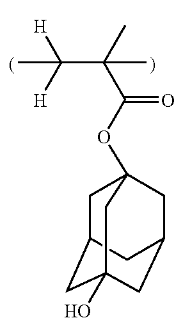
-continued
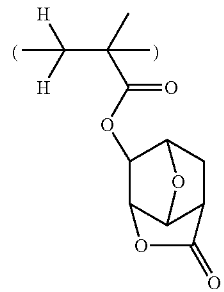
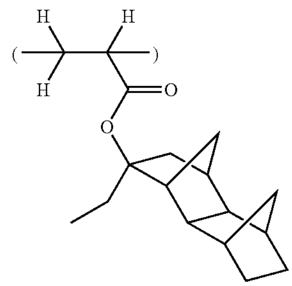
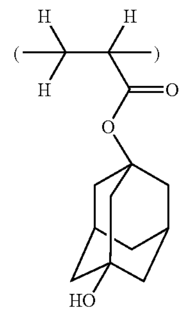
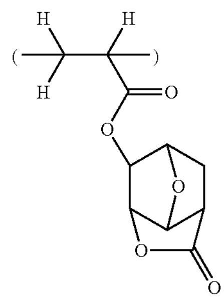
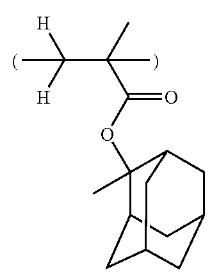
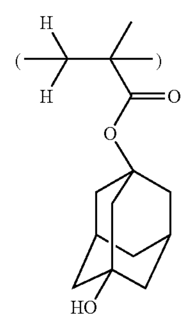
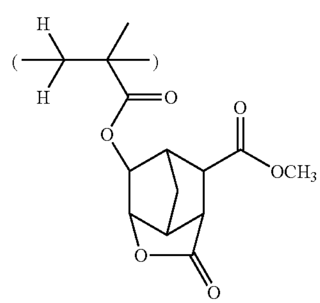

-continued
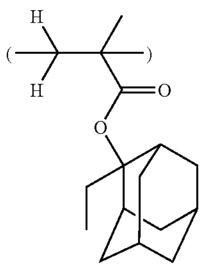
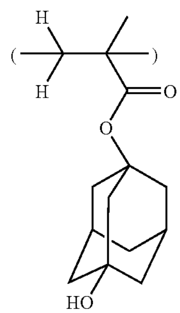
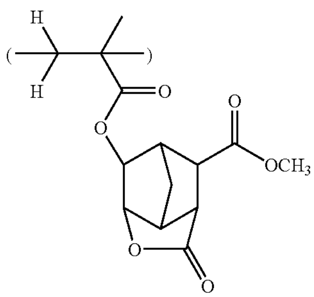
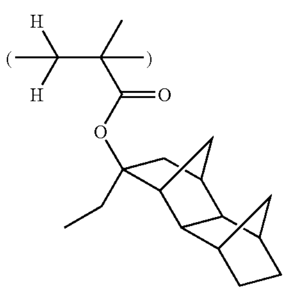
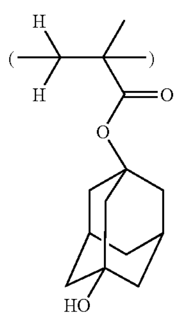
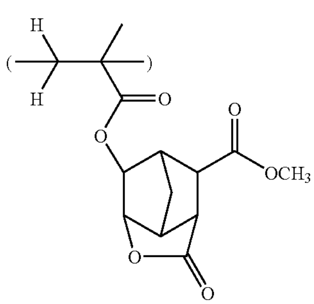
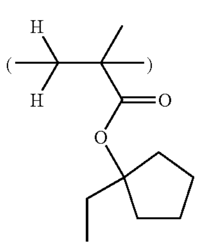
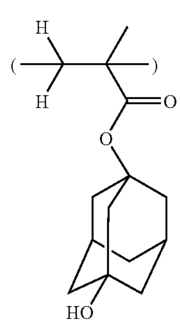
-continued
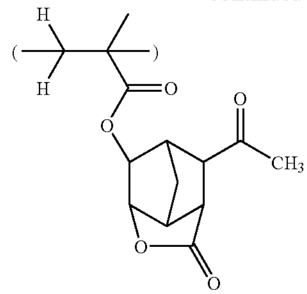
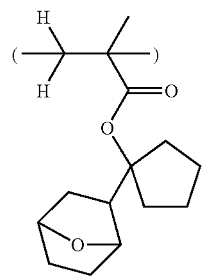
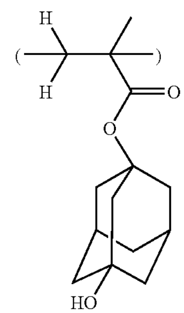
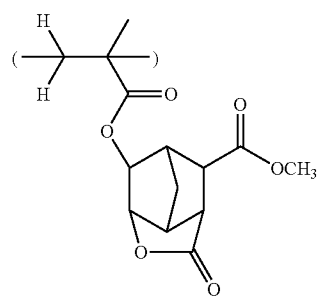
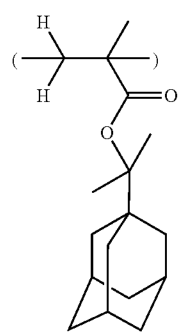
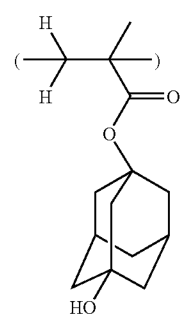
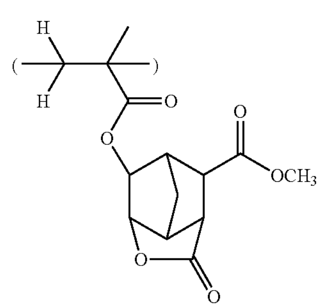

-continued
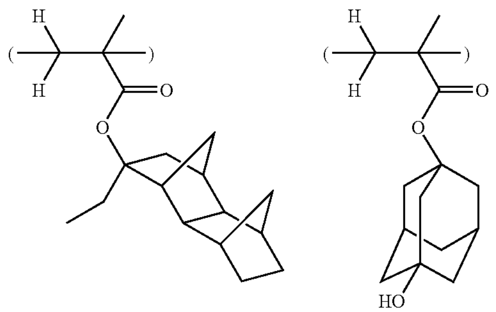
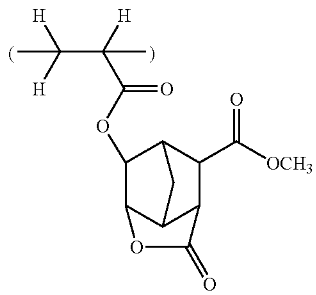
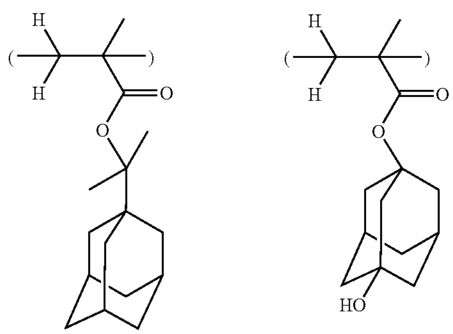
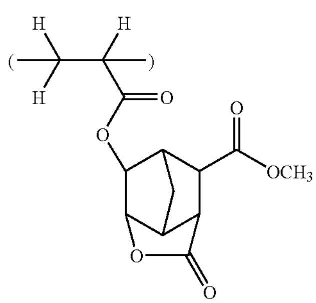
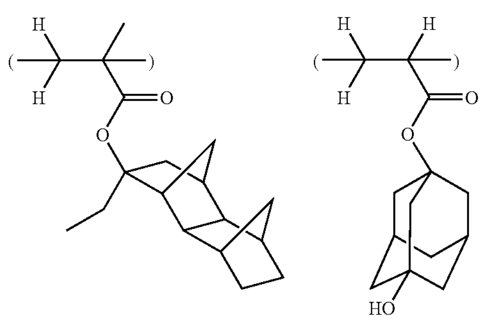
-continued
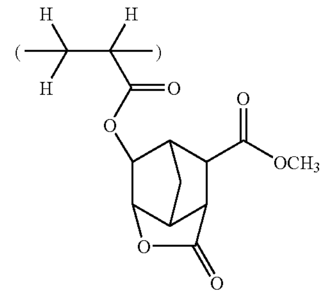
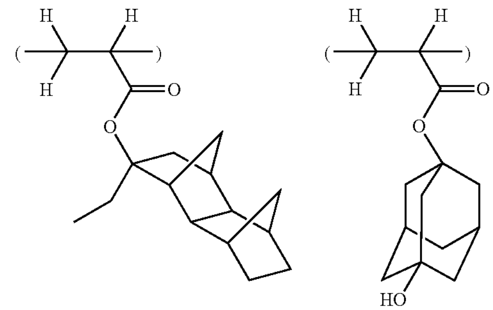
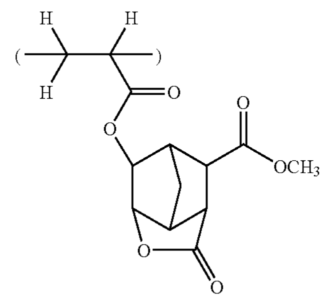
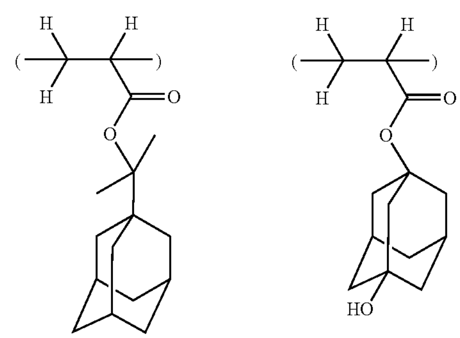
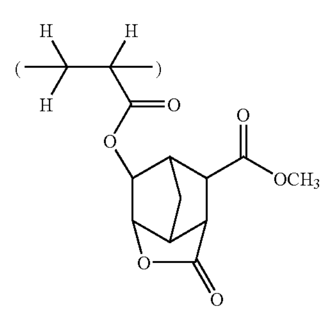

-continued
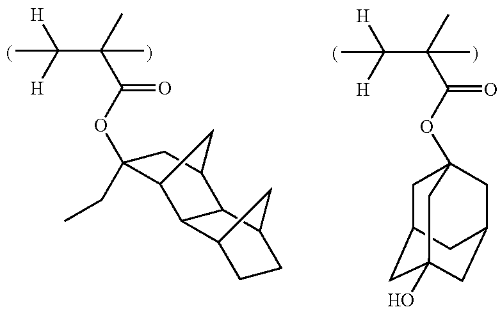
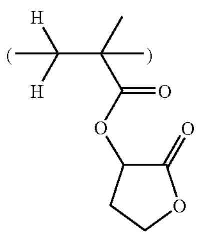
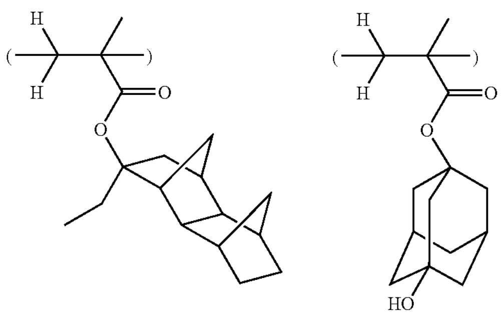
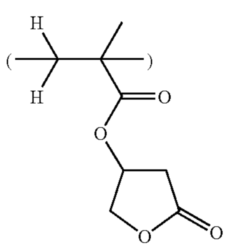
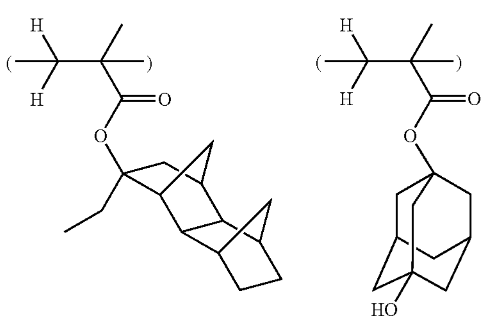
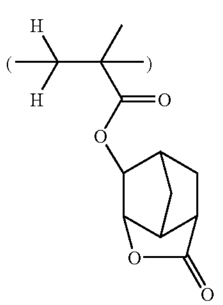
-continued
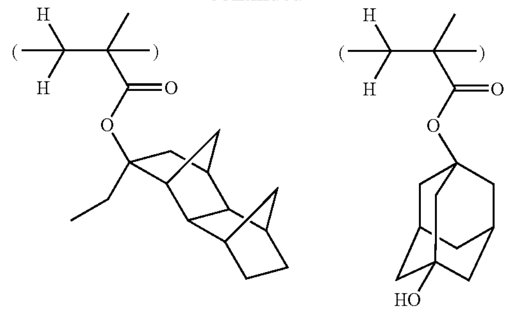
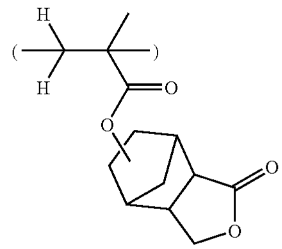
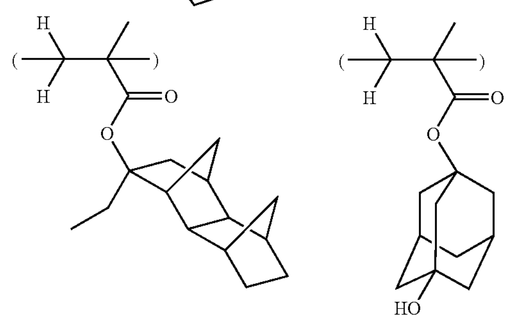
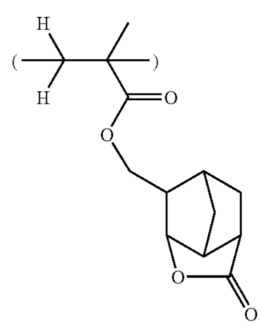
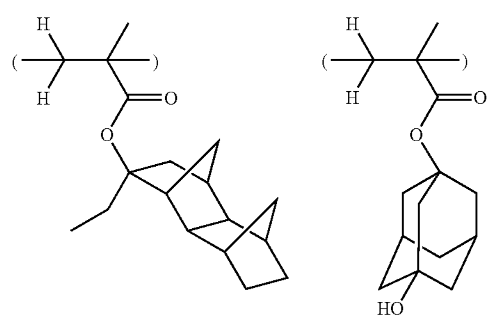
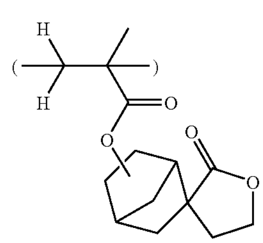

-continued
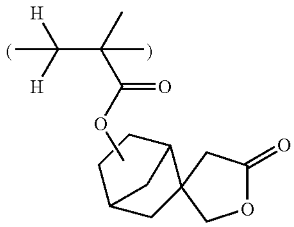
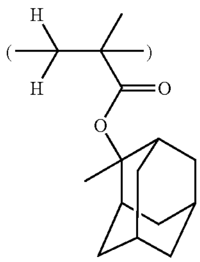
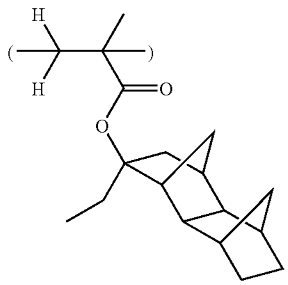
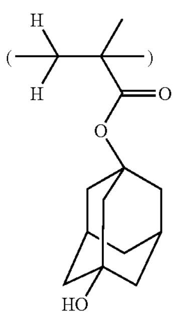
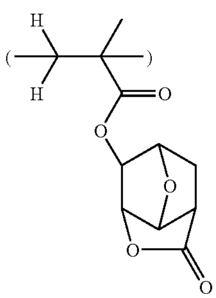
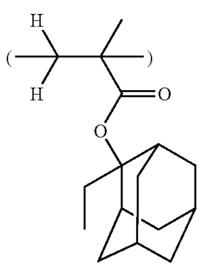
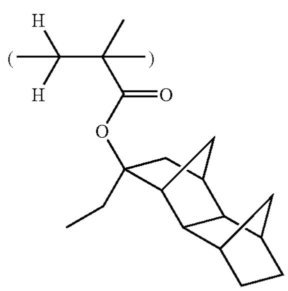
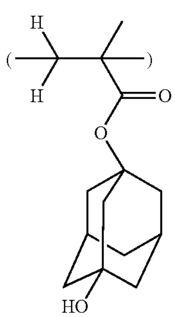
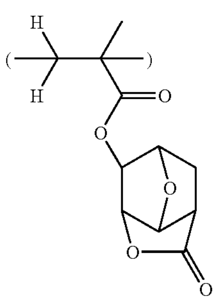
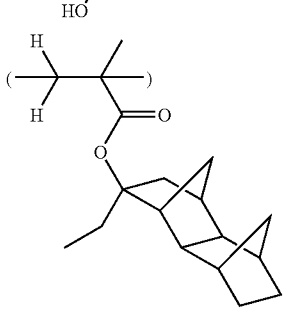
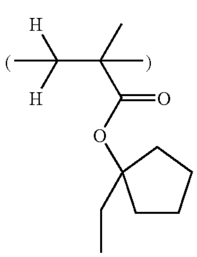
-continued
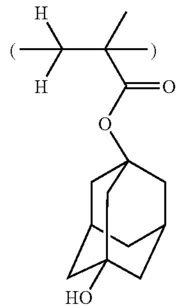
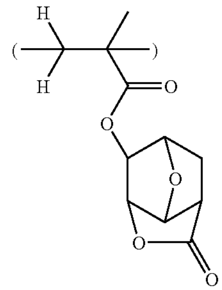
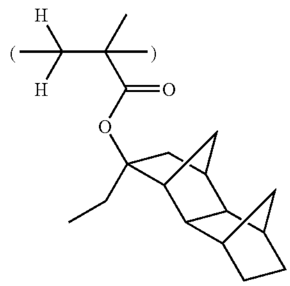
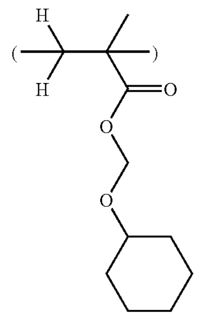
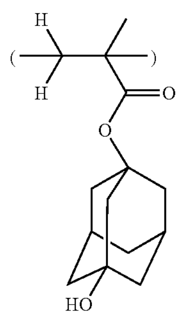
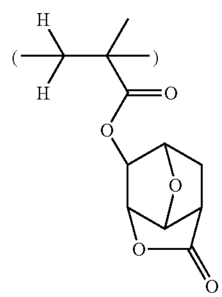
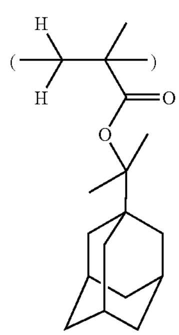
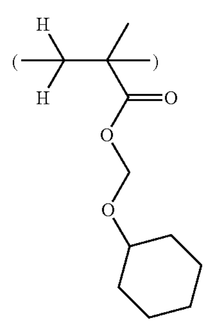
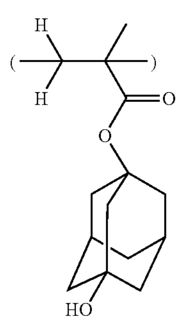
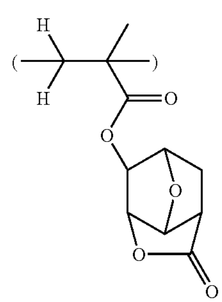

-continued
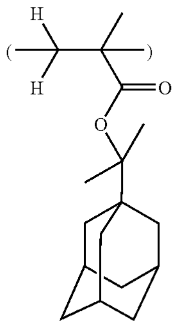
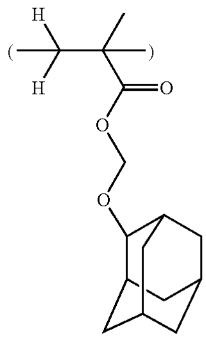
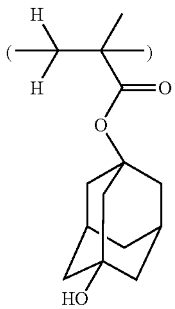
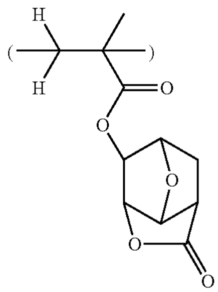
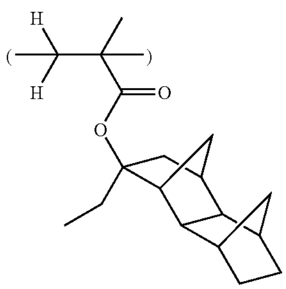
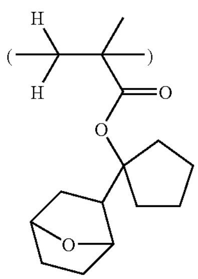
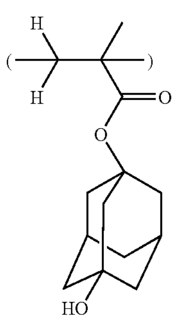
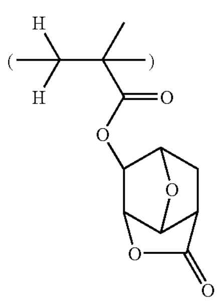
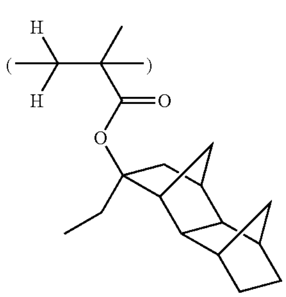
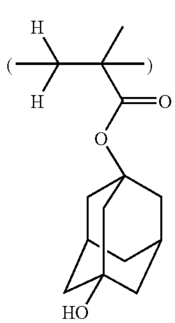
-continued
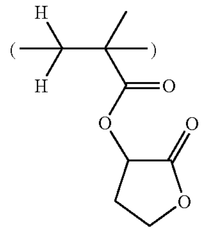
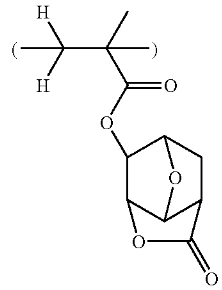
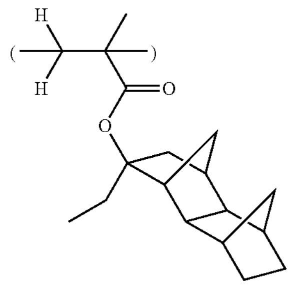
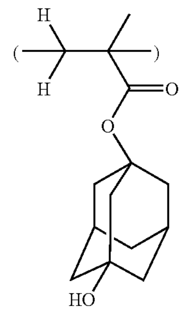
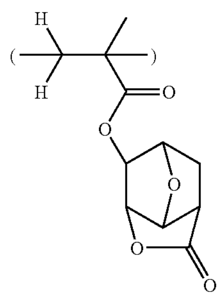
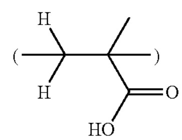
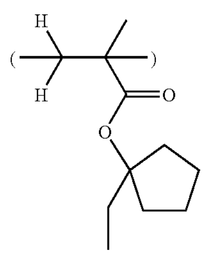
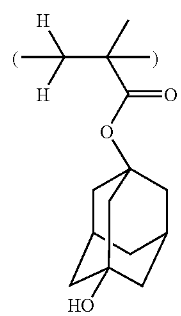
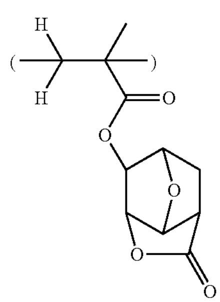
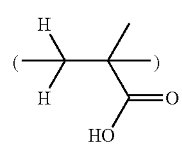

-continued
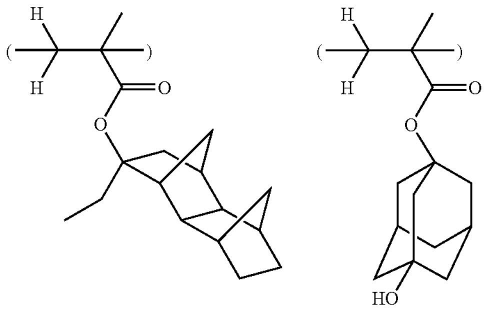
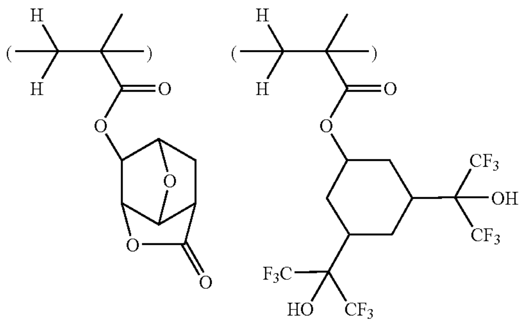
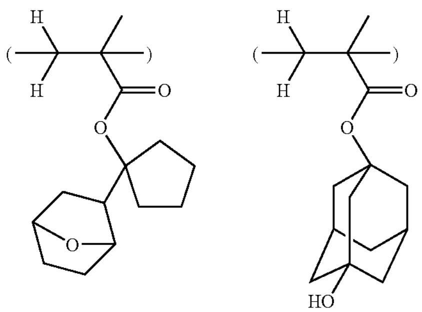
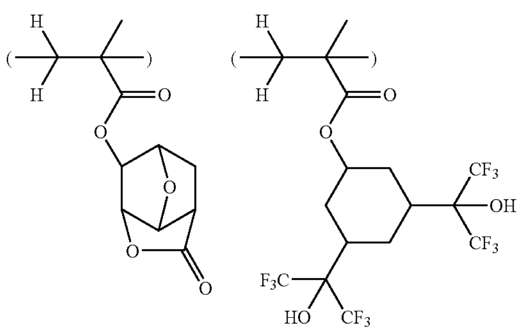
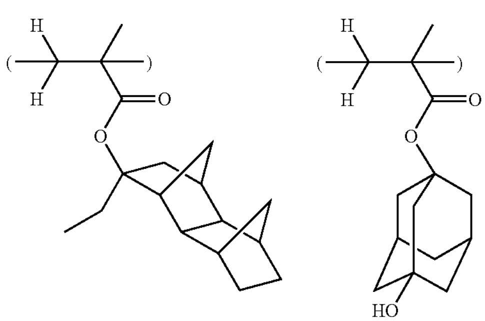
-continued
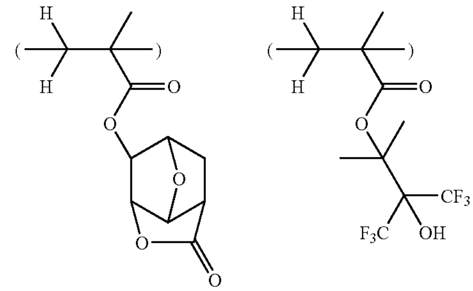
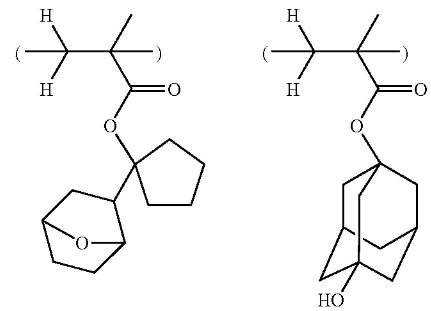
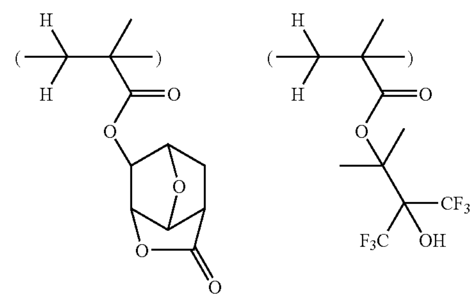
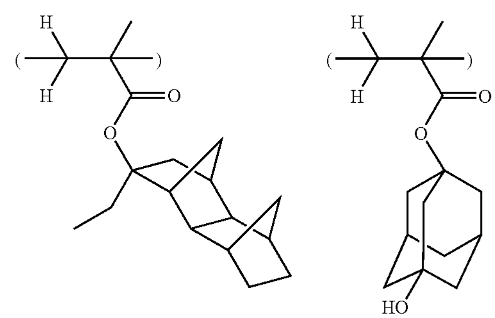
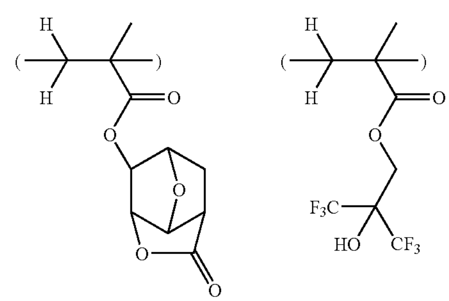

-continued
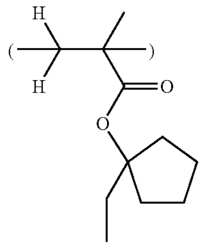
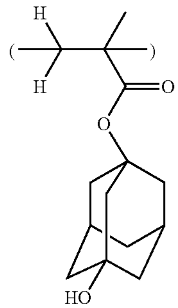
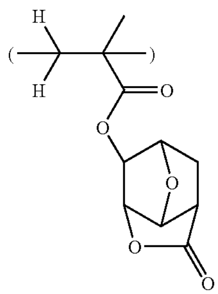
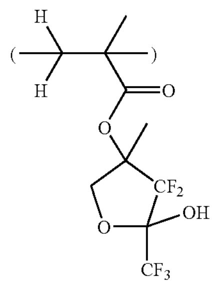
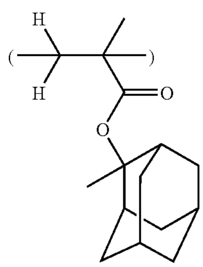
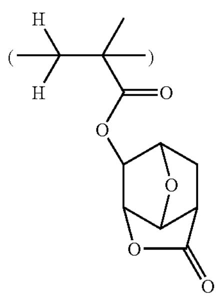
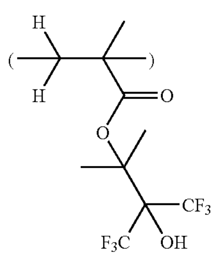
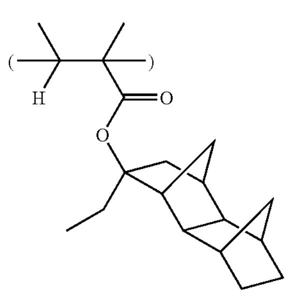
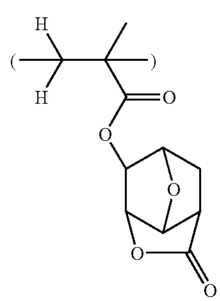
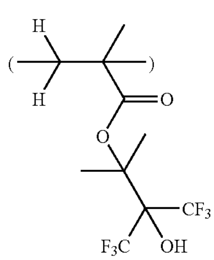
-continued
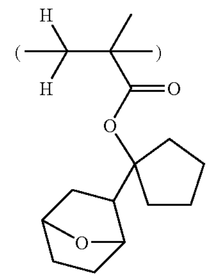
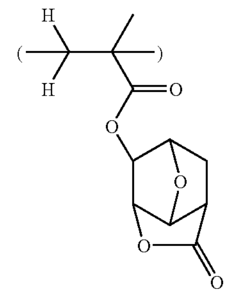
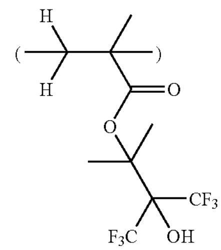
Non-limiting examples of polymers comprising the repeating units with the composition ratios of a2', b2', c2' and d2' in the formulae (R1) may include the following polymers.
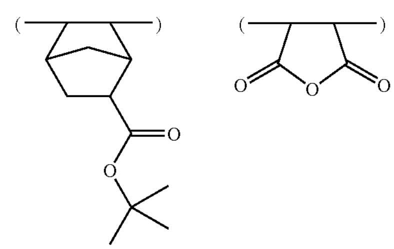
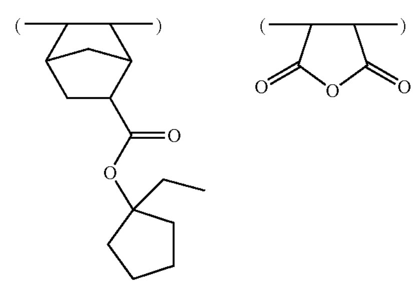
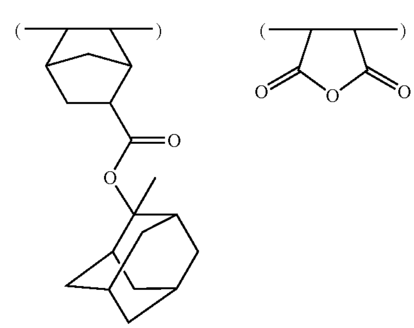

-continued
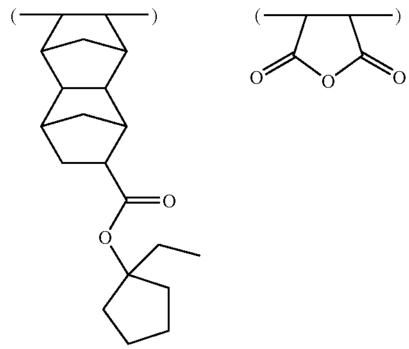
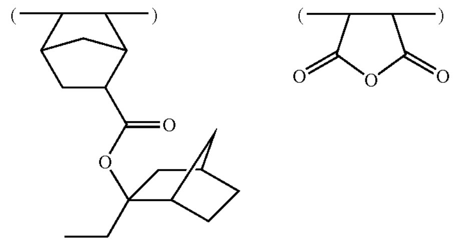
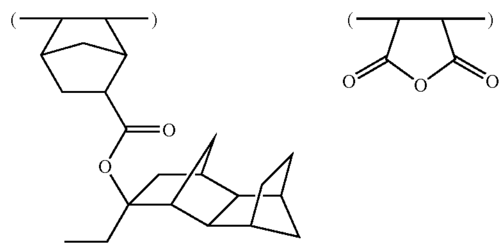
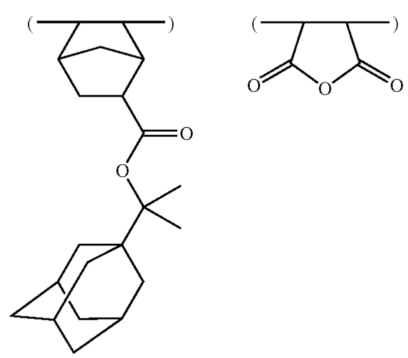
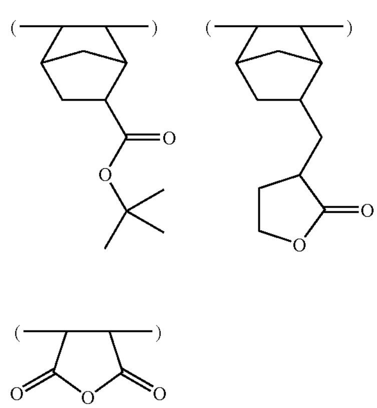
-continued
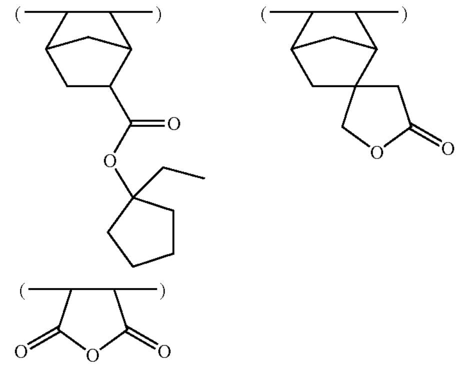
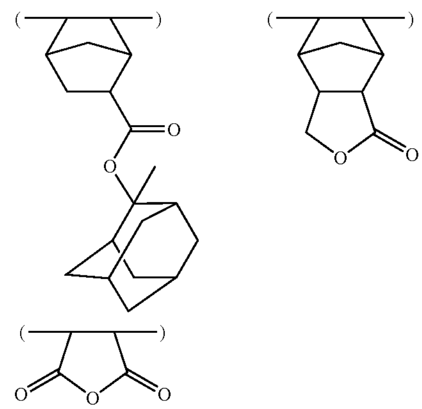
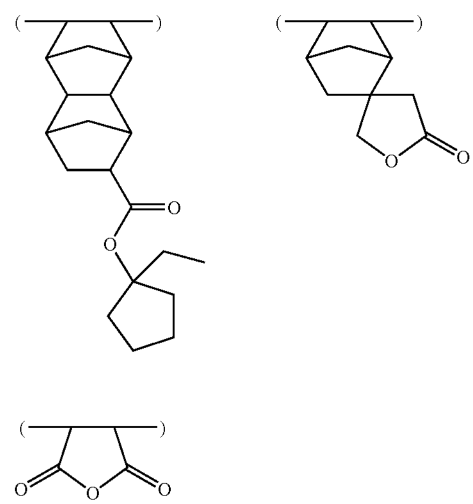
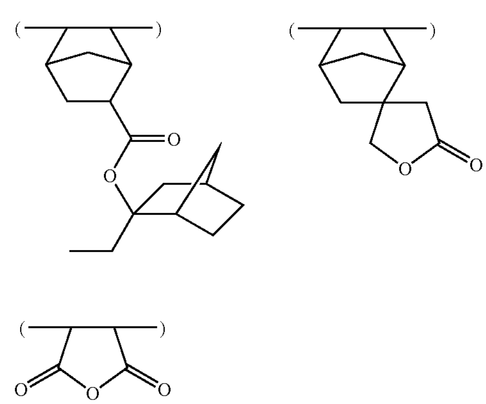

-continued
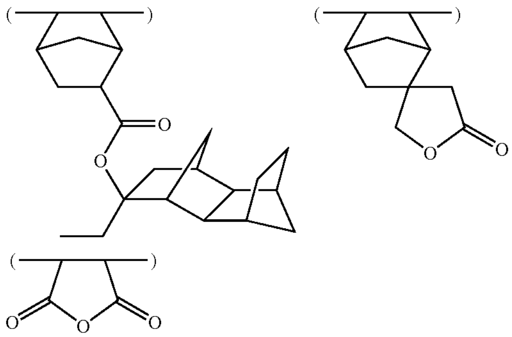
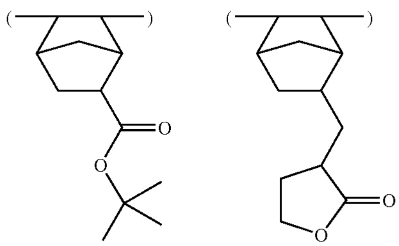
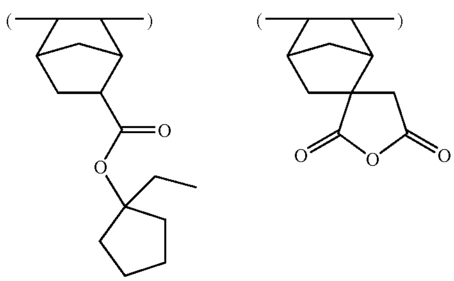
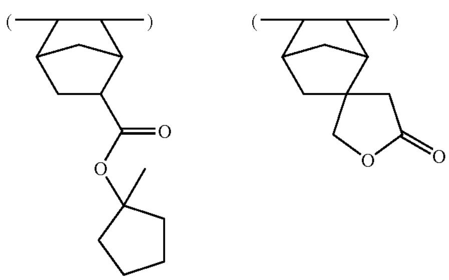
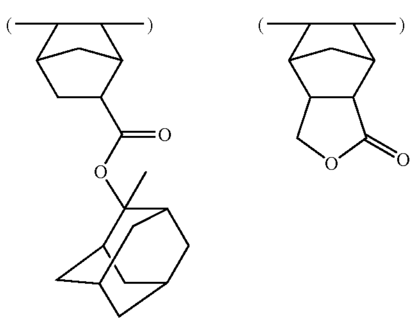
-continued
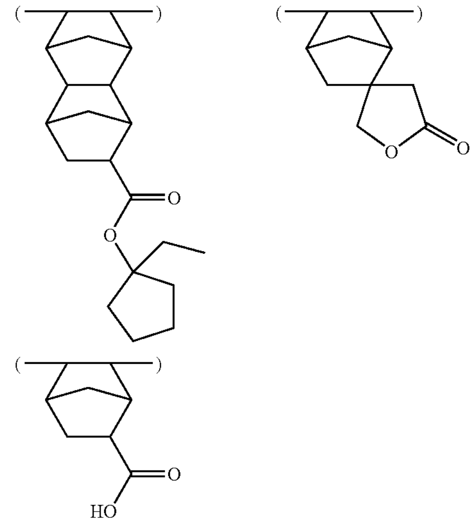
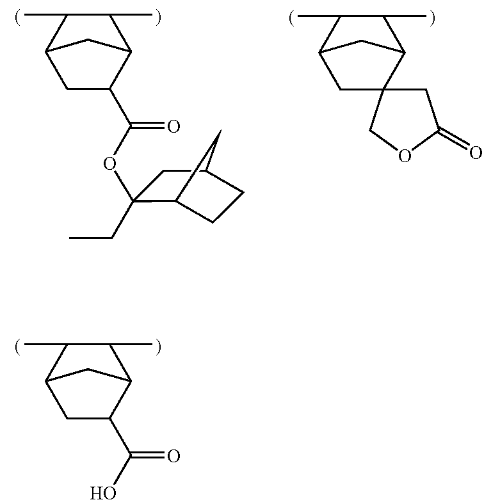
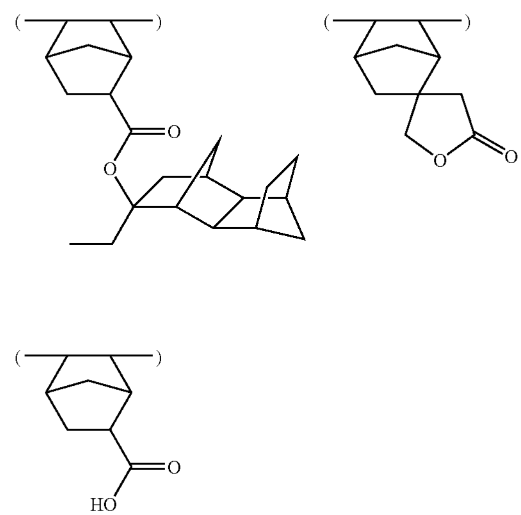
Non-limiting examples of polymers comprising the repeating units with the composition ratios of a3', b3', c3' and d3' in the formulae (R1) may include the following polymers.

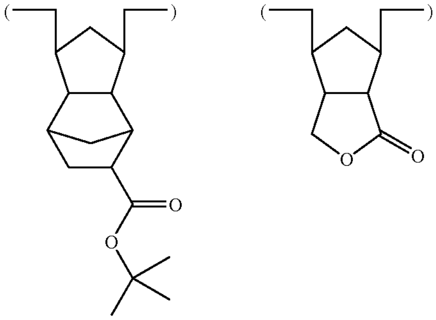
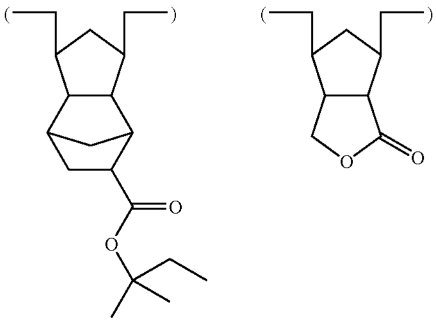
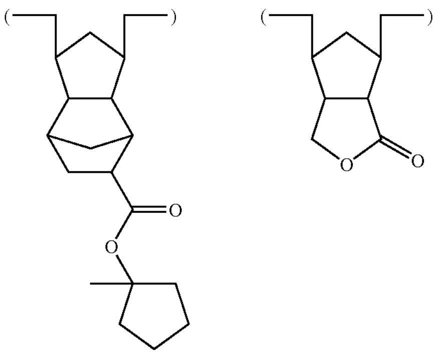
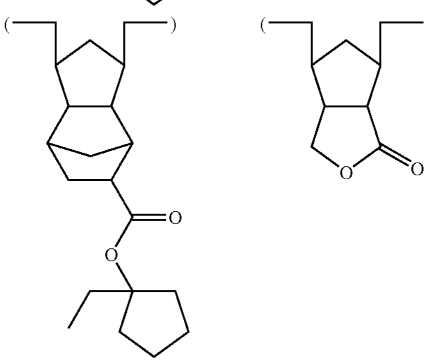
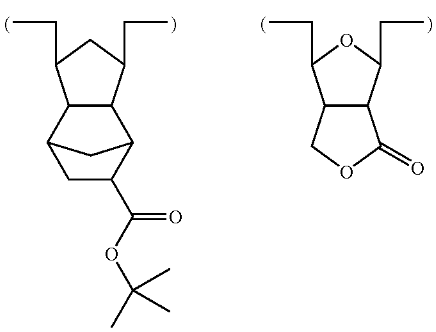
-continued
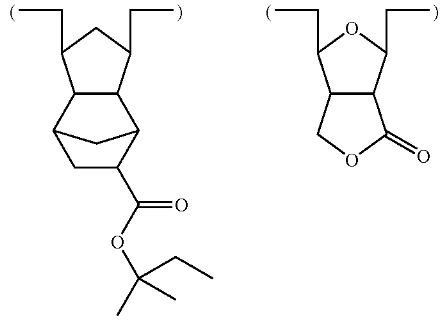
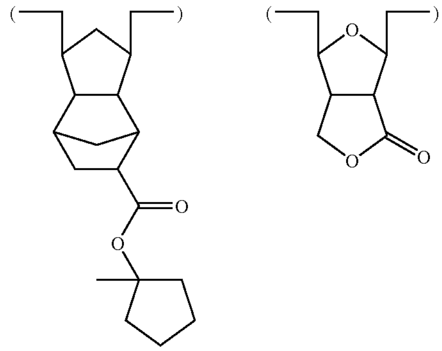
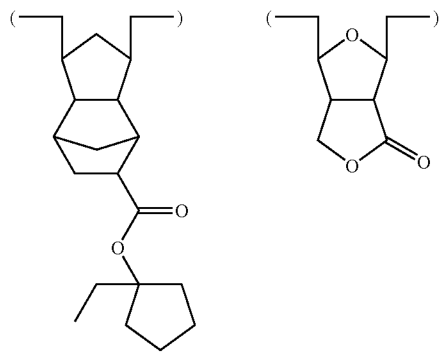
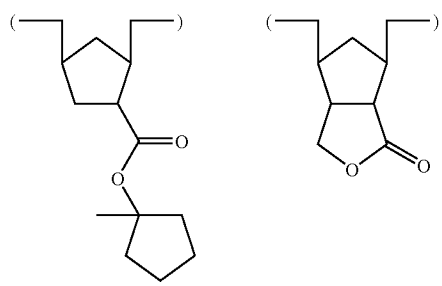
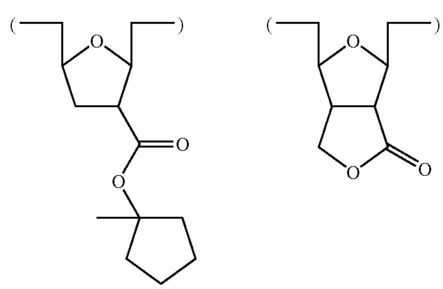

-continued
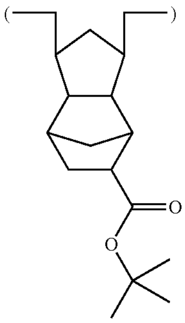
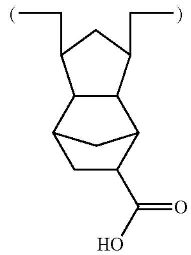
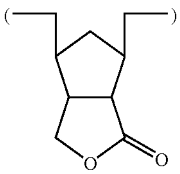
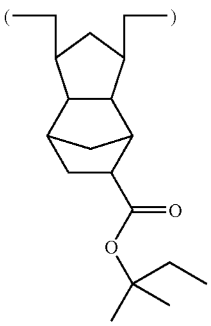
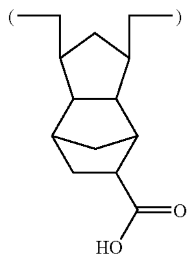
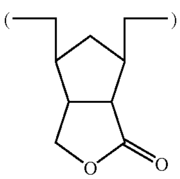
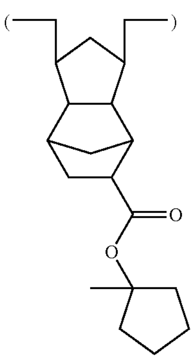
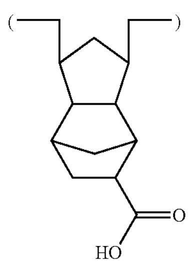
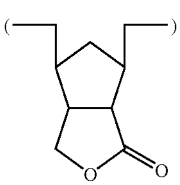
-continued
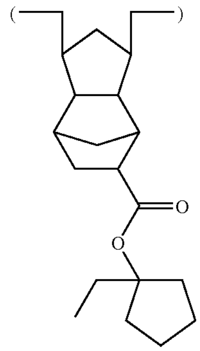
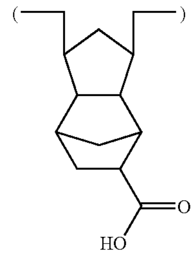
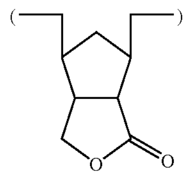
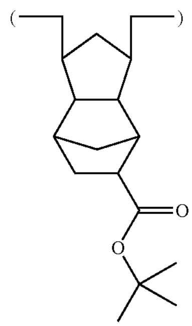
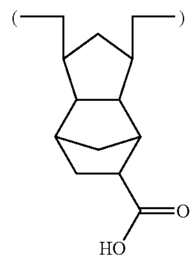
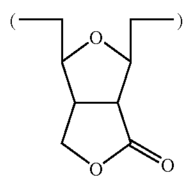
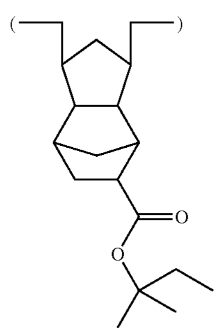
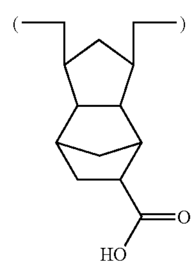
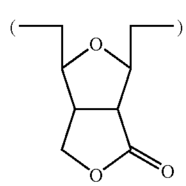

-continued
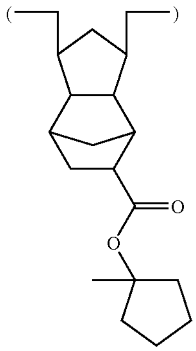
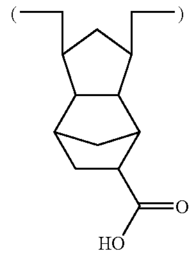
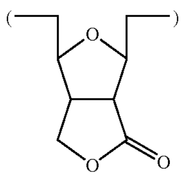
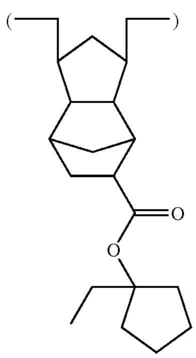
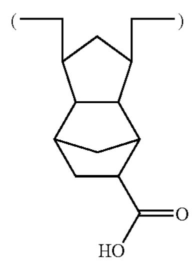
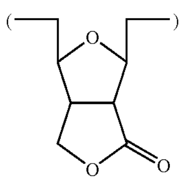
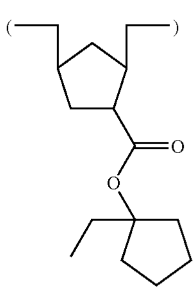
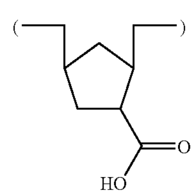
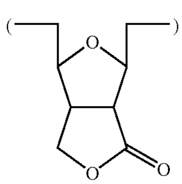
-continued
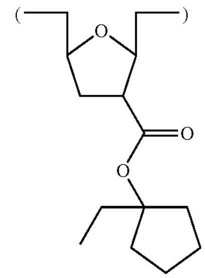
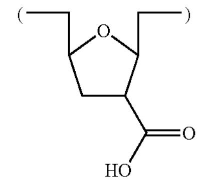
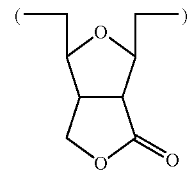
Non-limiting examples of polymers according to the formulae (R2) may include the following polymers.
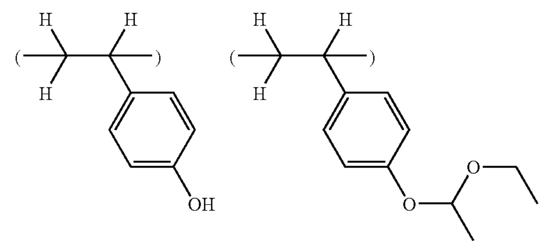
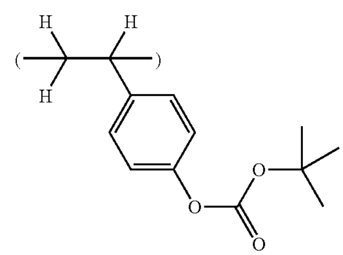
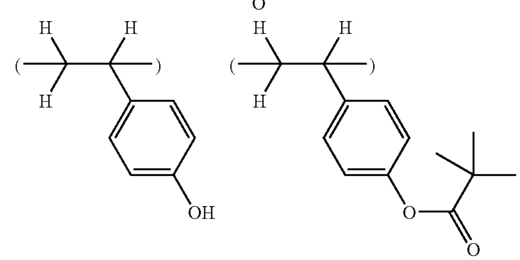
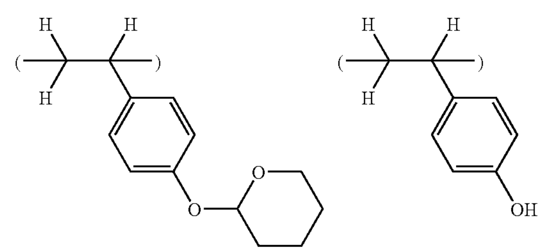

-continued
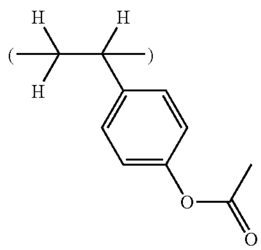
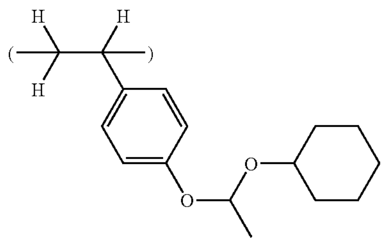
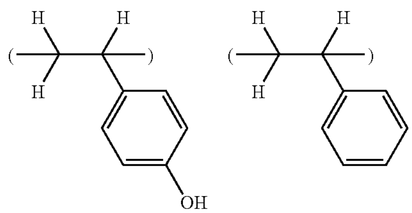
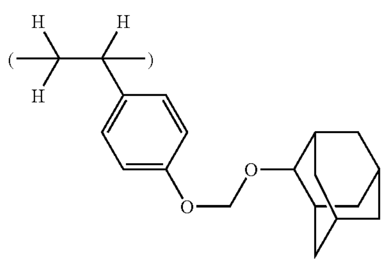
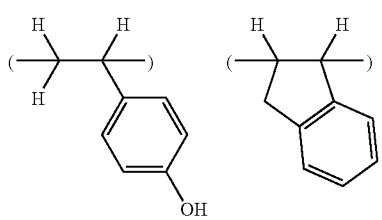
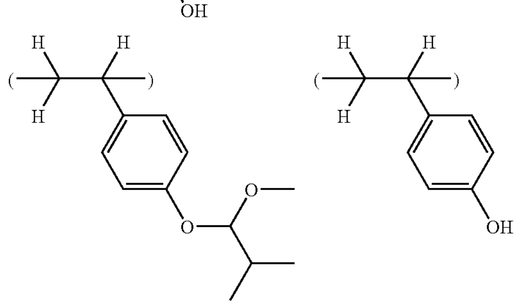
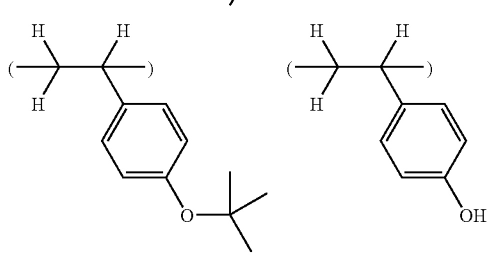
-continued
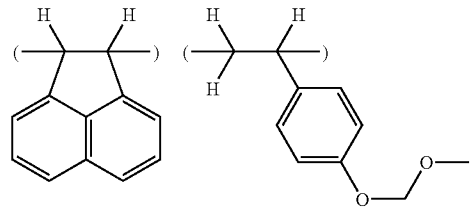
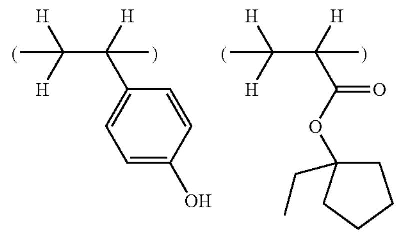
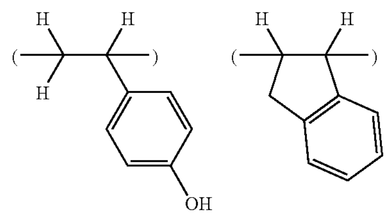
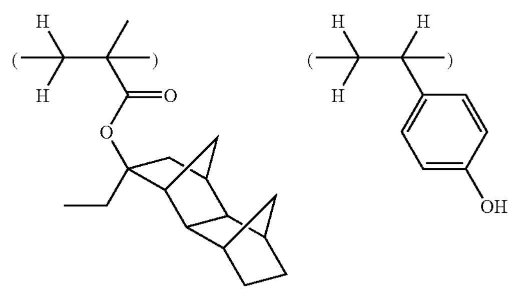
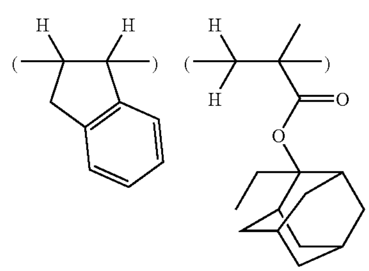
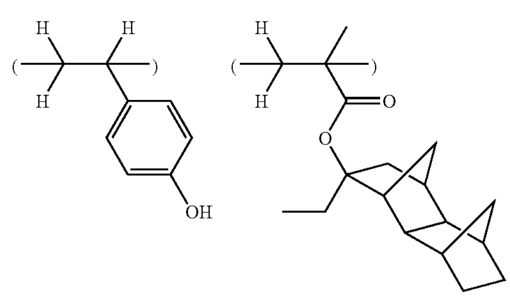

-continued

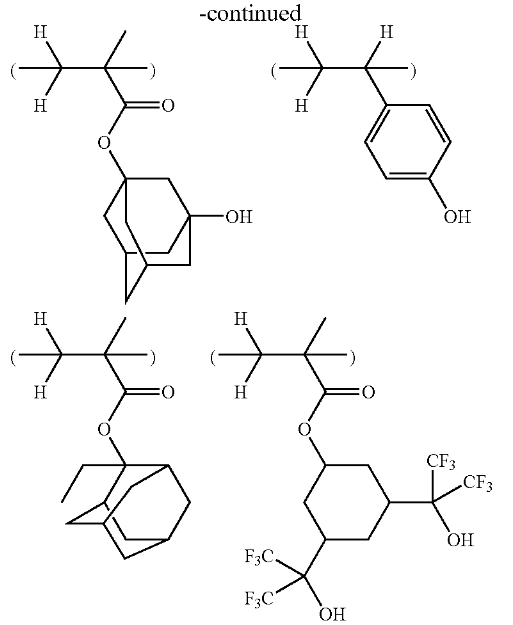

The blending amounts of the polymers other than the (A) resin component according to the present invention based on 100 parts by mass of the total of the polymers and the (A) resin component are preferably 0 to 80 parts by mass, more preferably 0 to 60 parts by mass, and still more preferably 0 to 50 parts by mass. When the polymers are blended, it is preferred that their blending amounts are 20 parts by mass or more and particularly 30 parts by mass or more. When the blending amounts of the polymers are less than 80 parts by mass or less, the (A) resin component according to the present invention sufficiently exhibits its advantageous effect and there is less possibility of inviting deterioration of resolution or degradation of pattern profiles. As for the polymers, not only one type but also two or more types may be added. Use of two or more types of the polymers enables adjustment of the properties of resist compositions.

A resist composition according to the present invention comprises (B) a photoacid generator generating sulfonic acid represented by the following general formula (2) upon exposure to a high energy beam such as ultraviolet rays, far ultraviolet rays, an electron beam, X-rays, excimer lasers, gamma rays, or synchrotron radiation.

$$R^{200}—CF_2SO_3^-H^+ \qquad (2)$$

In the general formula (2), $R^{200}$ represents a halogen atom, or a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group.

Examples of the sulfonic acid may include: perfluoroalkylsulfonic acids such as trifluoromethanesulfonate, pentafluoroethanesulfonate, nonafluorobutanesulfonate, dodecafluorohexanesulfonate, or heptadecafluorooctanesulfonate; and alkylsulfonic acids or aralkylsulfonic acids where part of hydrogen atoms is substituted with fluorine atoms such as 1,1-difluoro-2-naphthyl-ethanesulfonic acid or 1,1,2,2-tetrafluoro-2-(norbornane-2-yl)-ethanesulfonic acid.

Particularly preferred sulfonic acid is represented by the following general formula (8), that is, sulfonic acid that is not perfluoroalkylsulfonic acid.

$$R^{200}—CF_2SO_3^-H^+ \qquad (8)$$

In the formula (8), $R^{201}$ represents a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group, however, $R^{201}$ does not represent a perfluoroalkyl group.

Photoacid generators generating perfluoroalkanesulfonic acids are widely used for ArF chemically amplified resist compositions. Among the generators, perfluorooctanesulfonic acid and its derivatives are known as its initial word PFOS. PFOS is perceived as problems in terms of stability (nondegradability) derived from its C—F bond, and biological concentration and accumulativeness derived from its hydrophobicity and lipophilicity.

In order to overcome the problems of PFOS, it is advantageous to use semifluorinated alkanesulfonic acids according to the general formula (8) in which fluorinated ratio is decreased.

Examples of the sulfonic acids may include: 1,1-difluoro-2-naphthyl-ethanesulfonic acid, 1,1,2,2-tetrafluoro-2-(norbornane-2-yl)-ethanesulfonic acid, and 1,1,2,2-tetrafluoro-2-(tetracyclo[4.4.0.$1^{2,5}$.$1^{7,10}$]dodeca-3-ene-8-yl)-ethanesulfonic acid.

Some acid generators are already disclosed that generate semifluorinated alkanesulfonic acids. For example, published Japanese translations of PCT international publication No. 2004-531749 discloses α,α-difluoroalkylsulfonate developed by using α,α-difluoroalkene and a sulfur compound, that is, a photoacid generator that generates α,α-difluoroalkylsulfonic acid upon exposure; and specifically resist compositions comprising (4-tert-butylphenyl)iodonium 1,1-difluoro-1-sulfonate-2-(1-naphthyl)ethylene. Japanese Patent Application Laid-open (kokai) Nos. 2004-2252, 2005-352466, and 2006-257078 also disclose resist compositions comprising photoacid generators that generate semifluorinated alkanesulfonic acids.

Use of the acid generators alone that are disclosed in the documents, however, does not achieve both enhancement of resolution and improvements of resistance to surface roughness and side lobe under use of a halftone phase shift mask. It is thus necessary to combine the acid generator with the aforementioned (A) resin component and a specific (C) onium salt described later in detail, which the combination is disclosed in the present invention.

More preferred sulfonic acids have structures containing ester groups and the acids are represented by the following general formula (9) or (10).

$$CF_3—CH(OCOR^{202})—CF_2SO_3^-H^+ \qquad (9)$$

$$R^{203}—OOC—CF_2SO_3^-H^+ \qquad (10)$$

In the general formula (9), $R^{202}$ represents a substituted or unsubstituted $C_{1-20}$ linear, branched, or cyclic alkyl group; or a substituted or unsubstituted $C_{6-14}$ aryl group.

Specific examples of $R^{202}$ may include a methyl group, ethyl group, n-propyl group, sec-propyl group, cyclopropyl group, n-butyl group, sec-butyl group, iso-butyl group, tert-butyl group, n-pentyl group, cyclopentyl group, n-hexyl group, cyclohexyl group, n-octyl group, n-decyl group, n-dodecyl group, 1-adamantyl group, 2-adamantyl group, bicyclo[2.2.1]heptene-2-yl group, phenyl group, 4-methoxyphenyl group, 4-tert-butylphenyl group, 4-biphenyl group, 1-naphthyl group, 2-naphthyl group, 10-anthranyl group, and 2-furanyl. Among these examples, preferred groups are tert-butyl group, cyclohexyl group, 1-adamantyl group, phenyl group, 4-tert-butylphenyl group, 4-methoxyphenyl group, 4-biphenyl group, 1-naphthyl group, and 2-naphthyl group; and more preferred groups are tert-butyl group, cyclohexyl group, phenyl group, and 4-tert-butylphenyl group.

Examples of the substituted alkyl group and the substituted aryl group may include: a 2-carboxyethyl group, 2-(methoxycarbonyl)ethyl group, 2-(cyclohexyloxycarbonyl)ethyl group, 2-(1-adamantylmethyloxycarbonyl)ethyl group, 2-carboxycyclohexyl group, 2-(methoxycarbonyl)cyclohexyl group, 2-(cyclohexyloxycarbonyl)cyclohexyl group, 2-(1-adamantylmethyloxycarbonyl)cyclohexyl group, 2-carboxyphenyl group, 2-carboxynaphthyl group, 4-oxocyclohexyl group, and 4-oxo-1-adamantyl group.

More specific examples of the sulfonic acids represented by the general formula (9) are shown below.

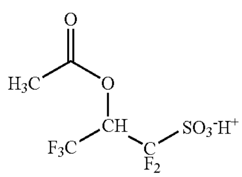

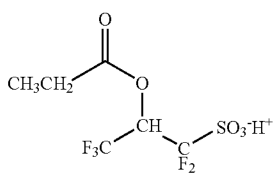

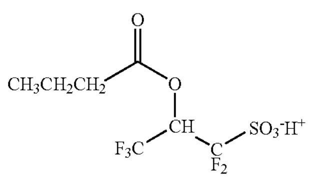

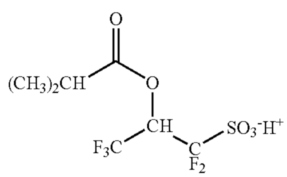

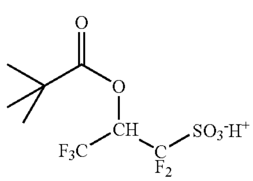

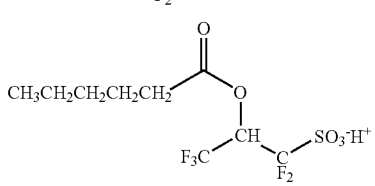

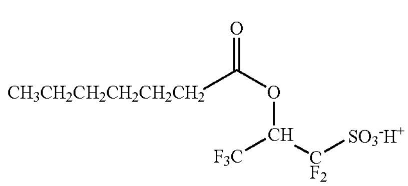

-continued

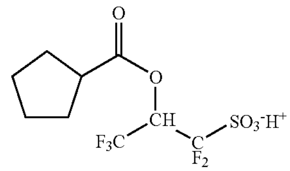

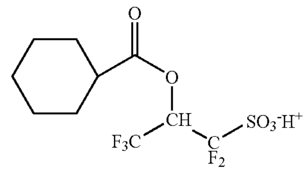

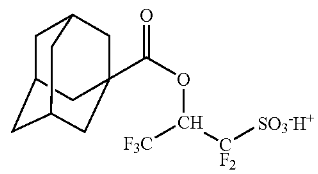

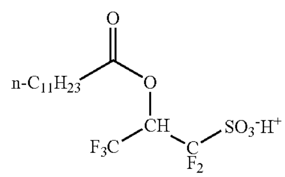

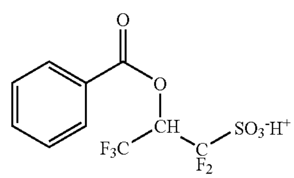

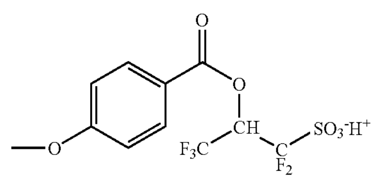

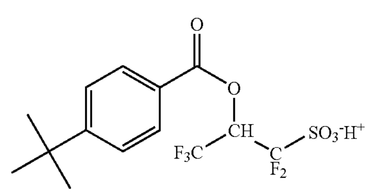

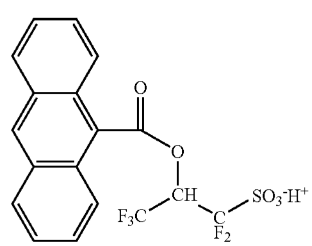

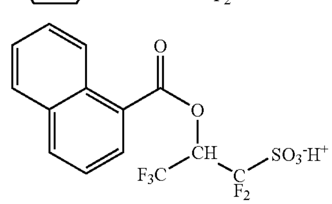

-continued
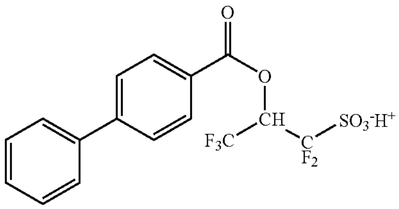
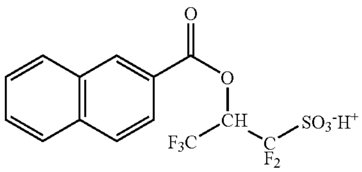
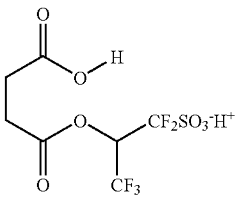
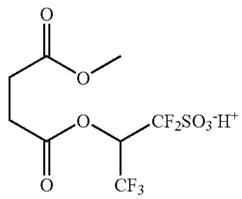
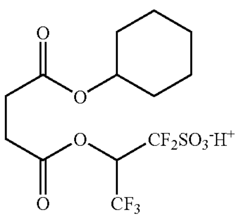
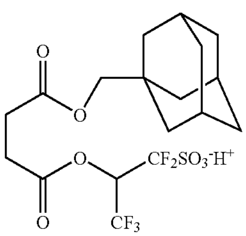
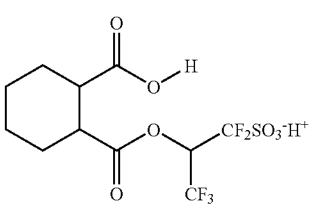
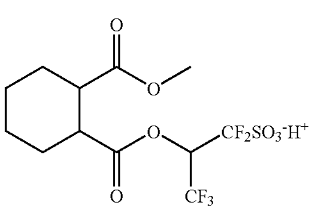
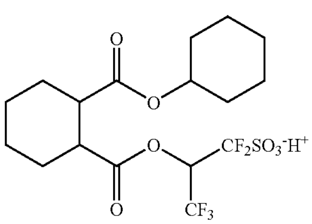
-continued
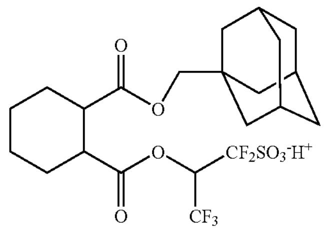
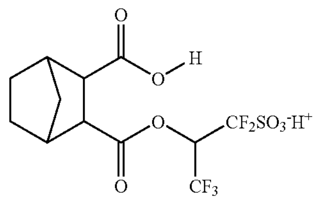
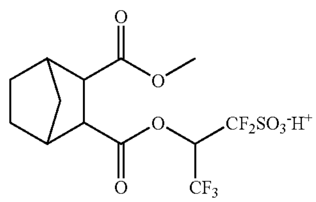
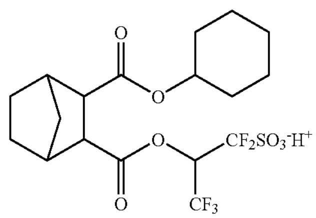
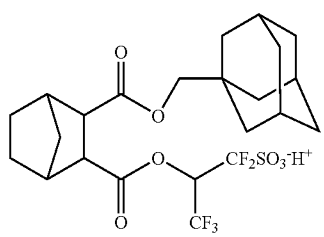
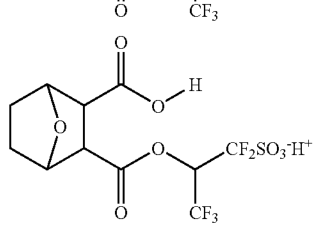
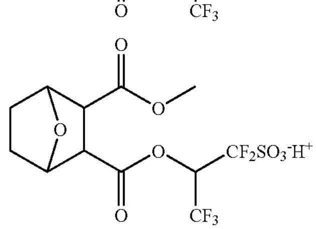
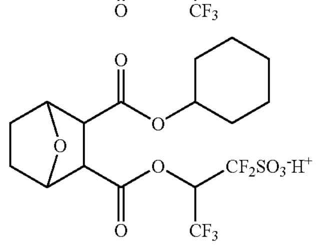

-continued

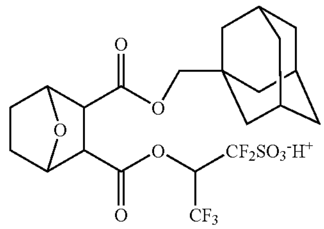

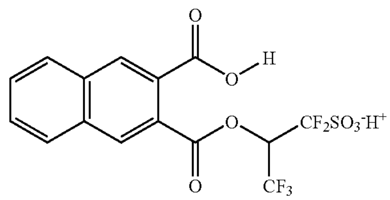

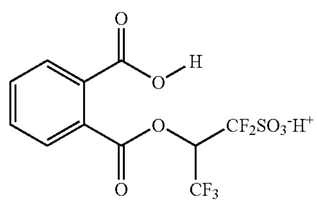

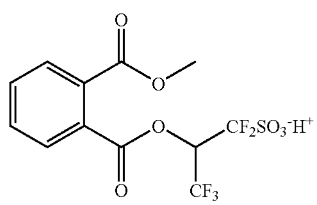

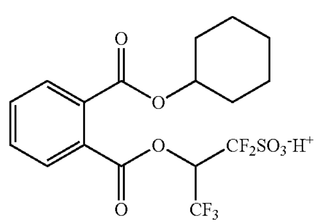

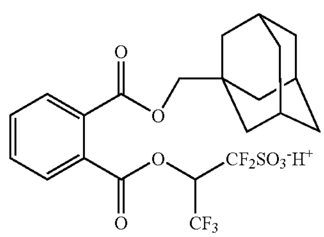

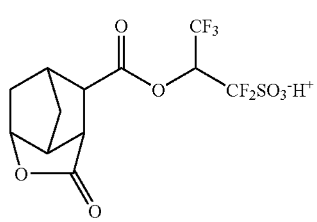

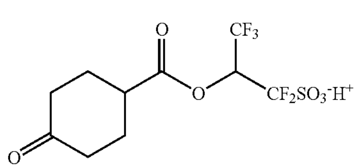

-continued

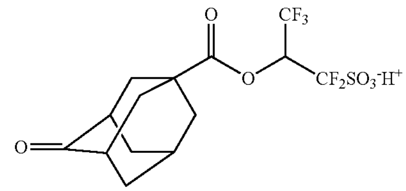

In the general formula (10), $R^{203}$ represents a substituted or unsubstituted $C_{1-20}$ linear, branched, or cyclic alkyl group; or a substituted or unsubstituted $C_{6-14}$ aryl group.

Specific examples of $R^{203}$ may include a methyl group, ethyl group, n-propyl group, sec-propyl group, cyclopropyl group, n-butyl group, sec-butyl group, iso-butyl group, tert-butyl group, n-pentyl group, cyclopentyl group, n-hexyl group, cyclohexyl group, n-octyl group, n-decyl group, n-dodecyl group, 1-adamantyl group, 2-adamantyl group, 1-adamantylmethyl group, 1-(3-hydroxymethyl)adamantyl-methyl group, 4-oxo-1-adamantyl group, 1-hexahydro-2-oxo-3,5-methano-2H-cyclopenta[b]furan-6-yl group, and 1-(3-hydroxy)adamantylmethyl group.

More specific examples of the sulfonic acids represented by the general formula (10) are shown below.

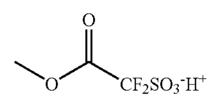

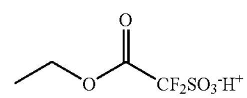

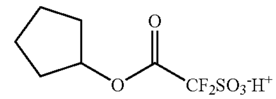

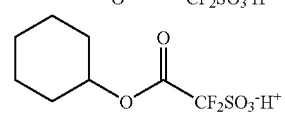

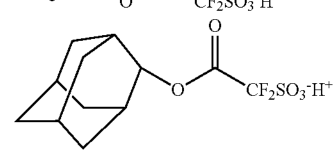

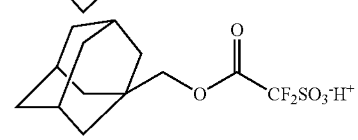

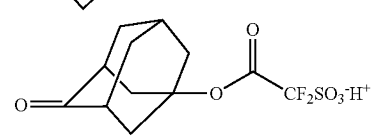

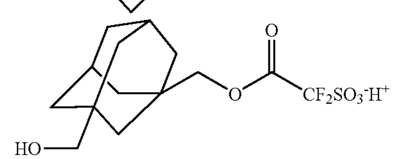

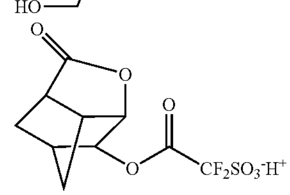

-continued

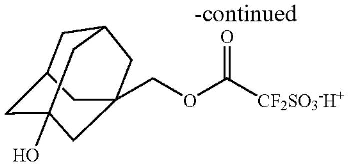

Non-limiting examples of the photoacid generator for chemically amplified resist compositions, the generator generating a sulfonic acid represented by the general formula (2), may include compounds, typically sulfonium salts, iodonium salts, oxime sulfonates and sulfonyl oximides.

The anions of the sulfonium salts are the aforementioned sulfonic acid anions. Examples of the cations of the sulfonic acids may include: triphenylsulfonium, 4-hydroxyphenyldiphenylsulfonium, bis(4-hydroxyphenyl)phenylsulfonium, tris(4-hydroxyphenyl)sulfonium, (4-tert-butoxyphenyl) diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl) phenylsulfonium, tris(3-tert-butoxyphenyl)sulfonium, (3,4-ditert-butoxy phenyl)diphenylsulfonium, bis(3,4-ditert-butoxyphenyl)phenylsulfonium, tris(3,4-ditert-butoxyphenyl)sulfonium, diphenyl(4-thiophenoxy phenyl) sulfonium, (4-tert-butoxycarbonylmethyloxyphenyl) diphenylsulfonium, tris(4-tert-butoxycarbonylmethyloxyphenyl)sulfonium, (4-tert-butoxyphenyl)bis(4-dimethylaminophenyl)sulfonium, tris (4-dimethylaminophenyl)sulfonium, 2-naphthyldiphenylsulfonium, dimethyl-2-naphthylsulfonium, 4-hydroxy phenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl 2-thienyl sulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium. Preferred cations are triphenyl sulfonium, 4-tert-butylphenyldiphenylsulfonium, 4-tert-butoxyphenyldiphenylsulfonium, tris(4-tert-butylphenyl)sulfonium, and (4-tert-butoxycarbonylmethyloxyphenyl)diphenylsulfonium.

Another examples of the cations may include: 4-(methacryloyloxy)phenyldiphenylsulfonium, 4-(acryloyloxy)phenyldiphenylsulfonium, 4-(methacryloyloxy)phenyldimethylsulfonium, and 4-(acryloyloxy)phenyldimethylsulfonium. As for such polymerizable sulfonium cations, Japanese Patent Application Laid-open (kokai) Nos. 04-230645, 2005-84365, and the like can be used as references. The polymerizable sulfonium salts can be used as component monomers for the polymers.

The anions of the iodonium salts are the aforementioned sulfonic acid anions. Examples of the cations of the iodonium salts may include: bis(4-methylphenyl)iodonium, bis(4-ethylphenyl)iodonium, bis(4-tert-butylphenyl)iodonium, bis(4-(1,1-dimethylpropyl)phenyl)iodonium, 4-methoxyphenylphenyliodonium, 4-tert-butoxyphenylphenyliodonium, 4-acryloyloxyphenylphenyliodonium, and 4-methacryloyloxyphenylphenyliodonium. Among the examples, preferred is bis(4-tert-butylphenyl)iodonium.

N-sulfonyloxyimide compounds are compounds where the sulfonic acids are bonded with N-hydroxyimides via sulfonic acid ester bonds. Examples of an imide skeleton except sulfonate moiety are shown below. As for the imide skeleton, Japanese Patent Application Laid-open (kokai) No. 2003-252855 can be used as a reference.

Note that the broken line indicates the point where the skeleton links to its sulfonate moiety.

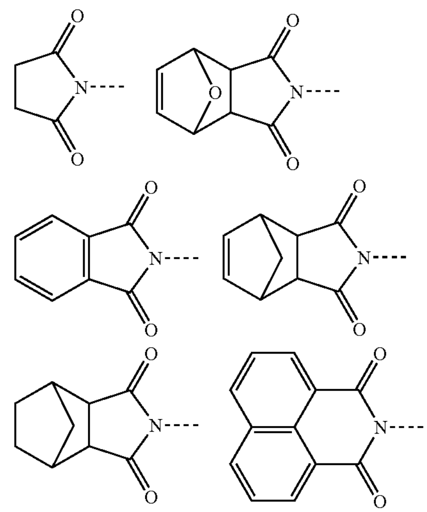

Oxime sulfonate compounds are compounds where the sulfonic acids are bonded with oximes via sulfonic acid ester bonds. Examples of an oxime sulfonate skeleton are shown below. Note that the broken line indicates the point where the skeleton links to its sulfonate moity. Such oxime sulfonate skeletons are desclosed in USP No. 6261738; Japanese Patent Application Laid-open (kokai) Nos. 09-95479, 09-208554, and 09-230588; Japanese Patent Publication No. 2906999; Japanese Patent Application Laid-open (kokai) Nos. 09-301948, 2000-314956, and 2001-233842; and International Publication WO2004/074242.

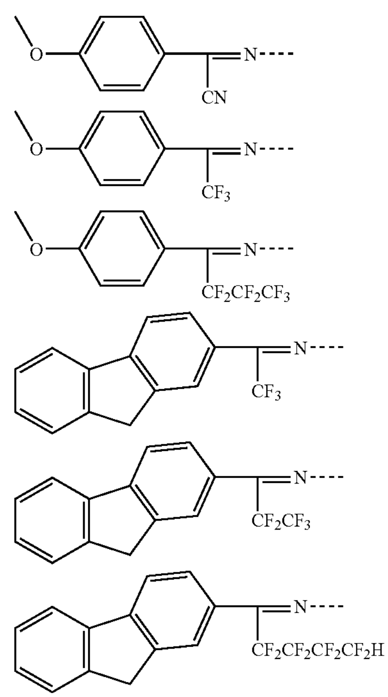

-continued

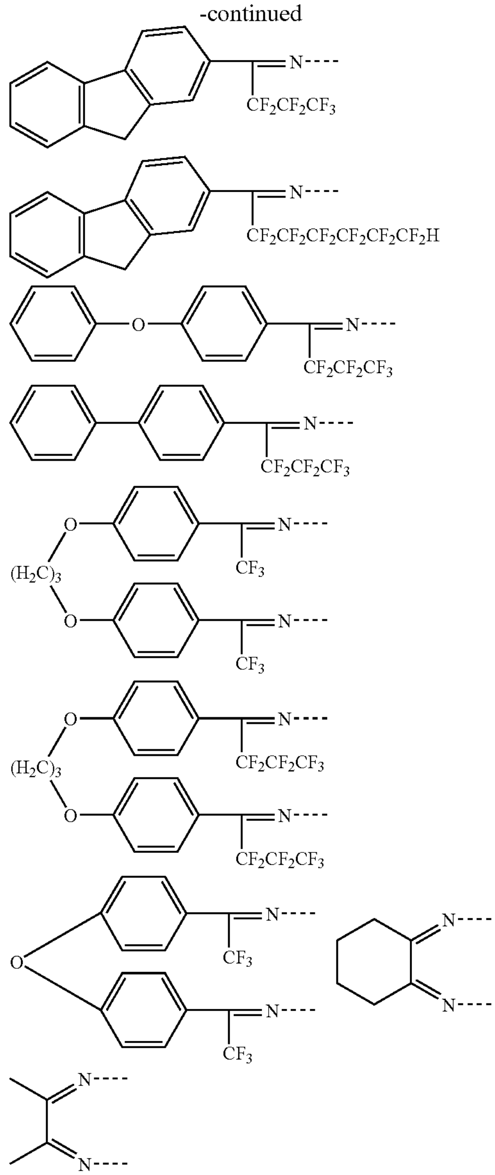

Next, there is described a method of synthesizing a photoacid generator generating sulfonic acid represented by the general formula (9).

There is effected reaction between 1,1,3,3,3-pentafluoropropene-2-yl aliphatic carboxylate or aromatic carboxylate and sodium bisulfite or sodium sulfite in water, alcohol, or mixture of water and alcohol in the presence of radical polymerization initiator such as azobisisobutyronitrile or benzoyl peroxide, thereby synthesizing sulfonate (reference: R. B. Wagner et al., Synthetic Organic Chemistry p813-814, John Wiley & Sons, Inc. (1965)). The 1,1,3,3,3-pentafluoropropene-2-yl aliphatic carboxylate is represented by 1,1,3,3,3-pentafluoropropene-2-yl benzoate, which was developed by Nakai et al. by using 1,1,1,3,3,3-hexafluoro-2-propanol as a starting material (Tetrahedron. Lett., Vol. 29, 4119 (1988)). The sulfonate obtained by the aforementioned method is furthermore subjected to hydrolysis by using alkali such as sodium hydroxide or potassium hydroxide or by solvolysis by using alcohol and base; and subsequently reaction is effected in thus obtained solution by appropriately using aliphatic carboxylic acid halide, aliphatic carboxylic acid anhydride, aromatic carboxylic acid halide, or aromatic carboxylic acid anhydride, thereby providing a sulfonate having a carboxylate structure different from that of the original carboxylate.

Thus obtained sulfonate can be used to prepare sulfonium salt or iodonium salt by methods known in the art. The sulfonate can be used to prepare imide sulfonate or oxime sulfonate by making the sulfonate into sulfonyl halide or sulfonic anhydride, and effecting reaction between the sulfonyl halide or sulfonic anhydride and corresponding hydroxyimide or oxime by methods known in the art.

The sulfonic acid represented by the general formula (9) has the ester moiety intramolecularly, and it is easy to incorporate groups such as from a small acyl group to a bulky acyl group, benzoyl group, naphthoyl group, anthrayl group, or the like. The sulfonic acid thus provides a high degree of flexibility in designing its molecule. Photoacid generators generating such sulfonic acids can be used without any problems in device fabrication processes such as application, pre-exposure baking, exposure, post-exposure baking, and development. By using the photoacid generators, leaching of generated acid to water can be inhibited in ArF immersion exposure, and also inhibits generation of defects because water remaining on wafers does not have large adverse impact. In treating the waste solution of resist after device fabrication, the ester moiety is base hydrolyzed to convert the generator and the acid into low accumulative compounds having lower molecular weights. Also in disposing of the waste solution by combustion, the generator and the acid have high flammability because of low fluorinated ratio.

Next, there is described a method of synthesizing a photoacid generator generating sulfonic acid represented by the general formula (10) according to the present invention. As disclosed in Japanese Patent Application Laid-open (kokai) No. 2006-257078, sodium difluorosulfoacetate and corresponding alcohol are subjected to dehydration condensation by using an acid catalyst, or reaction between sodium difluorosulfoacetate and corresponding alcohol is effected in the presence of 1,1'-carbonyldiimidazole, thereby synthesizing sodium sulfonate. Thus obtained sulfonate can be used to prepare sulfonium salt or iodonium salt by methods known in the art. The sulfonate can be used to prepare imide sulfonate or oxime sulfonate by making the sulfonate into sulfonyl halide or sulfonic anhydride, and effecting reaction between the sulfonyl halide or sulfonic anhydride and corresponding hydroxyimide or oxime.

As with the sulfonic acid represented by the general formula (9), the sulfonic acid represented by the general formula (10) has the ester moiety intramolecularly, and the sulfonic acid thus provides a high degree of flexibility in designing its molecule. Photoacid generators generating such sulfonic acids can be used without any problems in device fabrication processes such as application, pre-exposure baking, exposure, post-exposure baking, and development. By using the photoacid generators, leaching of generated acid to water can be inhibited in ArF immersion exposure, and also inhibits generation of defects because water remaining on wafers does not have large adverse impact. In treating the waste solution of resist after device fabrication, the ester moiety is base hydrolyzed to convert the generator and the acid into low accumulative compounds having lower molecular weights. Also in disposing of the waste solution by combustion, the generator and the acid have high flammability because of low fluorinated ratio.

Any-amount of the (B) photoacid generator may be added in a chemically amplified resist composition according to the present invention, but the amount is preferably 0.1 to 20 parts by mass, more preferably 0.1 to 10 parts by mass based on 100 parts by mass of a base polymer ((A) a resin component according to the present invention, and if necessary, other resin components). When the photoacid generator is used in an amount equal to or less than 20 parts by mass, there is less possibility that resolution deteriorates or problems of foreign matters occur on developing or stripping of resist. The photoacid generator may be used alone or in combination. A photoacid generator having low transmittance at an exposure wavelength may further be used, thereby controlling the transmittance of resist film depending on the amount of the photoacid generator.

Besides the compound (B), the resist composition according to the present invention may further contain another photoacid generator generating acid upon exposure to an active beam or a radiation. The photoacid generator may be any compound generating acid upon exposure to a high energy beam, and any known photoacid generator may be used which is conventionally used for resist compositions, particularly chemically amplified resist compositions. Preferred photoacid generators may include: sulfonium salts, iodonium salts, N-sulfonyloxyimide, and oxime-O-sulfonate type acid generators. Preferred acids generated upon exposure to an active beam or a radiation may include: semi-fluorinated alkanesulfonic acid, semi-fluorinated arenesulfonic acid, trisperfluoroalkylsulfonyl methide, bisperfluoroalkylsulfonylimide, perfluoro 1,3-propylenebissulfonylimide. Hereinafter, examples of the photoacid generators are described, and the photoacid generators may be used alone or in combination.

A sulfonium salt is a salt of sulfonium cation and sulfonate, bis(substituted alkylsulfonyl)imide or tris(substituted alkylsulfonyl)methide.

Examples of the sulfonium cation may include: triphenyl sulfonium, (4-tert-butoxyphenyl)diphenyl sulfonium, bis(4-tert-butoxyphenyl)phenyl sulfonium, tris(4-tert-butoxyphenyl)sulfonium, (3-tert-butoxyphenyl)diphenyl sulfonium, bis(3-tert-butoxyphenyl)phenyl sulfonium, tris(3-tert-butoxyphenyl)sulfonium, (3,4-ditert-butoxyphenyl)diphenyl sulfonium, bis(3,4-ditert-butoxyphenyl)phenyl sulfonium, tris(3,4-ditert-butoxyphenyl)sulfonium, diphenyl(4-thiophenoxyphenyl)sulfonium, (4-tert-butoxycarbonylmethyloxyphenyl)diphenyl sulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenyl sulfonium, dimethyl2-naphthyl sulfonium, 4-hydroxyphenyldimethyl sulfonium, 4-methoxyphenyldimethyl sulfonium, trimethyl sulfonium, 2-oxocyclohexylcyclohexylmethyl sulfonium, trinaphthyl sulfonium, tribenzyl sulfonium, diphenylmethyl sulfonium, dimethylphenyl sulfonium, 2-oxo-2-phenylethylthiacyclo pentanium, 4-n-butoxynaphthyl-1-thiacyclo pentanium, and 2-n-butoxynaphthyl-1-thiacyclo pentanium.

Examples of the sulfonate may include: pentafluoroethylperfluorocyclohexane sulfonate, 2,2,2-trifluoroethane sulfonate, pentafluorobenzene sulfonate, 4-trifluoromethylbenzene sulfonate, and 4-fluorobenzene sulfonate.

Examples of the bis(substituted alkylsulfonyl)imide may include: bistrifluoromethyl sulfonylimide, bispentafluoroethyl sulfonylimide, bisheptafluoropropyl sulfonylimide, and perfluoro-1,3-propylene bissulfonylimide. Examples of the tris(substituted alkylsulfonyl)methide may include tristrifluoromethyl sulfonylmethide.

Examples of the sulfonium salt may include combinations of the sulfonium cations and the sulfonates, the bis(substituted alkylsulfonyl)imides or the tris(substituted alkylsulfonyl)methide.

An iodonium salt is a salt of iodonium cation and sulfonate, bis(substituted alkylsulfonyl)imide or tris(substituted alkylsulfonyl)methide.

Examples of iodonium cation may include: aryl iodonium cation like diphenyl iodonium, bis(4-tert-butylphenyl)iodonium, 4-tert-butoxyphenylphenyl iodonium, and 4-methoxyphenylphenyl iodonium.

Examples of sulfonate may include: pentafluoroethylperfluorocyclohexane sulfonate, 2,2,2-trifluoroethane sulfonate, pentafluorobenzene sulfonate, 4-trifluoromethylbenzene sulfonate, and 4-fluorobenzene sulfonate.

Examples of the bis(substituted alkylsulfonyl)imide may include: bistrifluoromethyl sulfonylimide, bispentafluoroethyl sulfonylimide, bisheptafluoropropyl sulfonylimide, and perfluoro-1,3-propylene bissulfonylimide. Examples of the tris(substituted alkylsulfonyl)methide may include tristrifluoromethyl sulfonylmethide.

Examples of the iodonium salt may include combinations of the iodonium cations and the sulfonates, the bis(substituted alkylsulfonyl)imides or the tris(substituted alkylsulfonyl)methide.

Examples of N-sulfonyl oxyimide type photoacid generator may include: combined compounds of imide structure such as succinimide, naphthalene dicarboxyimide, phthalimide, cyclohexyl dicarboxyimide, 5-norbornene-2,3-dicarboxyimide, or 7-oxabicyclo[2.2.1]-5-heptene-2,3-dicarboxyimide; and pentafluoroethylperfluorocyclohexane sulfonate, 2,2,2-trifluoroethane sulfonate, pentafluorobenzene sulfonate, 4-trifluoromethylbenzene sulfonate, or 4-fluorobenzene sulfonate.

Examples of pyrogalloltrisulfonate type photoacid generator may include: compounds obtained by substituting all hydroxyl groups of pyrogallol, phloroglucinol, catechol, resorcinol and hydroquinone with pentafluoroethylperfluorocyclohexane sulfonate, 2,2,2-trifluoroethane sulfonate, pentafluorobenzene sulfonate, 4-trifluoromethylbenzene sulfonate, or 4-fluorobenzene sulfonate.

Examples of nitrobenzyl sulfonate type photoacid generator may include: 2,4-dinitrobenzyl sulfonate, 2-nitrobenzyl sulfonate, and 2,6-dinitrobenzyl sulfonate. Examples of sulfonate may include: pentafluoroethylperfluorocyclohexane sulfonate, 2,2,2-trifluoroethane sulfonate, pentafluorobenzene sulfonate, 4-trifluoromethylbenzene sulfonate, and 4-fluorobenzene sulfonate. Also usable are compounds in which a nitro group on the benzyl side is substituted with a trifluoromethyl group.

Examples of glyoxime derivative type photoacid generator may include compounds disclosed in Japanese Publication of Patent Application No. 2906999 and Japanese Patent Application Laid-open (kokai) No. 09-301948. Examples thereof may include: bis-O-(2,2,2-trifluoroethane sulfonyl)-α-dimethylglyoxime, bis-O-(p-fluorobenzene sulfonyl)-α-dimethylglyoxime, bis-O-(p-trifluoromethylbenzene sulfonyl)-α-dimethylglyoxime, bis-O-(2,2,2-trifluoroethane sulfonyl)-dioxime, bis-O-(p-fluorobenzene sulfonyl)-dioxime, and bis-O-(p-trifluoromethylbenzene sulfonyl)-dioxime.

Examples of the photoacid generators may further include oxime sulfonates represented by the following formula (specific examples thereof are disclosed in WO2004/074242).

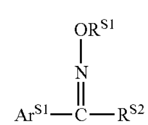

In the formula, $R^{S1}$ represents substituted or unsubstituted $C_{1-10}$ haloalkyl sulfonyl or halobenzene sulfonyl. $R^{S2}$ represents a $C_{1-11}$ haloalkyl group. $Ar^{S1}$ represents a substituted or unsubstituted aromatic group or hetero aromatic group.

Examples of the oxime sulfonates may include: 2-[2,2,3,3,4,4,5,5-octafluoro-1-(p-fluorobenzenesulfonyloxyimino)-pentyl]-fluorene, 2-[2,2,3,3,3,4,4-pentafluoro-1-(p-fluorobenzenesulfonyloxyimino)-butyl]-fluorene, 2-[2,2,3,3,4,4,5,5,6,6-decafluoro-1-(p-fluorobenzenesulfonyloxyimino)-hexyl]-fluorene, 2-[2,2,3,3,4,4,5,5-octafluoro-1-(p-fluorobenzenesulfonyloxyimino)-pentyl]-4-biphenyl, 2-[2,2,3,3,4,4-pentafluoro-1-(p-fluorobenzenesulfonyloxyimino)-butyl]-4-biphenyl, and 2-[2,2,3,3,4,4,5,5,6,6-decafluoro-1-(p-fluorobenzenesulfonyloxyimino)-hexyl]-4-biphenyl.

Furthermore, examples of the photoacid generators may include bisoxime sulfonates disclosed in Japanese Patent Application Laid-open (kokai) No. 09-208554, in particular, bis(α-(p-fluorobenzenesulfonyloxy)imino)-p-phenylenediacetonitrile, and bis(α-(p-fluorobenzenesulfonyloxy)imino)-m-phenylenediacetonitrile.

Among the above photoacid generators, preferred generators are sulfonium salts, N-sulfonyloxyimides, oxime-O-sulfonates, and glyoxime derivatives; and more preferably, sulfonium salts, N-sulfonyloxyimides, and oxime-O-sulfonates. Examples thereof may include: triphenylsulfonium pentafluorobenzenesulfonate, tert-butylphenyldiphenylsulfonium pentafluorobenzenesulfonate, 4-tertbutylphenyldiphenylsulfonium pentafluoroethylperfluorocyclohexanesulfonate, 2-[2,2,3,3,4,4,5,5-octafluoro-1-(p-fluorobenzenesulfonyloxyimino)-pentyl]-fluorene, 2-[2,2,3,3,4,4-pentafluoro-1-(p-fluorobenzenesulfonyloxyimino)-butyl]-fluorene, and 2-[2,2,3,3,4,4,5,5,6,6-decafluoro-1-(p-fluorobenzenesulfonyloxyimino)-hexyl]-fluorene.

A resist composition according to the present invention at least comprises:

(A) a resin component comprising a repeating unit represented by the general formula (1);

(B) a photoacid generator generating sulfonic acid represented by the general formula (2) upon exposure to a high energy beam such as ultraviolet rays, far ultraviolet rays, an electron beam, X-rays, excimer lasers, gamma rays, or synchrotron radiation; and (C) an onium salt where a cation is sulfonium represented by the following general formula (3), or ammonium represented by the following general formula (4); and an anion is represented by any one of the following general formulae (5) to (7).

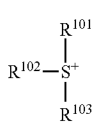

(3)

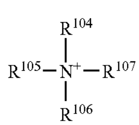

(4)

wherein $R^{101}$, $R^{102}$, and $R^{103}$ independently represent a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{101}$, $R^{102}$, and $R^{103}$ may be linked together to form a ring with the S in the formula (3); and $R^{104}$, $R^{105}$, $R^{106}$, and $R^{107}$ independently represent a hydrogen atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{104}$, $R^{105}$, $R^{106}$, and $R^{107}$ may be linked together to form a ring with the N in the formula (4).

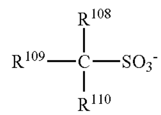

(5)

wherein $R^{108}$, $R^{109}$, and $R^{110}$ independently represent a hydrogen atom, a halogen atom except a fluorine atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{108}$, $R^{109}$, and $R^{110}$ may be linked together to form a ring.

$$R^{111}\text{—}SO_3^- \quad (6)$$

wherein $R^{111}$ represents a $C_{1-20}$ aryl group where a hydrogen atom or hydrogen atoms of the aryl group may be substituted with a halogen atom, a hydroxy group, a carboxy group, an amino group, or a cyano group; and hydrogen atom or hydrogen atoms of the aryl group may be substituted with a $C_{1-20}$ linear, branched, or cyclic alkyl group.

$$R^{112}\text{—}COO^- \quad (7)$$

wherein $R^{112}$ represents a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group.

The cation of the (C) onium salt is preferably quaternary ammonium represented by the following general formula (11).

In this case, where the cation of the (C) onium salt is quaternary ammonium represented by the following general formula (11), the resist composition has excellent storage stability over an extended time period because there are no hydrogen atoms on the nitrogen atom, and proton transfer does not occur in the presence of other strongly basic nitrogen-containing organic compounds.

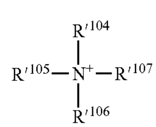

(11)

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

Examples of the sulfonium cation represented by the general formula (3) may include: triphenylsulfonium, 4-hydroxyphenyldiphenylsulfonium, bis(4-hydroxyphenyl)phenylsulfonium, tris(4-hydroxyphenyl)sulfonium, (4-tert-butoxyphenyl)diphenylsulfonium, bis(4-tert-butoxyphenyl) phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-ditert-butoxyphenyl)diphenylsulfonium, bis(3,4-ditert-butoxyphenyl)phenylsulfonium, tris(3,4-ditert-butoxyphenyl)sulfonium, diphenyl(4-thiophenoxyphenyl) sulfonium, (4-tert-butoxycarbonylmethyloxyphenyl) diphenylsulfonium, tris(4-tert-butoxycarbonylmethyloxyphenyl)sulfonium, (4-tert-butoxyphenyl)bis(4-dimethylaminophenyl)sulfonium, tris (4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium; more preferably, triphenylsulfonium, 4-tert-butylphenyldiphenylsulfonium, 4-tert-butoxyphenyldiphenylsulfonium, tris(4-tert-butylphenyl)sulfonium, and (4-tert-butoxycarbonylmethyloxyphenyl)diphenylsulfonium.

Examples of the sulfonium cation further may include: 4-(methacryloyloxy)phenyldiphenylsulfonium, 4-(acryloyloxy)phenyldiphenylsulfonium, 4-(methacryloyloxy)phenyldimethylsulfonium, and 4-(acryloyloxy)phenyldimethylsulfonium. As for such polymerizable sulfonium cations, Japanese Patent Application Laid-open (kokai) Nos. 04-230645, 2005-84365, and the like can be used as references. The polymerizable sulfonium salts can be incorporated into repeating units of the polymers.

Examples of the ammonium cation represented by the general formula (4) may include ammonium cations and quaternary ammonium cations obtained by protonating nitrogen atoms of ammonia, primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxyphenyl group, nitrogen-containing alcohol compounds, or the like.

Examples of primary aliphatic ammoniums may include: methylammonium, ethylammonium, n-propylammonium, isopropylammonium, n-butylammonium, isobutylammonium, sec-butyl-ammonium, tert-butylammonium, pentylammonium, tert-amylammonium, cyclopentylammonium, hexylammonium, cyclohexylammonium, heptylammonium, octylammonium, nonylammonium, decylammonium, dodecylammonium, cetylammonium, aminomethylammonium, and 2-aminoethylammonium.

Examples of secondary aliphatic ammoniums may include: dimethylammonium, diethylammonium, di-n-propylammonium, diisopropylammonium, di-n-butylammonium, diisobutylammonium, di-sec-butyl-ammonium, dipentylammonium, dicyclopentylammonium, dihexylammonium, dicyclohexylammonium, diheptylammonium, dioctylammonium, dinonylammonium, didecylammonium, didodecylammonium, dicetylammonium, methyl (methylamino)aminomethylammonium, and methyl-2-(methylamino)ethylammonium.

Examples of tertiary aliphatic ammoniums may include: trimethylammonium, triethylammonium, tri-n-propylammonium, triisopropylammonium, tri-n-butylammonium, triisobutylammonium, tri-sec-butyl-ammonium, tripentylammonium, tricyclopentylammonium, trihexylammonium, tricyclohexylammonium, triheptylammonium, trioctylammonium, trinonylammonium, tridecylammonium, tridodecylammonium, tricetylammonium, dimethyl(dimethylamino) methylammonium, and dimethyl-(2-dimethylaminoethyl) ammonium.

Examples of the mixed ammoniums may include: dimethylethylammonium, methylethylpropylammonium, benzylammonium, phenethylammonium, and benzyldimethylammonium. Examples of the aromatic ammoniums and heterocyclic ammoniums may include: anilinium derivatives such as anilinium, N-methylanilinium, N-ethylanilinium, N-propylanilinium, N,N-dimethylanilinium, 2-methylanilinium, 3-methylanilinium, 4-methylanilinium, ethylanilinium substituted at any position, propylanilinium substituted at any position, trimethylanilinium substituted at any position, 2-nitroanilinium, 3-nitroanilinium, 4-nitroanilinium, 2,4-dinitroanilinium, 2,6-dinitroanilinium, 3,5-dinitroanilinium, or N,N-dimethyltoluidinium substituted at any position; diphenyl(p-tolyl)ammonium; methyldiphenylammonium; triphenylammonium; aminophenylammonium substituted at any position; naphthylammonium; aminonaphthylammonium substituted at any position; pyrrolinium derivatives such as pyrrolinium, 2H-pyrrolinium, 1-methylpyrrolinium, 2,4-dimethylpyrrolinium, 2,5-dimethylpyrrolinium, and N-methylpyrrolinium; oxazolium derivatives such as oxazolium or isoxazolium; thiazolium derivatives such as thiazolium or isothiazolium; imidazolium derivatives such as imidazolium, 4-methylimidazolium, or 4-methyl-2-phenylimidazolium; pyrazolium derivatives; furazanium derivatives; pyrrolinium derivatives such as pyrrolinium, or 2-methyl-1-pyrrolinium; pyrrolidinium derivatives such as pyrrolidinium, N-methylpyrrolidinium, pyrrolidinonium, or N-methylpyrolidonium; imidazolinium derivatives; imidazolidinium derivatives; pyridinium derivatives such as pyridinium, methylpyridinium, ethylpyridinium, propylpyridinium, butylpyridinium, 4-(1-butylpentyl)pyridinium, dimethylpyridinium, trimethylpyridinium, triethylpyridinium, phenylpyridinium, 3-methyl-2-phenylpyridinium, 4-tert-butylpyridinium, diphenylpyridinium, benzylpyridinium, methoxypyridinium, butoxypyridinium, dimethoxypyridinium, 4-pyrrolidinopyridinium, 2-(1-ethylpropyl)pyridinium, aminopyridinium, or dimethylaminopyridinium; pyridazinium derivatives; pyrimidinium derivatives; pyrazinium derivatives; pyrazolinium derivatives; pyrazolidinium derivatives; piperidinium derivatives; piperazinium derivatives; morpholinium derivatives; indolinium derivatives; isoindolinium derivatives; 1H-indazolinium derivatives; indolinium derivatives; quinolinium derivatives such as quinolinium; isoquinolinium derivatives; cinnolinium derivatives; quinazolinium derivatives; quinoxalinium derivatives; phthalazinium derivatives; purinium derivatives; pteridinium derivatives; carbazolium derivatives; phenanthridinium derivatives; acridinium derivatives; phenazinium derivatives; and 1,10-phenanthrolinium derivatives.

Examples of the nitrogen-containing compounds having a carboxy group may include: carboxyphenylammonium, carboxyindolinium and amino acid derivatives such as protonated products of nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine. Examples of the nitrogen-containing compounds having a sulfonyl group may include 3-pyridiniumsulfonic acid. Examples of the nitrogen-containing compounds having a hydroxyl group, the nitrogen-containing compounds having a hydroxyphenyl group, and the nitrogen-containing alcohol compounds may include: 2-hydroxypyridinium, hydroxyanilinium substituted at any position, hydroxy-methyl-anilinium substituted at any position, hydroxyquinolinium, dihydroxyquinolinium, 2-hydroxyethylammonium, bis(2-hydroxyethyl)ammonium, tris(2-hydroxyethyl)ammonium, ethylbis(2-hydroxyethyl)ammonium, diethyl(2-hydroxyethyl)ammonium, hydroxypropylammonium, bis(hydroxypropyl)ammonium, tris(hydroxypropyl)ammonium, 4-(2-hydroxyethyl)morpholinium, 2-(2-hydroxyethyl) pyridinium, 1-(2-hydroxyethyl)piperazinium, 1-[2-(2-hydroxyethoxy)ethyl]piperazinium, (2-hydroxyethyl) piperazinium, 1-(2-hydroxyethyl)pyrrolidinium, 1-(2-hydroxyethyl)-2-pyrrolidinonium, 2,3-dihydroxypropylpiperizinium, 2,3-dihydroxypropylpiperolidinium, 8-hydroxyjulolidinium, and 3-hydroxyquinuclidinium.

There are another examples of ammonium cations represented by the following general formula (4)-1.

$$HN^{+}(X)_{n}(Y)_{3-n} \tag{4)-1 $$

In the formula, n is 1, 2, or 3. The side chain X may be the same or different, and may represent any one of the following general formulae (X1) to (X3).

$$-\!\!\!+ R^{300}-O-R^{301}] \quad \text{(X1)}$$

$$-\!\!\!+ R^{302}-O-R^{303}-\overset{O}{\overset{\|}{C}}-R^{304}] \quad \text{(X2)}$$

$$-\!\!\!+ R^{305}-\overset{O}{\overset{\|}{C}}-O-R^{306}] \quad \text{(X3)}$$

The side chain Y may be the same or different, and represents a hydrogen atom or a $C_{1-20}$ linear, branched or cyclic alkyl group which may contain an ether group or a hydroxyl group. X may bond to each other to form a ring.

In the general formulae (X1) to (X3), $R^{300}$, $R^{302}$, and $R^{305}$ represent a linear or branched alkylene group having 1-4 carbon atoms; and $R^{301}$ and $R^{304}$ represent a hydrogen atom or a $C_{1-20}$ linear, branched or cyclic alkyl group which may contain one or more of a hydroxy group, an ether group, an ester group, and a lactone ring.

$R^{303}$ represents a single bond, or a linear or branched alkylene group having 1-4 carbon atoms. $R^{306}$ represents a $C_{1-20}$ linear, branched or cyclic alkyl group which may contain one or more of a hydroxy group, an ether group, an ester group, and a lactone ring.

Examples of the compound represented by the general formula (4)-1 may include: tris(2-methoxymethoxyethyl) ammonium, tris{2-(2-methoxyethoxy)ethyl}ammonium, tris{2-(2-methoxyethoxymethoxy)ethyl}ammonium, tris{2-(1-methoxyethoxy)ethyl}ammonium, tris{2-(1-ethoxyethoxy)ethyl}ammonium, tris{2-(1-ethoxypropoxy) ethyl}ammonium, tris[2-{2-(2-hydroxyethoxy) ethoxy}ethyl]ammonium, protonated 4,7,13,16,21,24-hexaoxa-1,10-diazabicyclo[8.8.8]hexacosane, protonated 4,7,13,18-tetraoxa-1,10-diazabicyclo[8.5.5]eicosane, protonated 1,4,10,13-tetraoxa-7,16-diazabicyclo octadecane, protonated 1-aza-12-crown-4, protonated 1-aza-15-crown-5, protonated 1-aza-18-crown-6, tris(2-formyloxyethyl)ammonium, tris(2-acetoxyethyl)ammonium, tris(2-propionyloxyethyl)ammonium, tris(2-butylyloxyethyl)ammonium, tris(2-isobutyryloxyethyl)ammonium, tris(2-valeryloxyethyl) ammonium, tris(2-pivaloyloxyethyl)ammonium, N,N-bis(2-acetoxyethyl)2-(acetoxyacetoxy)ethylammonium, tris(2-methoxycarbonyloxyethyl)ammonium, tris(2-tert-butoxycarbonyloxyethyl)ammonium, tris[2-(2-oxopropoxy) ethyl]ammonium, tris[2-(methoxycarbonylmethyl)oxyethyl] ammonium, tris[2-(tert-butoxycarbonylmethyloxy)ethyl] ammonium, tris[2-(cyclohexyloxycarbonylmethyloxy) ethyl]ammonium, tris(2-methoxycarbonylethyl)ammonium, tris(2-ethoxycarbonylethyl)ammonium, N,N-bis(2-hydroxyethyl)2-(methoxycarbonyl)ethylammonium, N,N-bis(2-acetoxyethyl)2-(methoxycarbonyl)ethylammonium, N,N-bis (2-hydroxyethyl)2-(ethoxycarbonyl)ethylammonium, N,N-bis(2-acetoxyethyl)2-(ethoxycarbonyl)ethylammonium, N,N-bis(2-hydroxyethyl)2-(2-methoxyethoxycarbonyl) ethylammonium, N,N-bis(2-acetoxyethyl)2-(2-methoxyethoxycarbonyl)ethylammonium, N,N-bis(2-hydroxyethyl) 2-(2-hydroxyethoxycarbonyl)ethylammonium, N,N-bis(2-acetoxyethyl)2-(2-acetoxyethoxycarbonyl)ethylammonium, N,N-bis(2-hydroxyethyl)2-[(methoxycarbonyl)methoxycarbonyl]ethylammonium, N,N-bis(2-acetoxyethyl)2-[(methoxycarbonyl)methoxycarbonyl]ethylammonium, N,N-bis(2-hydroxyethyl)2-(2-oxopropoxycarbonyl)ethylammonium, N,N-bis(2-acetoxyethyl)2-(2-oxopropoxycarbonyl)ethylammonium, N,N-bis(2-hydroxyethyl)2-(tetrahydrofurfuryloxycarbonyl)ethylammonium, N,N-bis(2-acetoxyethyl)2-(tetrahydrofurfuryloxycarbonyl)ethylammonium, N, N-bis(2-hydroxyethyl)2-[(2-oxotetrahydrofuran-3-yl)oxycarbonyl] ethylammonium, N,N-bis(2-acetoxyethyl)2-[(2-oxotetrahydrofuran-3-yl)oxycarbonyl]ethylammonium, N,N-bis(2-hydroxyethyl)2-(4-hydroxybutoxycarbonyl)ethylammonium, N,N-bis(2-formyloxyethyl)2-(4-formyloxybutoxycarbonyl)ethylammonium, N,N-bis(2-fornyyloxyethyl) 2-(2-formyloxyethoxycarbonyl)ethylammonium, N,N-bis (2-methoxyethyl)2-(methoxycarbonyl)ethylammonium, N-(2-hydroxyethyl)bis[2-(methoxycarbonyl)ethyl]ammonium, N-(2-acetoxyethyl)bis[2-(methoxycarbonyl)ethyl]ammonium, N-(2-hydroxyethyl)bis[2-(ethoxycarbonyl)ethyl] ammonium, N-(2-acetoxyethyl)bis[2-(ethoxycarbonyl) ethyl]ammonium, N-(3-hydroxy-1-propyl)bis[2-(methoxycarbonyl)ethyl]ammonium, N-(3-acetoxy-1-propyl)bis[2-(methoxycarbonyl)ethyl]ammonium, N-(2-methoxyethyl)bis[2-(methoxycarbonyl)ethyl]ammonium, N-butylbis[2-(methoxycarbonyl)ethyl]ammonium, N-butylbis[2-(2-methoxyethoxycarbonyl)ethyl]ammonium, N-methylbis(2-acetoxyethyl)ammonium, N-ethylbis(2-acetoxyethyl)ammonium, N-methylbis(2-pivaloyloxyethyl) ammonium, N-ethylbis[2-(methoxycarbonyloxy)ethyl] ammonium, N-ethylbis[2-(tert-butoxycarbonyloxy)ethyl] ammonium, tris(methoxycarbonylmethyl)ammonium, tris (ethoxycarbonylmethyl)ammonium, N-butylbis (methoxycarbonylmethyl)ammonium, N-hexylbis (methoxycarbonylmethyl)ammonium, and protonated β-(diethylamino)-δ-valerolactone.

Examples of the ammonium cations include the following ammonium cations having cyclic structures represented by the following general formula (4)-2.

(4)-2

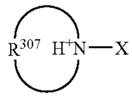

In the formula, X represents the same as mentioned above; $R^{307}$ represents a $C_{2-20}$ linear or branched alkylene group which may contain one or more of a carbonyl group, an ether group, an ester group, and a sulfide.

Examples of ammonium cations represented by the formula (4)-2 may include protonated compounds of 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidino propionate, methyl 3-morpholino propionate, methyl 3-(thiomorpholino) propionate, methyl 2-methyl-3-(1-pyrrolidinyl)propionate, ethyl 3-morpholino propionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Examples of the ammonium cations include the following ammonium cations having cyano groups represented by the following general formulae (4)-3 to (4)-6.

(4)-3

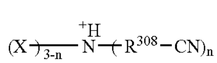

(4)-4

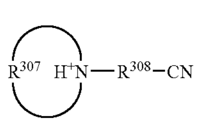

(4)-5

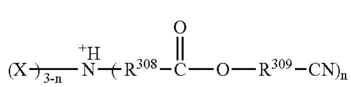

-continued (4)-6

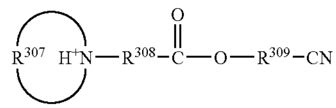

In the formulae, X, $R^{307}$, and n are the same as mentioned above. $R^{308}$ and $R^{309}$ are the same or different, and represent a linear or branched alkylene group having 1-4 carbon atoms.

Examples of the ammonium cations having cyano groups represented by the general formulae (4)-3 to (4)-6 may include protonated compounds of 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinium propiononitrile, 1-piperidinium propiononitrile, 4-morpholinium propiononitrile, 1-pyrrolidinium acetonitrile, 1-piperidinium acetonitrile, 4-morpholinium acetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, (2-cyanoethyl)3-diethylaminopropionate, (2-cyanoethyl) N,N-bis(2-hydroxyethyl)-3-aminopropionate, (2-cyanoethyl) N,N-bis(2-acetoxyethyl)-3-aminopropionate, (2-cyanoethyl) N,N-bis(2-formyloxyethyl)-3-aminopropionate, (2-cyanoethyl) N,N-bis(2-methoxyethyl)-3-aminopropionate, (2-cyanoethyl) N,N-bis[2-

(methoxymethoxy)ethyl]-3-aminopropionate, cyanomethyl 1-pyrrolidinium propionate, cyanomethyl 1-piperidinium propionate, cyanomethyl 4-morpholinium propionate, (2-cyanoethyl) 1-pyrrolidinepropionate, (2-cyanoethyl) 1-piperidinepropionate, and (2-cyanoethyl) 4-morpholinium propionate.

Examples of the ammonium cations include ammonium cations having an imidazolium skeleton and a polar functional group represented by the following general formula (4)-7.

(4)-7

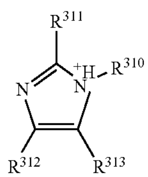

In the formula, $R^{310}$ represents a $C_{2-20}$ linear, branched or cyclic alkyl group having a polar functional group. The polar functional group is one or more of a hydroxy group, a carbonyl group, an ester group, an ether group, a sulfide group, a carbonate group, a cyano group, and an acetal group. $R^{311}$, $R^{312}$, and $R^{313}$ represent a hydrogen atom, a $C_{1-10}$ linear, branched or cyclic alkyl group, an aryl group, or an aralkyl group.

Examples of the ammonium cations include ammonium cations having a benzimidazolium skeleton and a polar functional group represented by the following general formula (4)-8.

(4)-8

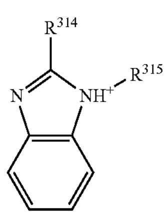

In the formula, $R^{314}$ represents a hydrogen atom, a $C_{1-10}$ linear, branched or cyclic alkyl group, an aryl group, or an aralkyl group. $R^{315}$ represents a $C_{1-20}$ linear, branched or cyclic alkyl group having a polar functional group; the polar functional group is one or more of an ester group, an acetal group and a cyano group; and $R^{315}$ may further contain one or more of a hydroxy group, a carbonyl group, an ether group, a sulfide group, and a carbonate group.

Examples of the ammonium cations include ammonium cations having a polar functional group represented by the following general formulae (4)-9 and (4)-10.

(4)-9

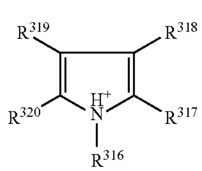

-continued (4)-10

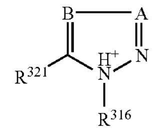

In the formulae, A represents a nitrogen atom or ═C—$R^{322}$. B represents a nitrogen atom or ═C—$R^{323}$. $R^{316}$ represents a $C_{2-20}$ linear, branched or cyclic alkyl group having a polar functional group. The polar functional group is one or more of a hydroxy group, a carbonyl group, an ester group, an ether group, a sulfide group, a carbonate group, a cyano group, and an acetal group. $R^{317}$, $R^{318}$, $R^{319}$, and $R^{320}$ represent a hydrogen atom, a $C_{1-10}$ linear, branched or cyclic alkyl group, or an aryl group. Alternatively, $R^{317}$ and $R^{318}$, and $R^{319}$ and $R^{320}$ can be linked to each other to form a benzene ring, a naphthalene ring or a pyridinium ring. $R^{321}$ represents a hydrogen atom, a $C_{1-10}$ linear, branched or cyclic alkyl group, or an aryl group. $R^{322}$ and $R^{323}$ represent a hydrogen atom, a $C_{1-10}$ linear, branched or cyclic alkyl group, or an aryl group. $R^{321}$ and $R^{323}$ can be linked to form a benzene ring or a naphthalene ring.

Examples of the ammonium cations include ammonium cations having aromatic carboxylate structures represented by the following general formulae (4)-11, (4)-12, (4)-13, and (4)-14.

(4)-11

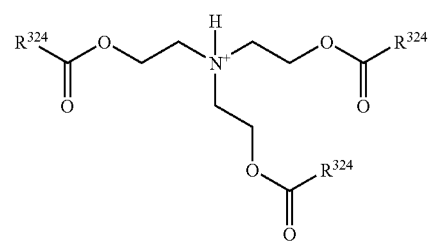

(4)-12

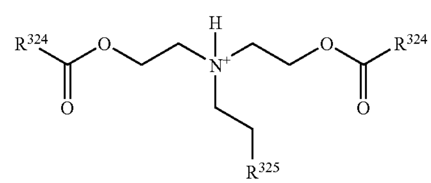

(4)-13

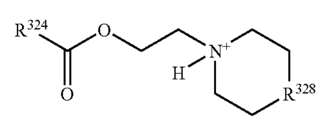

(4)-14

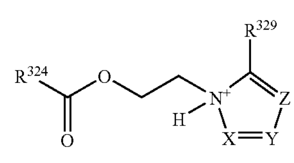

In the formulae, $R^{324}$ represents an aryl group having 6-20 carbon atoms or a hetero aromatic group having 4-20 carbon atoms where a part of or all hydrogen atoms may be optionally substituted with a halogen atom, a linear, branched or cyclic alkyl group having 1-20 carbon atoms, an aryl group having 6-20 carbon atoms, an aralkyl group having 7-20 carbon atoms, an alkoxy group having 1-10 carbon atoms, an acyloxy group having 1-10 carbon atoms, or an alkyl thio group having 1-10 carbon atoms. $R^{325}$ represents $CO_2R^{326}$, $OR^{327}$, or a cyano group. $R^{326}$ represents an alkyl group having 1-10 carbon atoms where methylene groups may partially be substituted with oxygen atoms. $R^{327}$ represents an alkyl group or an acyl group having 1-10 carbon atoms where methylene groups may partially be substituted with oxygen atoms. $R^{328}$ represents a single bond, a methylene group, an ethylene group, a sulfur atom, or $—O(CH_2CH_2O)_n—$ group. n denotes 0, 1, 2, 3, or 4. $R^{329}$ represents a hydrogen atom, a methyl group, an ethyl group, or a phenyl group. X represents a nitrogen atom or $CR^{330}$. Y represents a nitrogen atom or $CR^{331}$. Z represents a nitrogen atom or $CR^{332}$. $R^{330}$, $R^{331}$, and $R^{332}$ independently represent a hydrogen atom, a methyl group or a phenyl group. $R^{330}$ and $R^{331}$; or $R^{331}$ and $R^{332}$ can be linked to form an aromatic ring having 6-20 carbon atoms or a hetero aromatic ring having 2-20 carbon atoms.

Examples of the ammonium cations include ammonium cations having a 7-oxanorbornane-2-carboxylate structure represented by the following general formula (4)-15.

(4)-15

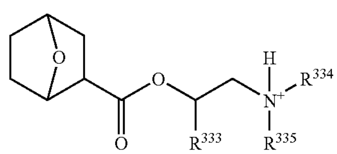

In the formula, $R^{333}$ represents a hydrogen atom, or a linear, branched or cyclic alkyl group having 1-10 carbon atoms. $R^{334}$ and $R^{335}$ independently represent a $C_{1-20}$ alkyl group, a $C_{6-20}$ aryl group, or a $C_{7-20}$ aralkyl group where the groups may comprise one or more polar functional groups such as ether, carbonyl, ester, alcohol, sulfide, nitrile, ammonium, imine or amide; and a part of or all hydrogen atoms may optionally be substituted with a halogen atom. $R^{334}$ and $R^{335}$ can be linked to form a hetero ring or a hetero aromatic ring having 2-20 carbon atoms.

Examples of the quaternary ammonium salt may include: tetramethylammonium, triethylmethylammonium, tetraethylammonium, tetrapropylammonium, tetrabutylammonium, tetraoctylammonium, didecyldimethylammonium, tridecylmethylammonium, hexadecyltrimethylammonium, stearyltrimethylammonium, phenyltrimethylammonium, benzyltrimethylammonium, benzyltriethylammonium, benzyltributylammonium, and benzyldimethylstearylammonium.

Examples of the alkanesulfonic acid anion represented by the general formula (5) may include: methanesulfonate, ethanesulfonate, propanesulfonate, butanesulfonate, pentanesulfonate, hexanesulfonate, cyclohexanesulfonate, octanesulfonate, and 10-camphorsulfonate.

Examples of the arenesulfonic acid anion represented by the general formula (6) may include: benzenesulfonate, 4-toluenesulfonate, 2-toluenesulfonate, xylenesulfonate substituted in any position, trimethylbenzenesulfonate, mesitylenesulfonate, 4-methoxybenzenesulfonate, 4-ethylbenzenesulfonate, 2,4,6-triisopropylbenzenesulfonate, 1-naphthalenesulfonate, 2-naphthalenesulfonate, anthraquinone-1-sulfonate, anthraquinone-2-sulfonate, 4-(4-methylbenzenesulfonyloxy)benzenesulfonate, 3,4-bis(4-methylbenzenesulfonyloxy)benzenesulfonate, 6-(4-methylbenzenesulfonyloxy)naphthalene-2-sulfonate, 4-phenyloxybenzenesulfonate, 4-diphenylmethylbenzenesulfonate, 2,4-dinitrobenzenesulfonate, and dodecylbenzenesulfonate.

Examples of the carboxylic acid anion represented by the general formula (7) may include: formic acid anion, acetic acid anion, propionic acid anion, butyric acid anion, isobutyric acid anion, valeric acid anion, isovaleric acid anion, pivalic acid anion, hexanoic acid anion, octanoic acid anion, cyclohexanecarboxylic acid anion, cyclohexylacetic acid anion, lauric acid anion, myristic acid anion, palmitic acid anion, stearic acid anion, phenylacetic acid anion, diphenylacetic acid anion, phenoxyacetic acid anion, mandelic acid anion, benzoylformic acid anion, cinnamicacid anion, dihydrocinnamicacid anion, benzoic acid anion, methylbenzoic acid anion, salicylic acid anion, naphthalenecarboxylic acid anion, anthracenecarboxylic acid anion, anthraquinonecarboxylic acid anion, hydroxyacetic acid anion, pivalic acid anion, lactic acid anion, methoxyacetic acid anion, 2-(2-methoxyethoxy)acetic acid anion, 2-(2-(2-methoxyethoxy)ethoxy)acetic acid anion, diphenolic acid anion, monochloroacetic acid anion, dichloroacetic acid anion, trichloroacetic acid anion, trifluoroacetic acid anion, pentafluoropropionic acid anion, heptafluorobutyric acid anion, and monoanions of dicarboxylic acids such as succinic acid, tartaric acid, glutaric acid, pimelic acid, sebacic acid, phthalic acid, isophthalicacid, terephthalicacid, naphthalenedicarboxylic acid, cyclohexanedicarboxylic acid, and cyclohexenedicarboxylic acid.

Examples of the quaternary ammonium salt represented by the general formula (11) may include: tetramethylammonium, triethylmethylammonium, tetraethylammonium, tetrapropylammonium, tetrabutylammonium, tetraoctylammonium, didecyldimethylammonium, tridecylmethylammonium, hexadecyltrimethylammonium, and stearyltrimethylammonium.

As for preferred combinations of onium salts, examples of the cation includes triphenyl sulfonium, triethylanmonium, tetramethylammonium, and tetrabutylammonium; and examples of the anion includes methanesulfonate, 10-camphorsulfonate, tosilate, mesitylenesulfonate, 2,4,6-triisopropylbenzenesulfonate, 4-(4-methylbenzenesulfonyloxy)benzenesulfonate, acetate, benzoate, and perfluorobutyric acid anion.

Methods for synthesizing the onium salts are not particularly restricted, and, for example, the anion exchange method known in the art may be used. In the anion exchange method, sulfonium alkanesulfonate, sulfonium arenesulfonate, quaternary ammonium alkanesulfonate, and quaternary ammonium arenesulfonate can be synthesized by exchanging corresponding sulfonium chloride, sulfonium bromide, quaternary ammonium chloride, or quaternary ammonium bromide with alkanesulfonic acid, salt thereof, arenesulfonic acid, or salt thereof. Ammonium salts except for quaternary ammonium salts can be synthesized by neutralization reaction between precursor amine and alkanesulfonic acid, arenesulfonic acid, or carboxylic acid; or by preparing ammonium hydrochloride and subsequently exchanging anions of the ammonium hydrochloride and alkanesulfonic acid, salt thereof, arenesulfonic acid, or salt thereof.

Because exchanging anions between carboxylates and precursor onium chloride or bromide is less prone to proceed quantitatively, onium salts can be synthesized by exchanging the precursor onium chloride or bromide for onium hydroxide by using an ion-exchange resin and subsequently conducting anion exchanging or precipitating and removing chloride ions and bromide ions in the system as silver salt or lead salt by using Ag ions or Pb ions Combined use of (C) an onium salt having the abovementioned structure and the (B) photoacid generator effects salt-exchanging reaction between a strong acid, sulfonic acid, generated from the (B) photoacid generator and the salt (C) of a weak acid, thereby generating a salt of the strong acid and the weak acid. The weak acid such as an alkanesulfonic acid where the α position of the sulfonic acid is not fluorinated, an unfluorinated arylsulfonic acid and an carboxylic acid lacks capabilities of effecting deprotection reaction of resins, thereby inhibiting excessive deprotection reaction peculiar to the acetal protection groups. In particular, combined use of the (B), the (C), and (A) a resin component comprising a carboxylic acid moiety protected by a specific acetal protection group exhibits appropriate capabilities of inhibiting excessive deprotection, thereby reducing dissolution at slightly exposed areas while retaining resolution, that is, achieving improved resistance to surface roughness and side lobe under use of a halftone phase shift mask.

Resist compositions according to the present invention may further comprise an acid amplifier, which is decomposed by acid to generate acid. The amplifier is disclosed in J. Photopolym. Sci. and Tech., 8. 43-44, 45-46 (1995), and J. Photopolym. Sci. and Tech., 9. 29-30 (1996).

Non-limiting examples of the acid amplifier may include tert-butyl 2-methyl 2-tosyloxymethylacetoacetate, and 2-phenyl 2-(2-tosyloxyethyl)1,3-dioxolan. Among known photoacid generators, compounds lacking stability, particularly thermal stability, often have properties of acid amplifiers.

The amount of the acid amplifier to be added to the resist composition according to the present invention is preferably equal to or less than 2 parts by mass, and more preferably equal to or less than 1 part by mass based on 100 parts by mass of the base polymer in the resist composition. When the amount is equal to or less than 2 parts by mass, acid diffusion is readily controlled, and there is less possibility that resolution and pattern profile may be deteriorated.

The resist composition according to the present invention comprises the (A), (B), and (C) components. The composition may further contain (D) an organic solvent, if necessary, (E) a nitrogen-containing organic compound, (F) a surfactant, and (G) another components.

As for the (D) organic solvent to be used in the present invention, any organic solvent can be used as long as the solvent dissolves a base resin, an acid generator and other additives. Non-limiting examples of such an organic solvent may include: ketones such as cyclohexanone, or methylamyl ketone; alcohols such as 3-methoxybutanol, 3-methyl-3-methoxybutanol, 1-methoxy-2-propanol, or 1-ethoxy-2-propanol; ethers such as propylene glypol monomethyl ether, ethylene glycol monomethyl ether, propylene glycol monoethyl ether, ethylene glycol monoethyl ether, propylene glycol dimethyl ether, or diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, or propylene glycol mono tert-butyl ether acetate; lactones such as γ-butyrolactone. These solvents may be used alone or in admixture. Among the solvents, diethylene glycol dimethyl ether, 1-ethoxy-2-propanol, propylene glycol monomethyl ether acetate, or a mixture thereof is preferably used for the present invention because such solvents have very high solubility of acid generators in resist components.

The amount of the organic solvent to be used is preferably 200 to 3,000 parts by mass, and more preferably 400 to 2,500 parts by mass based on 100 parts by mass of the base polymer.

The resist composition of the present invention may further comprise the (E) component, one or more nitrogen-containing organic compounds.

A suitable nitrogen-containing organic compound can suppress an acid diffusion rate when an acid generated from a photoacid generator diffuses in a resist film. Addition of the nitrogen-containing organic compound suppresses the diffusion rate of an acid in a resist film, thereby enhancing resolution, suppressing the change of sensitivity after exposure, reducing dependency on substrates or environments, and enhancing exposure margin, pattern profile and the like.

Such a nitrogen-containing organic compound may be any known nitrogen-containing organic compounds conventionally used for resist compositions, in particular, for chemically amplified resist compositions. Examples of such a nitrogen-containing organic compound may include: primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxy phenyl group, nitrogen-containing alcohol compounds, amides, imides, and carbamates.

Examples of the primary aliphatic amine may include: ammonia, methylamine, ethylamine, n-propylamine, isopropylamine, n-butylamine, isobutyl amine, sec-butyl-amine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine and the like. Examples of the secondary aliphatic amine may include: dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine and the like. Examples of the tertiary aliphatic amine may include: trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N∝-tetramethylethylenediamine, N,N,N',N'-tetramethyltetraethylenepentamine and the like.

Examples of the mixed amines may include: dimethylethylamine, methylethylpropylamine, benzylamine, phenethylamine, benzyldimethylamine, and the like.

Examples of the aromatic amines and the heterocyclic amines may include: an aniline derivative such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, or N,N-dimethyltoluidine; diphenyl(p-tolyl)amine; methyldiphenylamine; triphenylamine; phenylenediamine; naphthylamine; diaminonaphthalene; pyrrole derivatives such as pyrrole, 2H-pyrrole, 1-methylpyrrole, 2,4-dimethylpyrrole, 2,5-dimethylpyrrole, or N-methyl pyrrole; oxazole derivatives such as oxazole, or isoxazole; thiazole derivatives such as thiazole, or isothiazole; imidazole derivatives such as imidazole, 4-methylimidazole, or 4-methyl-2-phenylimidazole; pyrazole derivatives; furazan derivatives; pyrroline derivatives such as pyrroline, or 2-methyl-1-pyrroline; pyrrolidine derivatives such as pyrrolidine, N-methylpyrrolidine, pyrrolidinone, or N-methylpyrolidone; imidazoline derivatives; imidazolidine derivatives; pyridine derivatives such as pyridine, methylpyridine, ethylpyridine, propylpyridine, butylpyridine, 4-(1-butylpentyl) pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, or dimethylaminopyridine; pyridazine derivatives; pyrimidine derivatives; pyrazine derivatives; pyrazoline derivatives; pyrazolidine derivatives; piperidine derivatives; piperazine derivatives; morpholine derivatives; indole derivatives; isoindole derivatives; 1H-indazole derivatives; indoline derivatives; quinoline derivatives such as quinoline, or 3-quinoline carbonitrile; isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compounds having a carboxy group may include: aminobenzoic acid, indole carboxylic acid, and amino acid derivatives such as nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, or methoxy alanine.

Examples of the nitrogen-containing compounds having a sulfonyl group may include: 3-pyridine sulfonic acid, and p-toluenesulfonic acid pyridinium.

Examples of the nitrogen-containing compounds having a hydroxyl group, the nitrogen-containing compounds having a hydroxy phenyl group, and the nitrogen-containing alcohol compounds may include: 2-hydroxy pyridine, amino cresol, 2,4-quinoline diol, 3-Indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidinone-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of the amides may include: formamide, N-methyl formamide, N,N-dimethylformamide, acetamide, N-methyl acetamide, N,N-dimethylacetamide, propione amide, benzamide, and 1-cyclohexyl pyrolidone.

Examples of the imides may include: phthalimide, succinimide, and maleimide.

Examples of the carbamates may include: N-t-butoxycarbonyl-N,N-dicyclohexylamine, N-t-butoxycarbonyl-benzimidazole, and oxazolidine.

The nitrogen-containing organic compound may include compounds represented by the following general formula (B1)-1.

$$N(X)_n(Y)_{3-n} \qquad \text{(B1)-1}$$

In the formula, n is 1, 2, or 3. The side chain X may be the same or different, and may represent any one of the following general formulae (X1) to (X3).

$$-\!\!\left[R^{300}-O-R^{301}\right] \qquad \text{(X1)}$$

$$-\!\!\left[R^{302}-O-R^{303}-\overset{\displaystyle O}{\overset{\|}{C}}-R^{304}\right] \qquad \text{(X2)}$$

$$-\!\!\left[R^{305}-\overset{\displaystyle O}{\overset{\|}{C}}-O-R^{306}\right] \qquad \text{(X3)}$$

In the formula, the side chain Y may be the same or different, and represents a hydrogen atom or a $C_{1-20}$ linear, branched or cyclic alkyl group which may contain an ether group or a hydroxyl group. X may bond each to other to form a ring.

In the general formulae (X1) to (X3), $R^{300}$, $R^{302}$, and $R^{305}$ represent a linear or branched alkylene group having 1-4 carbon atoms; and $R^{301}$ and $R^{304}$ represent a hydrogen atom or a $C_{1-20}$ linear, branched or cyclic alkyl group which may contain one or more of a hydroxy group, an ether group, an ester group, and a lactone ring.

$R^{303}$ represents a single bond, or a linear or branched alkylene group having 1-4 carbon atoms; $R^{306}$ represents a $C_{1-20}$ linear, branched or cyclic alkyl group which may contain one or more of a hydroxy group, an ether group, an ester group, and a lactone ring.

Examples of the compound represented by the general formula (B1)-1 may include: tris(2-methoxymethoxyethyl) amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butylyloxy-ethyl)amine, tris(2-isobutyryloxyethyl) amine, tris(2-valeryloxyethyl)amine, tris(2-pivaloyloxyethyl)amine, N,N-bis(2-acetoxyethyl) 2-(acetoxyacetoxy) ethylamine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl) 2-(methoxycarbonyl) ethylamine, N,N-bis(2-acetoxyethyl) 2-(methoxycarbonyl) ethylamine, N,N-bis(2-hydroxyethyl) 2-(ethoxycarbonyl) ethylamine, N,N-bis(2-acetoxyethyl) 2-(ethoxycarbonyl) ethylamine, N,N-bis(2-hydroxyethyl) 2-(2-methoxyethoxycarbonyl)ethylamine, N,N-bis(2-acetoxyethyl) 2-(2-methoxyethoxycarbonyl)ethylamine, N,N-bis(2-hydroxyethyl) 2-(2-hydroxyethoxycarbonyl) ethylamine, N,N-bis(2-acetoxyethyl) 2-(2-acetoxyethoxycarbonyl)ethylamine, N,N-bis(2-hydroxyethyl) 2-[(methoxycarbonyl)methoxycarbonyl]ethylamine, N,N-bis(2-acetoxyethyl) 2-[(methoxycarbonyl)methoxycarbonyl] ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl) 2-(tetrahydrofurfuryloxycarbonyl) ethylamine, N,N-bis(2-acetoxyethyl) 2-(tetrahydrofurfuryloxycarbonyl)ethylamine, N,N-bis(2-hydroxyethyl) 2-[(2-oxotetrahydrofuran-3-yl)oxy-carbonyl]

ethylamine, N,N-bis(2-acetoxyethyl) 2-[(2-oxo-tetrahydrofuran-3-yl oxy-carbonyl]ethylamine, N,N-bis(2-hydroxyethyl) 2-(4-hydroxybutoxycarbonyl)ethylamine, N,N-bis(2-formyloxyethyl) 2-(4-formyloxybutoxycarbonyl) ethylamine, N,N-bis(2-formyloxyethyl) 2-(2-formyloxyethoxycarbonyl)ethylamine, N,N-bis(2-methoxyethyl) 2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxy-ethyl)amine, N-ethylbis[2-(methoxycarbonyloxy)ethyl]amine, N-ethylbis[2-(tert-butoxycarbonyloxy)ethyl]amine, tris(methoxycarbonylmethyl) amine, tris(ethoxycarbonylmethyl)amine, N-butylbis (methoxycarbonylmethyl)amine, N-hexylbis (methoxycarbonylmethyl)amine, and β-(diethylamino)-δ-valerolactone.

Examples of the nitrogen-containing organic compound may include a compound with a cyclic structure represented by the following general formula (B1)-2.

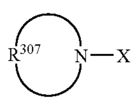
(B1)-2

In the formula, X represents the same as mentioned above; $R^{307}$ represents a $C_{2-20}$ linear or branched alkylene group which may contain one or more of a carbonyl group, an ether group, an ester group, and a sulfide.

Examples of the compound represented by the formula (B1)-2 may include: 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy) methoxy]ethyl]pyrrolidine, 1-[2-[(2-methoxyethoxy) methoxy]ethyl]piperidine, 4-[2-[(2-methoxyethoxy) methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinyl acetate, methyl piperidino acetate, methyl morpholino acetate, methyl thiomorpholino acetate, ethyl 1-pyrrolidinyl acetate, 2-methoxyethyl morpholino acetate, 2-morpholinoethyl 2-methoxy acetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Examples of the nitrogen-containing organic compound may include compounds containing cyano groups represented by the general formulae (B1)-3 to (B1)-6.

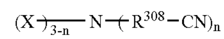
(B1)-3

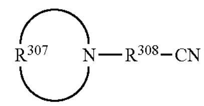
(B1)-4

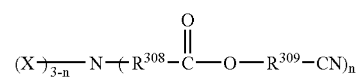
(B1)-5

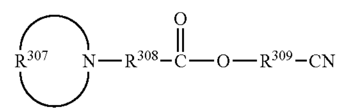
(B1)-6

In the formulae, X, $R^{307}$, and n are the same as mentioned above; $R^{308}$ and $R^{309}$ are the same or different, and represent a linear or branched alkylene group having 1-4 carbon atoms.

Examples of the nitrogen-containing organic compound containing a cyano group represented by the formulae (B1)-3 to (B1)-6 may include: 3-(diethylamino)propiononitrile, N,N-bis(2-hydroxyethyl)-3-aminopropiononitrile, N,N-bis (2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy) ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, (2-cyanoethyl) 3-diethylaminopropionate, (2-cyanoethyl) N,N-bis(2-hydroxyethyl)-3-aminopropionate, (2-cyanoethyl) N,N-bis(2-acetoxyethyl)-3-aminopropionate, (2-cyanoethyl) N,N-bis(2-formyloxyethyl)-3-aminopropionate, (2-cyanoethyl) N,N-bis(2-methoxyethyl)-3-aminopropionate, (2-cyanoethyl) N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, (2-cyanoethyl) 1-pyrrolidinepropionate, (2-cyanoethyl) 1-piperidinepropionate, and (2-cyanoethyl) 4-morpholine propionate.

Examples of the nitrogen-containing organic compound may include a nitrogen-containing organic compound having an imidazole structure and a polar functional group represented by the following general formula (B1)-7.

(B1)-7

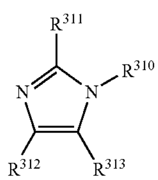

In the formula, $R^{319}$ represents a $C_{2-20}$ linear, branched or cyclic alkyl group having a polar functional group; The polar functional group is one or more of a hydroxy group, a carbonyl group, an ester group, an ether group, a sulfide group, a carbonate group, a cyano group, and an acetal group; $R^{311}$, $R^{312}$, and $R^{313}$ represent a hydrogen atom, a $C_{1-10}$ linear, branched or cyclic alkyl group, an aryl group, or an aralkyl group.

Examples of the nitrogen-containing organic compound may include a nitrogen-containing organic compound having a benzimidazole structure and a polar functional group represented by the following general formula (B1)-8.

(B1)-8

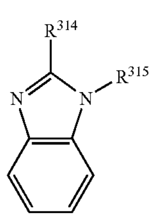

In the formula, $R^{314}$ represents a hydrogen atom, a $C_1$-10 linear, branched or cyclic alkyl group, an aryl group, or an aralkyl group; $R^{315}$ represents a $C_{1-20}$ linear, branched or cyclic alkyl group having a polar functional group; The polar functional group is one or more of an ester group, an acetal group and a cyano group; $R^{315}$ may further contain one or more of a hydroxy group, a carbonyl group, an ether group, a sulfide group, and a carbonate group.

Examples of the nitrogen-containing organic compound may include a nitrogen-containing heterocyclic organic compound having a polar functional group represented by the following general formulae (B1)-9 and (B1)-10.

(B1)-9

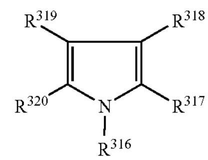

(B1)-10

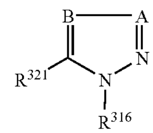

In the formulae, A represents a nitrogen atom or $\equiv C-R^{322}$; B represents a nitrogen atom or $\equiv C-R^{323}$; $R^{316}$ represents a $C_{2-20}$ linear, branched or cyclic alkyl group having a polar functional group; the polar functional group is one or more of a hydroxy group, a carbonyl group, an ester group, an ether group, a sulfide group, a carbonate group, a cyano group, and an acetal group; $R^{317}$, $R^{318}$, $R^{319}$, and $R^{320}$ represent a hydrogen atom, a linear, branched or cyclic alkyl group having 1-10 carbon atoms, or an aryl group; $R^{317}$ and $R^{318}$, $R^{319}$ and $R^{320}$ can be linked to form a benzene ring, a naphthalene ring or a pyridine ring. $R^{321}$ represents a hydrogen atom, a linear, branched or cyclic alkyl group having 1-10 carbon atoms, or an aryl group. $R^{322}$ and $R^{323}$ represent a hydrogen atom, a linear, branched or cyclic alkyl group having 1-10 carbon atoms, or an aryl group. $R^{321}$ and $R^{323}$ can be linked to form a benzene ring or a naphthalene ring.

Examples of the nitrogen-containing organic compound may include a nitrogen-containing organic compound having an aromatic carboxylate structure represented by the following general formulae (B1)-11, 12, 13 and 14.

(B1)-11

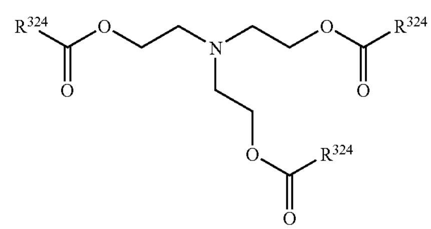

(B1)-12

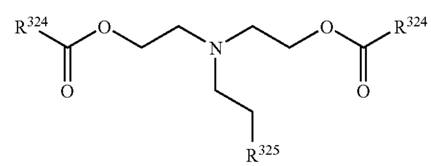

(B1)-13

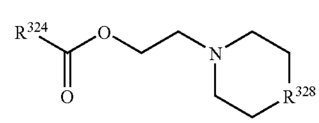

-continued (B1)-14

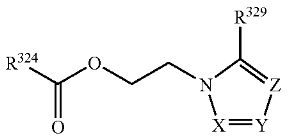

In the formulae, $R^{324}$ represents a $C_{6-20}$ aryl group or a $C_{4-20}$ hetero aromatic group where a part of or all hydrogen atoms may be optionally substituted with a halogen atom, a $C_{1-20}$ linear, branched or cyclic alkyl group, a $C_{6-20}$ aryl group, a $C_{7-20}$ aralkyl group, a $C_{1-10}$ alkoxy group, a $C_1$-10 acyloxy group, or a $C_{1-10}$ alkyl thio group. $R^{325}$ represents $CO_2R^{326}$, $OR^{327}$, or a cyano group. $R^{326}$ represents a $C_{1-10}$ alkyl group where methylene groups may partially be substituted with oxygen atoms. $R^{327}$ represents a $C_{1-10}$ alkyl group or a $C_{1-10}$ acyl group where methylene groups may partially be substituted with oxygen atoms. $R^{323}$ represents a single bond, a methylene group, an ethylene group, a sulfur atom, or —$O(CH_2CH_2O)_n$— group. n denotes 0, 1, 2, 3, or 4. $R^{329}$ represents a hydrogen atom, a methyl group, an ethyl group, or a phenyl group. X represents a nitrogen atom or $CR^{330}$. Y represents a nitrogen atom or $CR^{331}$. Z represents a nitrogen atom or $CR^{332}$. $R^{331}$, $R^{331}$, and $R^{332}$ independently represent a hydrogen atom, a methyl group or a phenyl group. $R^{330}$ and $R^{331}$, $R^{331}$ and $R^{332}$ can be linked to form a $C_{6-20}$ aromatic ring or a $C_{2-20}$ hetero aromatic ring.

Examples of the nitrogen-containing organic compound may include a nitrogen-containing organic compound having a 7-oxanorbornane-2-carboxylate structure represented by the following general formula (B1)-15.

(B1)-15

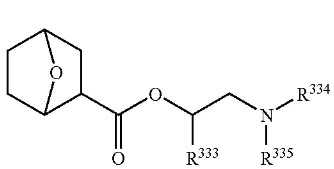

In the formula, $R^{333}$ represents a hydrogen atom, a linear, branched or cyclic alkyl group having 1-10 carbon atoms. $R^{334}$ and $R^{335}$ independently represent a $C_{1-20}$ alkyl group, a $C_{6-20}$ aryl group, or a $C_{7-20}$ aralkyl group which groups may comprise one or more polar functional groups such as ether, carbonyl, ester, alcohol, sulfide, nitrile, amine, imine or amide; and a part of or all hydrogen atoms of the groups may optionally be substituted with a halogen atom. $R^{334}$ and $R^{335}$ can be linked to form a $C_{2-20}$ hetero ring or a $C_{2-20}$ hetero aromatic ring.

The amount of the nitrogen-containing organic compound to be added is preferably 0.001 to 4 parts by mass, and more preferably 0.01 to 2 parts by mass based on 100 parts by mass of the base polymer. When the amount is equal to or more than 0.001 parts by mass, expected effects by addition of the compound are sufficiently obtained. When the amount is equal to or less than 4 parts by mass, there is less possibility that resolution may be deteriorated excessively.

Besides the components mentioned above, the resist composition of the present invention may further comprise (F) an optional component, a surfactant commonly added for the purpose of improving the application properties of resist compositions. The amount of the optional component to be added is a normal amount within the range that the component does not impede the effect of the present invention.

The surfactant is preferably non-ionic one. Examples thereof may include: perfluoro alkyl polyoxyethylene ethanol, fluorinated alkyl ester, perfluoro alkylamine oxide, perfluoro alkyl EO adduct, a fluorine-containing organosiloxane compound, and the like. Examples thereof include Fluorad "FC-430" and "FC-431" (both are manufactured by Sumitomo 3M), Surflon "S-141", "S-145", "KH-10", "KH-20", "KH-30", and "KH-40" (Surflons are manufactured by Asahi Glass Co., Ltd.), Unidyne "DS-401", "DS-403" and "DS-451" (Unidynes are manufactured by Daikin Industries, LTD.), MEGAFACE "F-8151" (manufactured by Dainippon Ink Industry), "X-70-092", and "X-70-093" (both are manufactured by Shin-Etsu Chemical Co., Ltd.), and the like. Preferred examples are Fluorad "FC-430" (manufactured by Sumitomo 3M), "KH-20" and "KH-30" (both manufactured by Asahi Glass Co., Ltd.), and "X-70-093" (manufactured by Shin-Etsu Chemical Co., Ltd.).

If necessary, the resist composition of the present invention may further comprise (G) optional components such as a dissolution inhibitor, a carboxylic compound, or an acetylene alcohol derivative. The amount of the (G) optional components to be added is a normal amount within the range that the components do not impede the effect of the present invention.

An example of the dissolution inhibitor that can be added to the resist composition according to the present invention is a compound having a mass average molecular weight of 100 to 1,000, preferably 150 to 800, where the compound has two or more of phenolic hydroxyl groups intramolecularly and the hydrogen atoms of the phenolic hydroxyl groups are substituted with acid labile groups at a ratio of 0 to 100 mole % on average as a whole; or the compound has a carboxy group intramolecularly and the hydrogen atoms of the carboxy groups are substituted with acid labile groups at a ratio of 50 to 100 mole % on average as a whole.

The substitution ratio of the hydrogen atoms of the phenolic hydroxyl groups with acid labile groups is preferably equal to or more than 0 mole % in the whole phenolic hydroxyl groups on average, and more preferably equal to or more than 30 mole %. The upper limit of the substitution ratio is 100 mole %, and more preferably 80 mole %.

The substitution ratio of the hydrogen atoms of the carboxy groups with acid labile groups in the whole carboxyl groups on average is equal to or more than 50 mole % or more, preferably equal to or more than 70 mole %. The upper limit of the substitution ratio is 100 mole %.

Suitable examples of the compound which has two or more of phenolic hydroxyl groups and the compound which has a carboxy group are shown as the following formulae (D1) to (D14).

(D1)

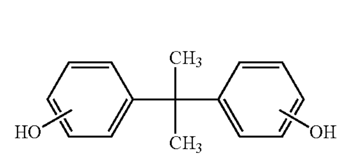

(D2)

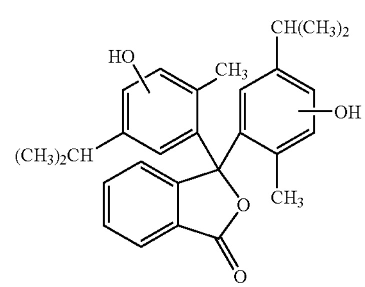

-continued (D3)

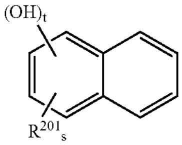

(D4)

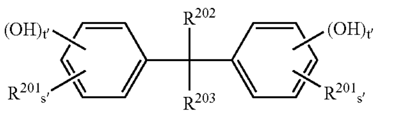

(D5)

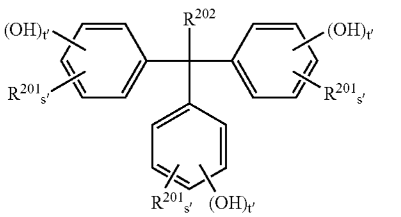

(D6)

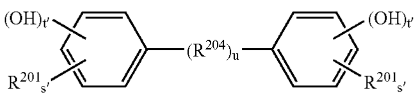

(D7)

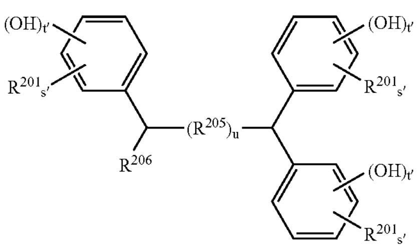

(D8)

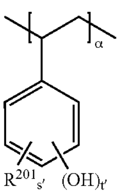

(D9)

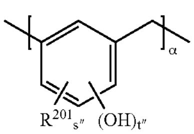

(D10)

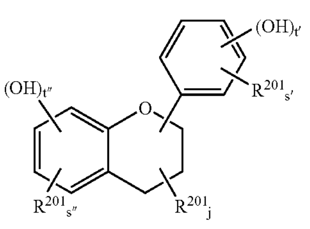

(D11)

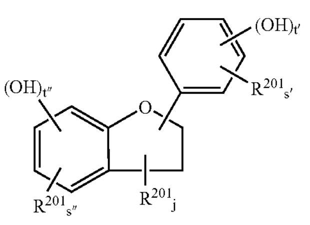

-continued (D12)

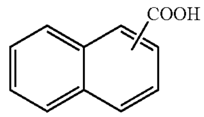

(D13)

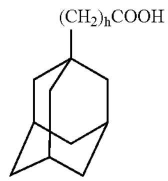

(D14)

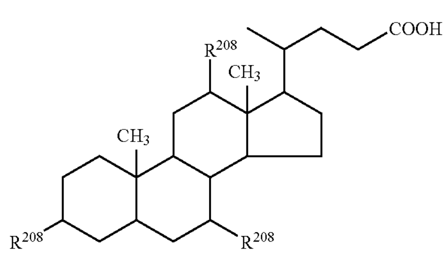

In the formulae, each of $R^{201}$ and $R^{202}$ represents a hydrogen atom or a linear or branched alkyl group or alkenyl group having 1-8 carbon atoms. Examples of $R^{201}$ and $R^{202}$ may include: a hydrogen atom, a methyl group, an ethyl group, a butyl group, a propyl group, an ethinyl group, and a cyclohexyl group.

$R^{203}$ represents a hydrogen atom or a linear or branched alkyl group or alkenyl group having 1-8 carbon atoms, or —$(R^{207})_h$COOH wherein $R^{207}$ represents a linear or branched alkyl group having 1-10 carbon atoms. Examples of $R^{203}$ may include the same as $R^{201}$ and $R^{202}$; and —COOH, and —$CH_2$COOH.

$R^{204}$ represents —$(CH_2)_i$-(i=2-10), an arylene group having 6-10 carbon atoms, a carbonyl group, a sulfonyl group, an oxygen atom, or a sulfur atom. Examples of $R^{204}$ may include an ethylene group, a phenylene group, a carbonyl group, a sulfonyl group, an oxygen atom, and a sulfur atom.

$R^{205}$ represents an alkylene group having 1-10 carbon atoms, an arylene group having 6-10 carbon atoms, a carbonyl group, a sulfonyl group, an oxygen atom, or a sulfur atom. Examples of $R^{205}$ may include a methylene group and the same as $R^{204}$.

$R^{206}$ represents a hydrogen atom, a linear or branched alkyl group or alkenyl group having 1-8 carbon atoms, a phenyl group or a naphthyl group where at least one hydrogen atom is substituted with a hydroxyl group. Examples of $R^{206}$ may include a hydrogen atom, a methyl group, an ethyl group, a butyl group, a propyl group, an ethinyl group, a cyclohexyl group; and a phenyl group, and naphthyl group where at least one hydrogen atom is substituted with a hydroxy group.

$R^{208}$ represents a hydrogen atom or a hydroxyl group.

j is an integer of 0-5. u and h are 0 or 1. s, t, s', t', s", and t" are numbers that satisfy s+t=8, s'+t'=5, s"+t"=4, and provide each of the phenyl structure with at least one hydroxy group. α is a number that makes the mass average molecular weight of the compounds of the formulae (D8) and (D9) to be 100 to 1,000.

The dissolution inhibitor can comprise various acid labile groups. Examples of the acid labile groups may include: the groups represented by the general formulae (L1) to (L4), a tertiary alkyl group having 4-20 carbon atoms, a trialkyl silyl group where each of the alkyl groups has 1-6 carbon atoms, and an oxoalkyl group having 4-20 carbon atoms. Examples of the groups are the same as mentioned above.

The blending amount of the dissolution inhibitor is 0 to 50 parts by mass, preferably 0 to 40 parts by mass, and more preferably 0 to 30 parts by mass based on 100 parts by mass of the base polymer of a resist composition. The dissolution inhibitor can be used alone or in admixture. When the blending amount of the dissolution inhibitor is equal to or less than 50 parts by mass, there is less possibility that film loss in a pattern is caused or resolution is degraded.

Note that the dissolution inhibitors are manufactured by introducing an acid labile group to a compound having phenolic hydroxyl groups or a carboxy group by organic chemical treatments.

Non-limiting examples of the carboxylic compound that can be added to the resist composition of the present invention may include one or more compounds selected from the following [group I] and [group II]. By blending the compound, PED (Post Exposure Delay) stability of resist is enhanced, and edge roughness on nitride film substrates is improved.

[Group I]

Compounds where a part of or all hydrogen atoms of phenolic hydroxyl groups of the compound represented by the following general formulae (A1) to (A10) are substituted with $—R^{401}—COOH$ wherein $R^{401}$ represents a linear or branched alkylene group having 1-10 carbon atoms, and a mole ratio of the phenolic hydroxyl group (C) and the group (D) represented by ≡C—COOH in a molecule is as follows: C/(C+D)=0.1 to 1.0.

[Group II]

Compounds represented by the following general formulae (A11) to (A15).

(A1)

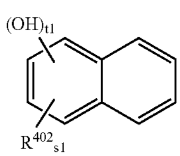

(A2)

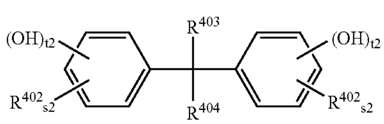

(A3)

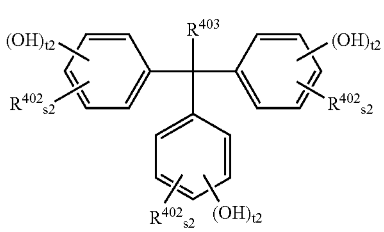

(A4)

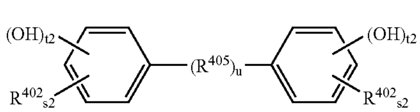

-continued (A5)

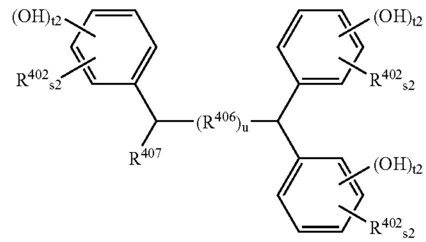

(A6)

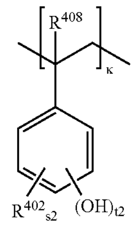

(A7)

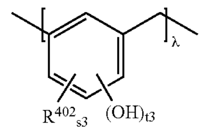

(A8)

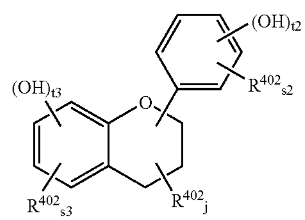

(A9)

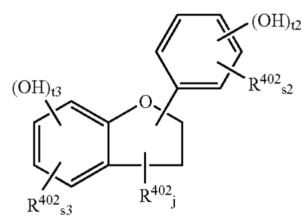

(A10)

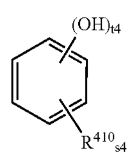

(A11)

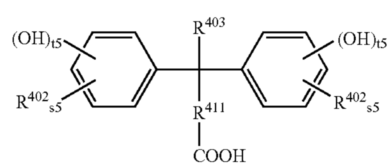

(A12)

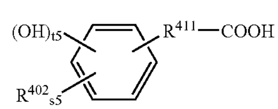

(A13)

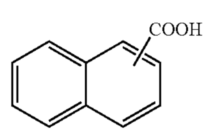

-continued (A14)

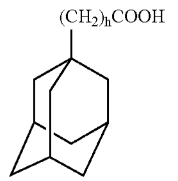

(A15)

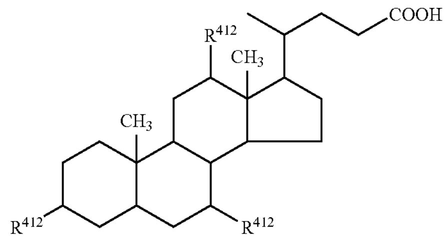

In the formulae, $R^{402}$ and $R^{403}$ independently represent a hydrogen atom or a $C_{1-8}$ linear or branched alkyl group or alkenyl group. $R^{404}$ represents a hydrogen atom or a $C_{1-8}$ linear or branched alkyl group or alkenyl group, or —$(R^{409})_h$—COOR' where R' represents a hydrogen atom or —$R^{409}$—COOH.

$R^{405}$ represents —$(CH_2)_i$-(i=2-10), an arylene group having 6-10 carbon atoms, a carbonyl group, a sulfonyl group, an oxygen atom, or a sulfur atom.

$R^{406}$ represents an alkylene group having 1-10 carbon atoms, an arylene group having 6-10 carbon atoms, a carbonyl group, a sulfonyl group, an oxygen atom, or a sulfur atom.

$R^{407}$ represents a hydrogen atom or a linear or branched alkyl group or alkenyl group having 1-8 carbon atoms, a phenyl group substituted with a hydroxyl group or a naphthyl group substituted with a hydroxyl group.

$R^{408}$ represents a hydrogen atom or a methyl group.

$R^{409}$ represents a linear or branched alkylene group having 1-10 carbon atoms.

$R^{410}$ represents a hydrogen atom or a linear or branched alkyl group or alkenyl group having 1-8 carbon atoms, or —$R^{411}$—COOH group where $R^{411}$ represents a $C_{1-10}$ linear or branched alkylene group.

$R^{412}$ represents a hydrogen atom or a hydroxyl group.

j is a number of 0 to 3. s1, t1, s2, t2, s3, t3, s4, and t4 are numbers that satisfy s1+t1=8, s2+t2=5, s3+t3=4, and s4+t4=6, and provide each phenyl structure with at least one hydroxyl group.

s5 and t5 are numbers that satisfy s5≥0, t5≥0, and s5+t5=5.

u is a number that satisfies 1≤u≤4. h is a number that satisfies 0≤h≤4.

κ is a number that makes the mass average molecular weight of the compound represented by the formula (A6) fall within the range of 1,000 to 5,000.

λ is a number that makes the mass average molecular weight of the compound represented by the formula (A7) fall within the range of 1,000 to 10,000.

Non-limiting examples of the above compounds may include compounds represented by the following general formulae (AI-1) to (AI-14) and (AII-1) to (AII-10).

(AI-1)

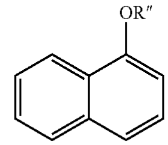

(AI-2)

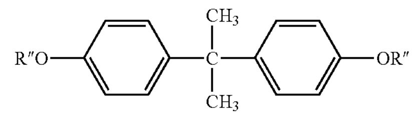

(AI-3)

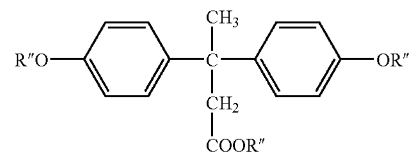

(AI-4)

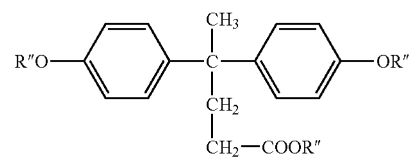

(AI-5)

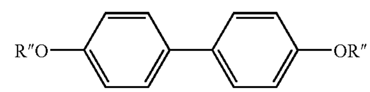

(AI-6)

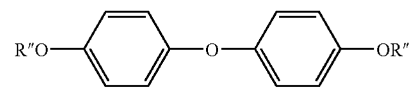

(AI-7)

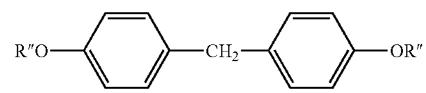

(AI-8)

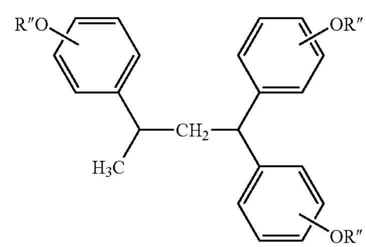

(AI-9)

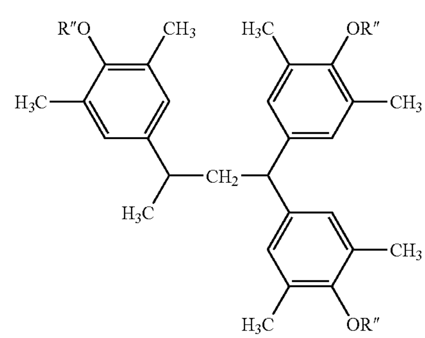

-continued (AI-10)

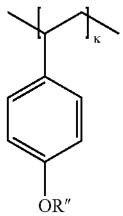

(AI-11)

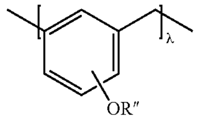

(AI-12)

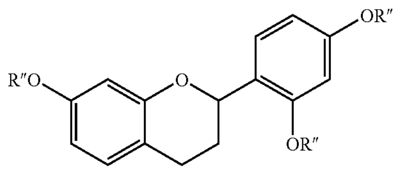

(AI-13)

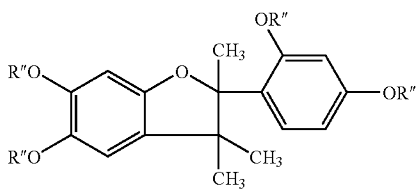

(AI-14)

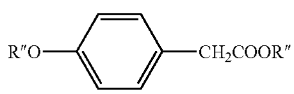

(AII-1)

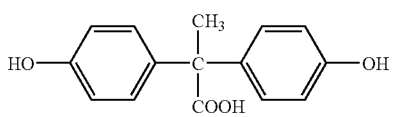

(AII-2)

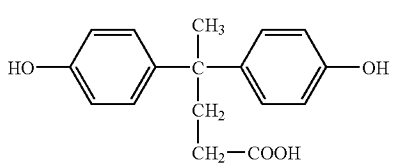

(AII-3)

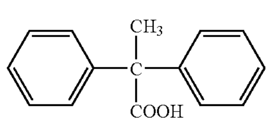

(AII-4)

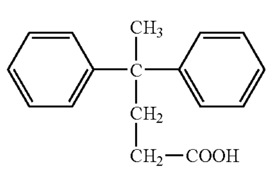

(AII-5)

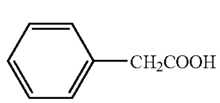

(AII-6)

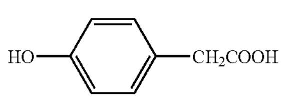

-continued (AII-7)

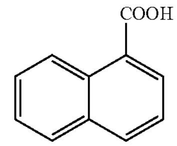

(AII-8)

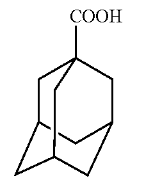

(AII-9)

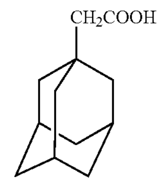

(AII-10)

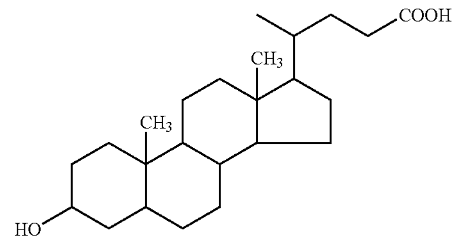

In the formulae, R" represents a hydrogen atom or a $CH_2COOH$ group, and 10 to 100 mole % of R" represents a $CH_2COOH$ group in each compound. κ and λ represent the same as mentioned above.

The amount of the compound to be added having a group represented by ≡C—COOH intramolecularly is preferably 0 to 5 parts by mass, more preferably 0.1 to 5 parts by mass, still more preferably 0.1 to 3 parts by mass, and still further more preferably 0.1 to 2 parts. When the compound is added in the amount equal to or less than 5 parts by mass, there is less possibility that the resolution of a resist composition is deteriorated.

Preferred acetylene alcohol derivatives that can be added to the resist composition according to the present invention are represented by the following general formulae (S1) and (S2).

$$R^{501}-C\equiv C-C(R^{502})(R^{503})-O-(CH_2CH_2O)_YH \quad (S1)$$

$$H(OCH_2CH_2)_X-O-C(R^{504})(R^{505})-C\equiv C-C(R^{502})(R^{503})-O-(CH_2CH_2O)_YH \quad (S2)$$

In the formulae, $R^{501}$, $R^{502}$, $R^{503}$, $R^{504}$, and $R^{505}$ independently represent a hydrogen atom or a linear, branched or cyclic alkyl group having 1-8 carbon atoms. X and Y represent 0 or positive numbers, which satisfy the following equation: $0 \leq X \leq 30$, $0 \leq Y \leq 30$, and $0 \leq X+Y \leq 40$.

Examples of the acetylene alcohol derivatives may include: Surfynol 61, Surfynol 82, Surfynol 104, Surfynol 104E, Surfynol 104H, Surfynol 104A, Surfynol TG, Surfynol PC, Surfynol 440, Surfynol 465, Surfynol 485 (manufactured by Air Products and Chemicals Inc.), and Surfynol E1004 (manufactured by Nisshin Kagaku Kogyo corporation).

The amount of the acetylene alcohol derivative to be added is preferably 0 to 2 parts by mass, more preferably 0.01 to 2 parts by mass, and still more preferably 0.02 to 1 part by mass based on 100 parts by mass of the base polymer of a resist composition. When the amount is equal to or less than 2 parts by mass, there is little possibility that the resolution of a resist composition may be degraded.

For patterning by using the resist composition according to the present invention, usable is a patterning process comprising: at least, a step of applying the positive resist composition according to the present invention to a substrate; a step of conducting a heat-treatment and then exposing the substrate to a high energy beam; and a step of developing the substrate with a developer.

As a matter of course, the exposure may be followed by heat treatment and then development, and the patterning process may comprise various steps such as etching, stripping of resist, or cleaning.

Such patterning processes can be conducted by lithography techniques known in the art.

For example, the resist composition of the present invention is applied to a substrate such as a silicon wafer so that the thickness of the applied composition may be 0.1 to 2.0 μm by techniques such as spin coating. The substrate is then pre-baked on a hot plate at 60° C. to 150° C. for 1 to 10 minutes, and preferably at 80° C. to 140° C. for 1 to 5 minutes. Thus a resist film is formed.

Subsequently, a mask for forming a target pattern is held above the resist film, and irradiated to the film is a high-energy beam such as far ultraviolet rays, excimer lasers, X-rays, or an electron beam so that an exposure dose may be 1 to 200 mJ/cm$^2$, and preferably 10 to 100 mJ/cm$^2$. The exposure can be conducted by normal exposure methods, or by an immersion method where the gap between a projection lens and resist is filled with water or the like.

Next, the resist film is subjected to post-exposure bake (PEB) on a hot plate, at 60° C. to 150° C. for 1 to 5 minutes, and preferably at 80° C. to 140° C. for 1 to 3 minutes.

Then the resist film is developed for 0.1 to 3 minutes, preferably for 0.5 to 2 minutes by using a developer of an aqueous alkali solution such as 0.1 to 5 mass %, preferably 2 to 3 mass % tetramethyl ammonium hydroxide (TMAH) by conventional methods such as a dip method, a puddle method, or a spray method. As a result, a target pattern is formed on the substrate.

Note that the resist composition of the present invention is particularly optimum for micropatterning using ultraviolet rays, excimer lasers, X-rays, or an electron beam at a wavelength of 250 to 190 nm among high-energy beams.

EXAMPLES

Hereinafter, the present invention will be described further in detail with reference to Examples and Comparative Examples. However, the present invention is not limited by the following Examples.

(Preparation of Resist Compositions)

Each of resist compositions according to the present invention was prepared by mixing and dissolving a resin component, a photoacid generator, an onium salt, a basic compound, and a solvent according to compositions shown in Table 1, and by filtrating thus-obtained solution with a Teflon (registered trade mark) filter (pore size: 0.2 μm). Note that all the solvent contained as a surfactant 0.01 mass % of KH-20 manufactured by Asahi Glass Co., Ltd.

TABLE 1

| Resist Composition | Resin Component | Photoacid Generator | Onium Salt | Basic Compound | Solvent 1 | Solvent 2 |
|---|---|---|---|---|---|---|
| R-01 | P-01 (80) | PAG-4 (4.5) | S-1 (1.0) | Base-1 (0.47) | PGMEA (560) | CyHO (240) |
| R-02 | P-02 (80) | PAG-4 (4.5) | S-1 (1.0) | Base-1 (0.47) | PGMEA (560) | CyHO (240) |
| R-03 | P-03 (80) | PAG-4 (4.5) | S-1 (1.0) | Base-1 (0.47) | PGMEA (560) | CyHO (240) |
| R-04 | P-04 (80) | PAG-4 (4.5) | S-1 (1.0) | Base-1 (0.47) | PGMEA (560) | CyHO (240) |
| R-05 | P-05 (80) | PAG-4 (4.5) | S-1 (1.0) | Base-1 (0.47) | PGMEA (560) | CyHO (240) |
| R-06 | P-06 (80) | PAG-4 (4.5) | S-1 (1.0) | Base-1 (0.47) | PGMEA (560) | CyHO (240) |
| R-07 | P-07 (80) | PAG-4 (4.5) | S-1 (1.0) | Base-1 (0.47) | PGMEA (560) | CyHO (240) |
| R-08 | P-08 (80) | PAG-4 (4.5) | S-1 (1.0) | Base-1 (0.47) | PGMEA (560) | CyHO (240) |
| R-09 | P-09 (80) | PAG-4 (4.5) | S-1 (1.0) | Base-1 (0.47) | PGMEA (560) | CyHO (240) |
| R-10 | P-10 (80) | PAG-4 (4.5) | S-1 (1.0) | Base-1 (0.47) | PGMEA (560) | CyHO (240) |
| R-11 | P-11 (80) | PAG-4 (4.5) | S-1 (1.0) | Base-1 (0.47) | PGMEA (560) | CyHO (240) |
| R-12 | P-12 (80) | PAG-4 (4.5) | S-1 (1.0) | Base-1 (0.47) | PGMEA (560) | CyHO (240) |
| R-13 | P-13 (80) | PAG-4 (4.5) | S-1 (1.0) | Base-1 (0.47) | PGMEA (560) | CyHO (240) |
| R-14 | P-14 (80) | PAG-4 (4.5) | S-1 (1.0) | Base-1 (0.47) | PGMEA (560) | CyHO (240) |
| R-15 | P-15 (80) | PAG-4 (4.5) | S-1 (1.0) | Base-1 (0.47) | PGMEA (560) | CyHO (240) |
| R-16 | P-16 (80) | PAG-4 (4.5) | S-1 (1.0) | Base-1 (0.47) | PGMEA (560) | CyHO (240) |
| R-17 | P-17 (80) | PAG-4 (4.5) | S-1 (1.0) | Base-1 (0.47) | PGMEA (560) | CyHO (240) |
| R-18 | P-18 (80) | PAG-4 (4.5) | S-1 (1.0) | Base-1 (0.47) | PGMEA (560) | CyHO (240) |
| R-19 | P-19 (80) | PAG-4 (4.5) | S-1 (1.0) | Base-1 (0.47) | PGMEA (560) | CyHO (240) |
| R-20 | P-20 (80) | PAG-4 (4.5) | S-1 (1.0) | Base-1 (0.47) | PGMEA (560) | CyHO (240) |
| R-21 | P-21 (80) | PAG-4 (4.5) | S-1 (1.0) | Base-1 (0.47) | PGMEA (560) | CyHO (240) |
| R-22 | P-22 (80) | PAG-4 (4.5) | S-1 (1.0) | Base-1 (0.47) | PGMEA (560) | CyHO (240) |
| R-23 | P-23 (80) | PAG-4 (4.5) | S-1 (1.0) | Base-1 (0.47) | PGMEA (560) | CyHO (240) |
| R-24 | P-24 (80) | PAG-4 (4.5) | S-1 (1.0) | Base-1 (0.47) | PGMEA (560) | CyHO (240) |
| R-25 | P-25 (80) | PAG-4 (4.5) | S-1 (1.0) | Base-1 (0.47) | PGMEA (560) | CyHO (240) |
| R-26 | P-26 (80) | PAG-4 (4.5) | S-1 (1.0) | Base-1 (0.47) | PGMEA (560) | CyHO (240) |
| R-27 | P-07 (80) | PAG-1 (4.4) | S-1 (1.0) | Base-1 (0.47) | PGMEA (560) | CyHO (240) |
| R-28 | P-07 (80) | PAG-2 (4.1) | S-1 (1.0) | Base-1 (0.47) | PGMEA (560) | CyHO (240) |
| R-29 | P-07 (80) | PAG-3 (4.2) | S-1 (1.0) | Base-1 (0.47) | PGMEA (560) | CyHO (240) |
| R-30 | P-07 (80) | PAG-4 (4.5) | S-1 (1.0) | Base-1 (0.47) | PGMEA (560) | CyHO (240) |
| R-31 | P-07 (80) | PAG-5 (4.7) | S-1 (1.0) | Base-1 (0.47) | PGMEA (560) | CyHO (240) |
| R-32 | P-07 (80) | PAG-6 (5.0) | S-1 (1.0) | Base-1 (0.47) | PGMEA (560) | CyHO (240) |
| R-33 | P-07 (80) | PAG-7 (4.6) | S-1 (1.0) | Base-1 (0.47) | PGMEA (560) | CyHO (240) |

TABLE 1-continued

| Resist Composition | Resin Component | | Photoacid Generator | | Onium Salt | | Basic Compound | | Solvent 1 | | Solvent 2 | |
|---|---|---|---|---|---|---|---|---|---|---|---|---|
| R-34 | P-07 | (80) | PAG-8 | (4.9) | S-1 | (1.0) | Base-1 | (0.47) | PGMEA | (560) | CyHO | (240) |
| R-35 | P-07 | (80) | PAG-9 | (4.4) | S-1 | (1.0) | Base-1 | (0.47) | PGMEA | (560) | CyHO | (240) |
| R-36 | P-07 | (80) | PAG-10 | (4.6) | S-1 | (1.0) | Base-1 | (0.47) | PGMEA | (560) | CyHO | (240) |
| R-37 | P-07 | (80) | PAG-11 | (4.6) | S-1 | (1.0) | Base-1 | (0.47) | PGMEA | (560) | CyHO | (240) |
| R-38 | P-07 | (80) | PAG-12 | (5.0) | S-1 | (1.0) | Base-1 | (0.47) | PGMEA | (560) | CyHO | (240) |
| R-39 | P-07 | (80) | PAG-4 | (4.5) | S-2 | (1.1) | Base-1 | (0.47) | PGMEA | (560) | CyHO | (240) |
| R-40 | P-07 | (80) | PAG-4 | (4.5) | S-3 | (0.56) | Base-1 | (0.47) | PGMEA | (560) | CyHO | (240) |
| R-41 | P-07 | (80) | PAG-4 | (4.5) | S-4 | (0.52) | Base-1 | (0.47) | PGMEA | (560) | CyHO | (240) |
| R-42 | P-07 | (80) | PAG-4 | (4.5) | S-5 | (0.80) | Base-1 | (0.47) | PGMEA | (560) | CyHO | (240) |
| R-43 | P-07 | (80) | PAG-4 | (4.5) | S-6 | (0.92) | Base-1 | (0.47) | PGMEA | (560) | CyHO | (240) |
| R-44 | P-07 | (80) | PAG-4 | (4.5) | S-7 | (0.56) | Base-1 | (0.47) | PGMEA | (560) | CyHO | (240) |
| R-45 | P-07 | (80) | PAG-4 | (4.5) | S-8 | (0.76) | Base-1 | (0.47) | PGMEA | (560) | CyHO | (240) |
| R-46 | P-07 | (80) | PAG-4 | (4.5) | S-9 | (0.88) | Base-1 | (0.47) | PGMEA | (560) | CyHO | (240) |
| R-47 | P-07 | (80) | PAG-4 | (4.5) | S-10 | (0.68) | Base-1 | (0.47) | PGMEA | (560) | CyHO | (240) |
| R-48 | P-07 | (80) | PAG-4 | (4.5) | S-11 | (0.52) | Base-1 | (0.47) | PGMEA | (560) | CyHO | (240) |
| R-49 | P-07 | (80) | PAG-4 | (4.5) | S-12 | (0.60) | Base-1 | (0.47) | PGMEA | (560) | CyHO | (240) |
| R-50 | P-07 | (80) | PAG-4 | (4.5) | S-13 | (0.76) | Base-1 | (0.47) | PGMEA | (560) | CyHO | (240) |
| R-51 | P-19 | (80) | PAG-4 | (4.5) | S-1 | (1.0) | Base-1 | (0.47) | PGMEA | (560) | CyHO | (240) |
| R-52 | P-19 | (80) | PAG-4 | (4.5) | S-5 | (0.80) | Base-1 | (0.47) | PGMEA | (560) | CyHO | (240) |
| R-53 | P-19 | (80) | PAG-4 | (4.5) | S-12 | (0.60) | Base-1 | (0.47) | PGMEA | (560) | CyHO | (240) |
| R-54 | P-19 | (80) | PAG-6 | (5.0) | S-1 | (1.0) | Base-1 | (0.47) | PGMEA | (560) | CyHO | (240) |
| R-55 | P-19 | (80) | PAG-6 | (5.0) | S-5 | (0.80) | Base-1 | (0.47) | PGMEA | (560) | CyHO | (240) |
| R-56 | P-19 | (80) | PAG-4 | (4.6) | S-1 | (1.0) | Base-1 | (0.47) | PGMEA | (560) | CyHO | (240) |
| R-57 | P-19 | (80) | PAG-4 | (4.6) | S-5 | (0.80) | Base-1 | (0.47) | PGMEA | (560) | CyHO | (240) |
| R-58 | P-20 | (80) | PAG-4 | (4.5) | S-1 | (1.0) | Base-1 | (0.47) | PGMEA | (560) | CyHO | (240) |
| R-59 | P-20 | (80) | PAG-4 | (4.5) | S-5 | (0.80) | Base-1 | (0.47) | PGMEA | (560) | CyHO | (240) |

In Table 1, the numbers in the parentheses denote blending amounts (parts by mass).

Resist compositions of Comparative Examples were prepared according to the compositions shown in Table 2 by the same procedures as Examples.

In Table 2, the numbers in the parentheses denote blending amounts (parts by mass).

In Tables 1 and 2, the numbers in the parentheses are described in parts by mass.

TABLE 2

| Resist Composition | Resin Component | | Photoacid Generator | | Onium Salt | | Basic Compound | | Solvent 1 | | Solvent 2 | |
|---|---|---|---|---|---|---|---|---|---|---|---|---|
| R-60 | P-28 | (80) | PAG-1 | (4.4) | S-5 | 0.80 | Base-1 | (0.47) | PGMEA | (560) | CyHO | (240) |
| R-61 | P-31 | (80) | PAG-1 | (4.4) | S-5 | 0.80 | Base-1 | (0.47) | PGMEA | (560) | CyHO | (240) |
| R-62 | P-28 | (80) | PAG-2 | (4.1) | S-5 | 0.80 | Base-1 | (0.47) | PGMEA | (560) | CyHO | (240) |
| R-63 | P-31 | (80) | PAG-2 | (4.1) | S-5 | 0.80 | Base-1 | (0.47) | PGMEA | (560) | CyHO | (240) |
| R-64 | P-28 | (80) | PAG-3 | (4.1) | S-5 | 0.80 | Base-1 | (0.47) | PGMEA | (560) | CyHO | (240) |
| R-65 | P-31 | (80) | PAG-3 | (4.1) | S-5 | 0.80 | Base-1 | (0.47) | PGMEA | (560) | CyHO | (240) |
| R-66 | P-27 | (80) | PAG-4 | (4.5) | S-5 | 0.80 | Base-1 | (0.47) | PGMEA | (560) | CyHO | (240) |
| R-67 | P-28 | (80) | PAG-4 | (4.5) | S-5 | 0.80 | Base-1 | (0.47) | PGMEA | (560) | CyHO | (240) |
| R-68 | P-29 | (80) | PAG-4 | (4.5) | S-5 | 0.80 | Base-1 | (0.47) | PGMEA | (560) | CyHO | (240) |
| R-69 | P-30 | (80) | PAG-4 | (4.5) | S-5 | 0.80 | Base-1 | (0.47) | PGMEA | (560) | CyHO | (240) |
| R-70 | P-31 | (80) | PAG-4 | (4.5) | S-5 | 0.80 | Base-1 | (0.47) | PGMEA | (560) | CyHO | (240) |
| R-71 | P-27 | (80) | PAG-9 | (4.6) | S-5 | 0.80 | Base-1 | (0.47) | PGMEA | (560) | CyHO | (240) |
| R-72 | P-28 | (80) | PAG-9 | (4.6) | S-5 | 0.80 | Base-1 | (0.47) | PGMEA | (560) | CyHO | (240) |
| R-73 | P-29 | (80) | PAG-9 | (4.6) | S-5 | 0.80 | Base-1 | (0.47) | PGMEA | (560) | CyHO | (240) |
| R-74 | P-30 | (80) | PAG-9 | (4.6) | S-5 | 0.80 | Base-1 | (0.47) | PGMEA | (560) | CyHO | (240) |
| R-75 | P-31 | (80) | PAG-9 | (4.6) | S-5 | 0.80 | Base-1 | (0.47) | PGMEA | (560) | CyHO | (240) |
| R-76 | P-03 | (80) | PAG'-13 | (4.4) | S-5 | 0.80 | Base-1 | (0.47) | PGMEA | (560) | CyHO | (240) |
| R-77 | P-07 | (80) | PAG'-13 | (4.4) | S-5 | 0.80 | Base-1 | (0.47) | PGMEA | (560) | CyHO | (240) |
| R-78 | P-03 | (80) | PAG'-14 | (4.5) | S-5 | 0.80 | Base-1 | (0.47) | PGMEA | (560) | CyHO | (240) |
| R-79 | P-07 | (80) | PAG'-14 | (4.5) | S-5 | 0.80 | Base-1 | (0.47) | PGMEA | (560) | CyHO | (240) |
| R-80 | P-20 | (80) | PAG'-14 | (4.5) | S-5 | 0.80 | Base-1 | (0.47) | PGMEA | (560) | CyHO | (240) |
| R-81 | P-07 | (80) | PAG-1 | (4.4) | S'-14 | (1.0) | Base-1 | (0.47) | PGMEA | (560) | CyHO | (240) |
| R-82 | P-07 | (80) | PAG-1 | (4.4) | — | (0) | Base-1 | (0.47) | PGMEA | (560) | CyHO | (240) |
| R-83 | P-07 | (80) | PAG-2 | (5.0) | S'-14 | (1.0) | Base-1 | (0.47) | PGMEA | (560) | CyHO | (240) |
| R-84 | P-07 | (80) | PAG-2 | (5.0) | — | (0) | Base-1 | (0.47) | PGMEA | (560) | CyHO | (240) |
| R-85 | P-07 | (80) | PAG-3 | (4.2) | S'-14 | (1.0) | Base-1 | (0.47) | PGMEA | (560) | CyHO | (240) |
| R-86 | P-07 | (80) | PAG-4 | (4.5) | S'-14 | (1.0) | Base-1 | (0.47) | PGMEA | (560) | CyHO | (240) |
| R-87 | P-07 | (80) | PAG-6 | (5.0) | S'-15 | (1.0) | Base-1 | (0.47) | PGMEA | (560) | CyHO | (240) |
| R-88 | P-07 | (80) | PAG-6 | (5.0) | — | (0) | Base-1 | (0.47) | PGMEA | (560) | CyHO | (240) |
| R-89 | P-07 | (80) | PAG-9 | (4.6) | S'-15 | (1.0) | Base-1 | (0.47) | PGMEA | (560) | CyHO | (240) |
| R-90 | P-07 | (80) | PAG-9 | (4.6) | — | (0) | Base-1 | (0.47) | PGMEA | (560) | CyHO | (240) |

The photoacid generators, basic compounds, and solvents shown by using abbreviations are described below.

Base-1: tri(2-methoxymethoxyethyl)amine

PGMEA: 1-methoxyisopropyl acetate

CyHO: cyclohexanone

The resin components listed by using abbreviations in Tables 1 and 2 denote polymers listed in the following Tables 3 to 6.

TABLE 3

| Resin Component | Unit 1 | (introduction ratio) | Unit 2 | (introduction ratio) | Unit 3 | (introduction ratio) | Unit 4 | (introduction ratio) | mass average molecular weight |
|---|---|---|---|---|---|---|---|---|---|
| P-01 | A-1M | (0.50) | B-2M | (0.50) | | | | | 7,200 |
| P-02 | A-9M | (0.50) | B-2M | (0.50) | | | | | 6,900 |
| P-03 | A-1M | (0.40) | B-1M | (0.25) | B-2M | (0.35) | | | 7,500 |
| P-04 | A-2M | (0.40) | B-1M | (0.25) | B-2M | (0.35) | | | 6,600 |
| P-05 | A-3M | (0.40) | B-1M | (0.25) | B-2M | (0.35) | | | 8,000 |
| P-06 | A-4M | (0.40) | B-1M | (0.25) | B-2M | (0.35) | | | 7,900 |
| P-07 | A-5M | (0.40) | B-1M | (0.25) | B-2M | (0.35) | | | 6,100 |
| P-08 | A-6M | (0.40) | B-1M | (0.25) | B-2M | (0.35) | | | 6,300 |
| P-09 | A-7M | (0.40) | B-1M | (0.25) | B-2M | (0.35) | | | 6,400 |
| P-10 | A-8M | (0.40) | B-1M | (0.25) | B-2M | (0.35) | | | 6,400 |
| P-11 | A-9M | (0.40) | B-1M | (0.25) | B-2M | (0.35) | | | 6,800 |
| P-12 | A-1M | (0.40) | B-1M | (0.25) | B-3M | (0.35) | | | 7,000 |
| P-13 | A-5M | (0.40) | B-1M | (0.25) | B-4M | (0.35) | | | 7,200 |
| P-14 | A-5M | (0.40) | B-1M | (0.25) | B-5M | (0.35) | | | 7,100 |
| P-15 | A-9M | (0.40) | B-1A | (0.25) | B-2M | (0.35) | | | 6,300 |
| P-16 | A-9M | (0.40) | B-1A | (0.25) | B-4A | (0.35) | | | 8,100 |
| P-17 | A-1M | (0.20) | A'-12M | (0.30) | B-1M | (0.25) | B-2M | (0.25) | 6,900 |
| P-18 | A-5M | (0.30) | A-9M | (0.10) | B-1M | (0.25) | B-2M | (0.35) | 6,500 |
| P-19 | A-5M | (0.30) | A'-11M | (0.10) | B-1M | (0.25) | B-2M | (0.35) | 7,800 |
| P-20 | A-9M | (0.30) | A'-12M | (0.20) | B-1M | (0.25) | B-2M | (0.25) | 8,200 |
| P-21 | A-6M | (0.30) | B-1M | (0.25) | B-2M | (0.25) | B-5M | (0.20) | 7,200 |
| P-22 | A-5M | (0.40) | B-1M | (0.20) | B-2M | (0.30) | B-6M | (0.10) | 7,200 |
| P-23 | A-5M | (0.40) | B-1M | (0.20) | B-2M | (0.30) | F-1M | (0.10) | 5,900 |
| P-24 | A-5M | (0.40) | B-1M | (0.20) | B-2M | (0.30) | F-2M | (0.10) | 6,000 |
| P-25 | A-5M | (0.40) | B-1M | (0.20) | B-2M | (0.30) | F-3M | (0.10) | 6,400 |
| P-26 | A-5M | (0.40) | B-1M | (0.20) | B-2M | (0.30) | F-4M | (0.10) | 6,700 |
| P-27 | A'-10M | (0.40) | B-1M | (0.25) | B-2M | (0.35) | | | 6,900 |
| P-28 | A'-11M | (0.40) | B-1M | (0.25) | B-2M | (0.35) | | | 8,000 |
| P-29 | A'-12M | (0.40) | B-1M | (0.25) | B-2M | (0.35) | | | 8,200 |
| P-30 | A'-13M | (0.40) | B-1M | (0.25) | B-2M | (0.35) | | | 7,300 |
| P-31 | A'-14M | (0.40) | B-1M | (0.25) | B-2M | (0.35) | | | 7,400 |

Introduction ratios in Table 3 are described in molar ratios.

TABLE 4

A-1M (R = $CH_3$)
A-1A (R = H)

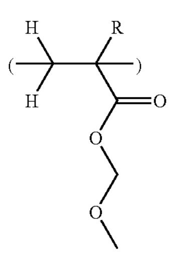

A-2M (R = $CH_3$)
A-2A (R = H)

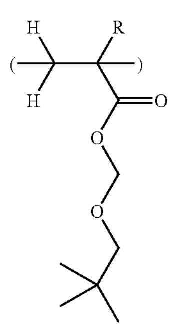

A-3M (R = $CH_3$)
A-3A (R = H)

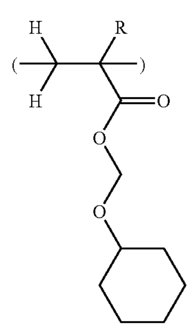

TABLE 4-continued

A-4M (R = $CH_3$)
A-4A (R = H)

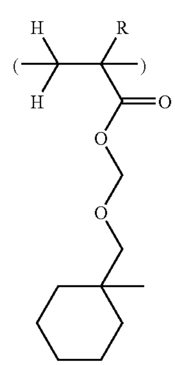

A-5M (R = $CH_3$)
A-5A (R = H)

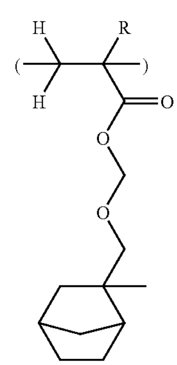

A-6M (R = $CH_3$)
A-6A (R = H)

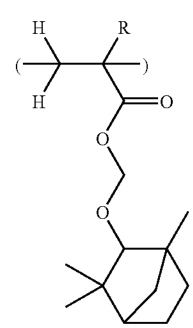

TABLE 4-continued

A-7M (R = $CH_3$)
A-7A (R = H)

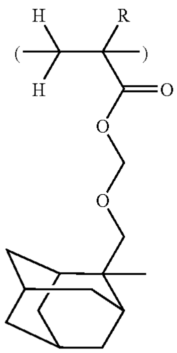

A-8M (R = $CH_3$)
A-8A (R = H)

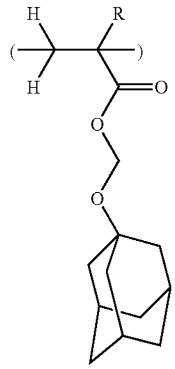

A-9M (R = $CH_3$)
A-9A (R = H)

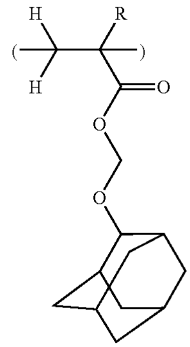

A'-10M (R = $CH_3$)
A'-10A (R = H)

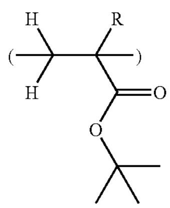

A'-11M (R = $CH_3$)
A'-11A (R = H)

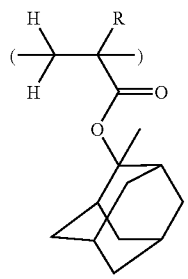

A'-12M (R = $CH_3$)
A'-12A (R = H)

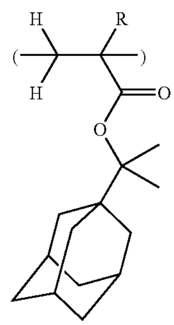

A'-13M (R = $CH_3$)
A'-13A (R = H)

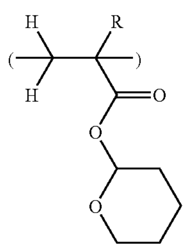

A'-14M (R = $CH_3$)
A'-14A (R = H)

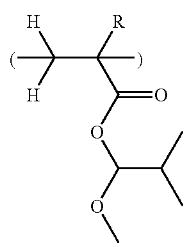

TABLE 5

B-1M (R = $CH_3$)
B-1A (R = H)

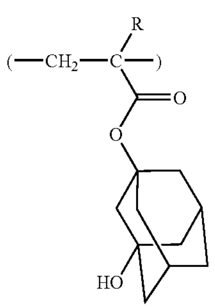

B-2M (R = $CH_3$)
B-2A (R = H)

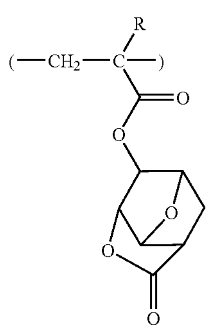

TABLE 5-continued

B-3M (R = $CH_3$)
B-3A (R = H)

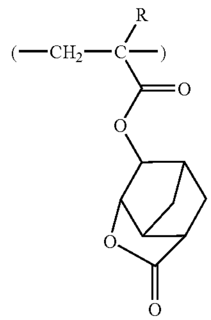

B-4M (R = $CH_3$)
B-4A (R = H)

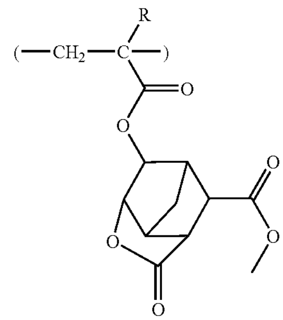

B-5M (R = $CH_3$)
B-5A (R = H)

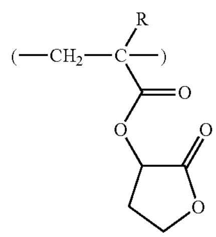

B-6M (R = $CH_3$)
B-6A (R = H)

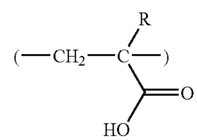

TABLE 6

F-1M (R = $CH_3$)
F-1A (R = H)

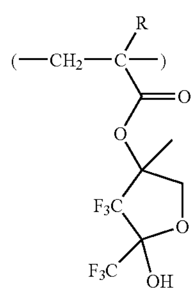

F-2M (R = $CH_3$)
F-2A (R = H)

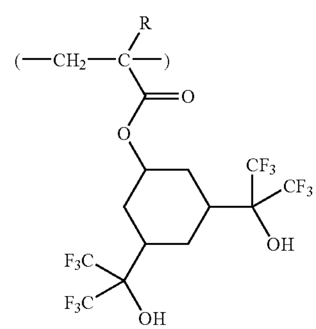

F-3M (R = $CH_3$)
F-3A (R = H)

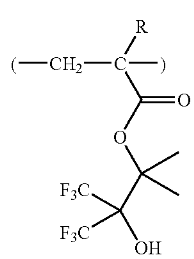

F-4M (R = $CH_3$)
F-4A (R = H)

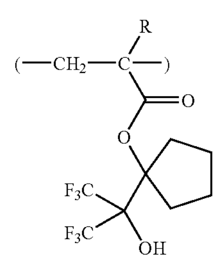

The photoacid generators listed by using abbreviations in Tables 1 and 2 denote compounds listed in the following Table 7.

TABLE 7
PAG-1
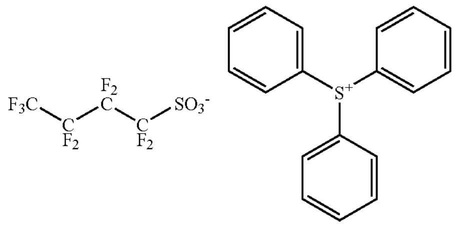
PAG-2
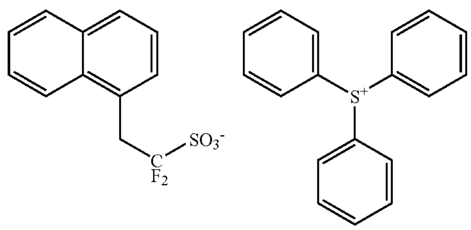
PAG-3
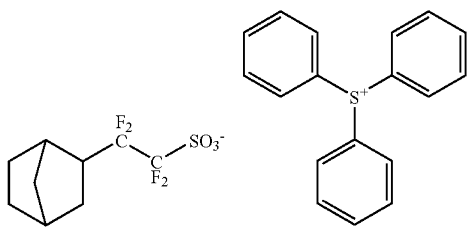
PAG-4
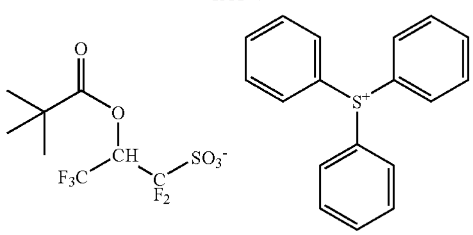
PAG-5
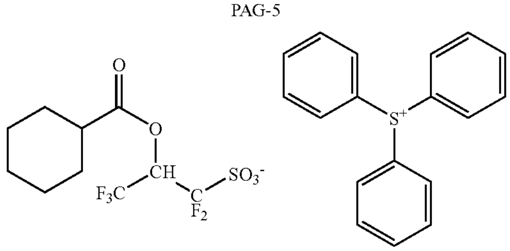
PAG-6
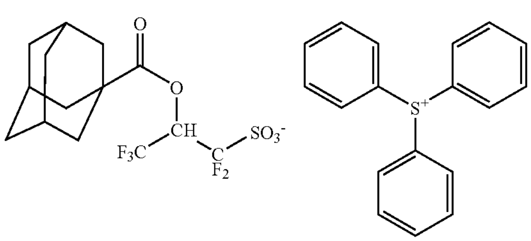
TABLE 7-continued
PAG-7
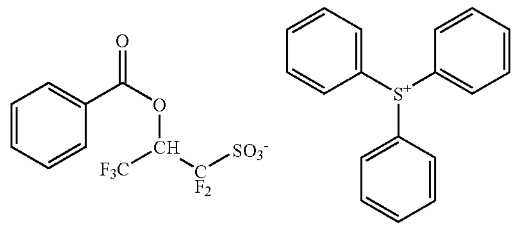
PAG-8
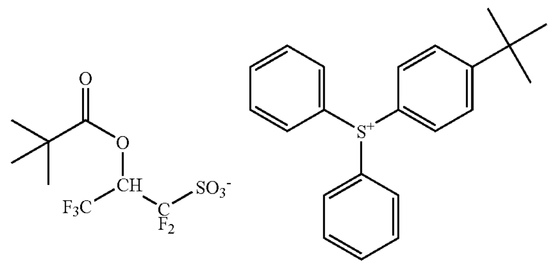
PAG-9
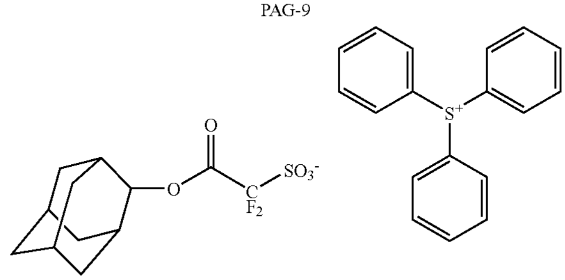
PAG-10
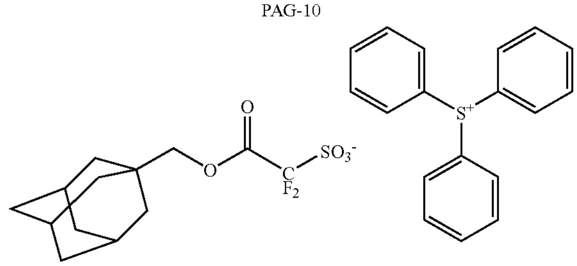
PAG-11
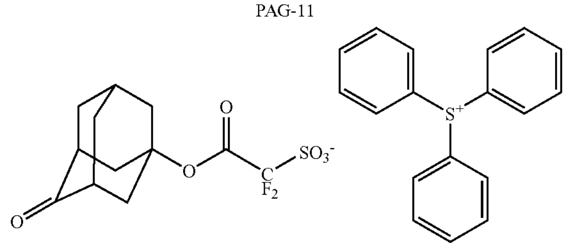
PAG-12
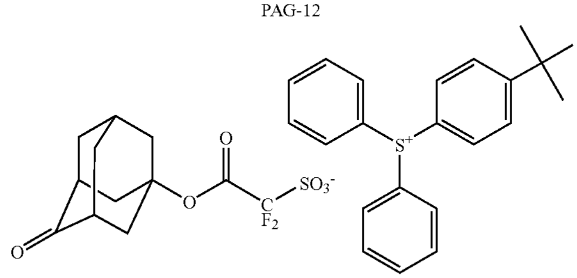

TABLE 7-continued

PAG'-13

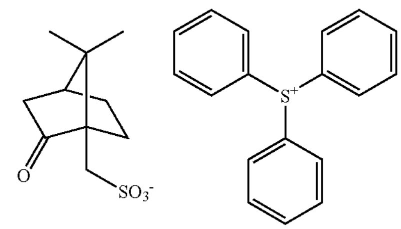

PAG'-14

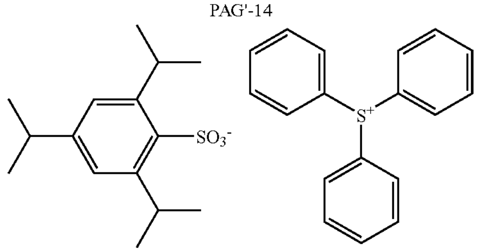

The onium salts listed by using abbreviations in Tables 1 and 2 denote compounds listed in the following Table 8.

TABLE 8

| | |
|---|---|
| S-1 | triphenylsulfonium 10-camphorsulfonate |
| S-2 | triphenylsulfonium 2,4,6-triisopropylbenzenesulfonate |
| S-3 | triethylammonium 10-camphorsulfonate |
| S-4 | tetramethylammonium 10-camphorsulfonate |
| S-5 | tetrabutylammonium 10-camphorsulfonate |
| S-6 | stearyltrimethylammonium 10-camphorsulfonate |
| S-7 | tetrabutylammonium methanesulfonate |
| S-8 | tetrabutylammonium mesitylenesulfonate |
| S-9 | tetrabutylammonium 2,4,6-triisopropylbenzenesulfonate |
| S-10 | tetrabutylammonium tosilate |
| S-11 | tetrabutylammonium acetate |
| S-12 | tetrabutylammonium benzoate |
| S-13 | tetrabutylammonium heptafluorobutyrate |
| S'-14 | tetrabutylammonium nonafluorobutanesulfonate |
| S'-15 | tetrabutylammonium pentafluorobenzenesulfonate |

Evaluation of Resist Compositions

Examples 01 to 59 and Comparative Examples 01 to 31

Each of the resist compositions of the present invention (R-01 to R-59) and the resist compositions of Comparative Examples (R-60 to R-90) was spin-coated to a silicon wafer to which antireflection coating (ARC29A manufactured by Nissan Chemical Industries, Ltd., thickness: 78 nm) was applied. The resist composition is subjected to heat treatment at 110° C. for 60 seconds to form a resist film having a thickness of 200 nm.

Thus obtained resist film was exposed with an ArF excimer laser stepper (manufactured by Nikon Corporation, NA=0.85), subjected to heat treatment (PEB) for 60 seconds, subsequently subjected to puddle development by using 2.38 mass % aqueous solution of tetramethylammonium hydroxide for 60 seconds to form hole patterns with 220 nm pitches and 330 nm pitches. As a mask, used was a halftone phase-shifting mask with a transmittance of 6%. The temperature in the PEB was optimized for each resist composition.

Thus-prepared patterned wafer was observed with a SEM (scanning electron microscope), and surface roughness was inspected at an optimum exposure dose (mJ/cm$^2$) with which a 110 nm diameter hole is formed on the wafer based on a 130 nm diameter hole design on the mask.

A focal length was changed on exposure to measure the range of the focal length (depth of focus) where the hole pattern was separated and resolved at the optimum exposure dose. The depth of focus was used to evaluate resolution. The larger the depth of focus is, the better the resolution is.

There was prepared a mask pattern where only hole diameters were changed with a constant pitch (hole diameter: 124 to 136 nm, pitch: 2 nm). The pattern was transferred to a wafer, and the transferred dimension was measured to obtain dependency of the measured dimension on the mask dimension. The dependency was defined as mask fidelity (variation of dimension on the wafer/variation of dimension on the mask; the smaller, the better).

An exposure dose was defined as Eo with which a 110 nm diameter hole in 330 nm pitch hole pattern was formed on the wafer based on a 130 nm diameter hole design on the mask. The minimum exposure dose with which side lobe was caused was defined as $E_s$. $E_s/E_o$ was determined and shown as side lobe margin (the larger, the better).

The evaluation results of the resist compositions according to the present invention (depth of focus, mask fidelity, side lobe margin, and surface roughness) are shown in Table 9, and the evaluation results of the resist compositions of Comparative Examples (depth of focus, mask fidelity, side lobe margin, and surface roughness) are shown in Table 10.

Abbreviations in Tables 9 and 10 denote the following meanings.

RC: resist composition
PEB temp: PEB temperature
OED: optimum exposure dose
DoF: depth of focus
MF: mask fidelity
SR: surface roughness
Comp. E: Comparative Example

TABLE 9

| Example | RC | PEB temp | OED | DoF | MF | Es/Eo | SR |
|---|---|---|---|---|---|---|---|
| 01 | R-01 | 100° C. | 40.0 mJ/cm$^2$ | 300 nm | 3.6 | 1.19 | slightly rough |
| 02 | R-02 | 100° C. | 36.0 mJ/cm$^2$ | 350 nm | 3.4 | 1.20 | none |
| 03 | R-03 | 110° C. | 41.0 mJ/cm$^2$ | 300 nm | 3.4 | 1.23 | none |
| 04 | R-04 | 115° C. | 38.0 mJ/cm$^2$ | 350 nm | 3.1 | 1.25 | none |
| 05 | R-05 | 105° C. | 39.0 mJ/cm$^2$ | 300 nm | 3.9 | 1.19 | slightly rough |
| 06 | R-06 | 110° C. | 37.0 mJ/cm$^2$ | 300 nm | 3.6 | 1.21 | slightly rough |
| 07 | R-07 | 110° C. | 42.0 mJ/cm$^2$ | 300 nm | 3.5 | 1.25 | none |
| 08 | R-08 | 105° C. | 34.0 mJ/cm$^2$ | 300 nm | 3.0 | 1.28 | none |
| 09 | R-09 | 110° C. | 39.0 mJ/cm$^2$ | 350 nm | 3.1 | 1.28 | none |
| 10 | R-10 | 110° C. | 41.0 mJ/cm$^2$ | 400 nm | 3.3 | 1.20 | none |
| 11 | R-11 | 110° C. | 41.0 mJ/cm$^2$ | 350 nm | 3.7 | 1.25 | none |
| 12 | R-12 | 115° C. | 42.0 mJ/cm$^2$ | 350 nm | 3.9 | 1.19 | none |

TABLE 9-continued

| Example | RC | PEB temp | OED | DoF | MF | Es/Eo | SR |
|---|---|---|---|---|---|---|---|
| 13 | R-13 | 105° C. | 45.0 mJ/cm$^2$ | 300 nm | 3.5 | 1.29 | none |
| 14 | R-14 | 105° C. | 37.0 mJ/cm$^2$ | 300 nm | 3.6 | 1.29 | none |
| 15 | R-15 | 115° C. | 39.0 mJ/cm$^2$ | 350 nm | 3.6 | 1.30 | none |
| 16 | R-16 | 110° C. | 39.0 mJ/cm$^2$ | 400 nm | 3.2 | 1.25 | none |
| 17 | R-17 | 115° C. | 41.0 mJ/cm$^2$ | 300 nm | 3.0 | 1.23 | none |
| 18 | R-18 | 110° C. | 43.0 mJ/cm$^2$ | 350 nm | 3.1 | 1.19 | none |
| 19 | R-19 | 115° C. | 40.0 mJ/cm$^2$ | 350 nm | 3.4 | 1.23 | none |
| 20 | R-20 | 110° C. | 40.0 mJ/cm$^2$ | 300 nm | 3.5 | 1.27 | none |
| 21 | R-21 | 105° C. | 44.0 mJ/cm$^2$ | 350 nm | 3.2 | 1.30 | none |
| 22 | R-22 | 105° C. | 40.0 mJ/cm$^2$ | 300 nm | 3.3 | 1.28 | slightly rough |
| 23 | R-23 | 100° C. | 39.0 mJ/cm$^2$ | 300 nm | 3.8 | 1.26 | none |
| 24 | R-24 | 100° C. | 39.0 mJ/cm$^2$ | 350 nm | 3.0 | 1.25 | slightly rough |
| 25 | R-25 | 100° C. | 40.0 mJ/cm$^2$ | 350 nm | 3.7 | 1.19 | none |
| 26 | R-26 | 100° C. | 43.0 mJ/cm$^2$ | 350 nm | 3.5 | 1.20 | none |
| 27 | R-27 | 105° C. | 40.0 mJ/cm$^2$ | 300 nm | 3.6 | 1.18 | slightly rough |
| 28 | R-28 | 105° C. | 44.0 mJ/cm$^2$ | 300 nm | 3.6 | 1.20 | slightly rough |
| 29 | R-29 | 105° C. | 37.0 mJ/cm$^2$ | 300 nm | 3.7 | 1.19 | none |
| 30 | R-30 | 105° C. | 39.0 mJ/cm$^2$ | 400 nm | 3.5 | 1.21 | none |
| 31 | R-31 | 105° C. | 38.0 mJ/cm$^2$ | 400 nm | 3.8 | 1.25 | none |
| 32 | R-32 | 110° C. | 40.0 mJ/cm$^2$ | 300 nm | 3.4 | 1.30 | none |
| 33 | R-33 | 110° C. | 40.0 mJ/cm$^2$ | 300 nm | 3.9 | 1.34 | none |
| 34 | R-34 | 105° C. | 47.0 mJ/cm$^2$ | 300 nm | 3.8 | 1.31 | none |
| 35 | R-35 | 105° C. | 36.0 mJ/cm$^2$ | 300 nm | 3.4 | 1.30 | none |
| 36 | R-36 | 105° C. | 35.0 mJ/cm$^2$ | 350 nm | 3.9 | 1.29 | none |
| 37 | R-37 | 105° C. | 43.0 mJ/cm$^2$ | 350 nm | 3.6 | 1.22 | none |
| 38 | R-38 | 105° C. | 49.0 mJ/cm$^2$ | 300 nm | 3.6 | 1.25 | none |
| 39 | R-39 | 105° C. | 39.0 mJ/cm$^2$ | 350 nm | 3.2 | 1.30 | none |
| 40 | R-40 | 105° C. | 38.0 mJ/cm$^2$ | 300 nm | 3.1 | 1.19 | none |
| 41 | R-41 | 105° C. | 37.0 mJ/cm$^2$ | 350 nm | 3.8 | 1.32 | none |
| 42 | R-42 | 105° C. | 36.0 mJ/cm$^2$ | 350 nm | 3.6 | 1.21 | none |
| 43 | R-43 | 105° C. | 36.0 mJ/cm$^2$ | 350 nm | 3.4 | 1.23 | none |
| 44 | R-44 | 105° C. | 38.0 mJ/cm$^2$ | 350 nm | 3.3 | 1.26 | none |
| 45 | R-45 | 105° C. | 45.0 mJ/cm$^2$ | 300 nm | 3.8 | 1.30 | none |
| 46 | R-46 | 105° C. | 44.0 mJ/cm$^2$ | 350 nm | 3.8 | 1.27 | none |
| 47 | R-47 | 105° C. | 44.0 mJ/cm$^2$ | 300 nm | 3.1 | 1.22 | none |
| 48 | R-48 | 105° C. | 45.0 mJ/cm$^2$ | 300 nm | 3.4 | 1.20 | none |
| 49 | R-49 | 105° C. | 48.0 mJ/cm$^2$ | 350 nm | 3.3 | 1.20 | none |
| 50 | R-50 | 105° C. | 42.0 mJ/cm$^2$ | 300 nm | 3.6 | 1.30 | none |
| 51 | R-51 | 105° C. | 41.0 mJ/cm$^2$ | 350 nm | 3.5 | 1.31 | none |
| 52 | R-52 | 100° C. | 40.0 mJ/cm$^2$ | 300 nm | 3.9 | 1.22 | none |
| 53 | R-53 | 105° C. | 40.0 mJ/cm$^2$ | 300 nm | 3.9 | 1.23 | none |
| 54 | R-54 | 100° C. | 44.0 mJ/cm$^2$ | 350 nm | 3.2 | 1.19 | none |
| 55 | R-55 | 100° C. | 38.0 mJ/cm$^2$ | 350 nm | 3.1 | 1.20 | none |
| 56 | R-56 | 100° C. | 36.0 mJ/cm$^2$ | 300 nm | 3.3 | 1.23 | none |
| 57 | R-57 | 110° C. | 41.0 mJ/cm$^2$ | 300 nm | 3.3 | 1.32 | none |
| 58 | R-58 | 110° C. | 40.0 mJ/cm$^2$ | 300 nm | 3.7 | 1.22 | none |
| 59 | R-59 | 110° C. | 39.0 mJ/cm$^2$ | 350 nm | 3.4 | 1.20 | none |

TABLE 10

| Comp. E | RC | PEB temp. | OED | DoF | MF | Es/Eo | SR |
|---|---|---|---|---|---|---|---|
| 01 | R-60 | 130° C. | 34.0 mJ/cm$^2$ | 200 nm | 4.8 | 1.19 | none |
| 02 | R-61 | 100° C. | 39.0 mJ/cm$^2$ | 250 nm | 4.6 | 0.98 | severely rough |
| 03 | R-62 | 130° C. | 38.0 mJ/cm$^2$ | 200 nm | 4.6 | 1.17 | none |
| 04 | R-63 | 100° C. | 44.0 mJ/cm$^2$ | 250 nm | 4.4 | 0.96 | severely rough |
| 05 | R-64 | 130° C. | 41.0 mJ/cm$^2$ | 250 nm | 4.9 | 1.22 | none |
| 06 | R-65 | 100° C. | 36.0 mJ/cm$^2$ | 300 nm | 4.5 | 1.00 | severely rough |
| 07 | R-66 | 130° C. | 38.0 mJ/cm$^2$ | 200 nm | 4.9 | 1.19 | none |
| 08 | R-67 | 130° C. | 37.0 mJ/cm$^2$ | 250 nm | 5.0 | 1.26 | none |
| 09 | R-68 | 125° C. | 35.0 mJ/cm$^2$ | 200 nm | 4.1 | 1.26 | none |
| 10 | R-69 | 110° C. | 44.0 mJ/cm$^2$ | 300 nm | 3.9 | 0.98 | severely rough |
| 11 | R-70 | 100° C. | 40.0 mJ/cm$^2$ | 350 nm | 3.5 | 0.96 | severely rough |
| 12 | R-71 | 130° C. | 39.0 mJ/cm$^2$ | 250 nm | 4.8 | 1.19 | none |
| 13 | R-72 | 130° C. | 39.0 mJ/cm$^2$ | 200 nm | 4.9 | 1.26 | none |
| 14 | R-73 | 125° C. | 37.0 mJ/cm$^2$ | 200 nm | 4.3 | 1.26 | none |
| 15 | R-74 | 110° C. | 46.0 mJ/cm$^2$ | 300 nm | 3.7 | 0.98 | severely rough |
| 16 | R-75 | 100° C. | 41.0 mJ/cm$^2$ | 350 nm | 3.6 | 0.96 | severely rough |
| 17 | R-76 | 140° C. | 48.0 mJ/cm$^2$ | 200 nm | 5.4 | 1.10 | severely rough |
| 18 | R-77 | 135° C. | 41.0 mJ/cm$^2$ | 200 nm | 5.5 | 1.04 | severely rough |
| 19 | R-78 | 125° C. | 46.0 mJ/cm$^2$ | 200 nm | 4.9 | 1.06 | slightly rough |
| 20 | R-79 | 130° C. | 46.0 mJ/cm$^2$ | 250 nm | 4.8 | 1.11 | slightly rough |
| 21 | R-80 | 120° C. | 39.0 mJ/cm$^2$ | 250 nm | 4.6 | 1.08 | slightly rough |
| 22 | R-81 | 105° C. | 25.0 mJ/cm$^2$ | 250 nm | 4.4 | 0.92 | severely rough |
| 23 | R-82 | 105° C. | 22.0 mJ/cm$^2$ | 300 nm | 3.8 | 0.95 | severely rough |

TABLE 10-continued

| Comp. E | RC | PEB temp. | OED | DoF | MF | Es/Eo | SR |
|---|---|---|---|---|---|---|---|
| 24 | R-83 | 105° C. | 28.0 mJ/cm$^2$ | 250 nm | 4.3 | 0.95 | severely rough |
| 25 | R-84 | 105° C. | 26.0 mJ/cm$^2$ | 300 nm | 3.8 | 0.98 | severely rough |
| 26 | R-85 | 105° C. | 22.0 mJ/cm$^2$ | 200 nm | 4.0 | 0.94 | severely rough |
| 27 | R-86 | 105° C. | 19.0 mJ/cm$^2$ | 300 nm | 3.8 | 0.95 | severely rough |
| 28 | R-87 | 105° C. | 20.0 mJ/cm$^2$ | 250 nm | 4.4 | 0.93 | severely rough |
| 29 | R-88 | 105° C. | 26.0 mJ/cm$^2$ | 300 nm | 3.9 | 0.97 | severely rough |
| 30 | R-89 | 105° C. | 21.0 mJ/cm$^2$ | 300 nm | 4.6 | 0.95 | severely rough |
| 31 | R-90 | 105° C. | 27.0 mJ/cm$^2$ | 300 nm | 3.9 | 0.98 | severely rough |

As shown in the results in Tables 9 and 10, it has been established that resist compositions according to the present invention have high resolution, that is, wide depth of focus, excellent mask fidelity, and excellent resistance to surface roughness and side lobe under use of a halftone phase shift mask.

The present invention is not limited to the above-described embodiments. The above-described embodiments are mere examples, and those having the substantially same structure as that described in the appended claims and providing the similar action and advantages are included in the scope of the present invention.

The invention claimed is:

1. A positive resist composition at least comprising:

(A) a resin component comprising a repeating unit (1') selected from the following formulae:

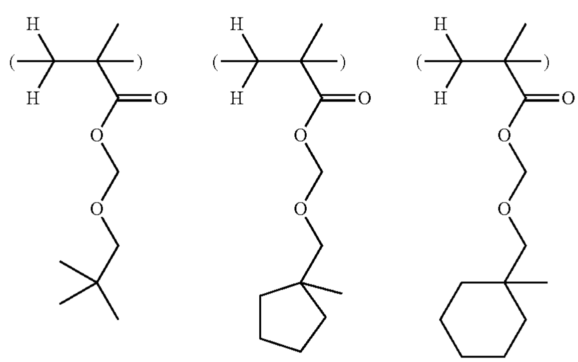

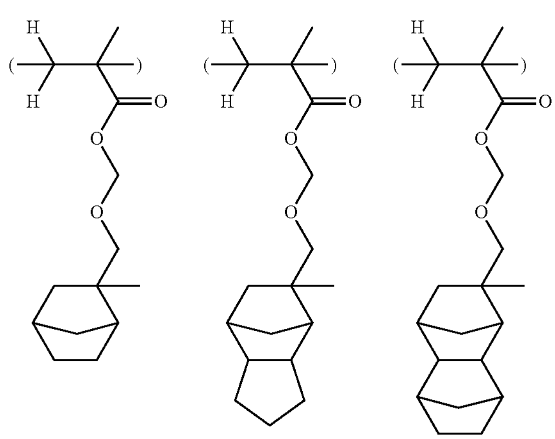

-continued

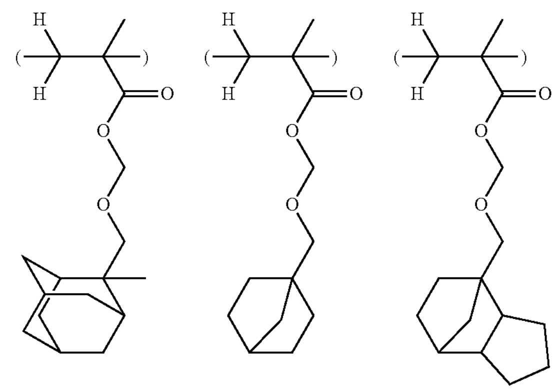

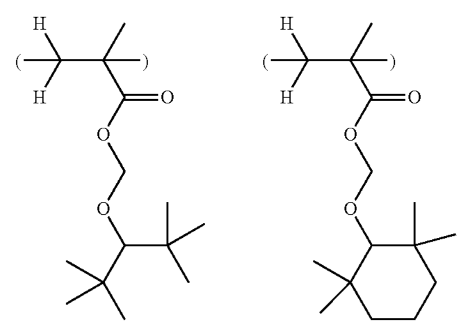

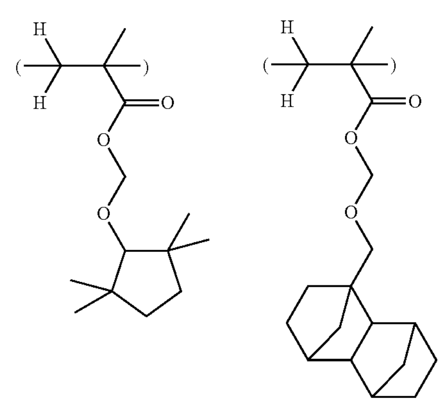

-continued

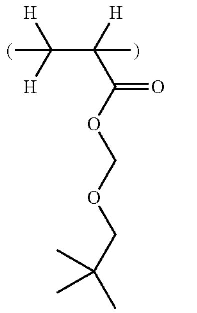
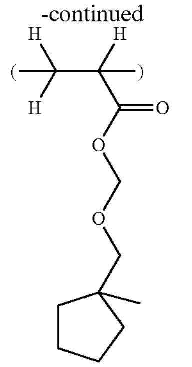
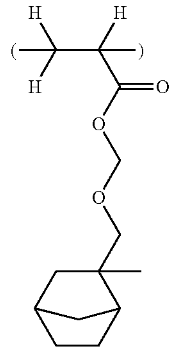
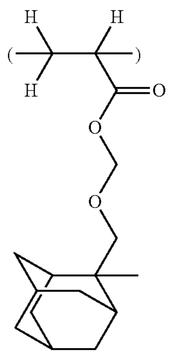
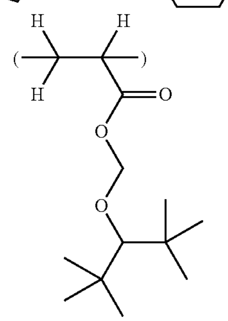
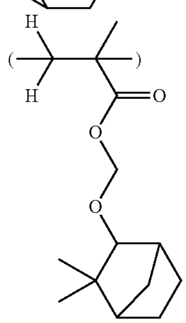
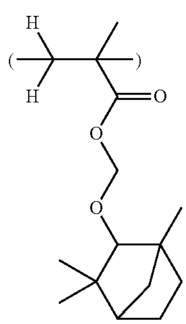
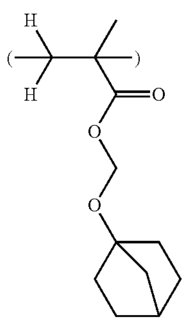
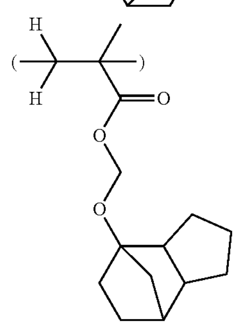
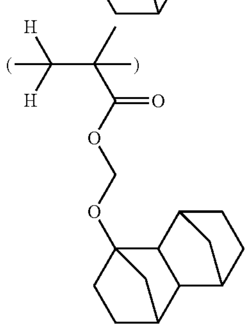
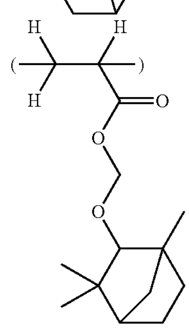

and one or more repeating units selected from the following general formulae (12), (13), (14), and (15), with the proviso that $a+b+c+d+e=1$, $0<a\leq 0.8$, $0\leq b\leq 0.6$, $0\leq c\leq 0.8$, $0\leq d\leq 0.6$, $0\leq e\leq 0.6$, in the case of defining the ratio of the repeating unit represented by formula (1') as a; the ratio of the repeating unit represented by formula (12) as b; the ratio of the repeating unit represented by formula (13) as c; the ratio of the repeating unit represented by formula (14) as d; and the ratio of the repeating unit represented by formula (15) as e;

(12)

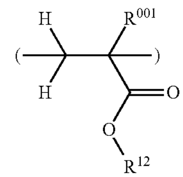

(13)

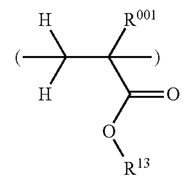

(14)

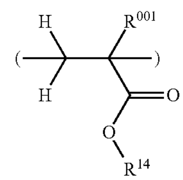

(15)

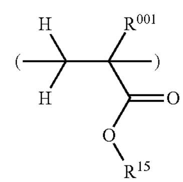

wherein $R^{001}$ independently represents a hydrogen atom, a methyl group, or a trifluoromethyl group;

$R^{12}$ represents a hydrogen atom or a monovalent hydrocarbon group comprising, at least one group selected from a $C_{1-15}$ fluorine-containing substituent, carboxy group, and hydroxy group; $R^{13}$ represents a $C_{3-15}$ monovalent hydrocarbon group comprising a —$CO_2$— moiety; $R^{14}$ represents a $C_{7-15}$ polycyclichydrocarbon group or an alkyl group comprising a $C_{7-15}$ polycyclichydrocarbon group; and $R^{15}$ represents an acid labile group, (B) a photoacid generator generating sulfonic acid represented by the following general formula (8) upon exposure to a high energy beam; and (C) an onium salt where a cation is sulfonium represented by the following general formula (3), or ammonium represented by the following general formula (4); and an anion is represented by any one of the following general formulae (5) to (7), $$R^{201}\text{—}CF_2SO_3^-H^+ \quad (8)$$

wherein $R^{201}$ represents a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group, however, $R^{201}$ does not represent a perfluoroalkyl group, (3)

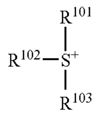

(4)

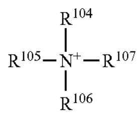

wherein $R^{101}$, $R^{102}$, and $R^{103}$ independently represent a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{101}$, $R^{102}$, and $R^{103}$ may be linked together to form a ring with the S in the formula (3); and $R^{104}$, $R^{105}$, $R^{106}$, and $R^{107}$ independently represent a hydrogen atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{104}$, $R^{105}$, $R^{106}$, and $R^{107}$ may be linked together to form a ring with the N in the formula (4), (5)

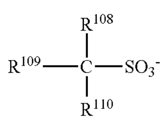

wherein $R^{108}$, $R^{109}$, and $R^{110}$ independently represent a hydrogen atom, a halogen atom except a fluorine atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{108}$, $R^{109}$, and $R^{110}$ may be linked together to form a ring, $$R^{111}\text{—}SO_3^- \quad (6)$$

wherein $R^{111}$ represents a $C_{1-20}$ aryl group where a hydrogen atom or hydrogen atoms of the aryl group may be substituted with a halogen atom, a hydroxy group, a carboxy group, an amino group, or a cyano group; and hydrogen atom or hydrogen atoms of the aryl group may be substituted with a $C_{1-20}$ linear, branched, or cyclic alkyl group, $$R^{112}\text{—}COO^- \quad (7)$$

wherein $R^{112}$ represents a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group.

2. The positive resist composition according to claim 1, wherein the sulfonic acid generated from the (B) photoacid generator is represented by the following general formula (9), $$CF_3\text{—}CH(OCOR^{202})\text{—}CF_2SO_3^-H^+ \quad (9)$$

wherein $R^{202}$ represents a $C_{1-20}$ linear, branched, or cyclic alkyl group where a hydrogen atom or hydrogen atoms of the alkyl group are substituted with a halogen atom, a hydroxy group, a carboxy group, an amino group, or a cyano group; or no hydrogen atoms of the alkyl group are substituted; or a $C_{6-14}$ aryl group where a hydrogen atom or hydrogen atoms of the aryl group are substituted with a halogen atom, a hydroxy group, a carboxy group, an amino group, or a cyano group; or no hydrogen atoms of the aryl group are substituted.

3. The positive resist composition according to claim 2, wherein the cation of the (C) onium salt is quaternary ammonium represented by the following general formula (11), (11)

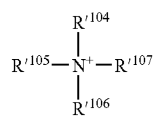

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

4. A patterning process comprising: at least, a step of applying the positive resist composition according to claim 2 to a substrate; a step of conducting a heat-treatment and then exposing the substrate to a high energy beam; and a step of developing the substrate with a developer.

5. The positive resist composition according to claim 1, wherein the sulfonic acid generated from the (B) photoacid generator is represented by the following general formula (10), $$R^{203}\text{—}OOC\text{—}CF_2SO_3^-H^+ \quad (10)$$

wherein $R^{203}$ represents a $C_{1-20}$ linear, branched, or cyclic alkyl group wherein a hydrogen atom or hydrogen atoms of the alkyl group are substituted with a halogen atom, a hydroxy group, a carboxy group, an amino group, or a cyano group; or no hydrogen atoms of the alkyl group are substituted; or a $C_{6-14}$ aryl group where a hydrogen atom or hydrogen atoms of the aryl group are substituted with a halogen atom, a hydroxy group, a carboxy group, an amino group, or a cyano group; or no hydrogen atoms of the aryl group are not substituted.

6. The positive resist composition according to claim 5, wherein the cation of the (C) onium salt is quaternary ammonium represented by the following general formula (11), (11)

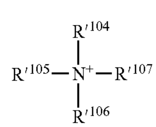

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

7. A patterning process comprising: at least, a step of applying the positive resist composition according to claim 5 to a substrate; a step of conducting a heat-treatment and then exposing the substrate to a high energy beam; and a step of developing the substrate with a developer.

8. The positive resist composition according to claim 1, wherein the cation of the (C) onium salt is quaternary ammonium represented by the following general formula (11), (11)

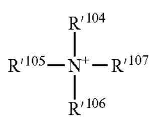

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

9. A patterning process comprising: at least, a step of applying the positive resist composition according to claim 8 to a substrate; a step of conducting a heat-treatment and then exposing the substrate to a high energy beam; and a step of developing the substrate with a developer.

10. A patterning process comprising: at least, a step of applying the positive resist composition according to claim 1 to a substrate; a step of conducting a heat-treatment and then exposing the substrate to a high energy beam; and a step of developing the substrate with a developer.

11. A positive resist composition at least comprising:

(A) a resin component comprising a repeating unit (1') selected from the following formulae,

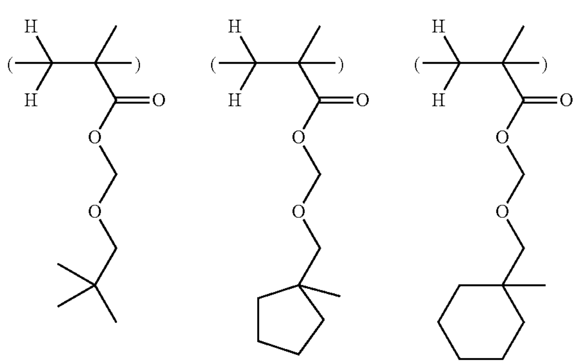

-continued

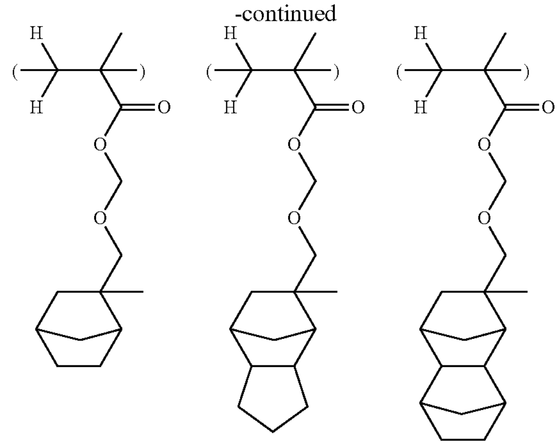

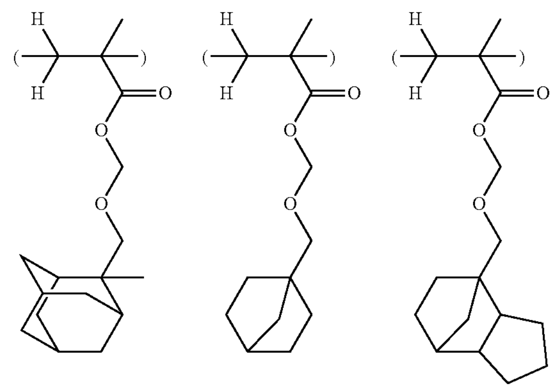

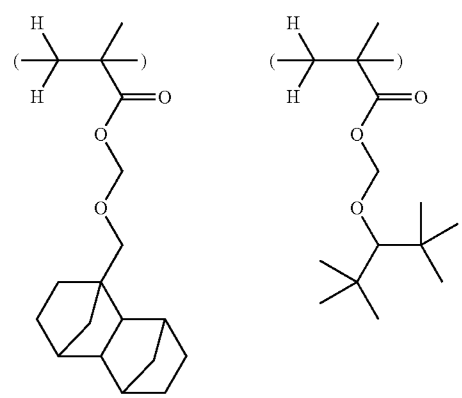

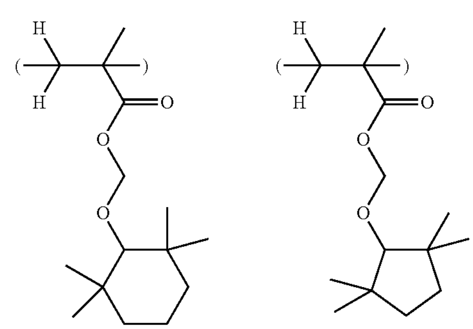

-continued

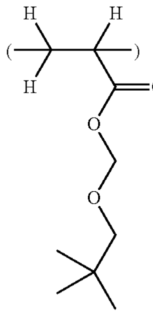
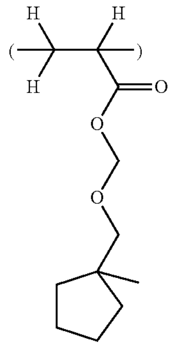
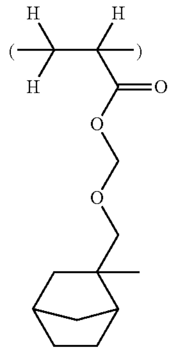
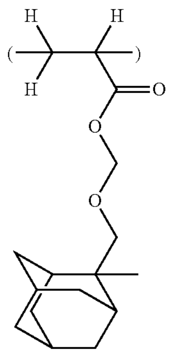
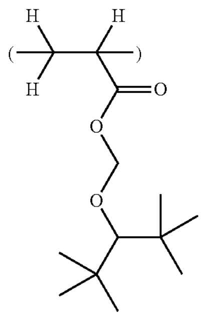
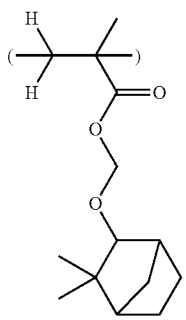
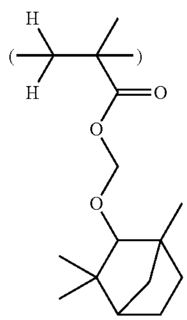
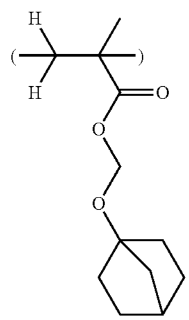
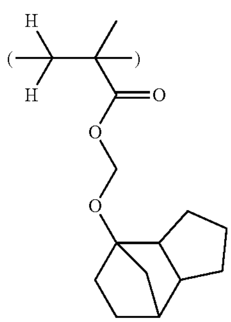
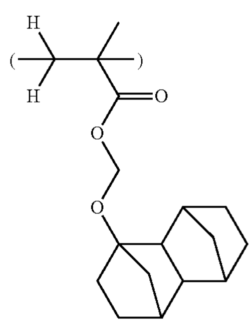
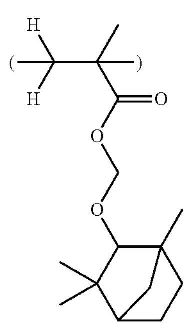
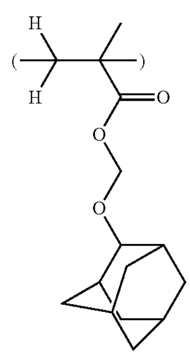

-continued

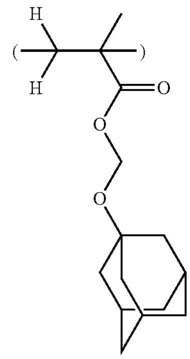
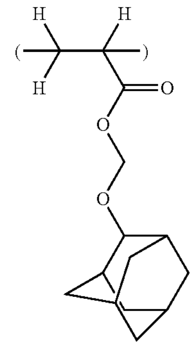
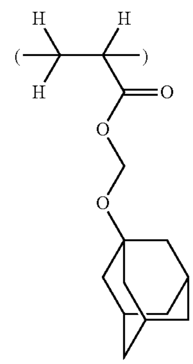

and one or more repeating units selected from the following general formulae (12), (13), (14), and (15) with the proviso that a+b+c+d+e=1, $0<a\leq 0.8$, $0\leq b\leq 0.6$, $0\leq c\leq 0.8$, $0\leq d\leq 0.6$, $0\leq e\leq 0.6$, in the case of defining the ratio of the repeating unit represented by formula (1') as a; the ratio of the repeating unit represented by formula (12) as b; the ratio of the repeating unit represented by formula (13) as c; the ratio of the repeating unit represented by formula (14) as d; and the ratio of the repeating unit represented by formula (15) as e;

(12)

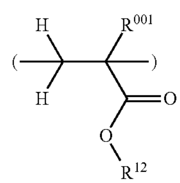

(13)

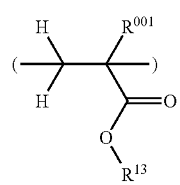

(14)

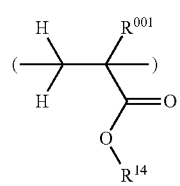

-continued

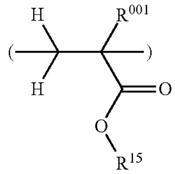

(15)

wherein $R^{001}$ independently represents a hydrogen atom, a methyl group, or a trifluoromethyl group;

$R^{12}$ represents a hydrogen atom or a monovalent hydrocarbon group comprising at least one group selected from a $C_{1-15}$ fluorine-containing substituent, carboxy group, and hydroxy group; $R^{13}$ represents a $C_{3-15}$ monovalent hydrocarbon group comprising a —$CO_2$— moiety; $R^{14}$ represents a $C_{7-15}$ polycyclichydrocarbon group or an alkyl group comprising a $C_{7-15}$ polycyclichydrocarbon group; and $R^{15}$ represents an acid labile group, (B) a photoacid generator generating sulfonic acid represented by the following general formula (8) upon exposure to a high energy beam; and (C) an onium salt where a cation is sulfonium represented by the following general formula (3) and an anion is represented by the following general formula (7), or where a cation is ammonium represented by the following general formula (4) and an anion is represented by the following general formulae (5), $$R^{201}\text{—}CF_2SO_3^-H^+ \quad (8)$$

wherein $R^{201}$ represents a $C_{1-23}$ linear, branched, or cyclic alkyl, aralkyl, or aryl group that may optionally contain an ether group, an ester group, or a carbonyl group where a hydrogen atom or hydrogen atoms of the alkyl, aralkyl, or aryl group may be substituted with a halogen atom, a hydroxy group, a carboxy group, an amino group, or a cyano group, however, $R^{201}$ does not represent a perfluoroalkyl group,

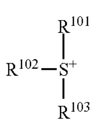

(3)

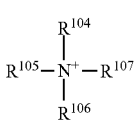

(4)

wherein $R^{101}$, $R^{102}$, and $R^{103}$ independently represent a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{101}$, $R^{102}$, and $R^{103}$ may be linked together to form a ring with the S in the formula (3); and wherein $R^{104}$, $R^{105}$, $R^{106}$, and $R^{107}$ independently represent a hydrogen atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{104}$, $R^{105}$, $R^{106}$, and $R^{107}$ may be linked together to form a ring with the N in the formula (4),

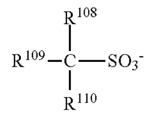

(5)

wherein $R^{108}$, $R^{109}$, and $R^{110}$ independently represent a hydrogen atom, a halogen atom except a fluorine atom, or a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group; two or more among $R^{108}$, $R^{109}$, and $R^{110}$ may be linked together to form a ring, $$R^{112}\text{—}COO^- \quad (7)$$

wherein $R^{112}$ represents a $C_{1-20}$ linear, branched, or cyclic alkyl, alkenyl, aralkyl, or aryl group that may optionally contain an ether group, an ester group, or a carbonyl group where a hydrogen atom or hydrogen atoms of the alkyl, alkenyl, aralkyl, or aryl group may be substituted with a halogen atom, a hydroxy group, a carboxy group, an amino group, or a cyano group.

12. The positive resist composition according to claim 11, wherein the sulfonic acid generated from the (B) photoacid generator is represented by the following general formula (9), $$CF_3\text{—}CH(OCOR^{202})\text{—}CF_2SO_3^-H^+ \quad (9)$$

wherein $R^{202}$ represents a $C_{1-20}$ linear, branched, or cyclic alkyl group where a hydrogen atom or hydrogen atoms of the alkyl group are substituted with a halogen atom, a hydroxy group, a carboxy group, an amino group, or a cyano group; or no hydrogen atoms of the alkyl group are substituted; or a $C_{6-14}$ aryl group where a hydrogen atom or hydrogen atoms of the aryl group are substituted with a halogen atom, a hydroxy group, a carboxy group, an amino group, or a cyano group; or no hydrogen atoms of the aryl group are substituted.

13. The positive resist composition according to claim 12, wherein the cation of the (C) onium salt is quaternary ammonium represented by the following general formula (11),

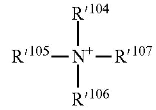

(11)

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

14. A patterning process comprising: at least, a step of applying the positive resist composition according to claim 12 to a substrate; a step of conducting a heat-treatment and then exposing the substrate to a high energy beam; and a step of developing the substrate with a developer.

15. The positive resist composition according to claim 11, wherein the sulfonic acid generated from the (B) photoacid generator is represented by the following general formula (10), $$R^{203}—OOC—CF_2SO_3^-H^+ \qquad (10)$$

wherein $R^{203}$ represents a $C_{1-20}$ linear, branched, or cyclic alkyl group wherein a hydrogen atom or hydrogen atoms of the alkyl group are substituted with a halogen atom, a hydroxy group, a carboxy group, an amino group, or a cyano group; or no hydrogen atoms of the alkyl group are substituted; or a $C_{6-14}$ aryl group where a hydrogen atom or hydrogen atoms of the aryl group are substituted with a halogen atom, a hydroxy group, a carboxy group, an amino group, or a cyano group; or no hydrogen atoms of the aryl group are not substituted.

16. The positive resist composition according to claim 15, wherein the cation of the (C) onium salt is quaternary ammonium represented by the following general formula (11), (11)

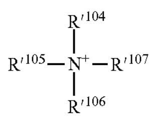

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

17. A patterning process comprising: at least, a step of applying the positive resist composition according to claim 15 to a substrate; a step of conducting a heat-treatment and then exposing the substrate to a high energy beam; and a step of developing the substrate with a developer.

18. The positive resist composition according to claim 11, wherein the cation of the (C) onium salt is quaternary ammonium represented by the following general formula (11), (11)

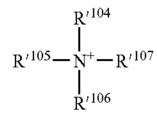

wherein $R'^{104}$, $R'^{105}$, $R'^{106}$, and $R'^{107}$ independently represent a $C_{1-20}$ linear, branched, or cyclic alkyl group; two or more among $R'^{104}$, $R'^{105}$, $R'^{106}$, and $R'^{107}$ may be linked together to form a ring with the N in the formula (11).

19. A patterning process comprising: at least, a step of applying the positive resist composition according to claim 18 to a substrate; a step of conducting a heat-treatment and then exposing the substrate to a high energy beam; and a step of developing the substrate with a developer.

20. A patterning process comprising: at least, a step of applying the positive resist composition according to claim 11 to a substrate; a step of conducting a heat-treatment and then exposing the substrate to a high energy beam; and a step of developing the substrate with a developer.

* * * * *